US009726976B2

(12) United States Patent
Ichikawa et al.

(10) Patent No.: US 9,726,976 B2
(45) Date of Patent: *Aug. 8, 2017

(54) PHOTORESIST COMPOSITION

(75) Inventors: Koji Ichikawa, Toyonaka (JP); Hiromu Sakamoto, Ibaraki (JP); Masako Sugihara, Nishinomiya (JP); Takashi Hiraoka, Hannan (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 669 days.

This patent is subject to a terminal disclaimer.

(21) Appl. No.: 12/881,942

(22) Filed: Sep. 14, 2010

(65) Prior Publication Data

US 2011/0065041 A1    Mar. 17, 2011

(30) Foreign Application Priority Data

Sep. 17, 2009  (JP) .................. 2009-215521
Sep. 17, 2009  (JP) .................. 2009-215522
Sep. 17, 2009  (JP) .................. 2009-215523

(51) Int. Cl.
*G03F 7/004* (2006.01)
*G03F 7/039* (2006.01)

(52) U.S. Cl.
CPC .......... *G03F 7/0397* (2013.01); *G03F 7/0045* (2013.01); *G03F 7/0046* (2013.01)

(58) Field of Classification Search
CPC ...................... G03F 7/0397; G03F 7/0045
See application file for complete search history.

(56) References Cited

U.S. PATENT DOCUMENTS

| | | | |
|---|---|---|---|
| 2003/0099900 A1 | 5/2003 | Yamada et al. | |
| 2003/0134224 A1 | 7/2003 | Mizutani et al. | |
| 2006/0035165 A1* | 2/2006 | Sasaki ...................... | 430/270.1 |
| 2006/0194982 A1* | 8/2006 | Harada et al. .............. | 560/150 |
| 2008/0220371 A1* | 9/2008 | Kodama ................... | 430/281.1 |
| 2008/0234259 A1 | 9/2008 | Muthuppalaniappan et al. | |
| 2010/0015554 A1* | 1/2010 | Saegusa ............... | G03F 7/0045 430/286.1 |
| 2010/0203446 A1* | 8/2010 | Ichikawa ............. | G03F 7/0045 430/270.1 |

FOREIGN PATENT DOCUMENTS

| | | | |
|---|---|---|---|
| JP | 2003241381 A | * | 8/2003 |
| JP | 2006-256039 A | | 9/2006 |

OTHER PUBLICATIONS

English Translation of JP2003241381.*
An Office Action (including an English translation) issued in the corresponding Japanese Patent Application No. 2010-202793 on Apr. 28, 2015.
An Office Action (including an English translation) issued in the corresponding Japanese Patent Application No. 2010-202794 on Apr. 30, 2015.

* cited by examiner

*Primary Examiner* — Cynthia H Kelly
*Assistant Examiner* — Anna Malloy
(74) *Attorney, Agent, or Firm* — Birch, Stewart, Kolasch & Birch, LLP

(57) ABSTRACT

A photoresist composition comprising an acid generator and a resin comprising a structural unit derived from a monomer represented by the formula (1):

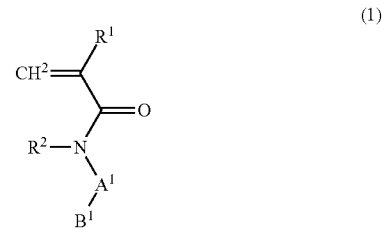

(1)

wherein $R^1$ represents a hydrogen atom etc.,
$R^2$ represents a hydrogen atom or a C1-C4 alkyl group,
$A^1$ represents a single bond etc., and
$B^1$ represents
a group represented by the formula (1a):

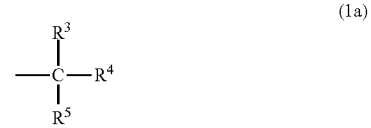

(1a)

wherein $R^3$, $R^4$ and $R^5$ each independently represents a C1-C16 aliphatic hydrocarbon group and $R^4$ and $R^5$ can be bonded each other to form a C3-C18 ring together with the carbon atom to which $R^4$ and $R^5$ are bonded,
a C4-C20 saturated cyclic group having a lactone structure or
a C5-C20 saturated cyclic hydrocarbon group having at least one hydroxyl group.

11 Claims, No Drawings

PHOTORESIST COMPOSITION

This nonprovisional application claims priority under 35 U.S.C. §119(a) on Patent Applications Nos. 2009-215521, 2009-215522 and 2009-215523 filed in JAPAN on Sep. 17, 2009, the entire contents of which are hereby incorporated by reference.

FIELD OF THE INVENTION

The present invention relates to a photoresist composition.

BACKGROUND OF THE INVENTION

A photoresist composition used for semiconductor microfabrication employing a lithography process contains a resin and an acid generator comprising a compound generating an acid by irradiation.

US 2003/0099900 A1 discloses a photoresist composition comprising a resin comprising a structural unit derived from 2-ethyl-2-adamantyl methacrylate, a structural unit derived from 3-hydroxy-1-adamantyl methacrylate and a structural unit derived from α-methacryloyloxy-γ-butyrolactone, an acid generator and a solvent.

SUMMARY OF THE INVENTION

The present invention is to provide a photoresist composition.

The present invention relates to the followings:

<1> A photoresist composition comprising an acid generator and a resin comprising a structural unit derived from a monomer represented by the formula (1):

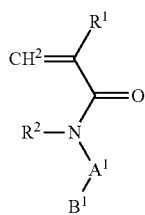

(1)

wherein $R^1$ represents a hydrogen atom or a C1-C4 alkyl group, $R^2$ represents a hydrogen atom or a C1-C4 alkyl group, $A^1$ represents a single bond, —$(CH_2)_m$—CO—O—$A^2$-*, or —$(CH_2)_n$—CO—$NR^{30}$-$A^3$-*, m and n each independently represent an integer of 1 to 6, $R^{30}$ represents a hydrogen atom or a C1-C4 alkyl group, $A^2$ represents a single bond or a C1-C3 alkanediyl group, $A^3$ represents a single bond or a C1-C3 alkanediyl group, and * represents a binding position to $B^1$, and $B^1$ represents a group represented by the formula (1a):

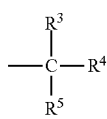

(1a)

wherein $R^3$, $R^4$ and $R^5$ each independently represents a C1-C16 aliphatic hydrocarbon group and $R^4$ and $R^5$ can be bonded each other to form a C3-C18 ring together with the carbon atom to which $R^4$ and $R^5$ are bonded, a C4-C20 saturated cyclic group having a lactone structure or a C5-C20 saturated cyclic hydrocarbon group having at least one hydroxyl group;

<2> The photoresist composition according to <1>, wherein $B^1$ is the group represented by the formula (1a) wherein $R^3$, $R^4$ and $R^5$ each independently represents a C1-C8 aliphatic hydrocarbon group or a C3-C8 saturated cyclic hydrocarbon group, and $R^4$ and $R^5$ can be bonded each other to form a C3-C10 ring together with the carbon atom to which $R^4$ and $R^5$ are bonded, and the saturated cyclic hydrocarbon group and the ring can have a C1-C8 aliphatic hydrocarbon group;

<3> The photoresist composition according to <1>, wherein $B^1$ is a group represented by the formula (1a-1) or (1a-2):

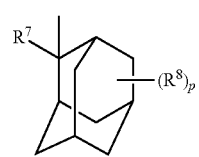

(1a-1)

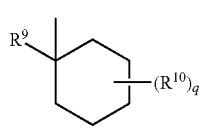

(1a-2)

wherein $R^7$ represents a C1-C8 aliphatic hydrocarbon group or a C3-C8 saturated cyclic hydrocarbon group which can have a C1-C8 aliphatic hydrocarbon group, $R^8$ is independently in each occurrence a C1-C8 aliphatic hydrocarbon group, p represents an integer of 0 to 10, $R^9$ represents a C1-C8 aliphatic hydrocarbon group or a C3-C8 saturated cyclic hydrocarbon group which can have a C1-C8 aliphatic hydrocarbon group, $R^{10}$ is independently in each occurrence a C1-C8 aliphatic hydrocarbon group, and q represents an integer of 0 to 10;

<4> The photoresist composition according to <1>, wherein $B^1$ is a group represented by the formula (1b-1) or (1b-2):

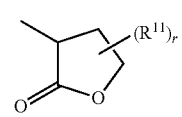

(1b-1)

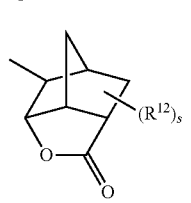

(1b-2)

wherein is independently in each occurrence a C1-C4 alkyl group, r represents an integer of 0 to 3, $R^{12}$ is independently in each occurrence a carboxyl group, a cyano group or a C1-C4 alkyl group, and s represents an integer of 0 to 3;

<5> The photoresist composition according to <1>, wherein $B^1$ is a group represented by the formula (1c-1):

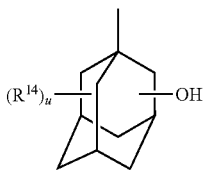

wherein $R^{14}$ is independently in each occurrence a C1-C4 alkyl group or a hydroxyl group, u represents an integer of 0 to 3;

<6> The photoresist composition according to <5>, wherein $B^1$ is a group represented by the formula (1c-2):

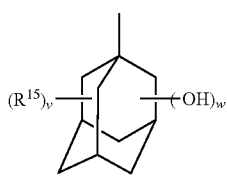

wherein $R^{15}$ is independently in each occurrence a C1-C4 alkyl group, v represents an integer of 0 to 3, and w represents an integer of 1 to 3, with the proviso that sum of v and w is 4 or less;

<7> The photoresist composition according to any one of <1> to <6>, wherein $A^2$ and $A^3$ are single bonds;

<8> The photoresist composition according to any one of <1> or <6>, wherein the resin has an acid-labile group and is insoluble or poorly soluble in an aqueous alkaline solution but becomes soluble in an aqueous alkaline solution by the action of an acid;

<9> The photoresist composition according to <7>, wherein the resin has an acid-labile group and is insoluble or poorly soluble in an aqueous alkaline solution but becomes soluble in an aqueous alkaline solution by the action of an acid;

<10> The photoresist composition according to any one of <1> to <6>, wherein the acid generator is a salt represented by the formula (B1):

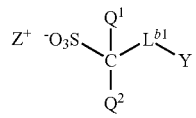

wherein $Q^1$ and $Q^2$ each independently represent a fluorine atom or a C1-C6 perfluoroalkyl group, $L^{b1}$ represents a single bond or a C1-C17 divalent saturated aliphatic hydrocarbon group in which one or more methylene groups can be replaced by —O— or —CO—, Y represents a C1-C36 aliphatic hydrocarbon group which can have one or more substituents, and one or more methylene groups in the aliphatic hydrocarbon group can be replaced by —O—, —CO— or —SO$_2$—, and $Z^+$ represents an organic cation;

<11> The photoresist composition according to any one of <7> to <9>, wherein the acid generator is the salt represented by the formula (B1);

<12> The photoresist composition according to <10>, wherein $L^{b1}$ is *—CO—O— in which * represents a binding position to —C($Q^1$)($Q^2$)-;

<13> The photoresist composition according to <11>, wherein $L^{b1}$ is *—CO—O— in which * represents a binding position to —C($Q^1$)($Q^2$)-;

<14> The photoresist composition according to <10> or <12>, wherein $Z^+$ is an arylsulfonium cation;

<15> The photoresist composition according to <11> or <13>, wherein $Z^+$ is an arylsulfonium cation;

<16> The photoresist composition according to any one of <1> to <15>, wherein the composition further comprises a basic compound;

<17> A process for producing a photoresist pattern comprising the following steps (1) to (5):

(1) a step of applying the photoresist composition according to any one of <1> to <16> on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

DESCRIPTION OF PREFERRED EMBODIMENTS

The photoresist composition of the present invention comprises an acid generator and a resin comprising a structural unit derived from a monomer represented by the formula (1):

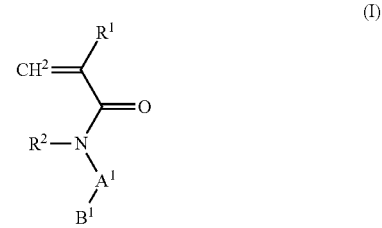

wherein $R^1$ represents a hydrogen atom or a C1-C4 alkyl group, $R^2$ represents a hydrogen atom or a C1-C4 alkyl group, $A^1$ represents a single bond, —(CH$_2$)$_m$—CO—O-$A^2$-* or —(CH$_2$)$_n$—CO—NR$^{30}$-$A^3$-*, m and n each independently represent an integer of 1 to 6, $R^{30}$ represents a hydrogen atom or a C1-C4 alkyl group, $A^2$ represents a single bond or a C1-C3 alkanediyl group, $A^3$ represents a single bond or a C1-C3 alkanediyl group, and * represents a binding position to $B^1$, and $B^1$ represents a group represented by the formula (1a):

wherein $R^3$, $R^4$ and $R^5$ each independently represents a C1-C16 aliphatic hydrocarbon group and $R^4$ and $R^5$ can be bonded each other to form a C3-C18 ring together with the carbon atom to which $R^4$ and $R^5$ are bonded, a C4-C20 saturated cyclic group having a lactone structure or a C5-C20 saturated cyclic hydrocarbon group having at least one hydroxyl group.

Examples of the C1-C4 alkyl group include a methyl group, an ethyl group, a propyl group, an isopropyl group, a butyl group, an isobutyl group, a sec-butyl group and a tert-butyl group. $R^1$ is preferably a hydrogen atom or a methyl group. $R^2$ is preferably a hydrogen atom, a methyl group or an ethyl group, and is more preferably a hydrogen atom. Examples of the C1-C3 alkanediyl group include a methylene group, an ethylene group and a trimethylene group. $A^2$ is preferably a single bond, a methylene group or an ethylene group, and is more preferably a single bond or a methylene group, and m is preferably an integer of 1 to 4, more preferably 1 or 2, and especially preferably 1. $A^3$ is preferably a single bond, a methylene group or an ethylene group, and is more preferably a single bond or a methylene group. $R^{30}$ is preferably a hydrogen atom, a methyl group or an ethyl group, and is more preferably a hydrogen atom or a methyl group, and n is preferably an integer of 1 to 4, more preferably 1 or 2, and especially preferably 1. $A^1$ is especially preferably a single bond, —$CH_2$—CO—O— or —$CH_2$—CO—NH—.

Examples of the C1-C16 aliphatic hydrocarbon group include a C1-C16 linear or branched chain aliphatic hydrocarbon group such as a methyl group, an ethyl group, a propyl group, an isopropyl group, a butyl group, a tert-butyl group, a 2,2-dimethylethyl group, a 1-methylpropyl group, a 2,2-dimethylpropyl group, a 1-ethylpropyl group, a pentyl group, a 1-methylbutyl group, a 2-methylbutyl group, 3-methylbutyl group, a 1-propylbutyl group, a 1-methylpentyl group, a hexyl group, a 1,4-dimethylhexyl group, a heptyl group, a 1-methylheptyl group and an octyl group, and a C3-C16 alicyclic hydrocarbon group such as a cycloheptyl group, a methylcycloheptyl group, a cyclohexyl group, a methylcyclohexyl group, a dimethylcyclohexyl group, a norbornyl group and a methylnorbornyl group. Among them, preferred are a C1-C8 aliphatic hydrocarbon group and a C3-C8 saturated cyclic hydrocarbon group.

Examples of the C3-C18 ring formed together with the carbon atom to which $R^4$ and $R^5$ are bonded by bonding $R^4$ and $R^5$ each other include a cycloheptane ring, a methylcycloheptane ring, a cyclohexane ring, a methylcyclohexane ring, a dimethylcyclohexane ring, a norbornane ring, a methylnorbornane ring and an adamantane ring, and a C3-C10 ring is preferable.

As the group represented by the formula (1a), a group represented by the formula (1a-1) or (1a-2):

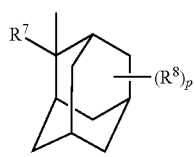
(1a-1)

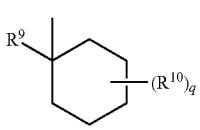
(1a-2)

wherein $R^7$ represents a C1-C8 aliphatic hydrocarbon group or a C3-C8 saturated cyclic hydrocarbon group which can have a C1-C8 aliphatic hydrocarbon group, $R^9$ is independently in each occurrence a C1-C8 aliphatic hydrocarbon group, p represents an integer of 0 to 10, $R^9$ represents a C1-C8 aliphatic hydrocarbon group or a C3-C8 saturated cyclic hydrocarbon group which can have a C1-C8 aliphatic hydrocarbon group, $R^{10}$ is independently in each occurrence a C1-C8 aliphatic hydrocarbon group, and q represents an integer of 0 to 10, is preferable.

Examples of the monomer represented by the formula (1) wherein $B^1$ is the group represented by the formula (1a) include the following monomers represented by the formulae (I-1) to (I-154).

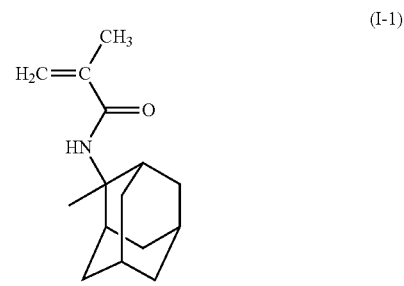
(I-1)

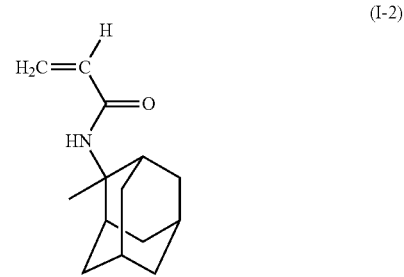
(I-2)

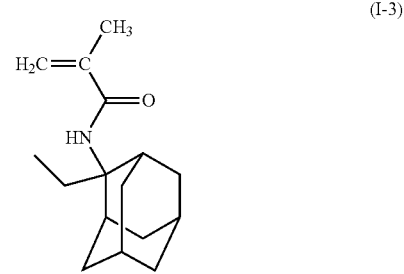
(I-3)

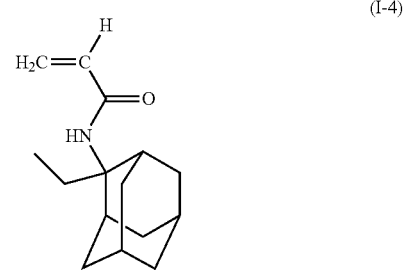
(I-4)

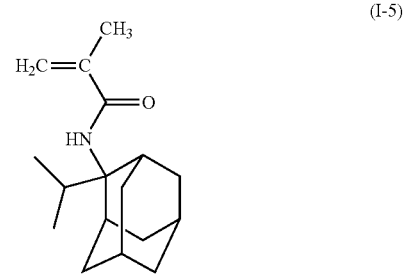
(I-5)

-continued
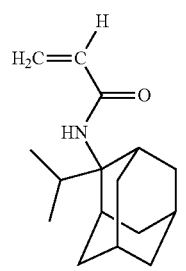
(I-6)
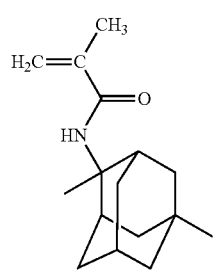
(I-7)
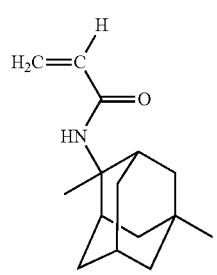
(I-8)
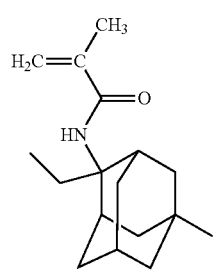
(I-9)
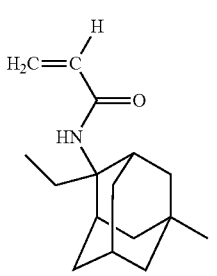
(I-10)
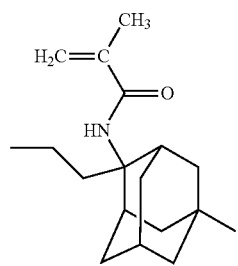
(I-10)
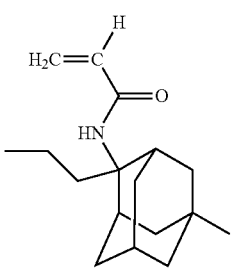
(I-12)
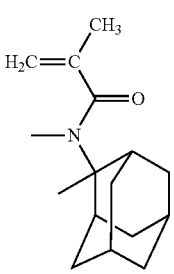
(I-13)
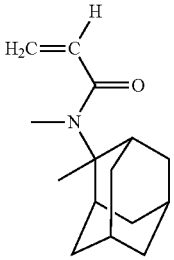
(I-14)
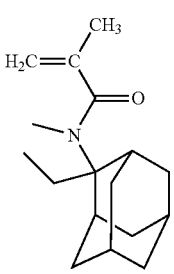
(I-15)
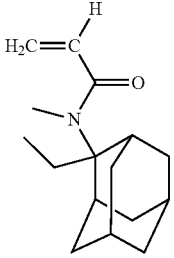
(I-16)
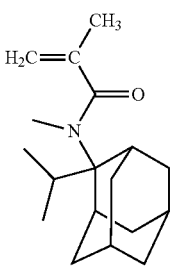
(I-17)

(I-18) 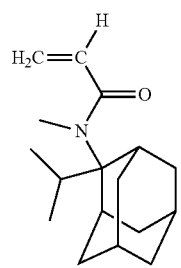
(I-19) 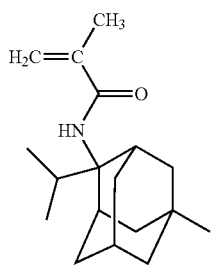
(I-20) 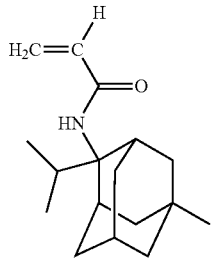
(I-21) 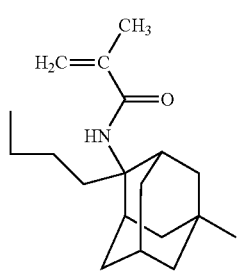
(I-22) 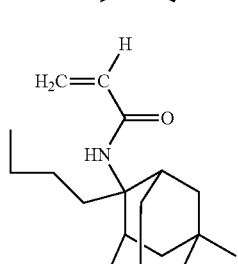
(I-23) 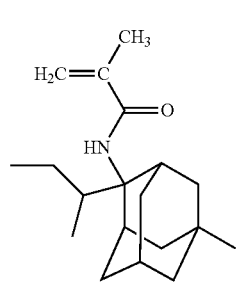
(I-24) 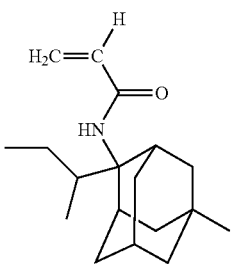
(I-25) 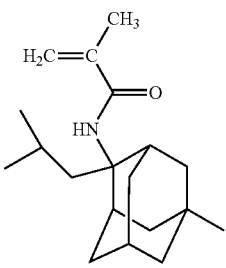
(I-26) 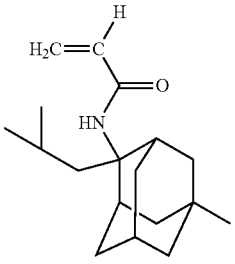
(I-27) 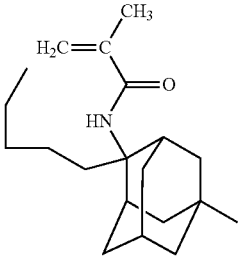
(I-28) 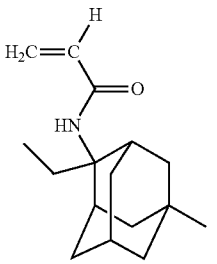
(I-29) 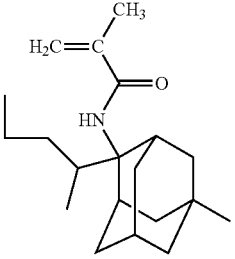

-continued
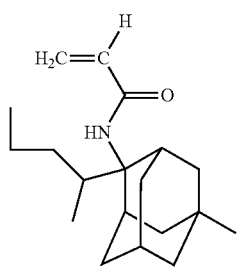 (I-30)
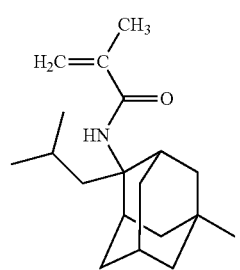 (I-31)
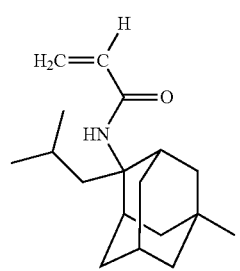 (I-32)
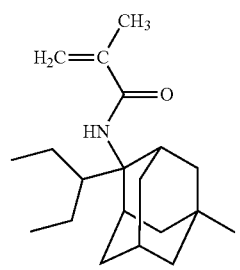 (I-33)
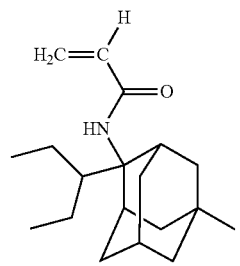 (I-34)
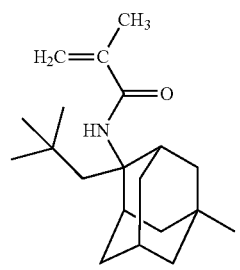 (I-35)
-continued
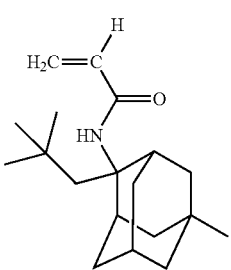 (I-36)
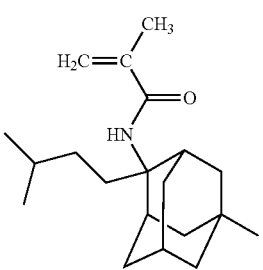 (I-37)
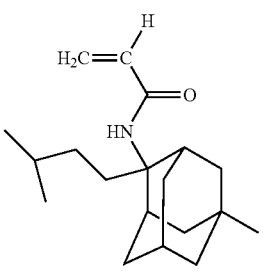 (I-38)
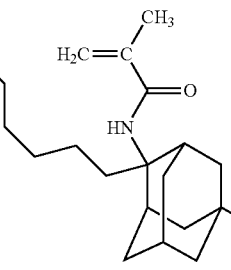 (I-39)
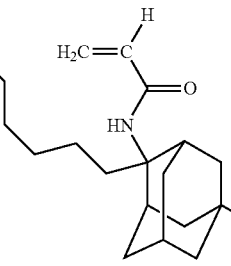 (I-40)
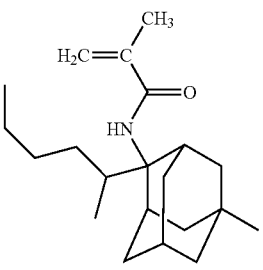 (I-41)

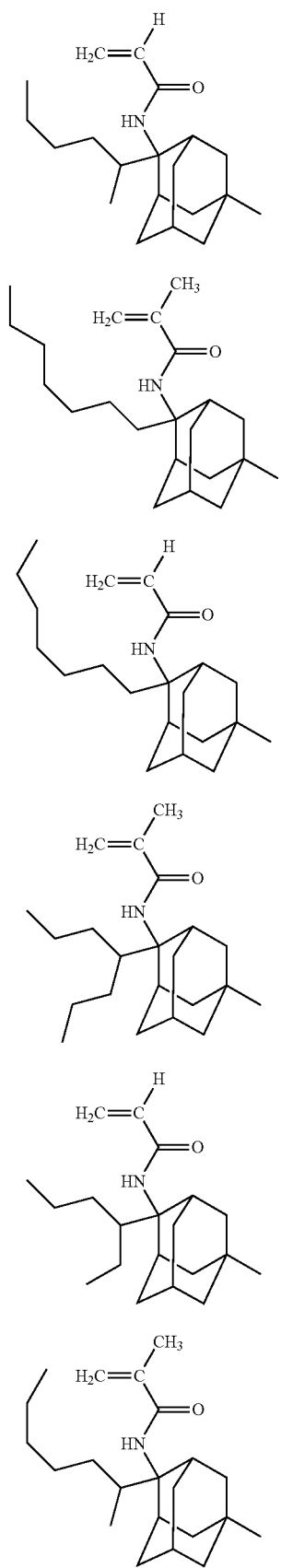
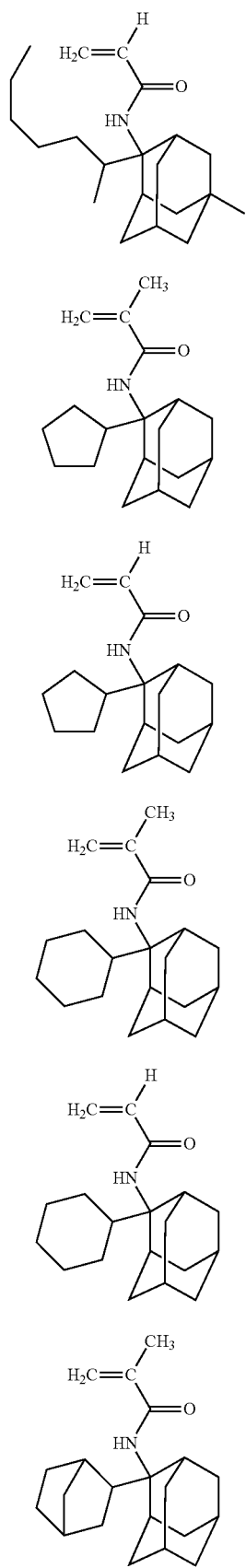

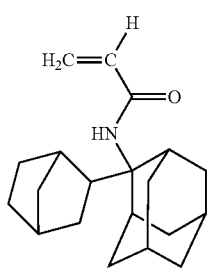 (I-54)
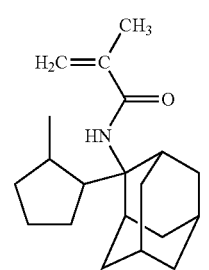 (I-55)
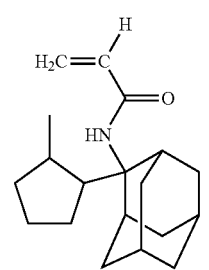 (I-56)
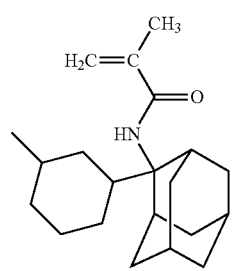 (I-57)
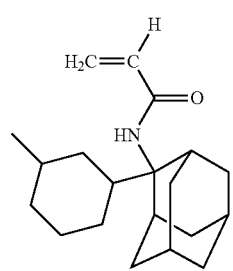 (I-58)
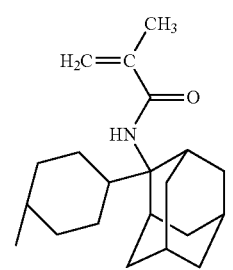 (I-59)
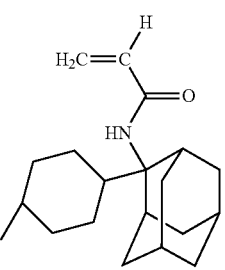 (I-60)
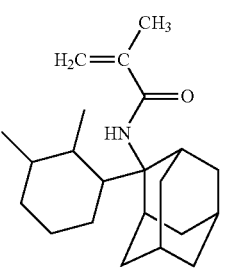 (I-61)
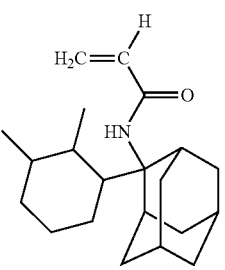 (I-62)
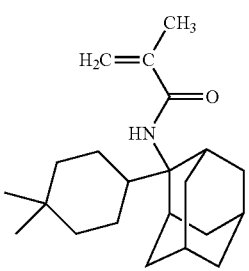 (I-63)
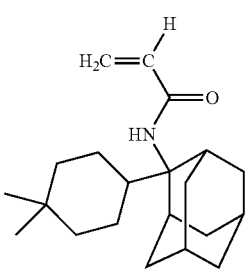 (I-64)
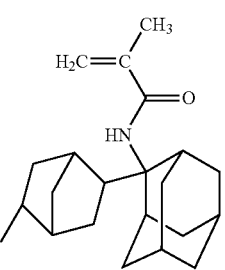 (I-65)

(I-66) 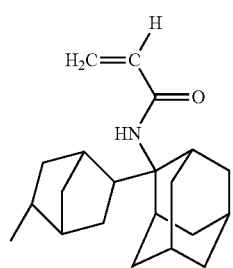
(I-67) 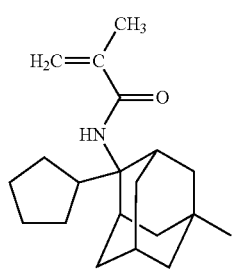
(I-68) 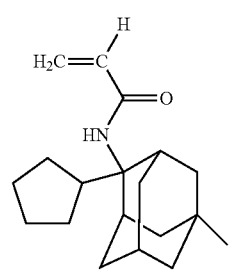
(I-69) 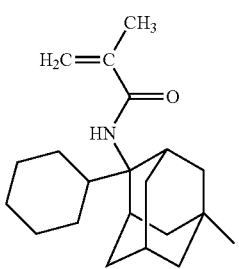
(I-70) 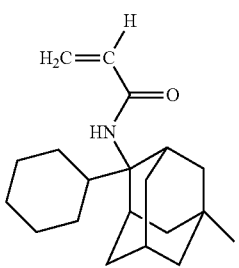
(I-71) 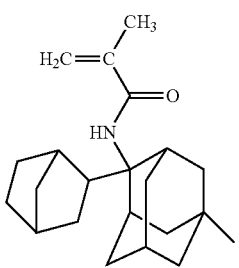
(I-72) 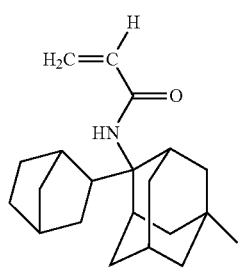
(I-73) 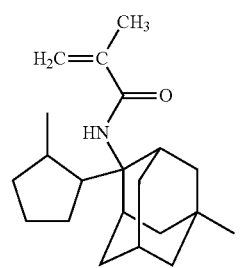
(I-74) 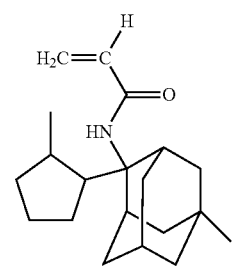
(I-75) 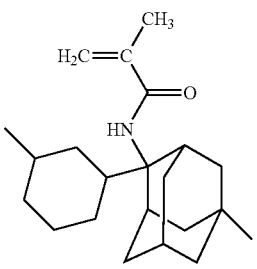
(I-76) 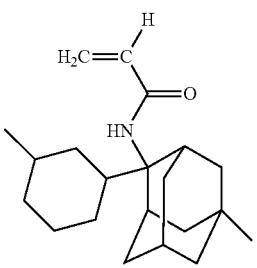
(I-77) 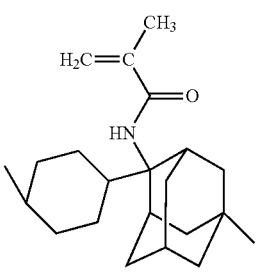

-continued
(I-78) 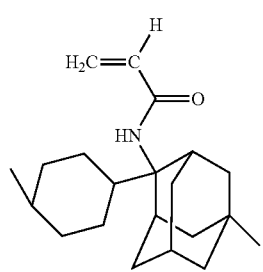
(I-79) 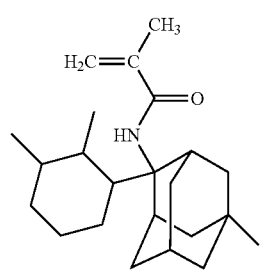
(I-80) 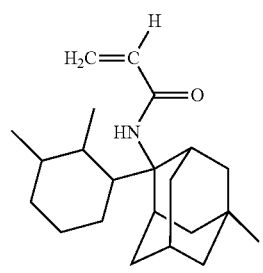
(I-81) 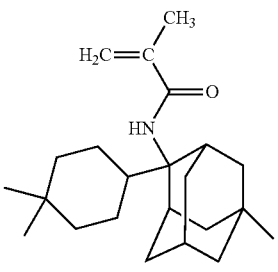
(I-82) 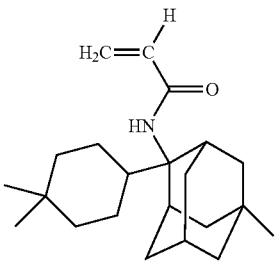
(I-83) 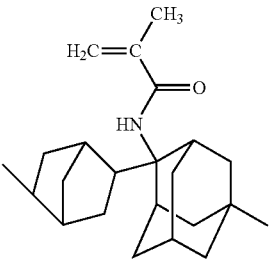
-continued
(I-84) 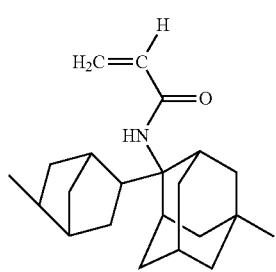
(I-85) 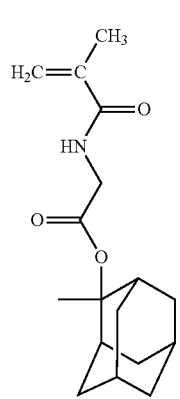
(I-86) 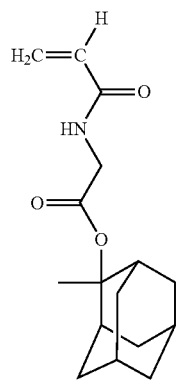
(I-87) 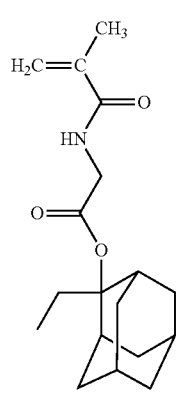

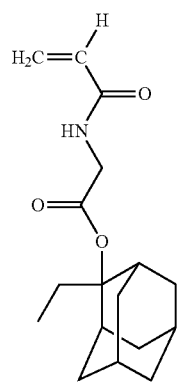
(I-88)
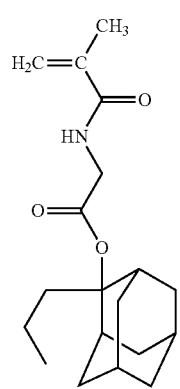
(I-89)
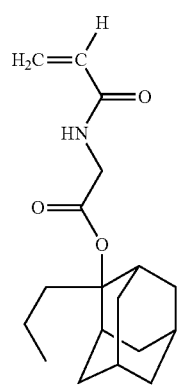
(I-90)
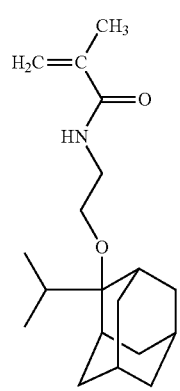
(I-91)
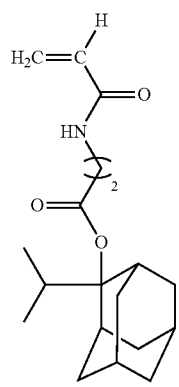
(I-92)
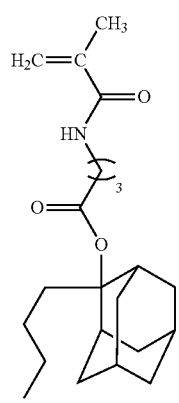
(I-93)
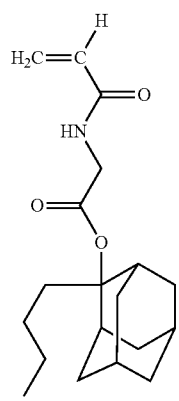
(I-94)
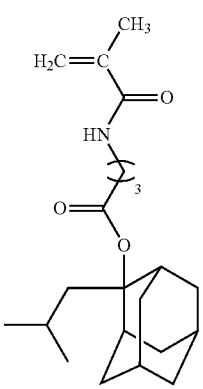
(I-95)

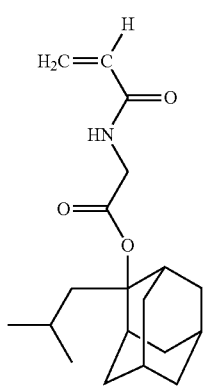
(I-96)
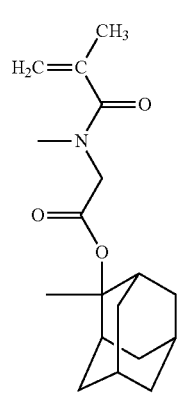
(I-97)
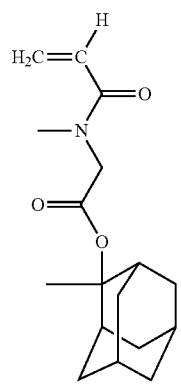
(I-98)
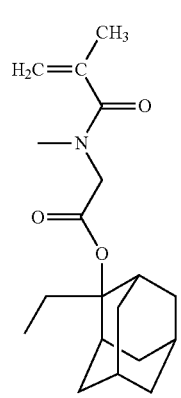
(I-99)
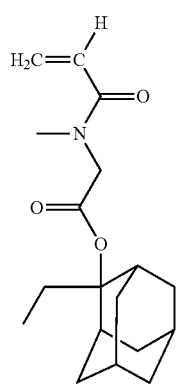
(I-100)
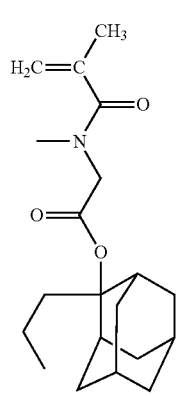
(I-101)
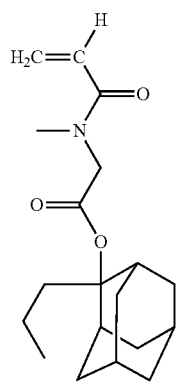
(I-102)
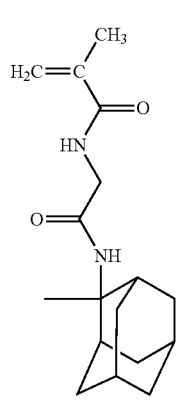
(I-103)

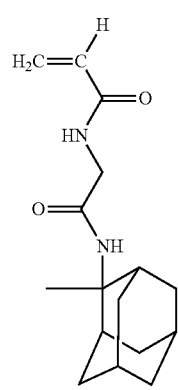 (I-104)
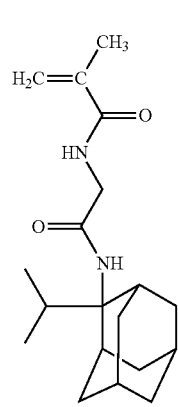 (I-105)
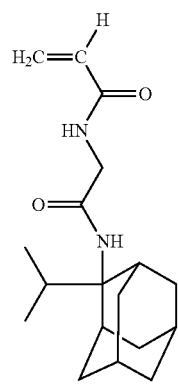 (I-106)
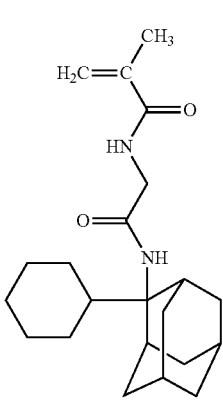 (I-107)
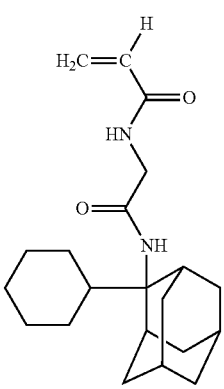 (I-108)
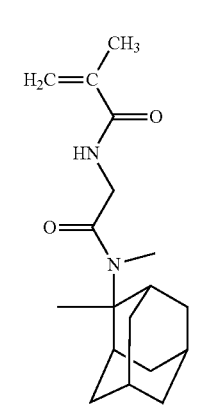 (I-109)
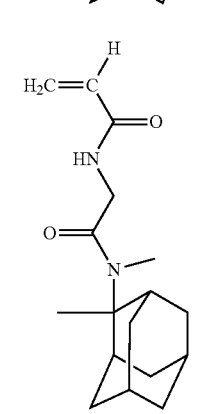 (I-110)
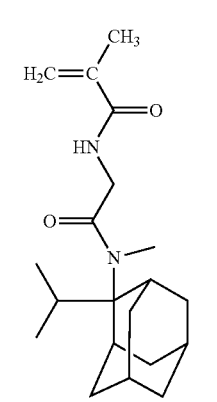 (I-111)

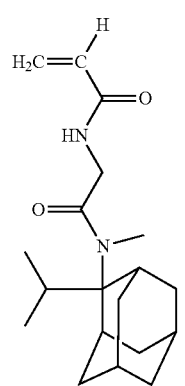 (I-112)
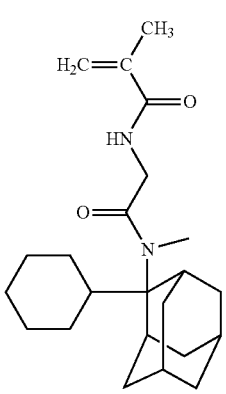 (I-113)
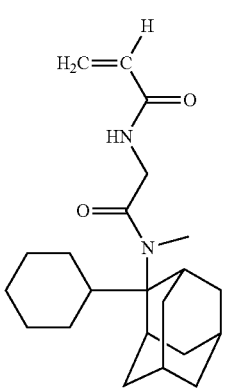 (I-114)
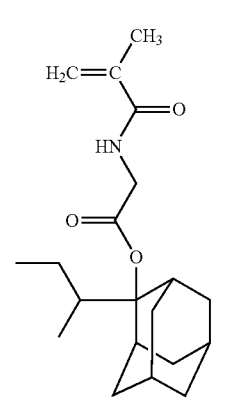 (I-115)
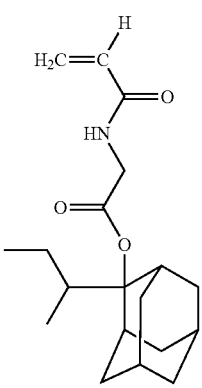 (I-116)
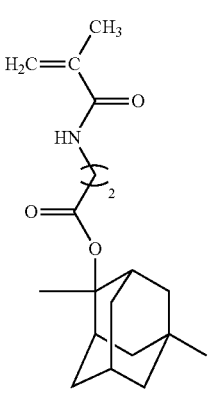 (I-117)
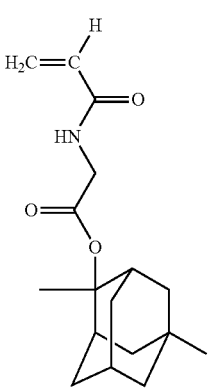 (I-118)
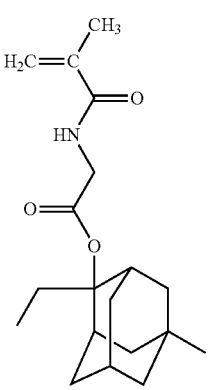 (I-119)

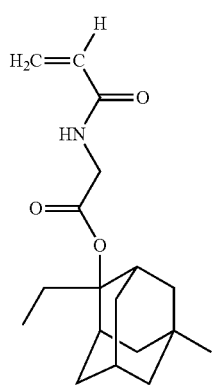
(I-120)
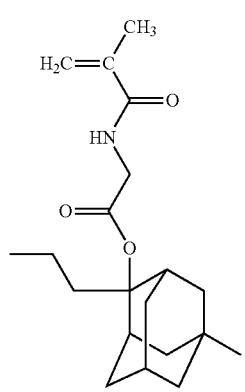
(I-121)
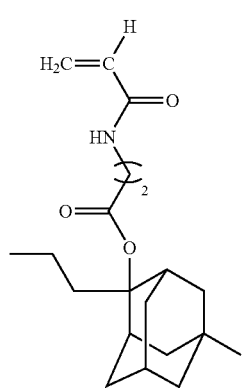
(I-122)
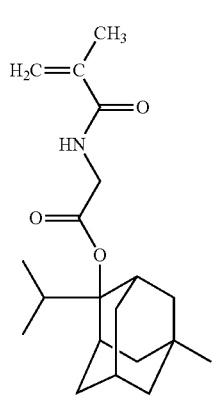
(I-123)
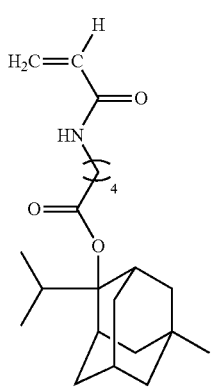
(I-124)
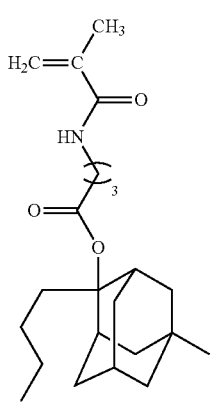
(I-125)
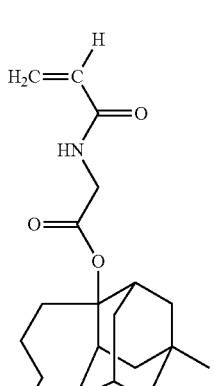
(I-126)
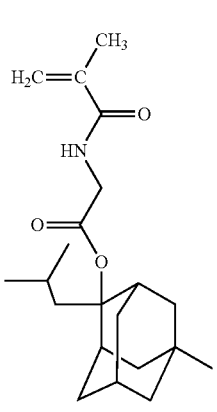
(I-127)

-continued
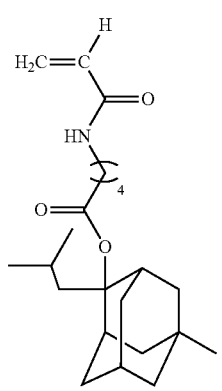 (I-128)
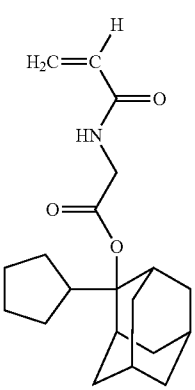 (I-132)
(I-129)
(I-133) 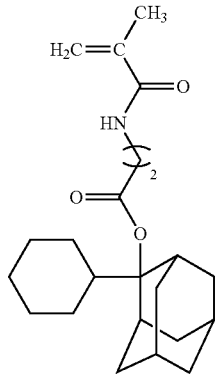
(I-130)
(I-134) 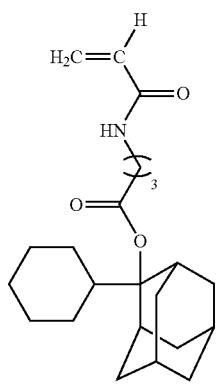
(I-131) 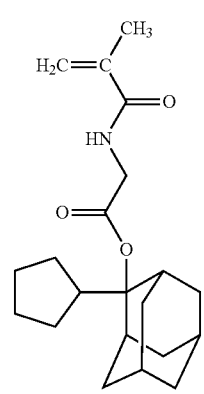
(I-135) 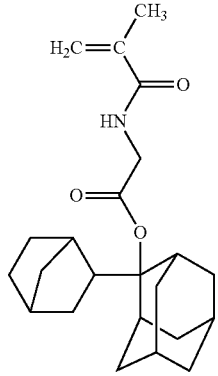

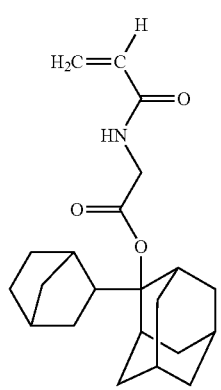 (I-136)
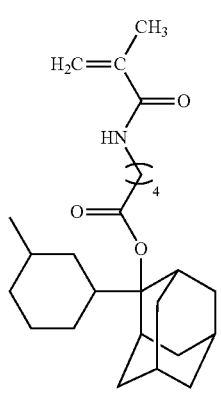 (I-137)
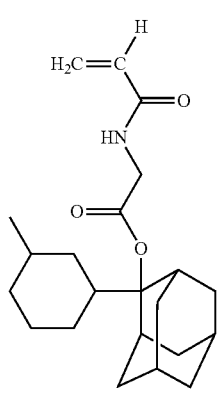 (I-138)
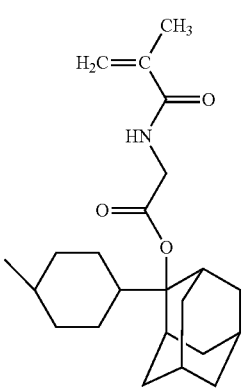 (I-139)
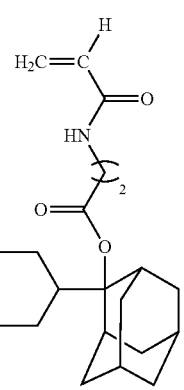 (I-140)
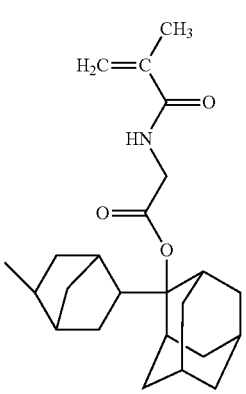 (I-141)
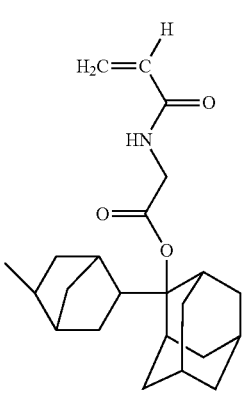 (I-142)
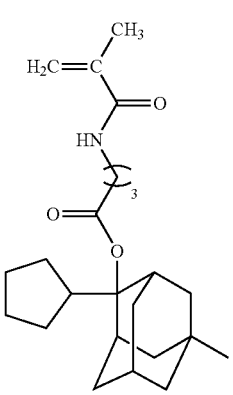 (I-143)

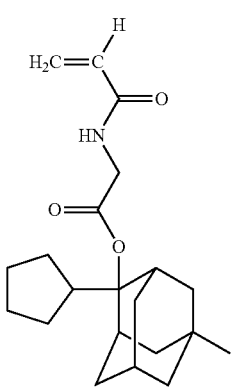 (I-144)
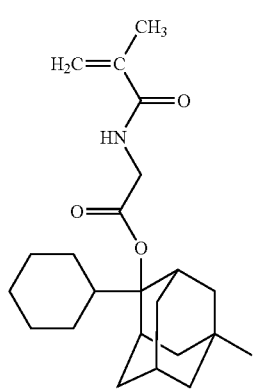 (I-145)
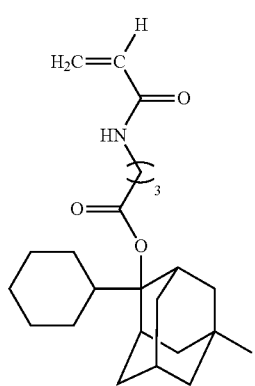 (I-146)
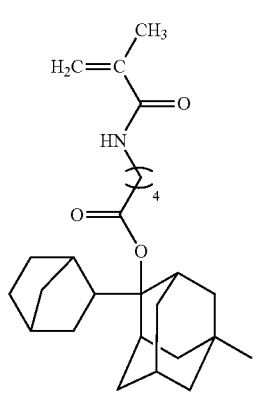 (I-147)
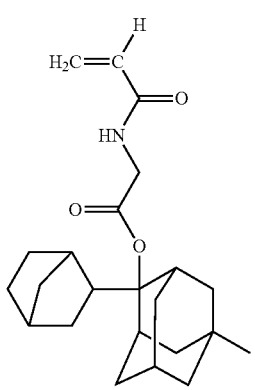 (I-148)
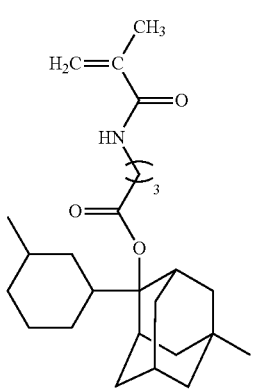 (I-149)
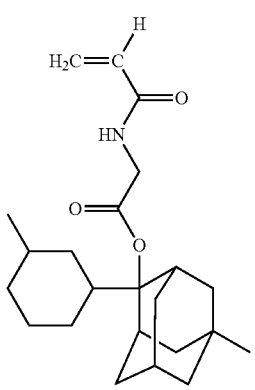 (I-150)
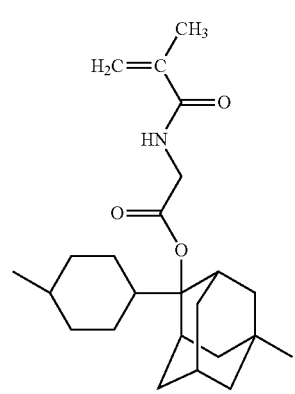 (I-151)

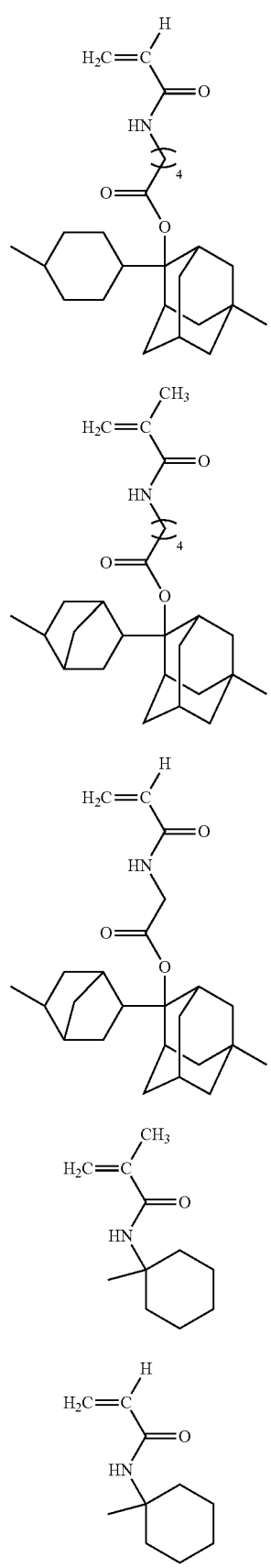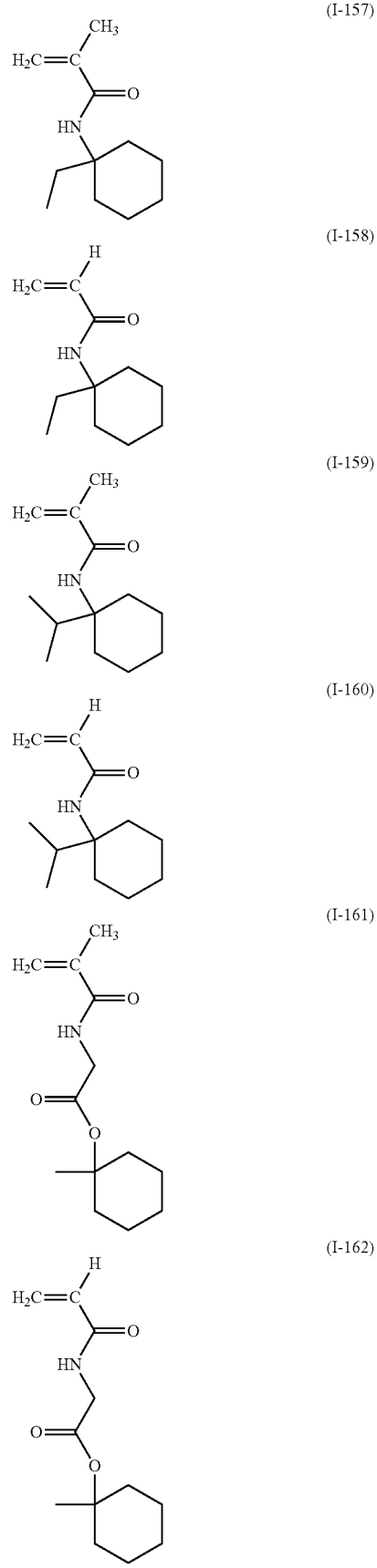

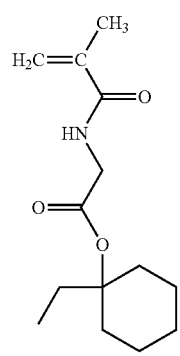
(I-163)
(I-164)
(I-165)
(I-166)
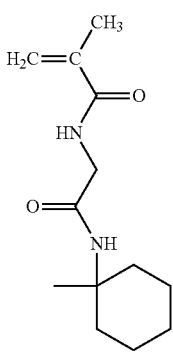
(I-167)
(I-168)
(I-169)
(I-170)

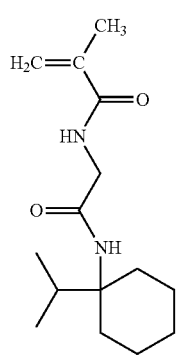

(I-171)

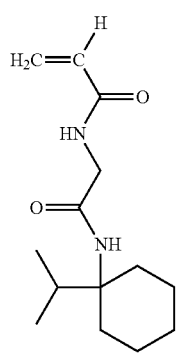

(I-172)

Among them, preferred are the monomers represented by the formulae (I-1) to (I-6), (I-85) to (I-88), (I-91), (I-92), (I-101) to (I-106), (I-155) to (I-158), (I-161) to (I-164) and (I-167) to (I-170), and more preferred are the monomers represented by the formulae (I-1), (I-3), (I-5), (I-85), (I-87), (I-91), (I-101), (I-103), (I-105), (I-157), (I-163) and (I-169).

The C4-C20 saturated cyclic group having a lactone structure may be a monocyclic group or a polycyclic group. The C4-C20 saturated cyclic group can have one or more substituents. Examples of the lactone structure include a monocyclic lactone structure such as β-propiolactone structure, γ-butyrolactone structure and γ-valerolactone structure, and a condensed ring structure formed from a monocyclic lactone structure and the other ring structure. Among them, preferred are γ-butyrolactone structure and a condensed lactone structure formed from γ-butyrolactone structure and the other ring structure.

Examples of the C4-C20 saturated cyclic group having a lactone structure include the groups represented by the formulae (1b-1), (1b-2) and (1b-3).

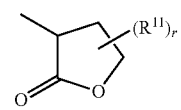

(1b-1)

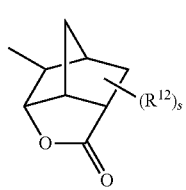

(1b-2)

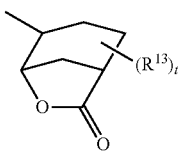

(1b-3)

wherein $R^{11}$ is independently in each occurrence a C1-C4 alkyl group, r represents an integer of 0 to 3, $R^{12}$ is independently in each occurrence a carboxyl group, a cyano group or a C1-C4 alkyl group, and s represents an integer of 0 to 3, $R^{13}$ is independently in each occurrence a carboxyl group, a cyano group or a C1-C4 alkyl group, and t represents an integer of 0 to 3. Among them, preferred are the groups represented by the formulae (1b-1) and (1b-2).

Examples of the monomer represented by the formula (1) wherein $B^1$ is the C4-C20 saturated cyclic group having a lactone structure include the monomers represented by the formulae (II-1) to (II-144):

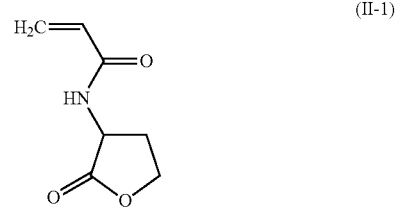

(II-1)

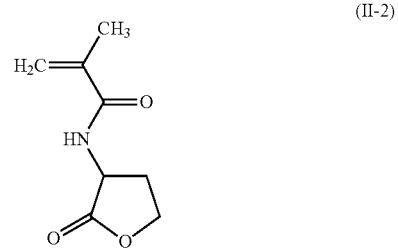

(II-2)

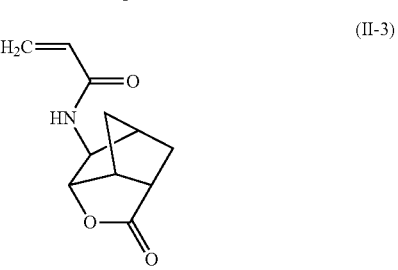

(II-3)

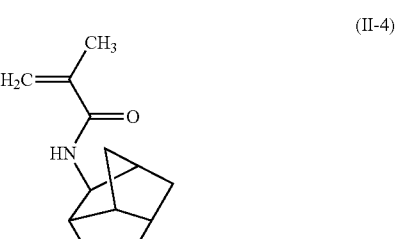

(II-4)

(II-5)
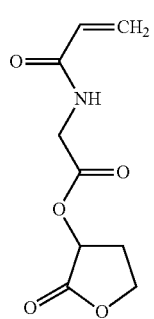
(II-6)
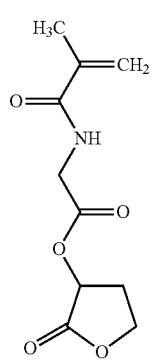
(II-7)
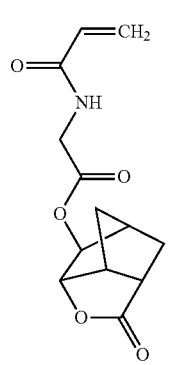
(II-8)
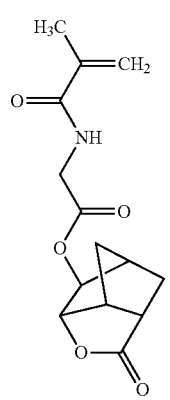
(II-9)
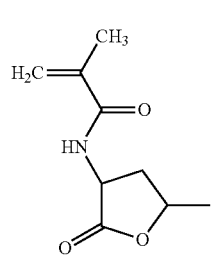
(II-10)
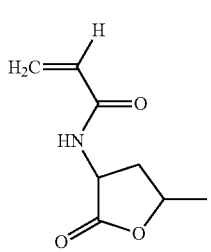
(II-11)
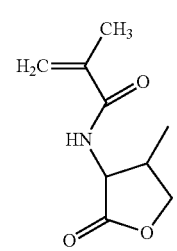
(II-12)
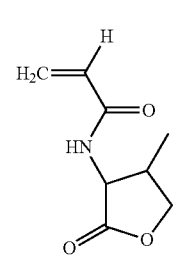
(II-13)
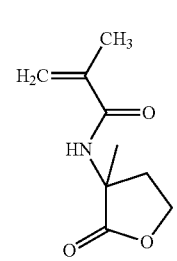
(II-14)
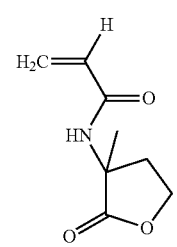
(II-15)
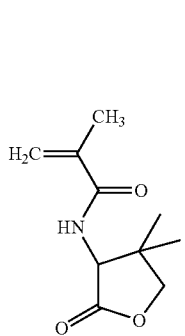

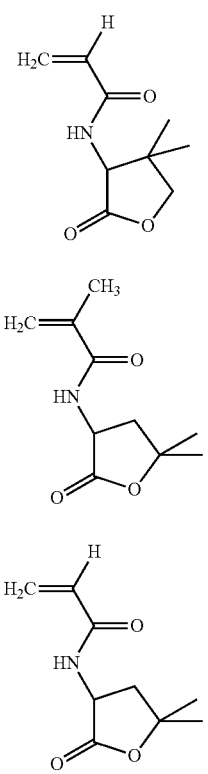 (II-16)
(II-17)
(II-18)
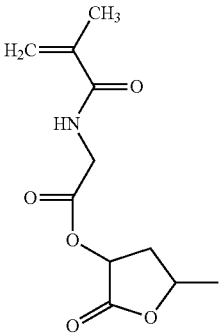 (II-19)
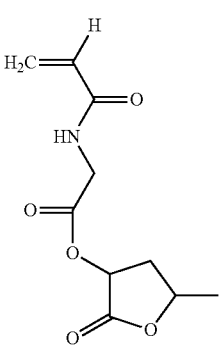 (II-20)
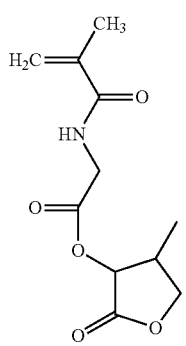 (II-21)
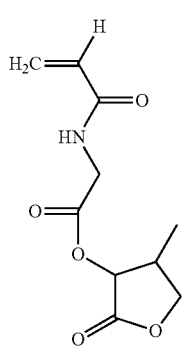 (II-22)
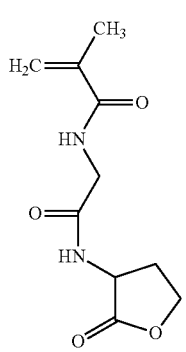 (II-23)
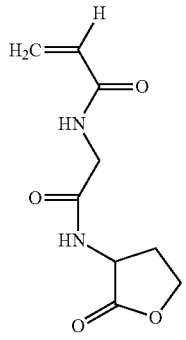 (II-24)

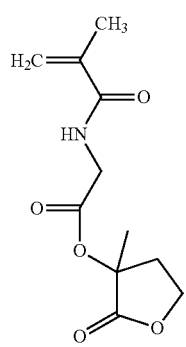 (II-25)
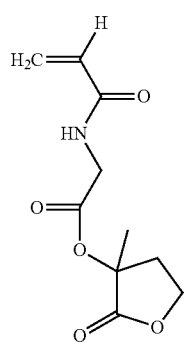 (II-26)
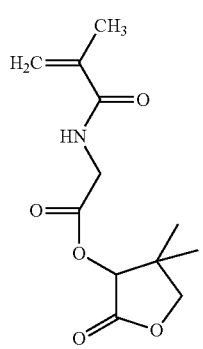 (II-27)
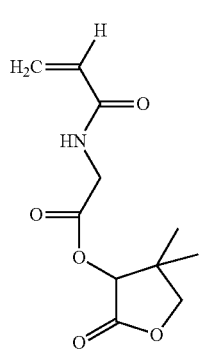 (II-28)
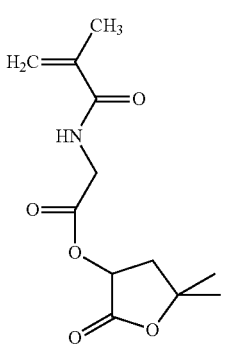 (II-29)
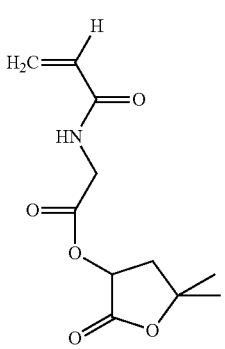 (II-30)
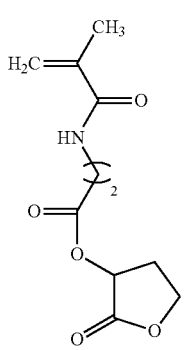 (II-31)
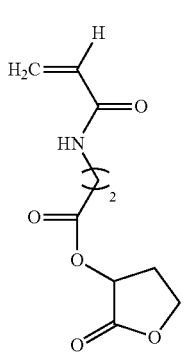 (II-32)

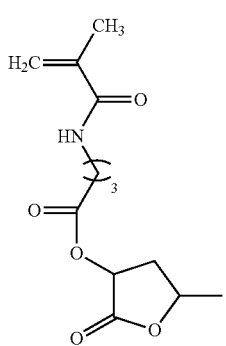 (II-33)
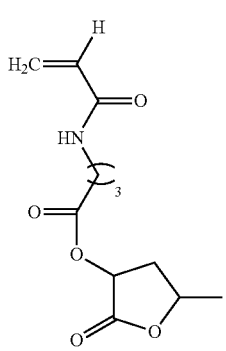 (II-34)
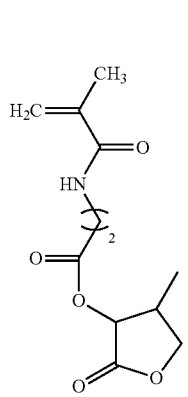 (II-35)
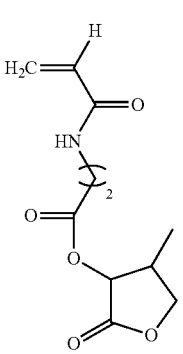 (II-36)
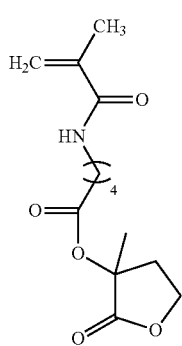 (II-37)
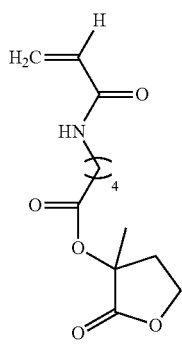 (II-38)
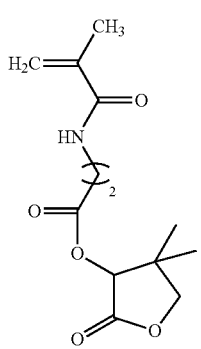 (II-39)
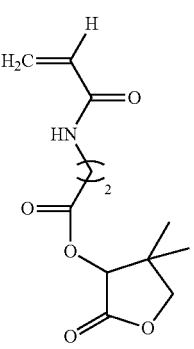 (II-40)

(II-41) 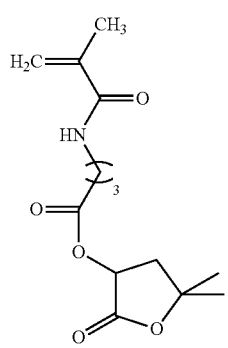
(II-42) 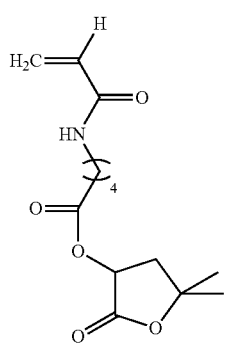
(II-43) 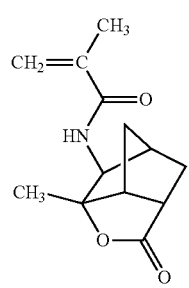
(II-44) 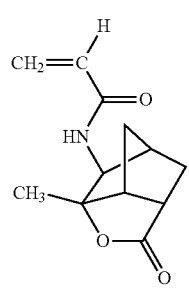
(II-45) 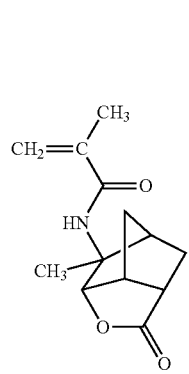
(II-46) 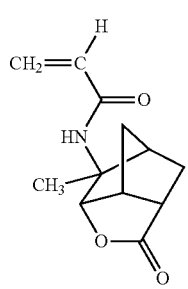
(II-47) 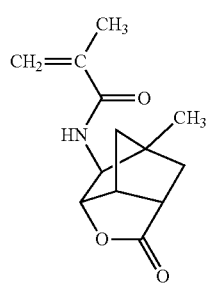
(II-48) 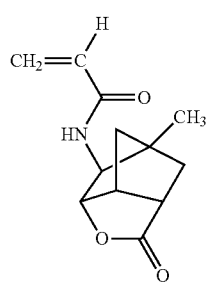
(II-49) 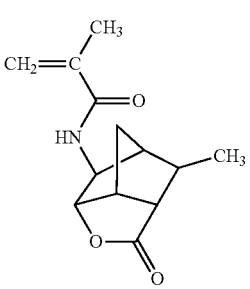
(II-50) 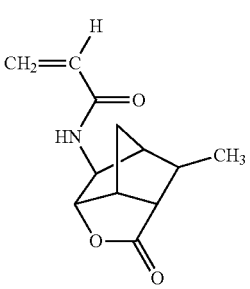

-continued
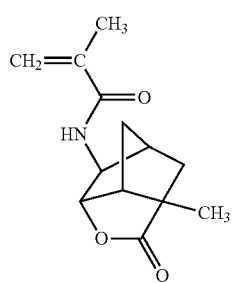 (II-51)
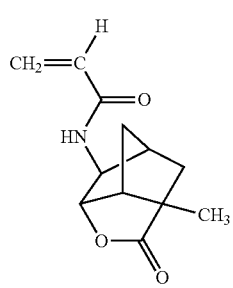 (II-52)
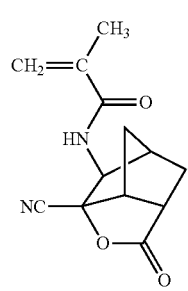 (II-53)
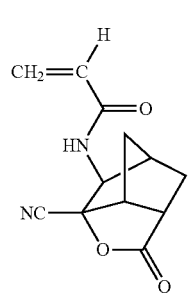 (II-54)
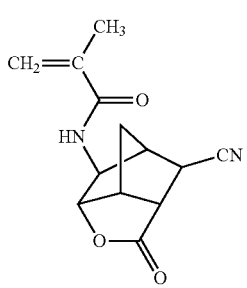 (II-55)
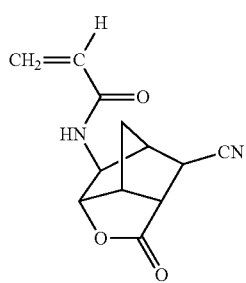 (II-56)
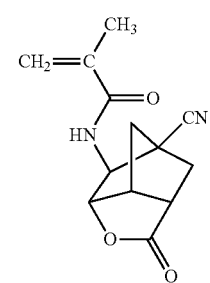 (II-57)
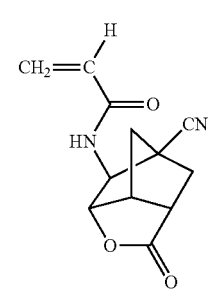 (II-58)
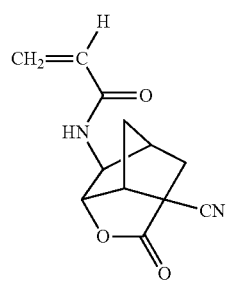 (II-59)
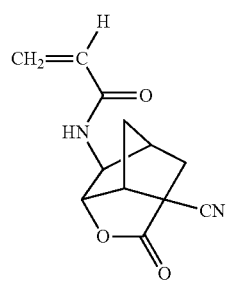 (II-60)

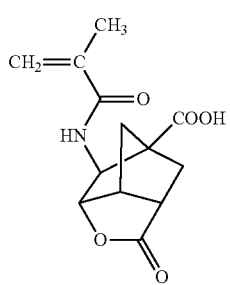 (II-61)
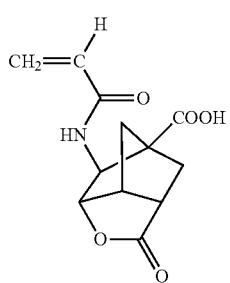 (II-62)
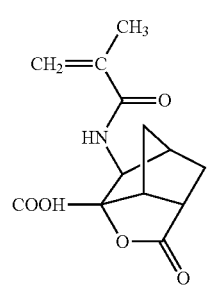 (II-63)
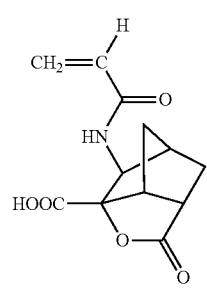 (II-64)
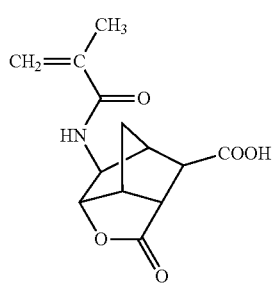 (II-65)
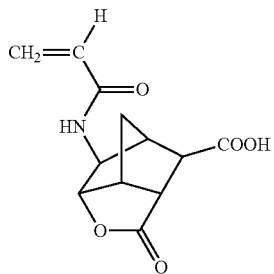 (II-66)
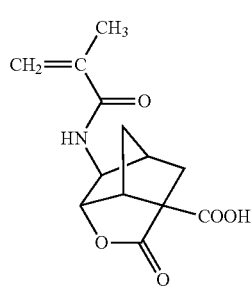 (II-67)
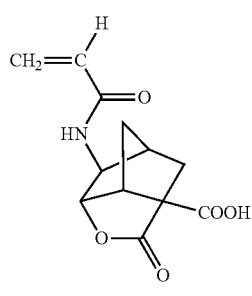 (II-68)
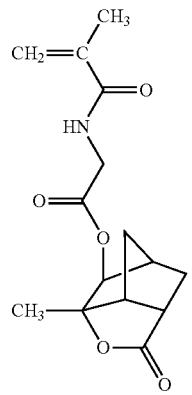 (II-69)
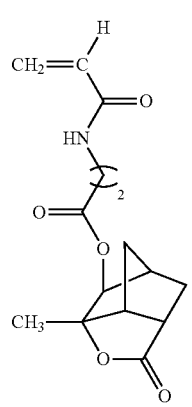 (II-70)

(II-71) 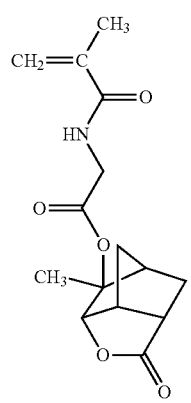
(II-72) 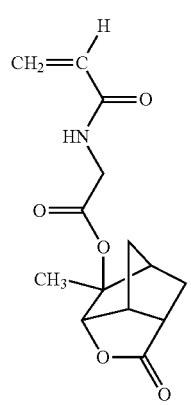
(II-73) 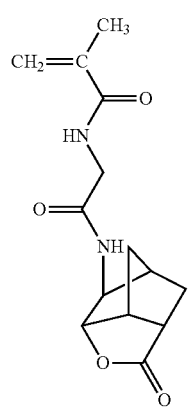
(II-74) 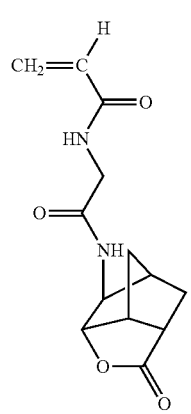
(II-75) 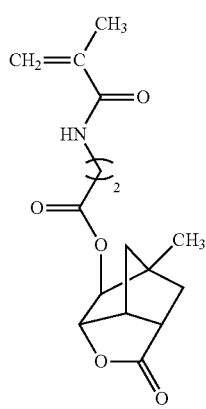
(II-76) 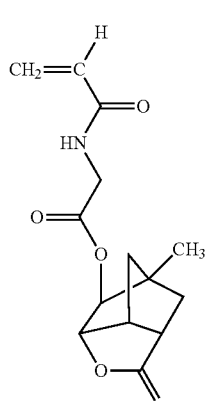
(II-77) 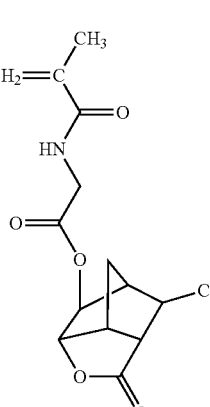
(II-78) 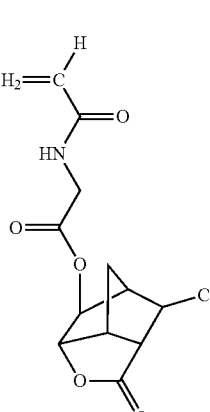

(II-79) 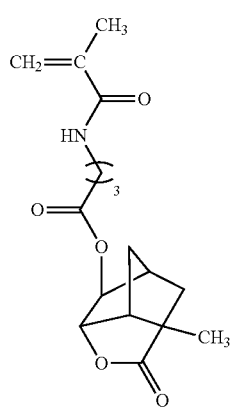
(II-80) 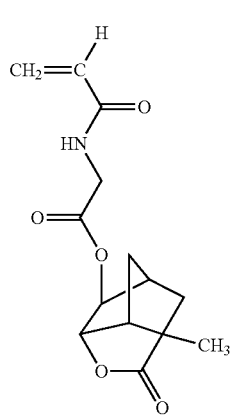
(II-81) 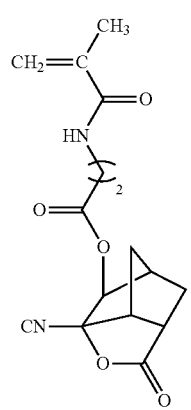
(II-82) 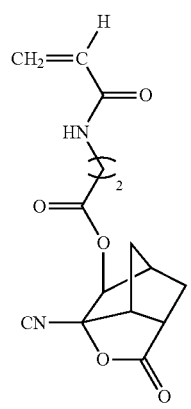
(II-83) 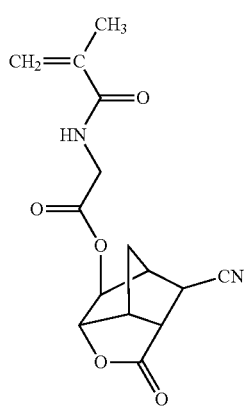
(II-84) 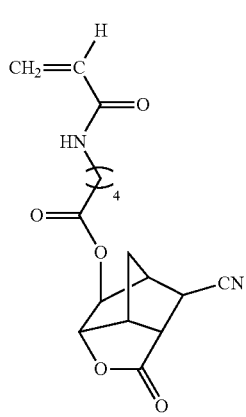
(II-85) 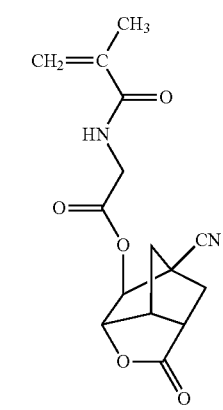
(II-86) 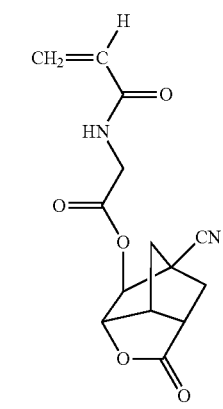

(II-87)
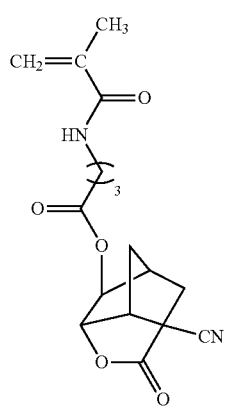
(II-88)
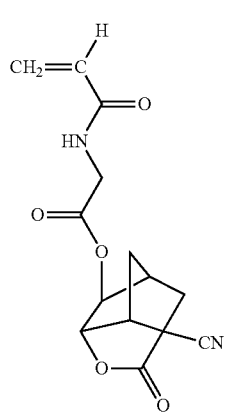
(II-89)
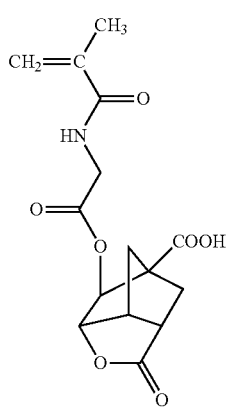
(II-90)
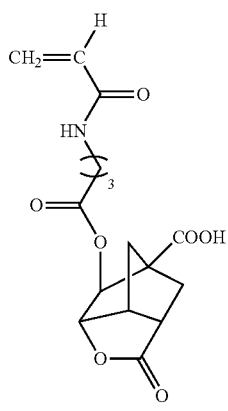
(II-91)
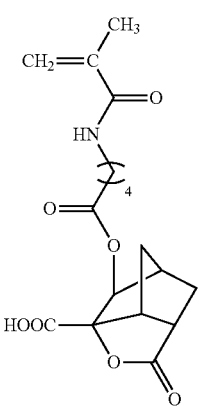
(II-92)
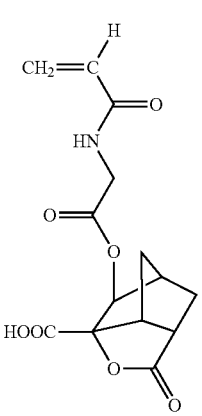
(II-93)
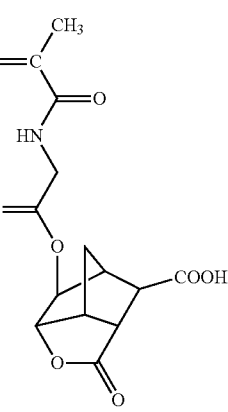
(II-94)
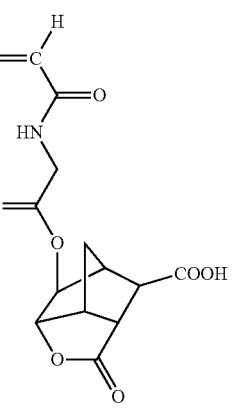

-continued
(II-95)
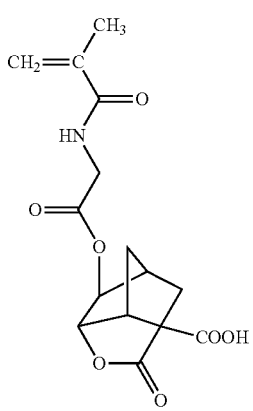
(II-96)
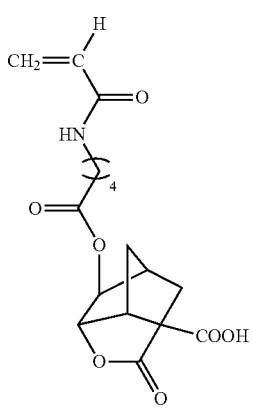
(II-97)
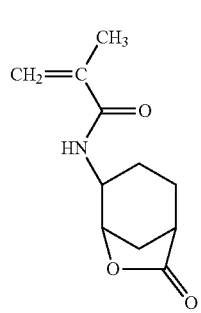
(II-98)
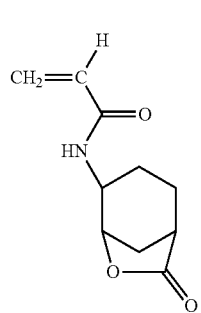
(II-99)
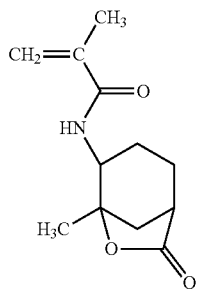
(II-100)
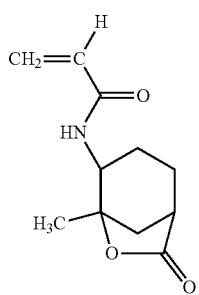
(II-101)
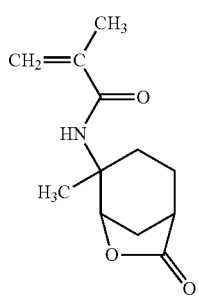
(II-102)
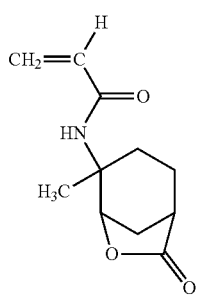
(II-103)
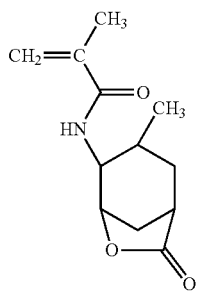

(II-104)
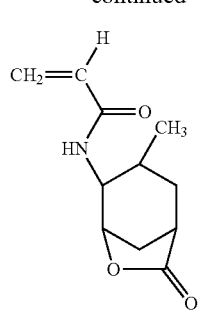
(II-105)
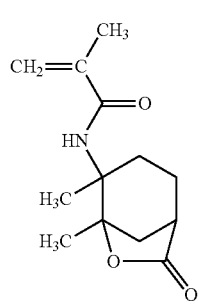
(II-106)
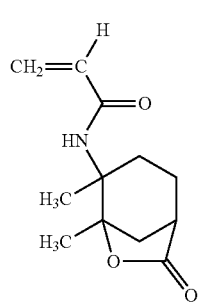
(II-107)
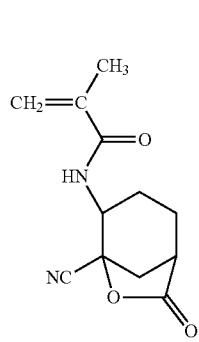
(II-108)
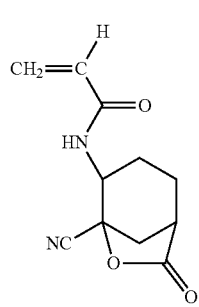
(II-109)
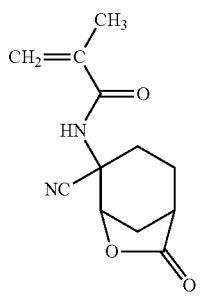
(II-110)
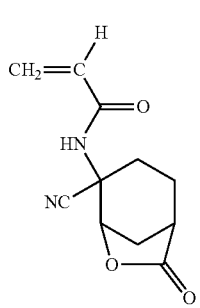
(II-111)
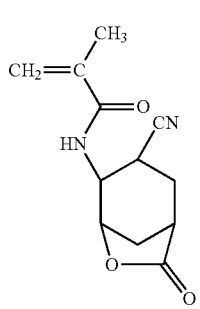
(II-112)
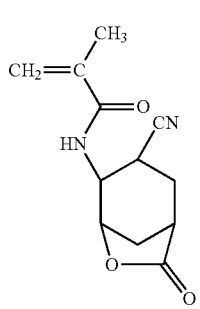
(II-113)
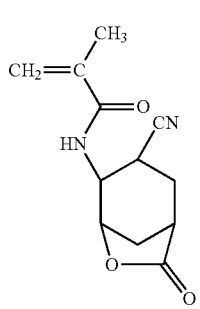

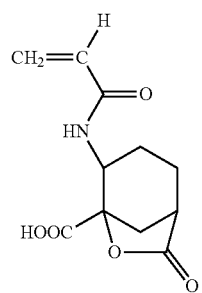  (II-114)
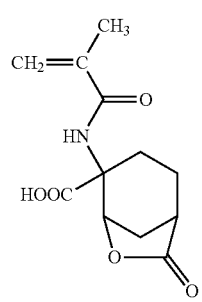  (II-115)
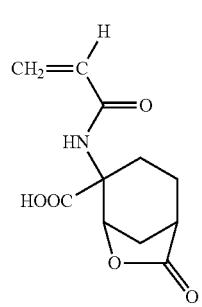  (II-116)
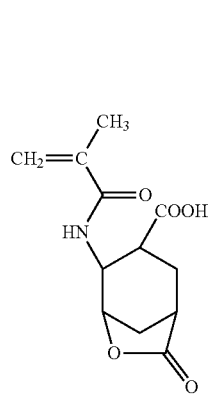  (II-117)
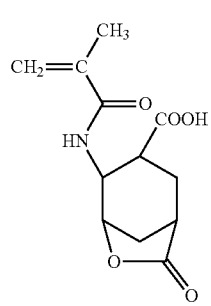  (II-118)
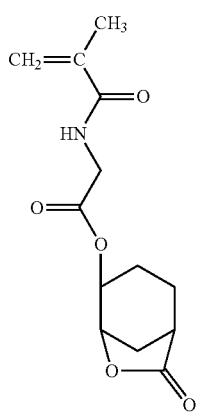  (II-119)
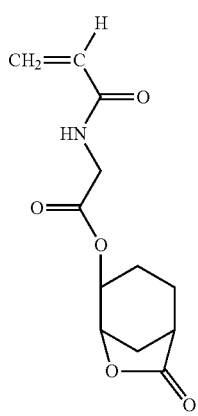  (II-120)
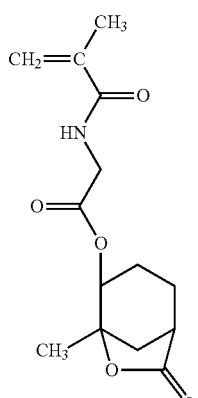  (II-121)
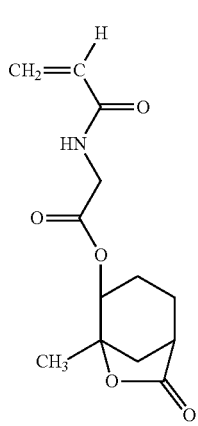  (II-122)

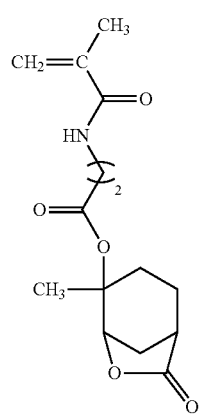 (II-123)
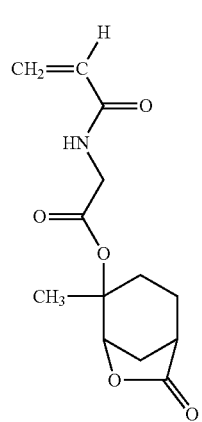 (II-124)
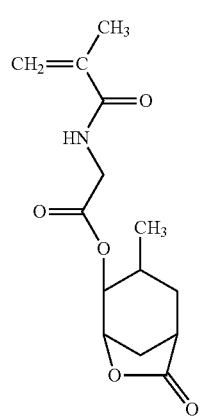 (II-125)
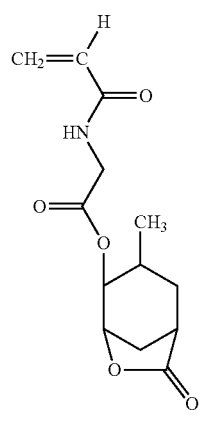 (II-126)
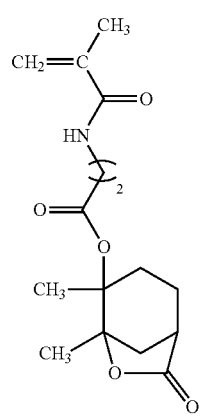 (II-127)
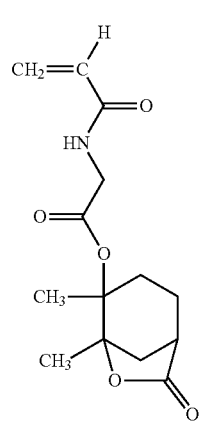 (II-128)
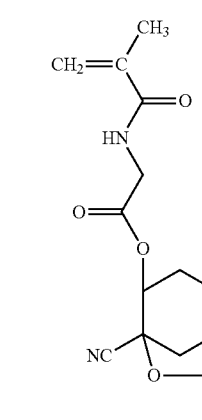 (II-129)
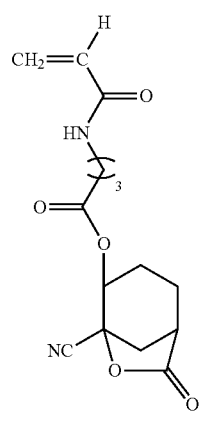 (II-130)

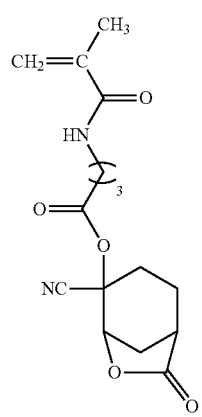
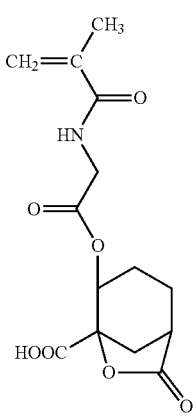
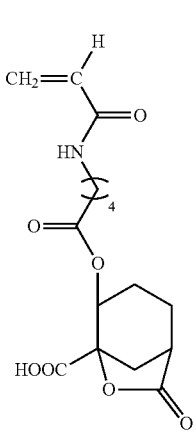
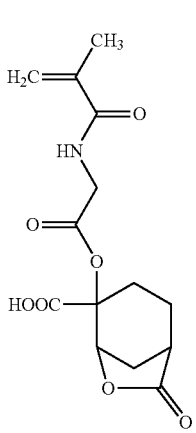
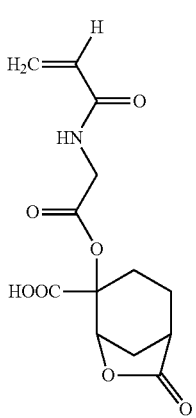

(II-139)
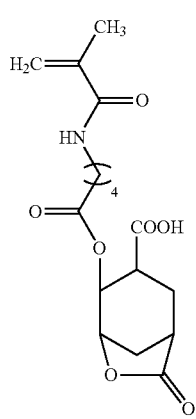

(II-140)
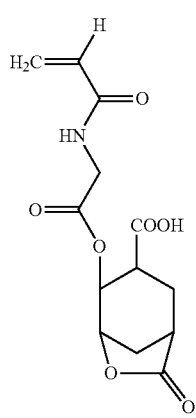

(II-141)
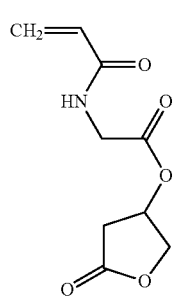

(II-142)
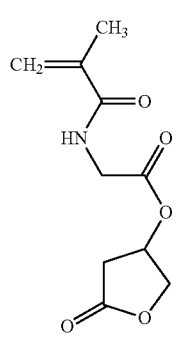

(II-143)
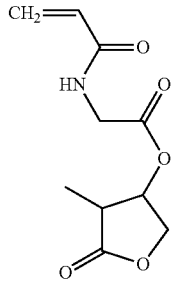

(II-144)
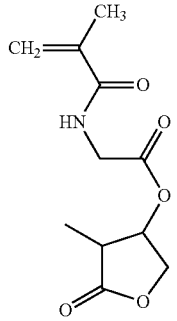

The monomers represented by the formulae (II-1) to (II-8) are preferable.

Examples of the C5-C20 saturated cyclic hydrocarbon group having at least one hydroxyl group include the followings.

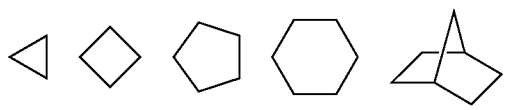
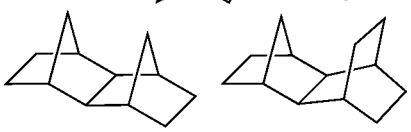
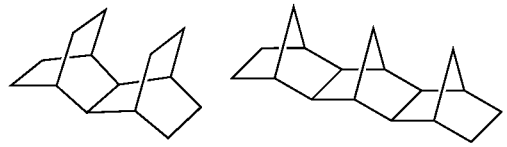
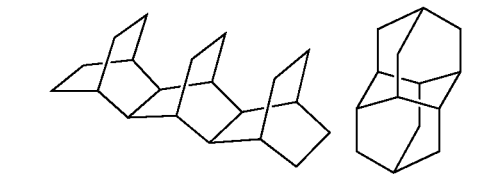

wherein the ring has one or more hydroxyl groups. The C5-C20 saturated cyclic hydrocarbon group can have one or more substituents other than a hydroxyl group, and examples of the substituents include a C1-C4 alkyl group. The C5-C20 saturated cyclic hydrocarbon group preferably has one or two hydroxyl groups.

The preferable saturated cyclic hydrocarbon group is the group represented by the formula (1c-1):

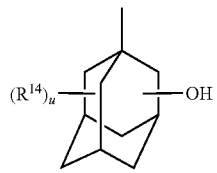
(1c-1)

wherein $R^{14}$ is independently in each occurrence a C1-C4 alkyl group or a hydroxyl group, u represents an integer of 0 to 3, and a group represented by the formula (1c-2):

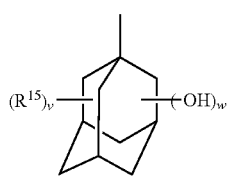
(1c-2)

wherein $R^{15}$ is independently in each occurrence a C1-C4 alkyl group, v represents an integer of 0 to 3, and w represents an integer of 1 to 3, with the proviso that sum of v and w is 4 or less, is more preferable. As the C1-C4 alkyl group, a methyl group is preferable, and u is preferably 0, 1, or 2, and w is preferably 1 or 2, and v is preferably 0 or 1.

Examples of the monomer represented by the formula (1) wherein $B^1$ is the C5-C20 saturated cyclic hydrocarbon group having at least one hydroxyl group include the monomers represented by the formulae (III-1) to (III-35):

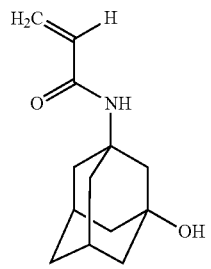
(III-1)

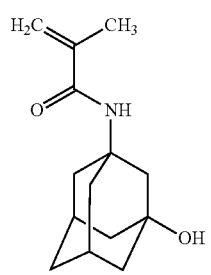
(III-2)

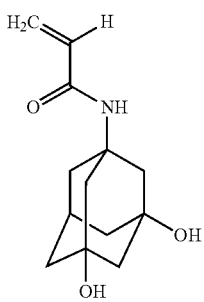
(III-3)

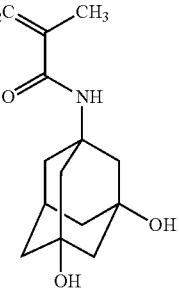
(III-4)

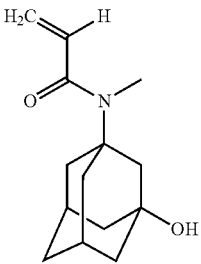
(III-5)

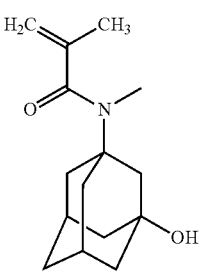
(III-6)

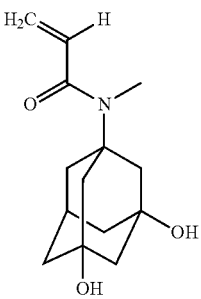
(III-7)

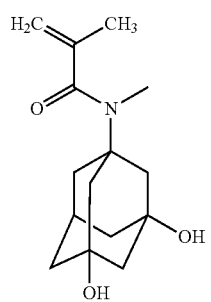 (III-8)
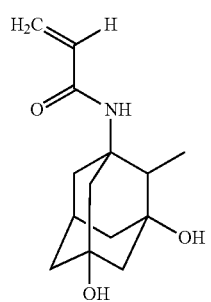 (III-9)
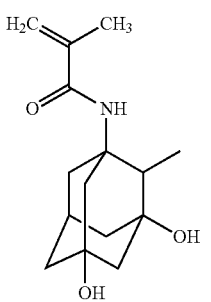 (III-10)
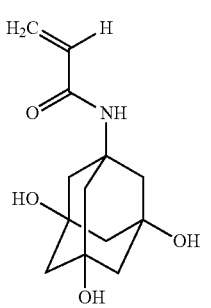 (III-11)
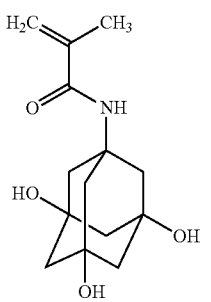 (III-12)
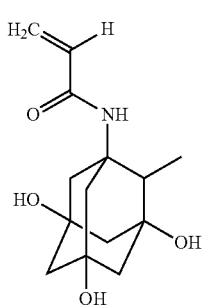 (III-13)
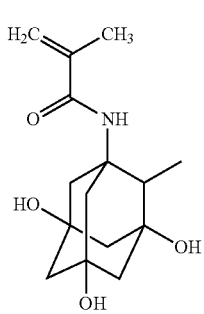 (III-14)
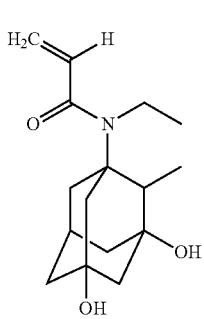 (III-15)
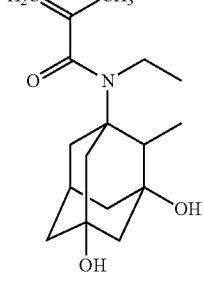 (III-16)
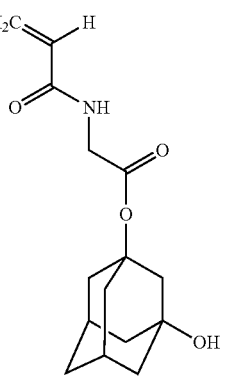 (III-17)

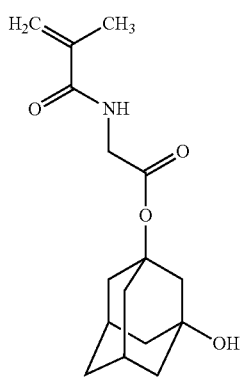 (III-18)
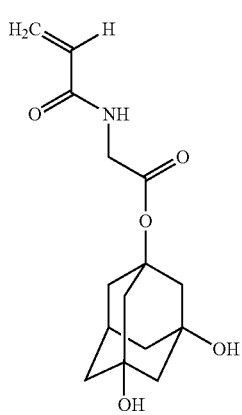 (III-18)
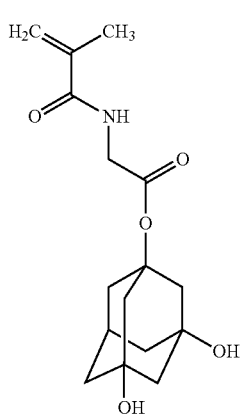 (III-20)
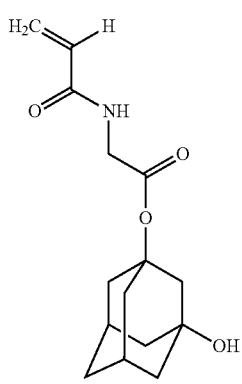 (III-21)
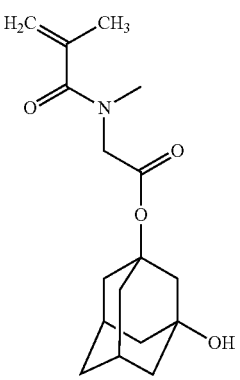 (III-22)
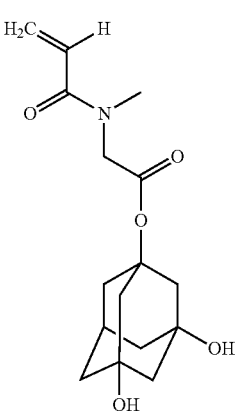 (III-23)
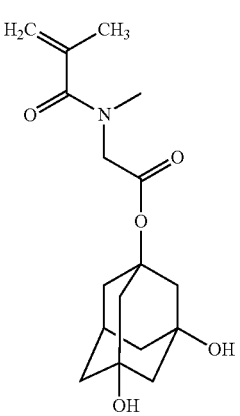 (III-24)
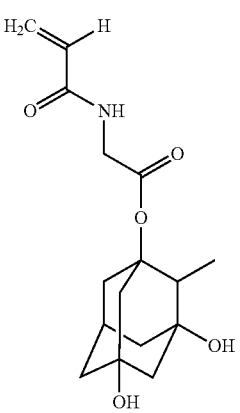 (III-25)

-continued
(III-26)
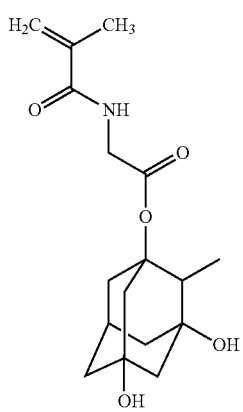
(III-27)
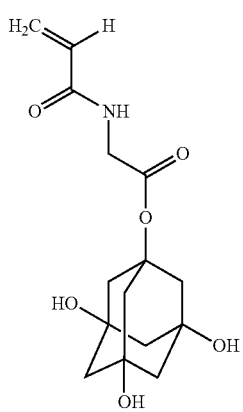
(III-28)
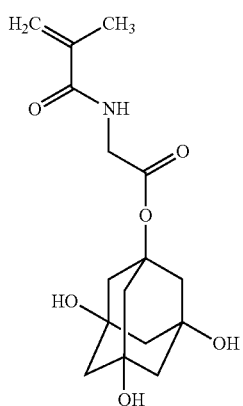
(III-29)
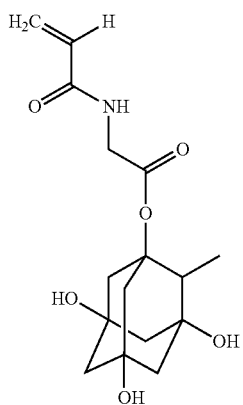
(III-30)
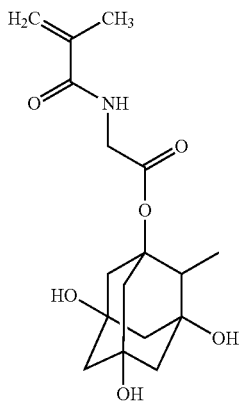
(III-31)
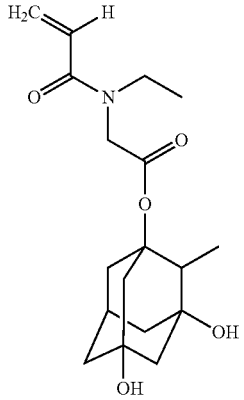
(III-32)
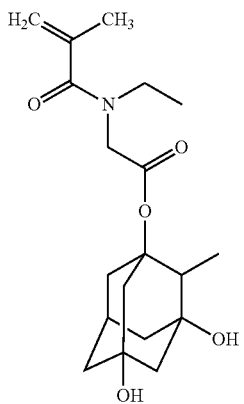
(III-33)
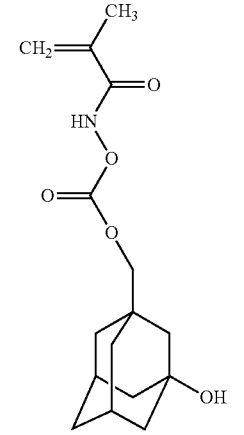

-continued (III-34)
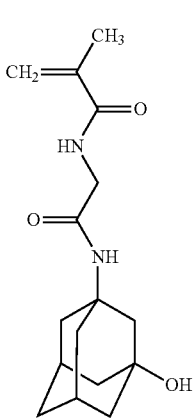

(III-35)
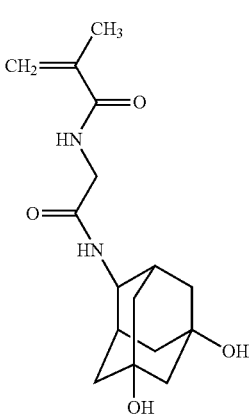

The monomers represented by the formulae (III-1) to (III-4) and (III-33) to (III-35) are preferable.

The monomer represented by the formula (1) wherein $A^1$ is a single bond, can be produced, for example, by reacting a compound represented by the formula (1a-a):

(1a-a)
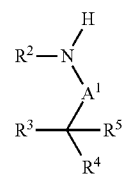

wherein $R^2$, $R^3$, $R^4$ and $R^5$ are the same as defined above and $A^1$ is a single bond, with a compound represented by the formula (1a-b):

(1a-b)
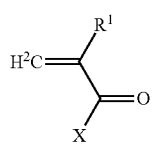

wherein $R^1$ is the same as defined above, and X represents a halogen atom, a acryloyooxy group or a methacryloyloxy group.

Examples of the halogen atom include a chlorine atom, a bromine atom and an iodine atom, and a chlorine atom is preferable.

Examples of the compound represented by the formula (1a-a) include 2-amino-2-methyladamantane, 2-amino-2-ethyladamantane, 1-amino-1-methylcyclohexane, 1-amino-1-ethylcyclohexane, α-amino-γ-butyrolactone, and 3-amino-1-adamantanol.

Examples of the compound represented by the formula (1a-b) include acryloyl chloride, methacryloyl chloride, acrylic anhydride and methacrylic anhydride.

The reaction of the compound represented by the formula (1a-a) with the compound represented by the formula (1a-b) is usually conducted in the presence of a base such as triethylamine and pyridine, in a solvent such as an aprotic solvent (e.g. toluene, tetrahydrofuran).

The monomer represented by the formula (I) wherein $A^1$ is $-(CH_2)_m-CO-O-A^2$-* or $-(CH_2)_n-CO-NR^{30}-A^3$-*, can be also produced by reacting a compound represented by the formula (1a-d):

(1a-d)
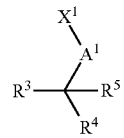

wherein $R^3$, $R^4$ and $R^5$ are the same as defined above, $A^1$ is $-(CH_2)_m-CO-O-A^2$-* or $-(CH_2)_n-CO-NR^{30}-A^3$-* and $X^1$ represents a halogen atom, with a compound represented by the formula (1a-e):

(1a-e)
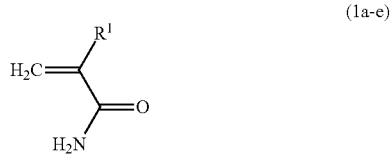

wherein $R^1$ is the same as defined above.

Examples of the halogen atom include a chlorine atom, a bromine atom and an iodine atom, and a chlorine atom is preferable.

Examples of the compound represented by the formula (1a-e) include acrylamide and methacrylamide. Examples of the compound represented by the formula (1a-d) include the followings.

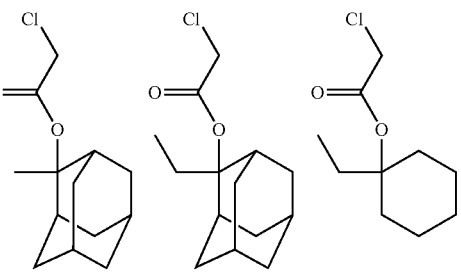

-continued

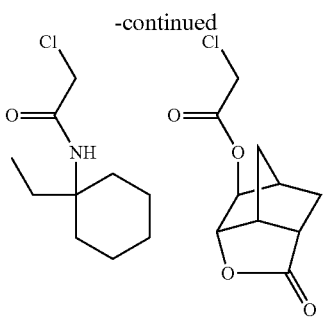

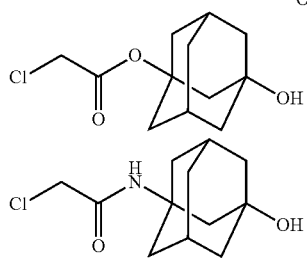

The reaction of the compound represented by the formula (1a-d) with the compound represented by the formula (1a-e) is usually conducted in the presence of a catalyst such as potassium carbonate and potassium iodide, in a solvent such as an aprotic solvent (e.g. N,N-dimethyformamide).

The resin can contain two or more kinds of the structural units derived from a monomer represented by the formula (I).

The content of the structural unit derived from a monomer represented by the formula (I) in the resin is usually 1 to 100% by mole, preferably 5 to 80% by mole and more preferably 10 to 60% by mole based on 100% by mole of all the structural units of the resin.

The resin is preferably one being insoluble or poorly soluble in an alkaline aqueous solution but becoming soluble in an alkaline aqueous solution by the action of an acid. Such resin preferably has one or more structural units derived from a monomer having an acid-labile group in its side chain, and can be produced by polymerizing one or more monomers represented by the formula (1) with one or more monomers having an acid-labile group in its side chain.

In this specification, "an acid-labile group" means a group capable of being eliminated by the action of an acid.

Examples of the acid-labile group include a group represented by the formula (1):

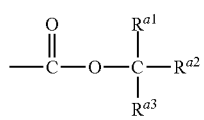

(1)

wherein $R^{a1}$, $R^{a2}$ and $R^{a3}$ independently each represent an aliphatic hydrocarbon group or a saturated cyclic hydrocarbon group, or $R^{a1}$ and $R^{a2}$ are bonded each other to form a ring together with a carbon atom to which $R^{a1}$ and $R^{a2}$ are bonded.

Examples of the aliphatic hydrocarbon group include a C1-C8 aliphatic hydrocarbon group, and preferable examples thereof include a C1-C8 alkyl group. Specific examples of the C1-C8 alkyl group include a methyl group, an ethyl group, a propyl group, an isopropyl group, a butyl group, a pentyl group, a hexyl group, a heptyl group and an octyl group. Examples of the saturated cyclic hydrocarbon group include a C3-C20 saturated cyclic hydrocarbon group, and the saturated cyclic hydrocarbon group may be monocyclic or polycyclic. Preferable examples thereof include a monocyclic saturated cyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic saturated cyclic hydrocarbon group such as a decahydronaphthyl group, an adamantyl group, a norbornyl group, a methylnorbornyl group, and the followings:

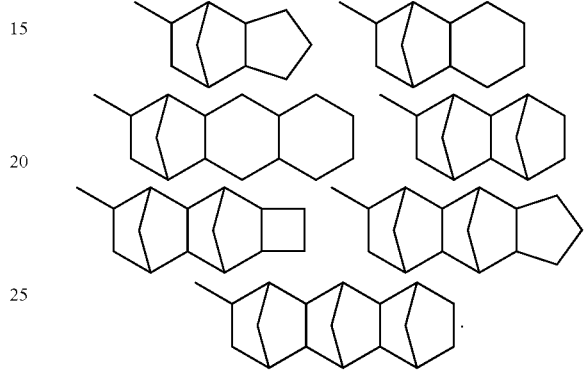

Examples of the ring formed together with a carbon atom to which $R^{a1}$ and $R^{a2}$ are bonded by bonding $R^{a1}$ and $R^{a2}$ each other include the following groups and the ring preferably has 3 to 12 carbon atoms.

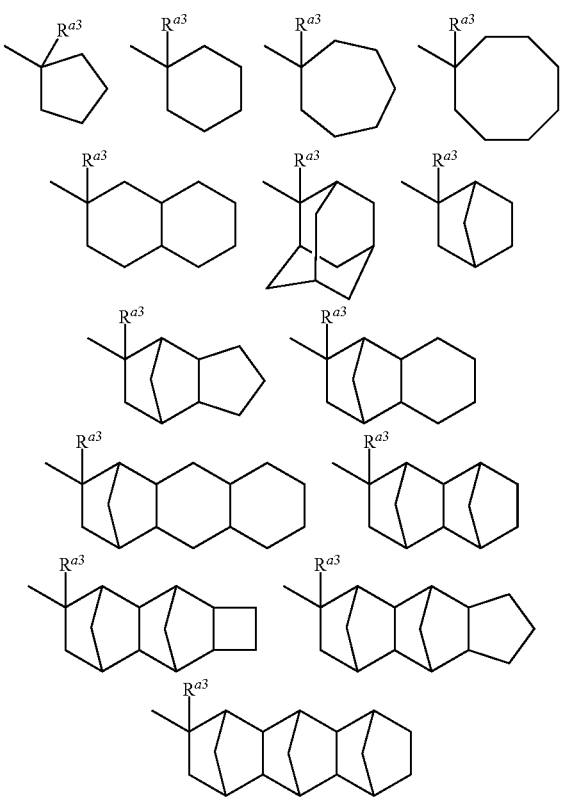

wherein $R^{a3}$ is the same as defined above.

The group represented by the formula (1) wherein $R^{a1}$, $R^{a2}$ and $R^{a3}$ independently each represent a C1-C8 alkyl group such as a tert-butyl group, the group represented by the formula (1) wherein $R^{a1}$ and $R^{a2}$ are bonded each other to form an adamantyl ring together with a carbon atom to which $R^{a1}$ and $R^{a2}$ are bonded and $R^{a3}$ is a C1-C8 alkyl group such as a 2-alkyl-2-adamantyl group, and the group represented by the formula (1) wherein $R^{a1}$ and $R^{a2}$ are C1-C8 alkyl groups and $R^{a3}$ is an adamantyl group such as a 1-(1-adamantyl)-1-alkylalkoxycarbonyl group are preferable.

The monomer having an acid-labile group in its side chain is preferably an acrylate monomer having an acid-labile group in its side chain or a methacryalte monomer having an acid-labile group in its side chain.

Preferable examples of the monomer having an acid-labile group include monomers represented by the formulae (a1-1) and (a1-2):

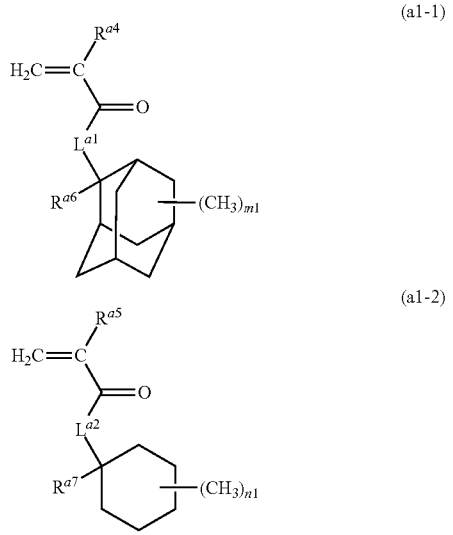

wherein $R^{a4}$ and $R^{a5}$ each independently represents a hydrogen atom or a methyl group, $R^{a6}$ and $R^{a7}$ each independently represents a C1-C8 aliphatic hydrocarbon group or a C3-C10 saturated cyclic hydrocarbon group, $L^{a1}$ and $L^{a2}$ each independently represents *—O— or *—O—$(CH_2)_{k1}$—CO—O— in which * represents a binding position to —CO—, and k1 represents an integer of 1 to 7, m1 represents an integer of 0 to 14 and n1 represents an integer of 0 to 10.

The aliphatic hydrocarbon group preferably has 1 to 6 carbon atoms, and the saturated cyclic hydrocarbon group preferably has 3 to 8 carbon atoms and more preferably 3 to 6 carbon atoms.

Examples of the aliphatic hydrocarbon group include a C1-C8 alkyl group such as a methyl group, an ethyl group, a propyl group, an isopropyl group, a butyl group, a tert-butyl group, a 2,2-dimethylethyl group, a 1-methylpropyl group, a 2,2-dimethylpropyl group, a 1-ethylpropyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the saturated cyclic hydrocarbon group include a cyclohexyl group, a methylcyclohexyl group, a dimethylcyclohexyl group, a cycloheptyl group, a methylcycloheptyl group, a norbornyl group and a methylnorbornyl group.

$L^{a1}$ is preferably *—O— or *—O—$(CH_2)_{f1}$—CO—O— in which * represents a binding position to —CO—, and f1 represents an integer of 1 to 4, and is more preferably *—O— or *—O—$CH_2$—CO—O—, and is especially preferably *—O—. $L^{a2}$ is preferably *—O— or *—O—$(CH_2)_{f1}$—CO—O— in which * represents a binding position to —CO—, and f1 is the same as defined above, and is more preferably *—O— or *—O—$CH_2$—CO—O—, and is especially preferably *—O—.

In the formula (a1-1), m1 is preferably an integer of 0 to 3, and is more preferably 0 or 1. In the formula (a1-2), n1 is preferably an integer of 0 to 3, and is more preferably 0 or 1.

Particularly when the photoresist composition contains a resin derived from a monomer having a bulky structure such as a saturated cyclic hydrocarbon group, the photoresist composition having excellent resolution tends to be obtained.

Examples of the monomer represented by the formula (a1-1) include the followings.

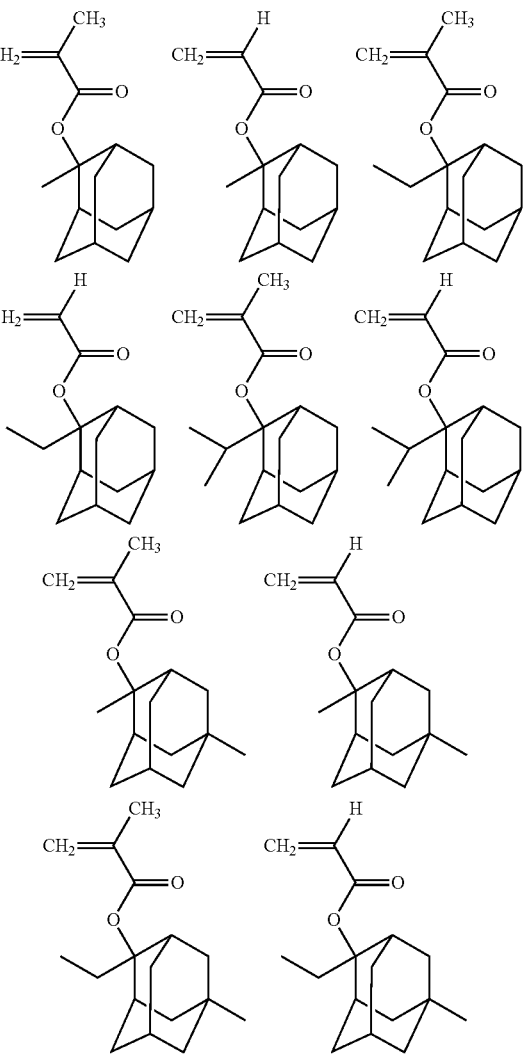

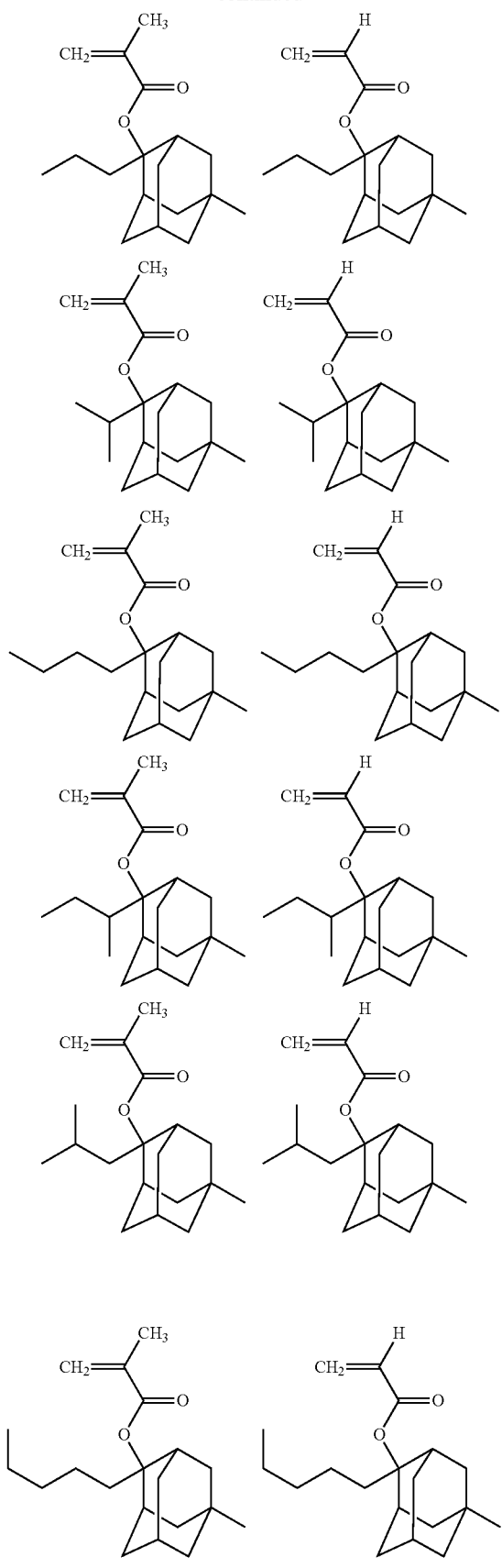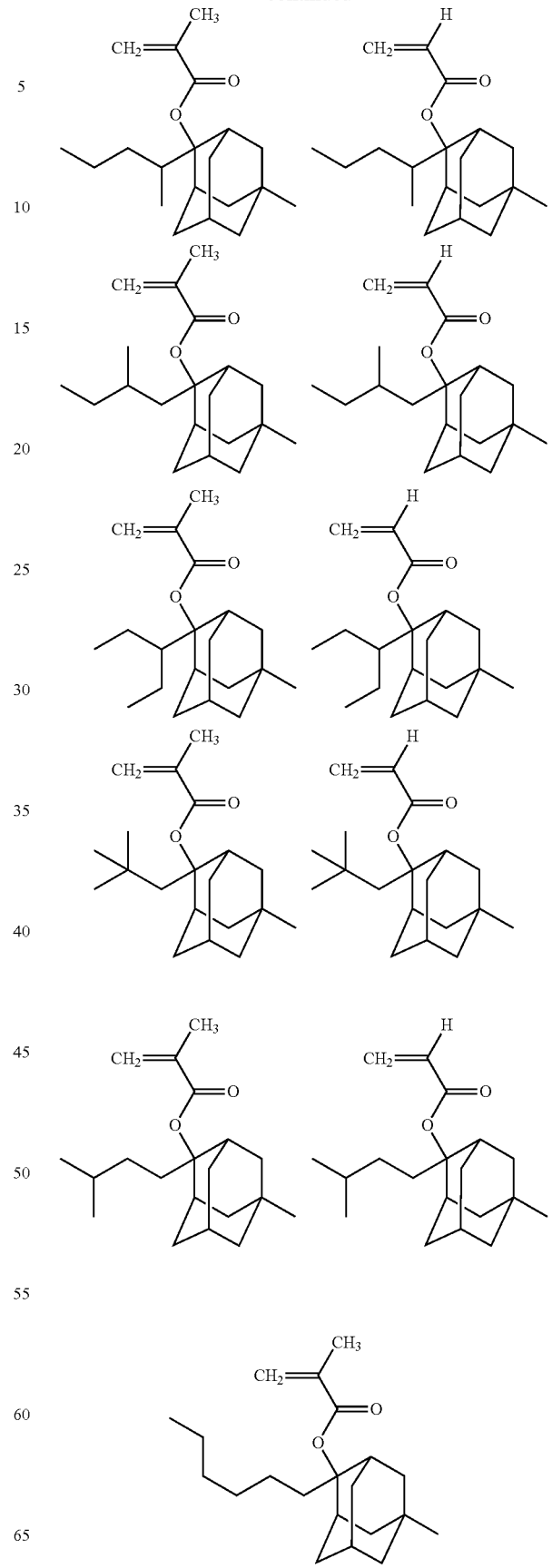

-continued
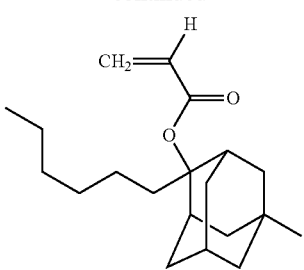
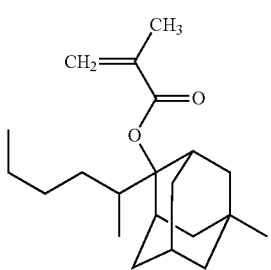
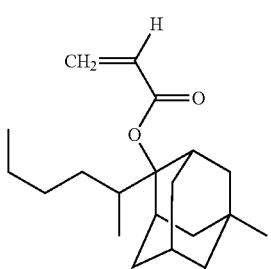
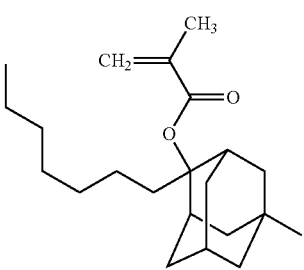
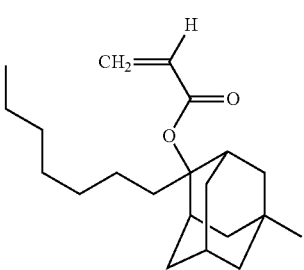
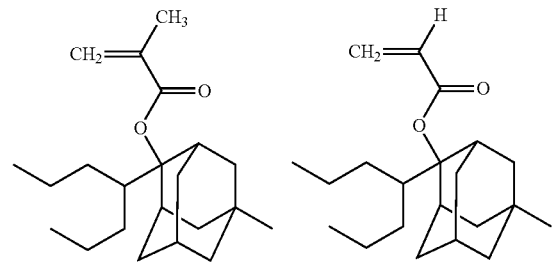
-continued
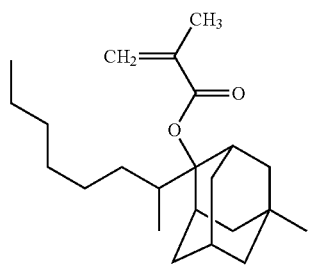
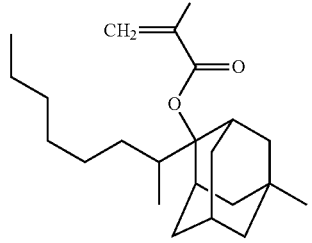
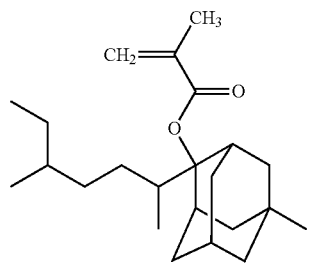
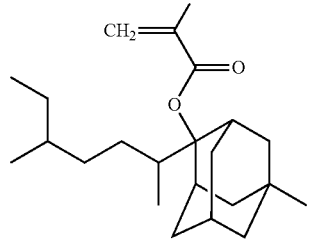
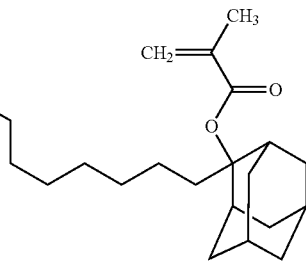

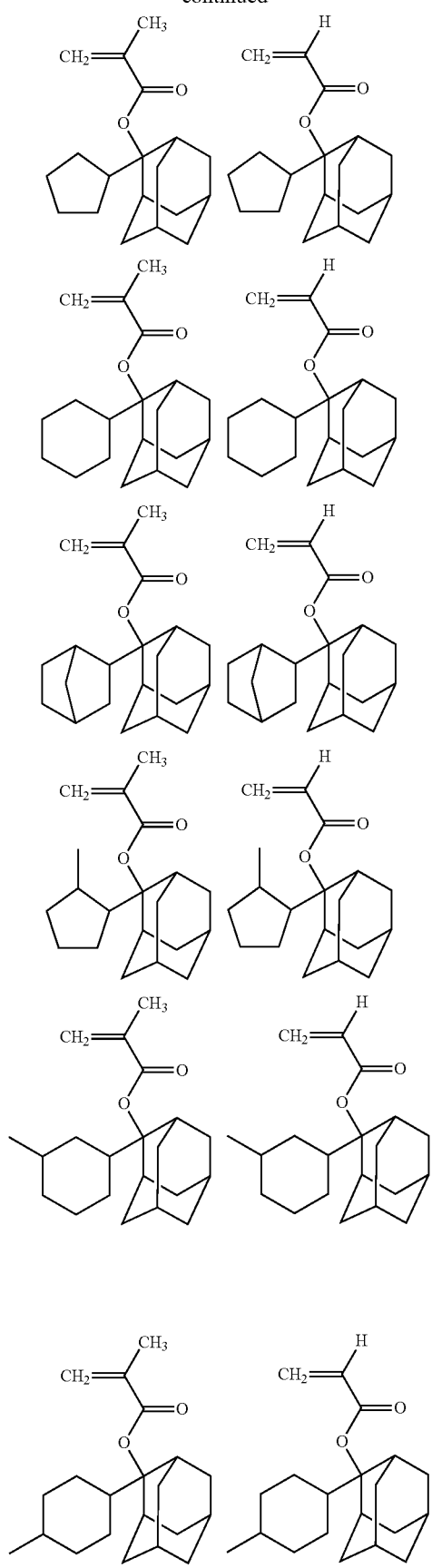
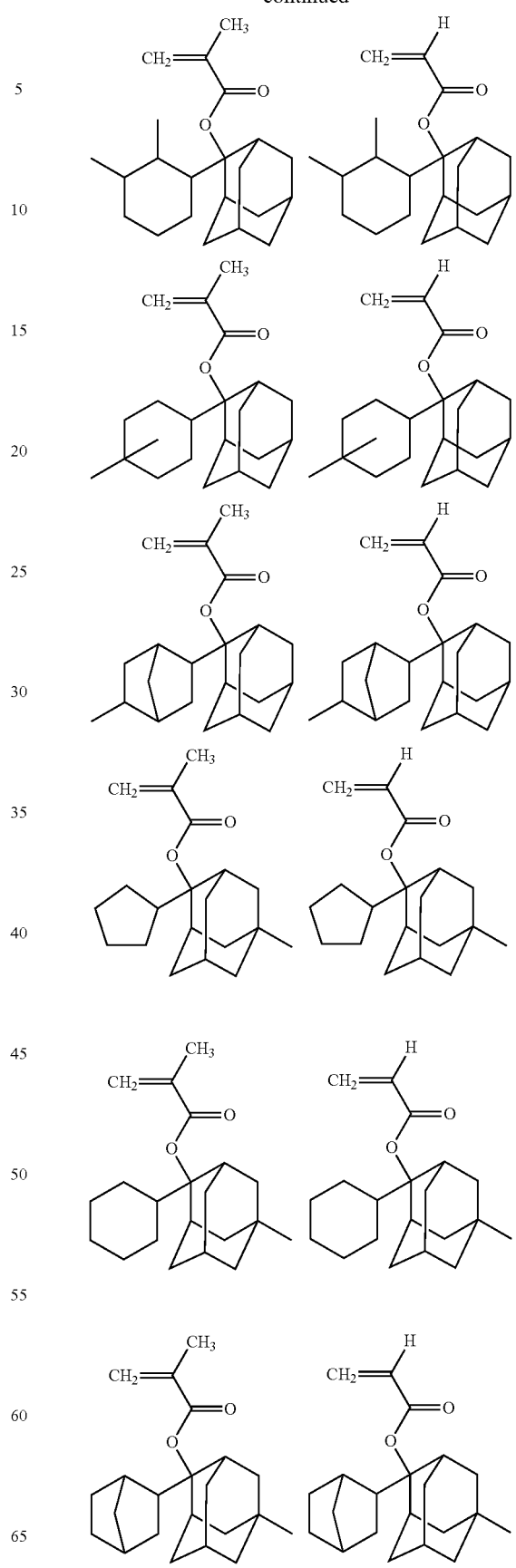

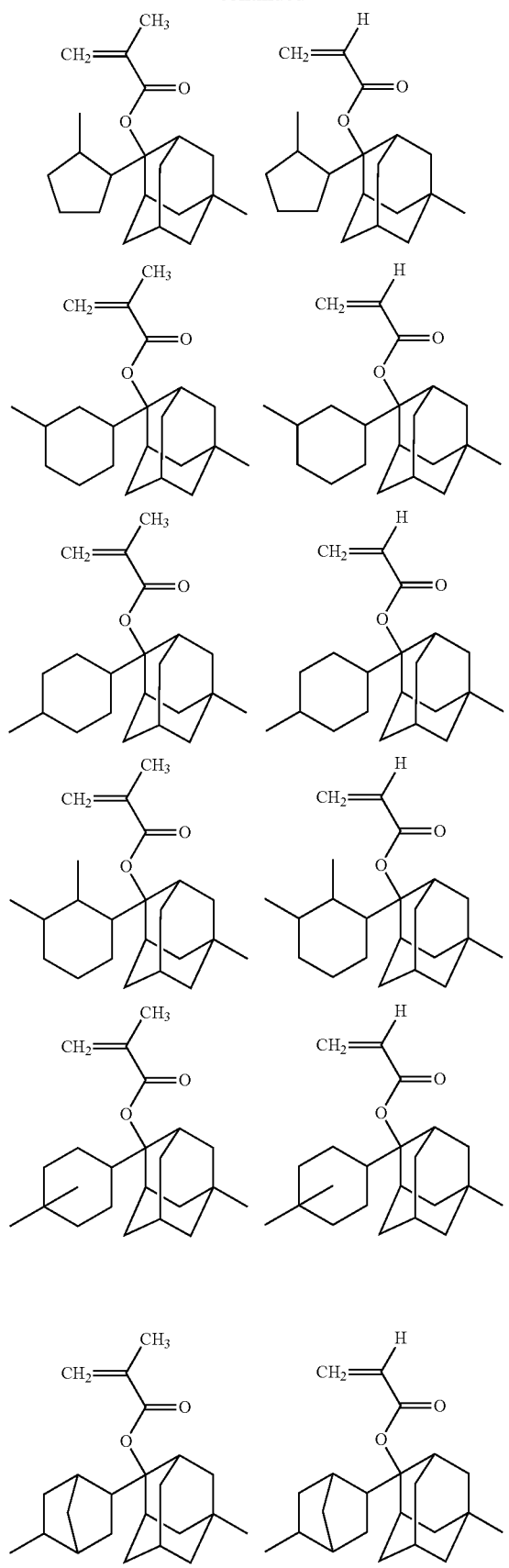
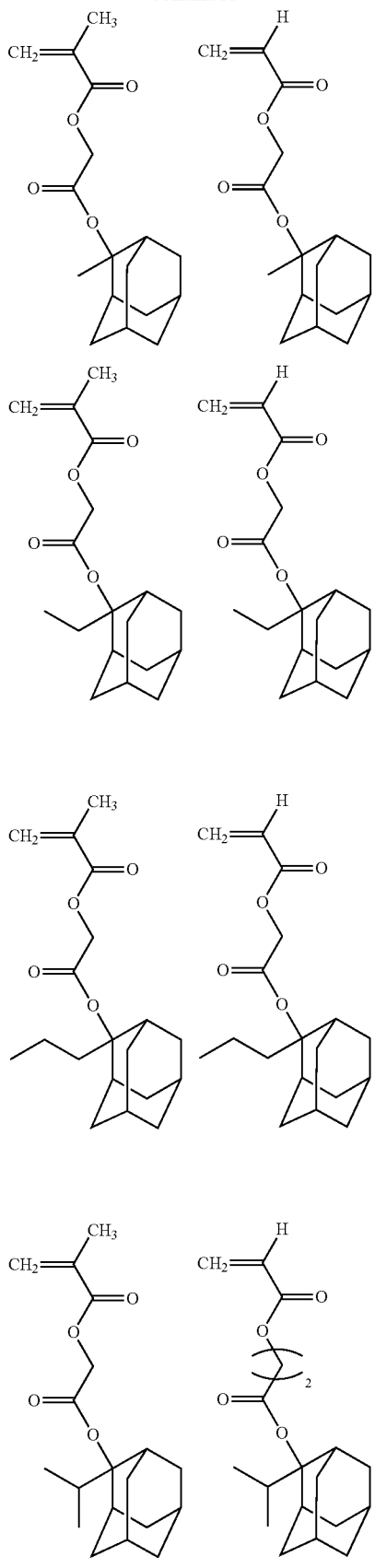

97
-continued
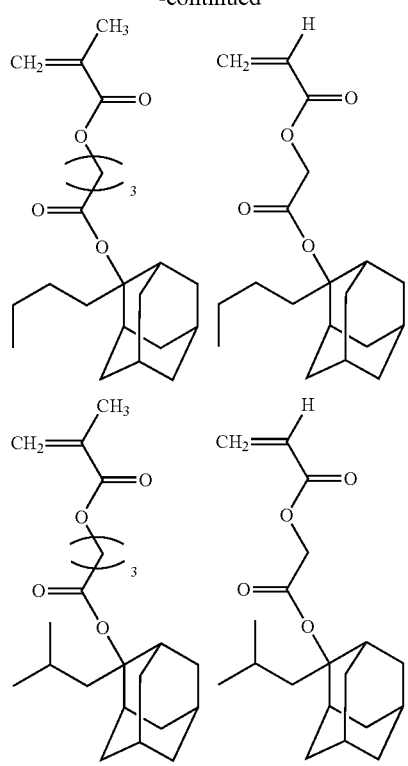
98
-continued
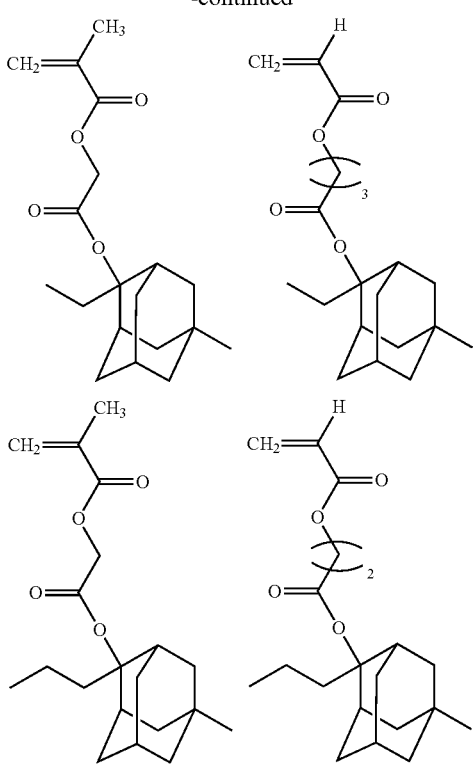
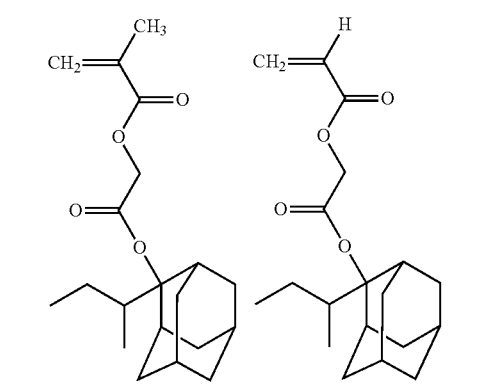
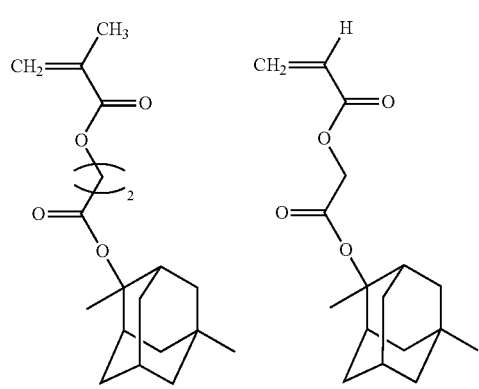

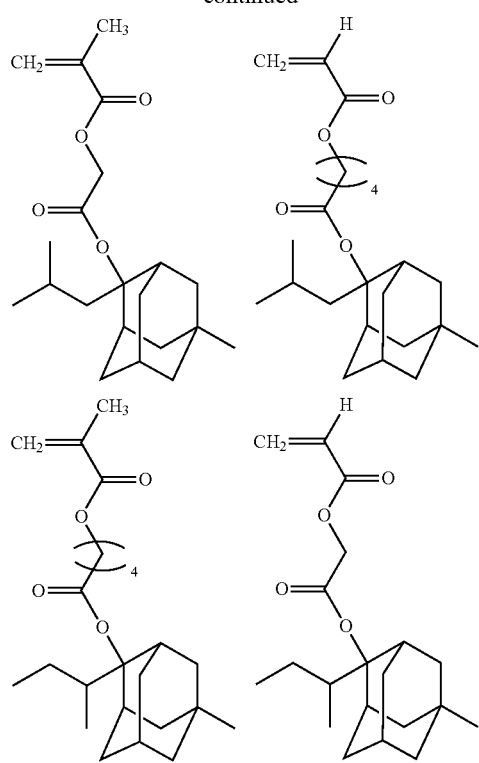
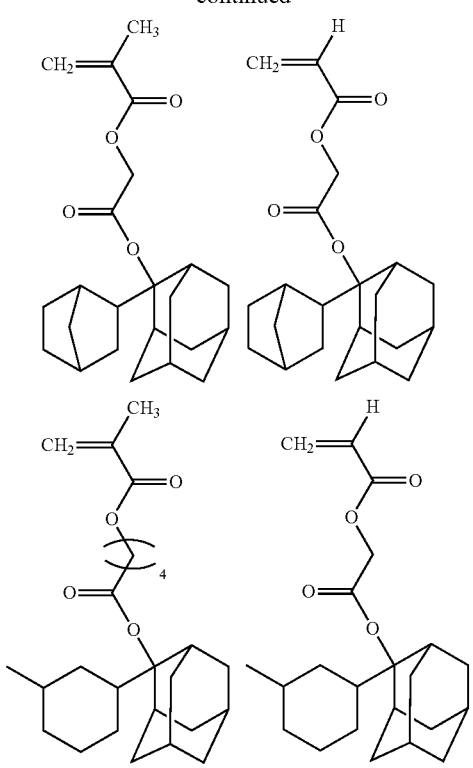
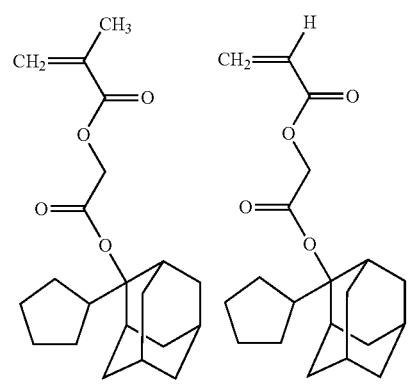
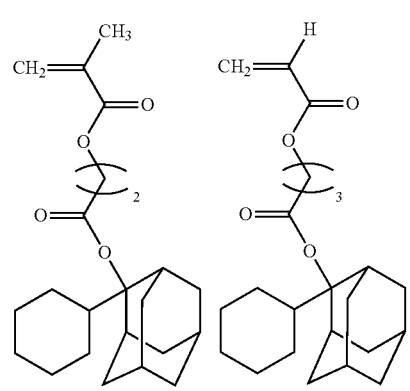

-continued

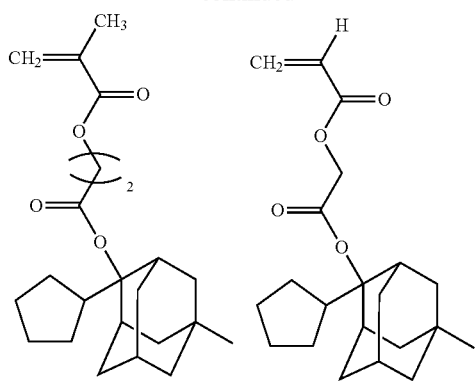

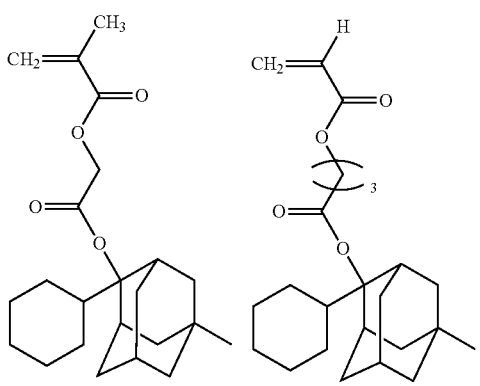

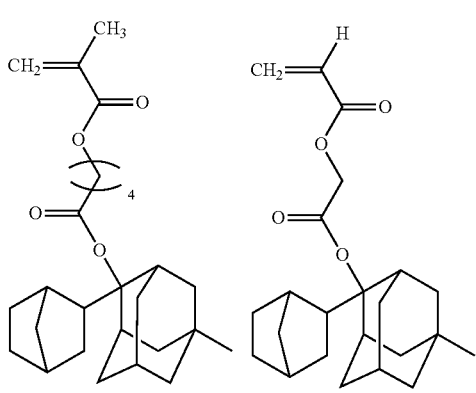

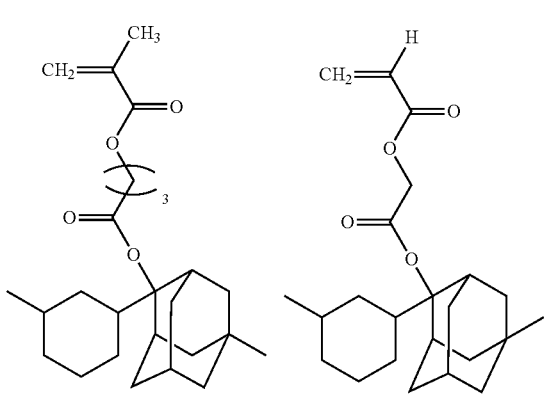

-continued

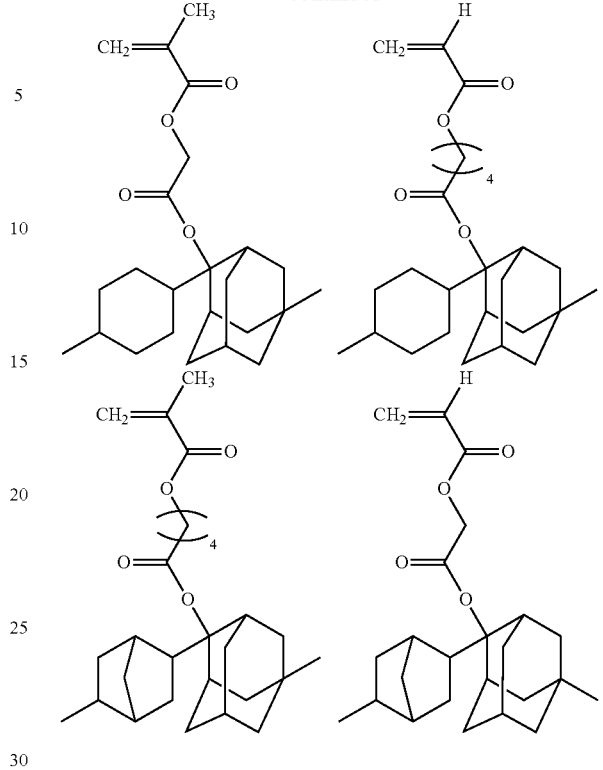

Among them, preferred are 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate and 2-isopropyl-2-adamantyl methacrylate, and more preferred are 2-methyl-2-adamantyl methacrylate, 2-ethyl-2-adamantyl methacrylate, and 2-isopropyl-2-adamantyl methacrylate.

Examples of the monomer represented by the formula (a1-2) include the followings.

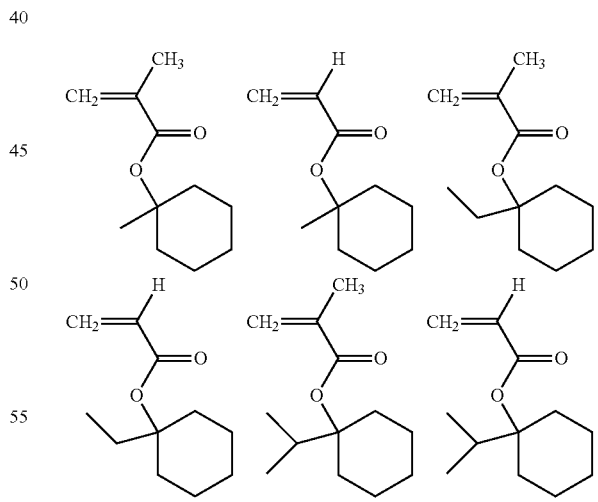

Among them, preferred are 1-ethyl-1-cyclohexyl acrylate and 1-ethyl-1-cyclohexyl methacrylate, and more preferred is 1-ethyl-1-cyclohexyl methacrylate.

The content of the structural unit derived from a monomer having an acid-labile group in its side chain in the resin is usually 0 to 99% by mole, preferably 20 to 95% by mole and more preferably 40 to 90% by mole based on 100% by mole of all the structural units of the resin.

Other examples of the compound having an acid-labile group include a monomer represented by the formula (a1-3):

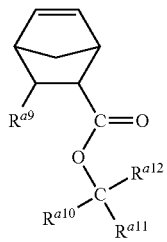

(a1-3)

wherein $R^{a9}$ represents a hydrogen atom, a C1-C3 aliphatic hydrocarbon group which can have one or more substituents, a carboxyl group, a cyano group or a —COOR$^{a13}$ group in which $R^{a13}$ represents a C1-C8 aliphatic hydrocarbon group or a C3-C8 saturated cyclic hydrocarbon group, and the C1-C8 aliphatic hydrocarbon group and the C3-C8 saturated cyclic hydrocarbon group can have one or more hydroxyl groups, and one or more —CH$_2$— in the C1-C8 aliphatic hydrocarbon group and the C3-C8 saturated cyclic hydrocarbon group can be replaced by —O— or —CO—, $R^{a10}$, $R^{a11}$ and $R^{a12}$ each in dependently represent a C1-C12 aliphatic hydrocarbon group or a C3-C12 saturated cyclic hydrocarbon group, and $R^{a10}$ and $R^{a11}$ can be bonded each other to form a ring together with the carbon atom to which $R^{a10}$ and $R^{a11}$ are bonded, and the C1-C12 aliphatic hydrocarbon group and the C3-C12 saturated cyclic hydrocarbon group can have one or more hydroxyl groups, and one or more —CH$_2$— in the C1-C12 aliphatic hydrocarbon group and the C3-C12 saturated cyclic hydrocarbon group can be replaced by —O— or —CO—.

Examples of the substituent include a hydroxyl group. Examples of the C1-C3 aliphatic hydrocarbon group which can have one or more substituents include a methyl group, an ethyl group, a propyl group, a hydroxymethyl group and a 2-hydroxyethyl group. Examples of $R^{a13}$ include a methyl group, an ethyl group, a propyl group, a 2-oxo-oxolan-3-yl group and a 2-oxo-oxolan-4-yl group, a cyclohexyl group, a methylcyclohexyl group, a hydroxycyclohexyl group, an oxocyclohexyl group and an adamantyl group, and examples of the ring formed by bonding $R^{a10}$ and $R^{a11}$ each other together with the carbon atom to which $R^{a10}$ and $R^{a11}$ are bonded include a cyclohexane ring and an adamantane ring.

Examples of the monomer represented by the formula (a1-3) include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate and 1-(1-adamantyl)-1-methylethyl 5-norbornene-2-carboxylate.

When the resin has a structural unit derived from the monomer represented by the formula (a1-3), the photoresist composition having excellent resolution and higher dry-etching resistance tends to be obtained.

When the resin contains the structural unit derived form the monomer represented by the formula (a1-3), the content of the structural unit derived from the monomer represented by the formula (a1-3) is usually 0 to 99% by mole and preferably 20 to 95% by mole and more preferably 40 to 90% by mole based on total molar of all the structural units of the resin.

Other examples of the acid-labile group include a group represented by the formula (2):

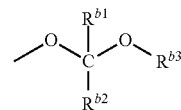

(2)

wherein $R^{b1}$ represents a hydrogen atom, an aliphatic hydrocarbon group, a saturated cyclic hydrocarbon group or a phenyl group, $R^{b2}$ represents a hydrogen atom, an aliphatic hydrocarbon group, a saturated cyclic hydrocarbon group or an aralkyl group, $R^{b3}$ represents an aliphatic hydrocarbon group, a saturated cyclic hydrocarbon group, a phenyl group, or a group formed by combining an aliphatic hydrocarbon group and a saturated cyclic hydrocarbon group, or $R^{b2}$ and $R^{b3}$ are bonded each other to form a ring together with the carbon atom to which $R^{b2}$ is bonded and the oxygen atom to which $R^{b3}$ is bonded, and one or more —CH$_2$— in the aliphatic hydrocarbon group and the saturated cyclic hydrocarbon group can be replaced by —O—, —S—, —CO—, —SO$_2$— or —NH—.

Examples of the aliphatic hydrocarbon group and the saturated cyclic hydrocarbon group include the same as described above. Examples of the aralkyl group include a benzyl group and a phenethyl group. Examples of the group formed by combining an aliphatic hydrocarbon group and a saturated cyclic hydrocarbon group include a 2-cylohexylethyl group, a 2-norbornylethyl group and a 2-(1-adamantyl)ethyl group.

Examples of the group represented by the formula (2) include the followings.

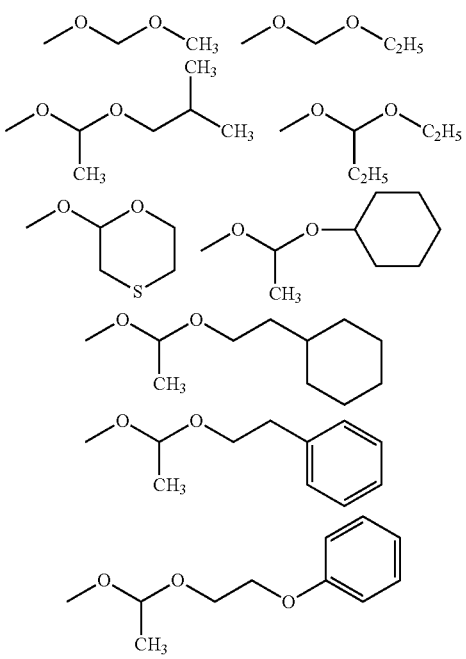

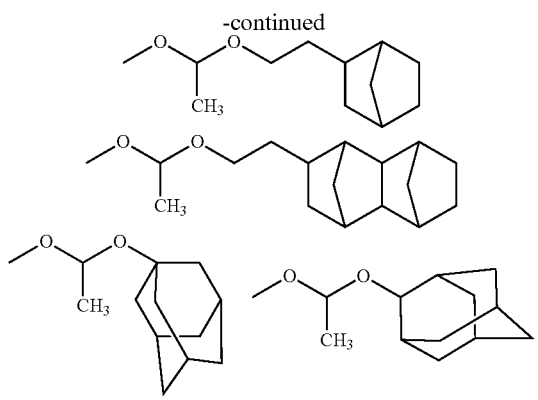

Specific examples of the monomer having the group represented by the formula (2) include a monomer represented by the formula (a1-4):

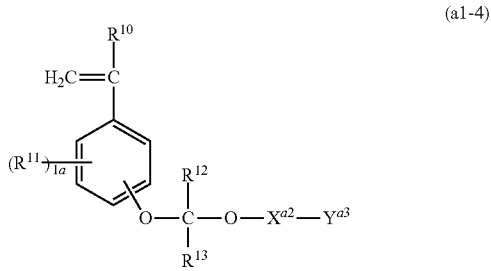

wherein $R^{10}$ represents a hydrogen atom, a halogen atom, a C1-C6 alkyl group or a C1-C6 halogenated alkyl group, $R^{11}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, 1a represents an integer of 0 to 4, $R^{12}$ and $R^{13}$ each independently represent a hydrogen atom or a C1-C12 hydrocarbon group, $X^{a2}$ represents a single bond or a C1-C17 divalent saturated hydrocarbon group in which one or more —CH$_2$— can be replaced by —O—, —CO—, —S—, —SO$_2$— or —N(R$^c$)— wherein R$^c$ represents a hydrogen atom or a C1-C6 alkyl group, and $Y^{a3}$ represents a C1-C12 aliphatic hydrocarbon group, a C3-C18 saturated cyclic hydrocarbon group or a C6-C18 aromatic hydrocarbon group, and the C1-C12 aliphatic hydrocarbon group, the C2-C18 saturated cyclic hydrocarbon group and the C6-C18 aromatic hydrocarbon group can have one or more substituents.

Examples of the halogen atom include a fluorine atom.

Examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable.

Examples of the C1-C6 halogenated alkyl group include a trifluoromethyl group, a pentafluoroethyl group, a heptafluoropropyl group, a heptafluoroisopropyl group, a nonafluorobutyl group, a nonafluor-sec-butyl group, a nonafluoro-tert-butyl group, a perfluoropentyl group and a perfluorohexyl group.

Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable.

Examples of the C2-C4 acyl group include an acetyl group, a propionyl group and a butyryl group, and examples of the C2-C4 acyloxy group include an acetyloxy group, a propionyloxy group and a butyryloxy group.

Examples of the C1-C12 hydrocarbon group include a C1-C12 aliphatic hydrocarbon group such as a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group, and a C3-C12 saturated cyclic hydrocarbon group such as a cyclohexyl group, an adamantyl group, a 2-alkyl-2-adamantyl group, a 1-(1-adamantyl)-1-alkyl group and an isobornyl group.

Examples of the C1-C17 divalent saturated hydrocarbon group include a C1-C17 alkanediyl group such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,1'-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group.

Examples of the C1-C12 aliphatic hydrocarbon group include a methyl group, an ethyl group, a propyl group, an isopropyl group, a butyl group, an isobutyl group, a sec-butyl group, a tert-butyl group, a pentyl group, a hexyl group, a heptyl group, an octyl group, a 2-ethylhexyl group, a nonyl group, a decyl group, an undecyl group and a dodecyl group. Examples of the C3-C18 saturated cyclic hydrocarbon group include a cyclopropyl group, a cyclobutyl group, a cyclopentyl group, a cyclohexyl group, a cycloheptyl group, a cyclooctyl group, a cyclononyl group, a cyclodecyl group, a norbornyl group, a 1-adamantyl group, a 2-adamantyl group, an isobornyl group and the following groups:

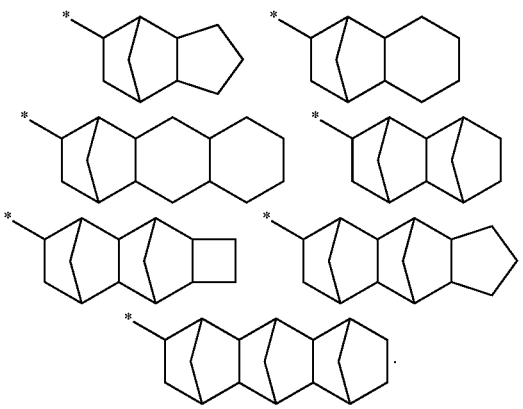

Examples of the C6-C18 aromatic hydrocarbon group include a phenyl group, a naphthyl group, an anthryl group, a p-methylphenyl group, a p-tert-butylphenyl group and a p-adamantylphenyl group.

Examples of the monomer represented by the formula (a1-4) include the followings.
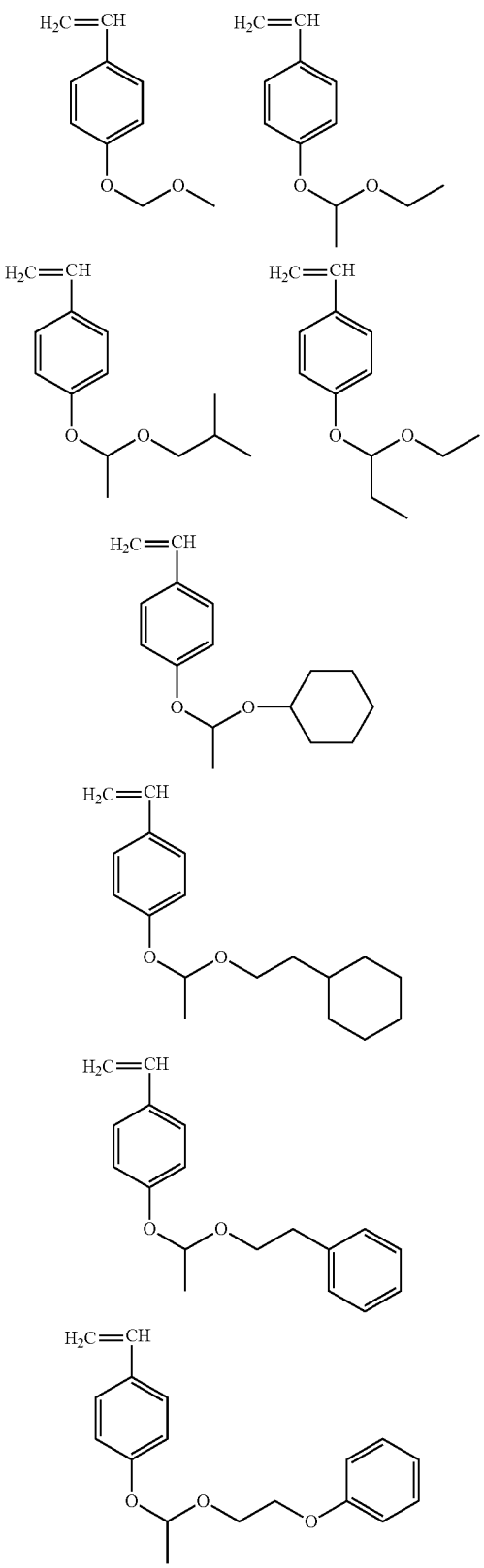
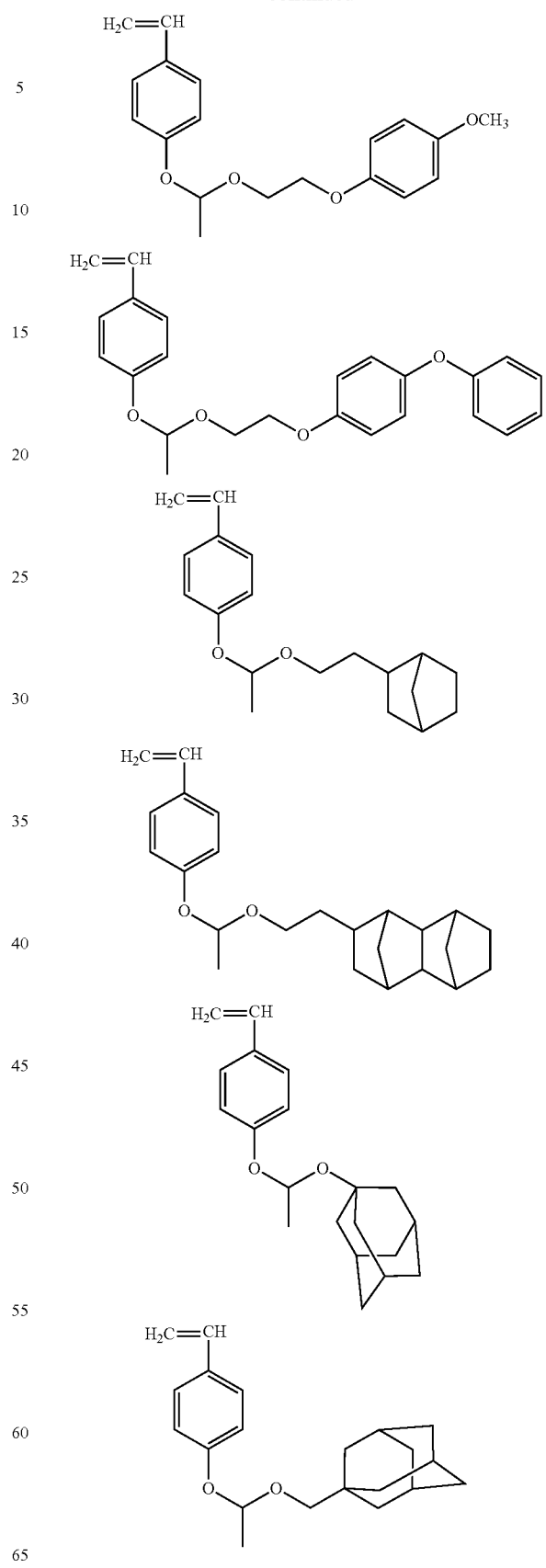

-continued

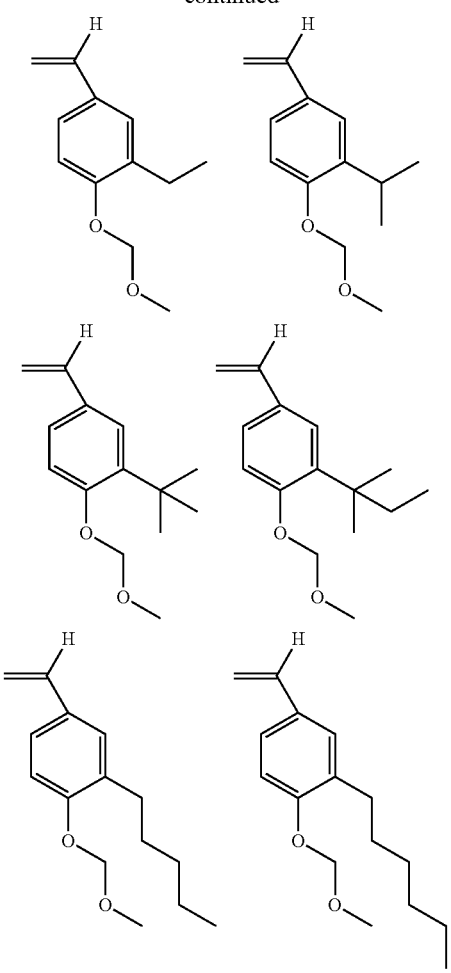

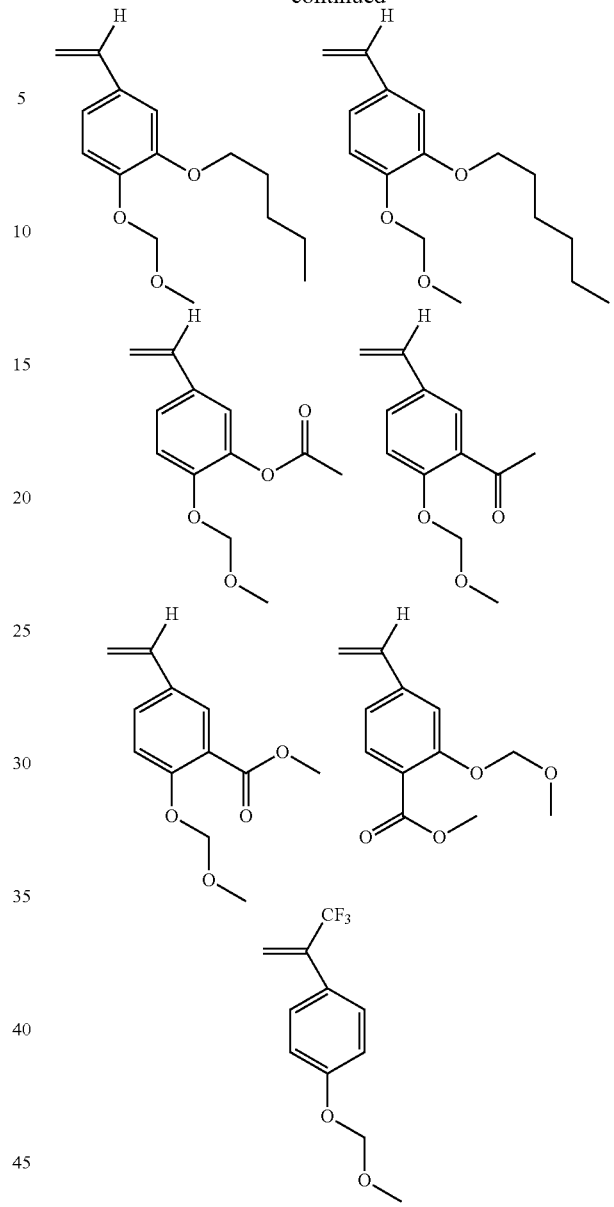

When the resin contains the structural unit derived form the monomer represented by the formula (a1-4), the content of the structural unit derived from the monomer represented by the formula (a1-4) is usually 0 to 99% by mole and preferably 20 to 95% by mole and more preferably 40 to 90% by mole based on total molar of all the structural units of the resin.

The resin can have two or more kinds of structural units derived from the monomers having an acid-labile group in its side chain.

The resin preferably contains the structural unit derived from the monomer having an acid-labile group in its side chain and a structural unit derived from the monomer having no acid-labile group. The resin can have two or more kinds of structural units derived from the monomers having no acid-labile group. When the resin contains the structural unit derived from the monomer having an acid-labile group in its side chain and the structural unit derived from the monomer having no acid-labile group in addition to the structural unit derived from the monomer represented by the formula (1), the content of the structural unit derived from the monomer having an acid-labile group in its side chain is usually 10 to 80% by mole and preferably 20 to 60% by mole based on total molar of all the structural units of the resin. The content of the structural unit derived from a monomer having an adamantyl group, especially the monomer represented by the formula (a1-1) in the structural unit derived from the compound having no acid-labile group is preferably 15% by mole or more from the viewpoint of dry-etching resistance of the photoresist composition.

The monomer having no acid-labile group preferably contains one or more hydroxyl groups or a lactone ring. When the resin contains the structural unit derived from the monomer having no acid-labile group and having one or more hydroxyl groups or a lactone ring, a photoresist composition having good resolution and adhesiveness of photoresist to a substrate tends to be obtained.

Examples of the monomer having no acid-labile group and having one or more hydroxyl groups include a monomer represented by the formula (a2-0):

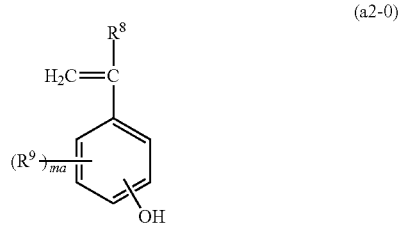

(a2-0)

wherein $R^8$ represents a hydrogen atom, a halogen atom, a C1-C6 alkyl group or a C1-C6 halogenated alkyl group, $R^9$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, ma represents an integer of 0 to 4, and
a monomer represented by the formula (a2-1):

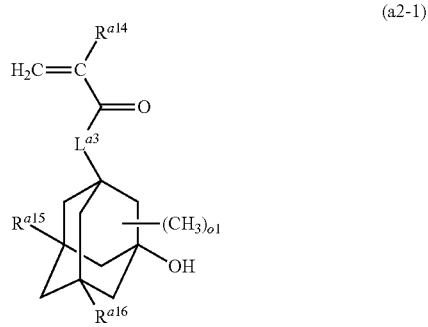

(a2-1)

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *—O— or *—O—$(CH_2)_{k2}$—CO—O— in which * represents a binding position to —CO—, and k2 represents an integer of 1 to 7, and of represents an integer of 0 to 10.

When KrF excimer laser (wavelength: 248 nm) lithography system, or a high energy laser such as electron beam and extreme ultraviolet is used as an exposure system, the resin containing the structural unit derived from the monomer represented by the formula (a2-0) is preferable, and when ArF excimer laser (wavelength: 193 nm) is used as an exposure system, the resin containing the structural unit derived from the monomer represented by the formula (a2-1) is preferable.

In the formula (a2-0), examples of the halogen atom include a fluorine atom, examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable. Examples of the C2-C4 acyl group include an acetyl group, a propionyl group and a butyryl group, and examples of the C2-C4 acyloxy group include an acetyloxy group, a propionyloxy group and a butyryloxy group. In the formula (a2-0), ma is preferably 0, 1 or 2, and is more preferably 0 or 1, and especially preferably 0.

The resin containing the structural unit derived from the monomer represented by the formula (a2-0) and the structural unit derived from the compound having an acid generator can be produced, for example, by polymerizing the compound having an acid generator and a monomer obtained by protecting a hydroxyl group of the monomer represented by the formula (a2-0) with an acetyl group followed by conducting deacetylation of the obtained polymer with a base.

Examples of the monomer represented by the formula (a2-0) include the followings.

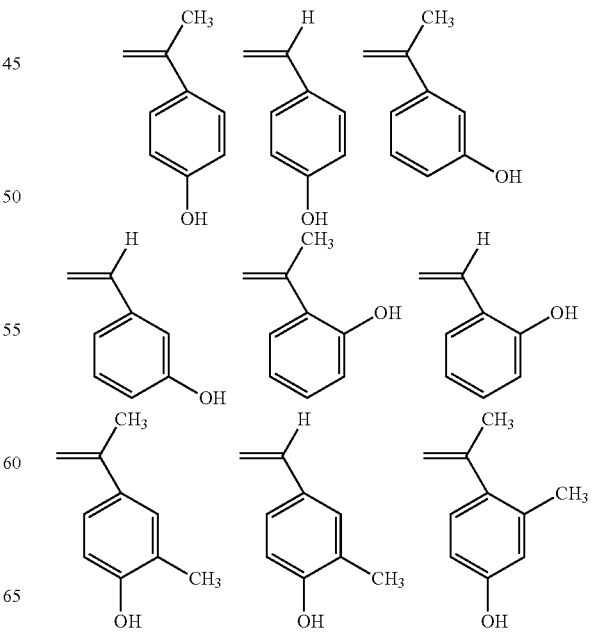

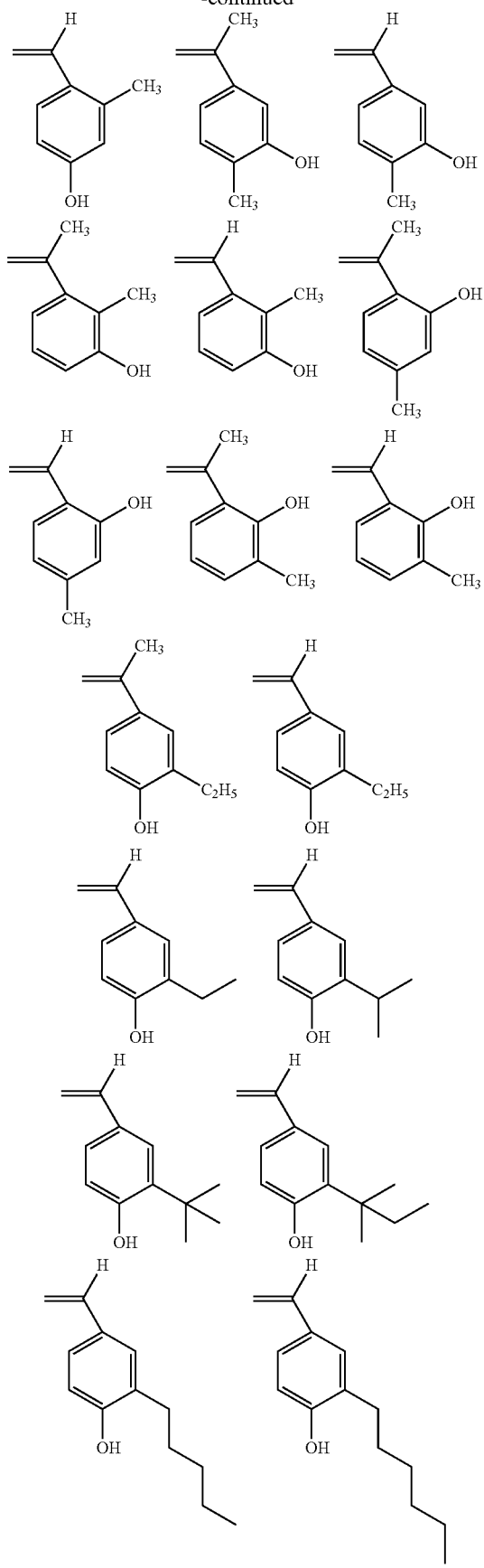
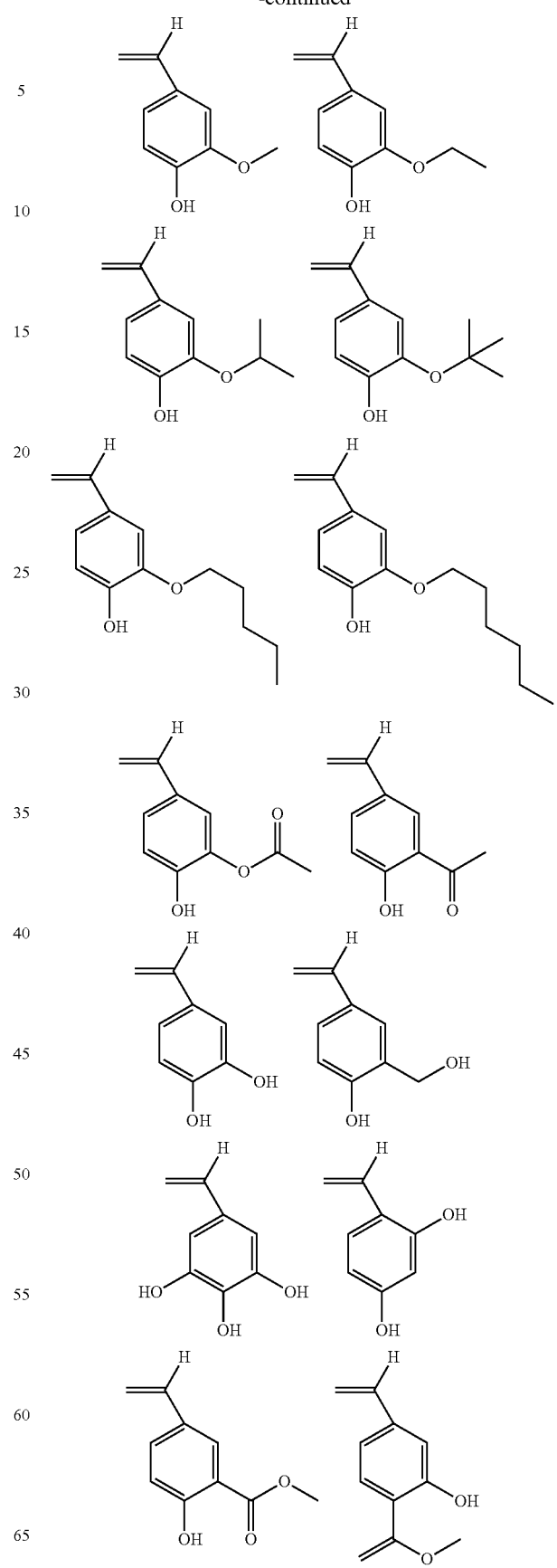

-continued

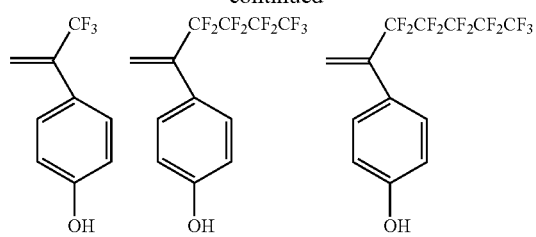

Among them, preferred are 4-hydroxystyrene and 4-hydroxy-α-methylstyrene

When the resin contains the structural unit derived from the monomer represented by the formula (a2-0), the content of the structural unit derived from the monomer represented by the formula (a2-0) is usually 5 to 90% by mole and preferably 10 to 85% by mole and more preferably 15 to 80% by mole based on total molar of all the structural units of the resin.

In the formula (a2-1), $R^{a14}$ is preferably a methyl group, $R^{a15}$ is preferably a hydrogen atom, $R^{a16}$ is preferably a hydrogen atom or a hydroxyl group, $2^3$ is preferably *—O— or *—O—$(CH_2)_{f2}$—CO—O— in which * represents a binding position to —CO—, and f2 represents an integer of 1 to 4, and is more preferably *—O—, and of is preferably 0, 1, 2 or 3 and is more preferably 0 or 1.

Examples of the monomer represented by the formula (a2-1) include the followings, and 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, 1-(3,5-dihydroxy-1-adamantyloxycarbonyl)methyl acrylate and 1-(3,5-dihydroxy-1-adamantyloxycarbonyl)methyl methacrylate are preferable, and 3-hydroxy-1-adamantyl methacrylate and 3,5-dihydroxy-1-adamantyl methacrylate are more preferable.

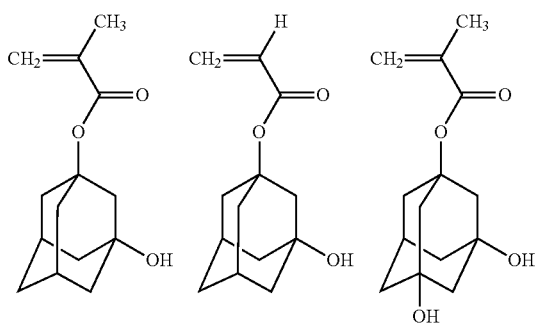

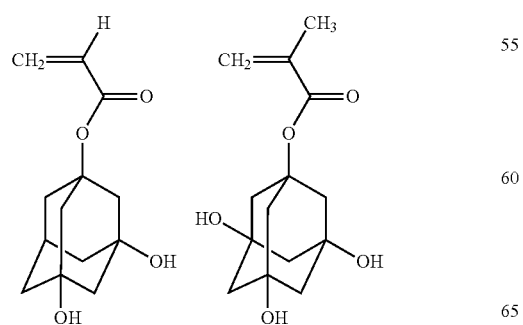

-continued

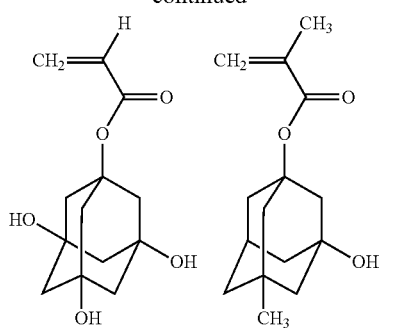

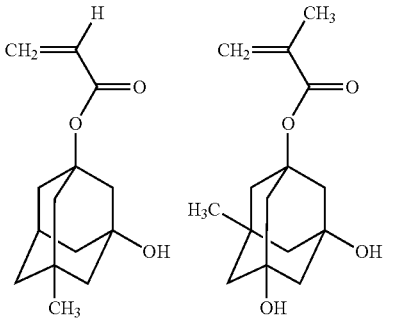

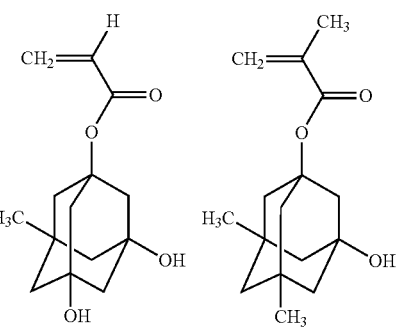

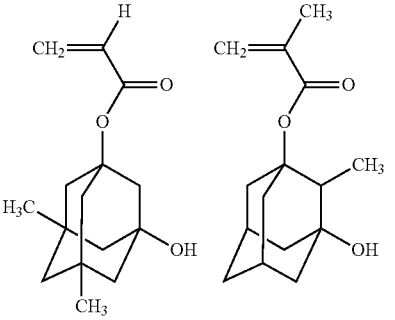

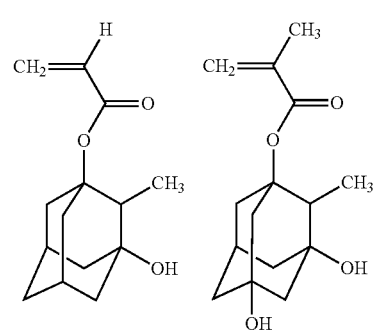

117
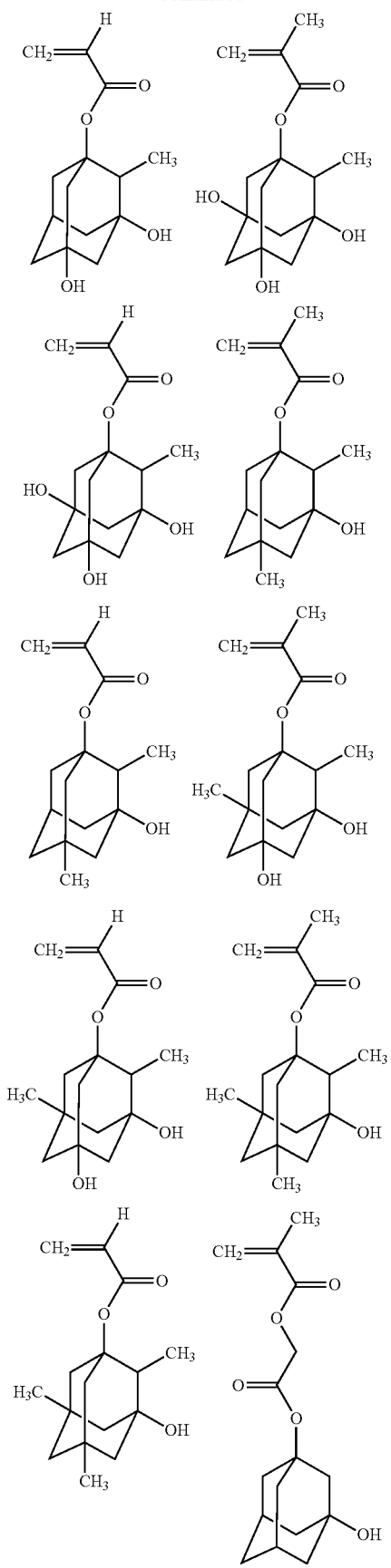
118
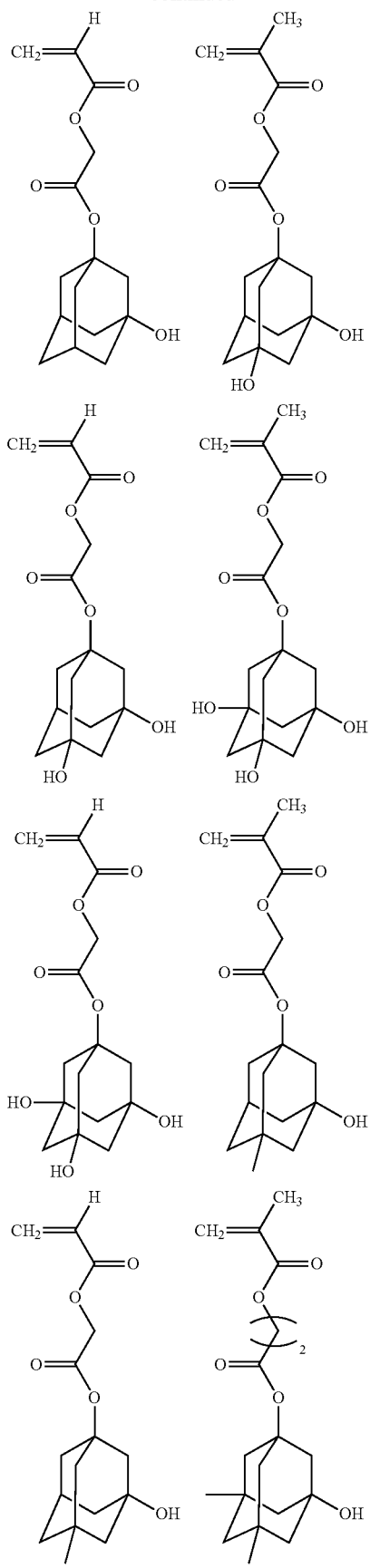

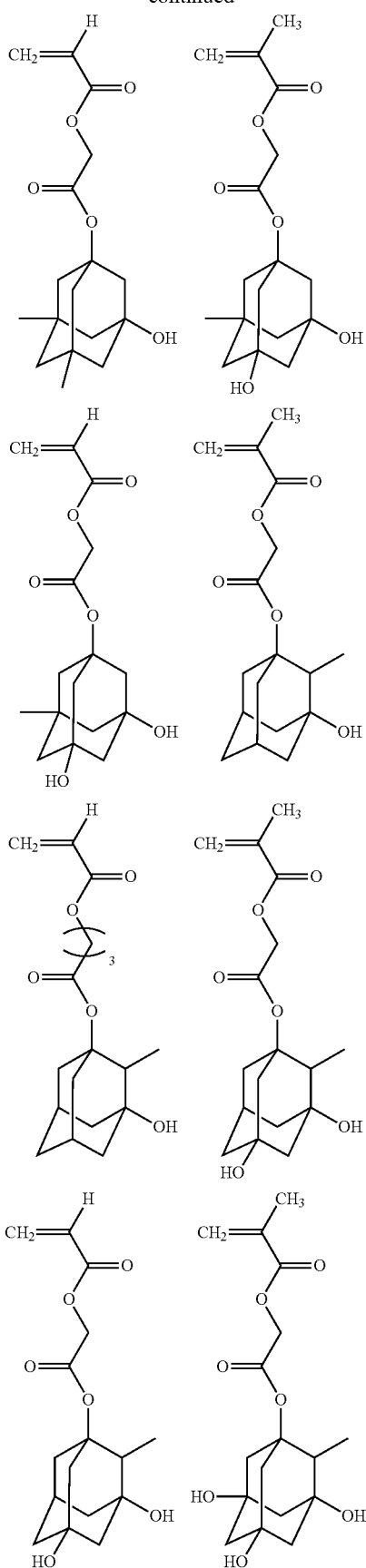

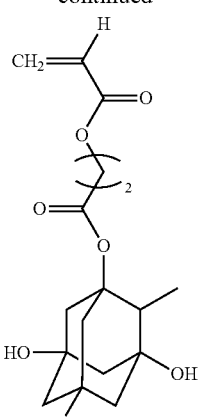

When the resin contains the structural unit derived from the monomer represented by the formula (a2-1), the content of the structural unit derived from the monomer represented by the formula (a2-1) is usually 3 to 40% by mole and preferably 5 to 35% by mole and more preferably 5 to 30% by mole based on total molar of all the structural units of the resin.

Examples of the lactone ring of the compound having no acid-labile group and having a lactone ring include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferable examples of the monomer having no acid-labile group and a lactone ring include the monomers represented by the formulae (a3-1), (a3-2) and (a3-3):

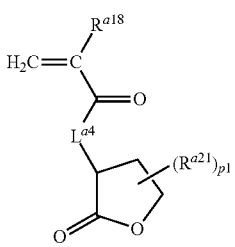
(a3-1)

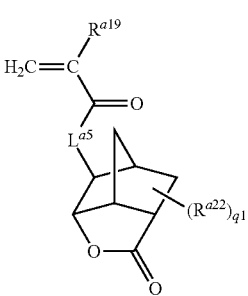
(a3-2)

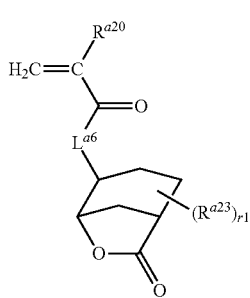

(a3-3)

wherein $L^{a4}$, $L^{a5}$ and $L^{a6}$ each independently represent *—O— or *—O—$(CH_2)_{k3}$—CO—O— in which * represents a binding position to —CO— and k3 represents an integer of 1 to 7, $R^{a18}$, $R^{a19}$ and $R^{a20}$ each independently represent a hydrogen atom or a methyl group, $R^{a21}$ represents a C1-C4 aliphatic hydrocarbon group, $R^{a22}$ and $R^{a23}$ are independently in each occurrence a carboxyl group, a cyano group or a C1-C4 aliphatic hydrocarbon group, and p1 represents an integer of 0 to 5, q1 and r1 independently each represent an integer of 0 to 3.

It is preferred that $L^{a4}$, $L^{a5}$ and $L^{a6}$ each independently represent *—O— or *—O—$(CH_2)_{d1}$—CO—O— in which * represents a binding position to —CO— and d1 represents an integer of 1 to 4, and it is more preferred that $L^{a4}$, $L^{a5}$ and $L^{a6}$ are *—O—. $R^{a18}$, $R^{a19}$ and $R^{a20}$ are preferably methyl groups. $R^{a21}$ is preferably a methyl group. It is preferred that $R^{a22}$ and $R^{a23}$ are independently in each occurrence a carboxyl group, a cyano group or a methyl group. It is preferred that p1 is an integer of 0 to 2, and it is more preferred that p1 is 0 or 1. It is preferred that q1 and r1 independently each represent an integer of 0 to 2, and it is more preferred that q1 and r1 independently each represent 0 or 1.

Examples of the monomer represented by the formula (a3-1) include the followings.

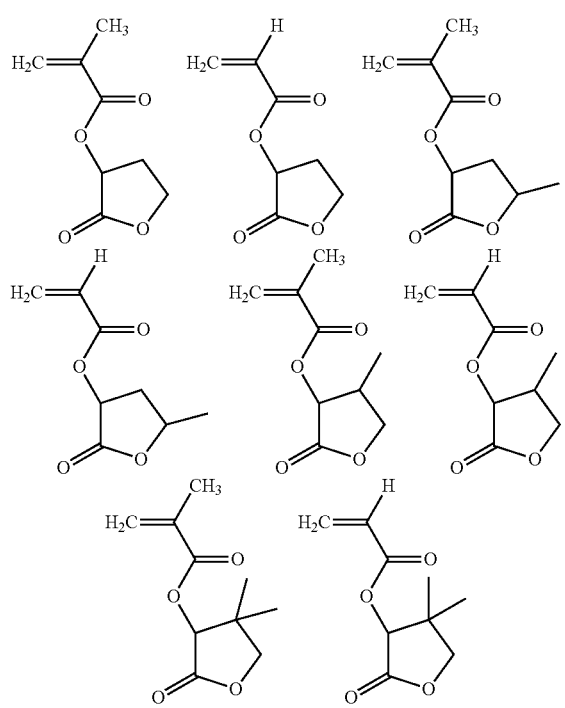

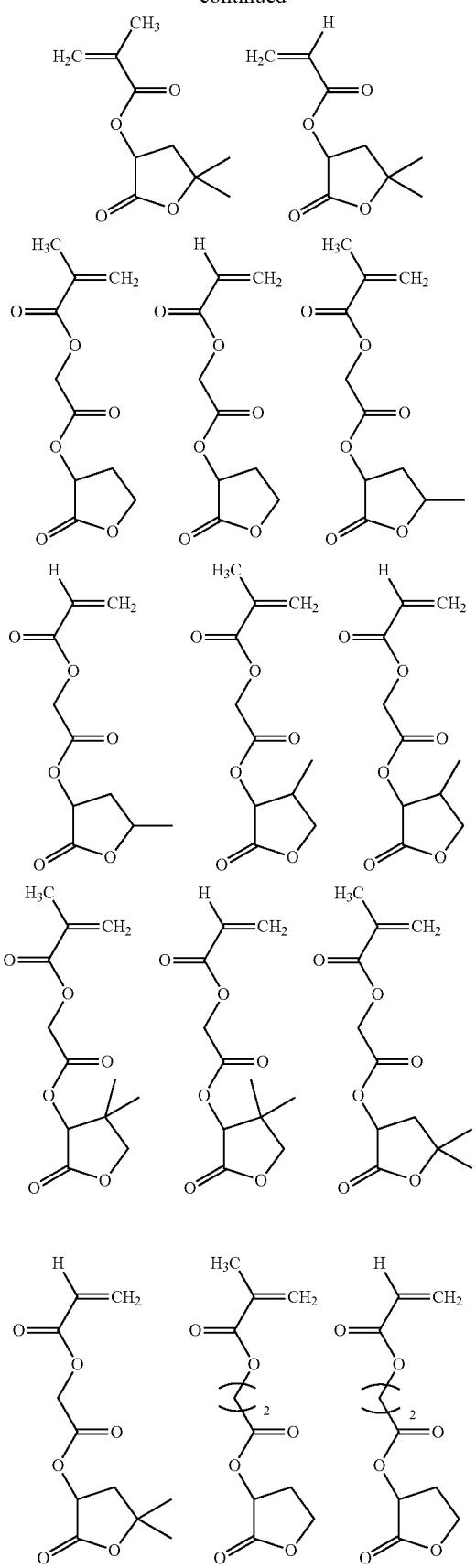

-continued
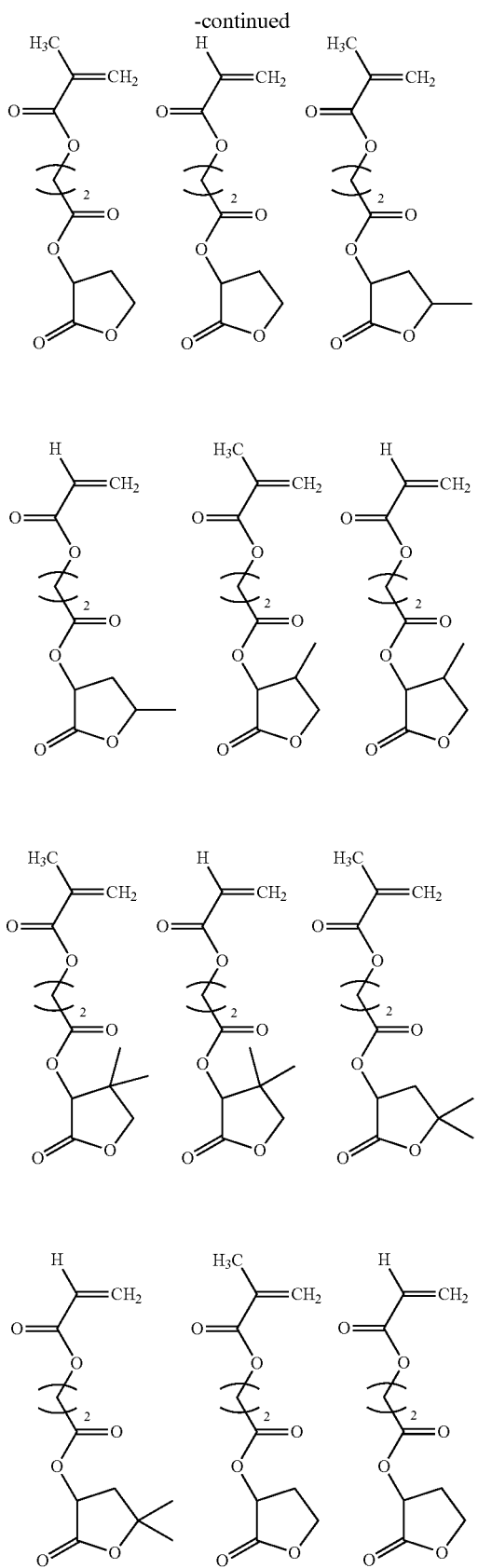
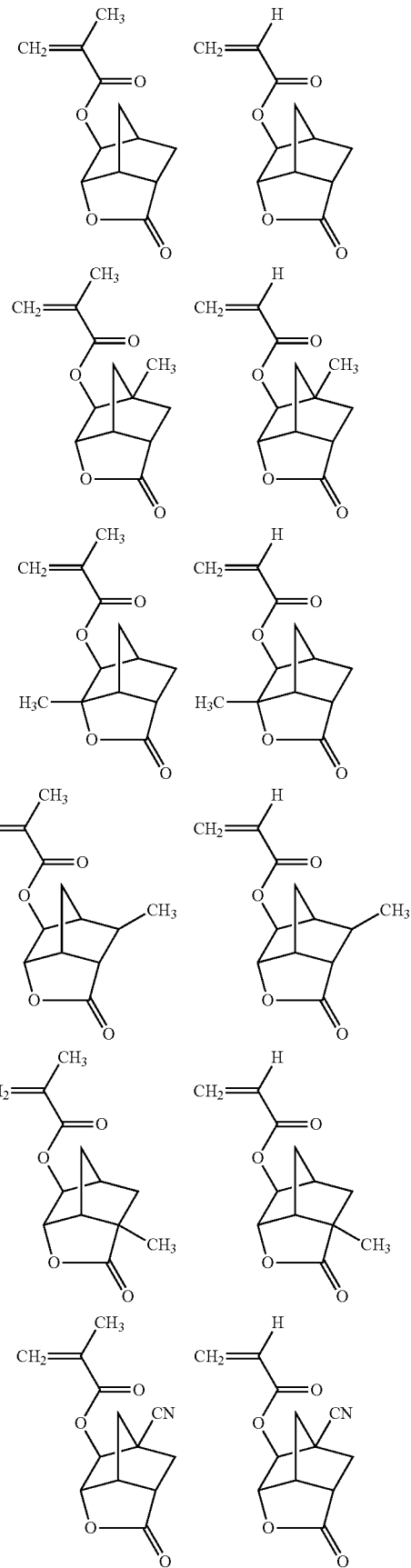
Examples of the monomer represented by the formula (a3-2) include the followings.

-continued
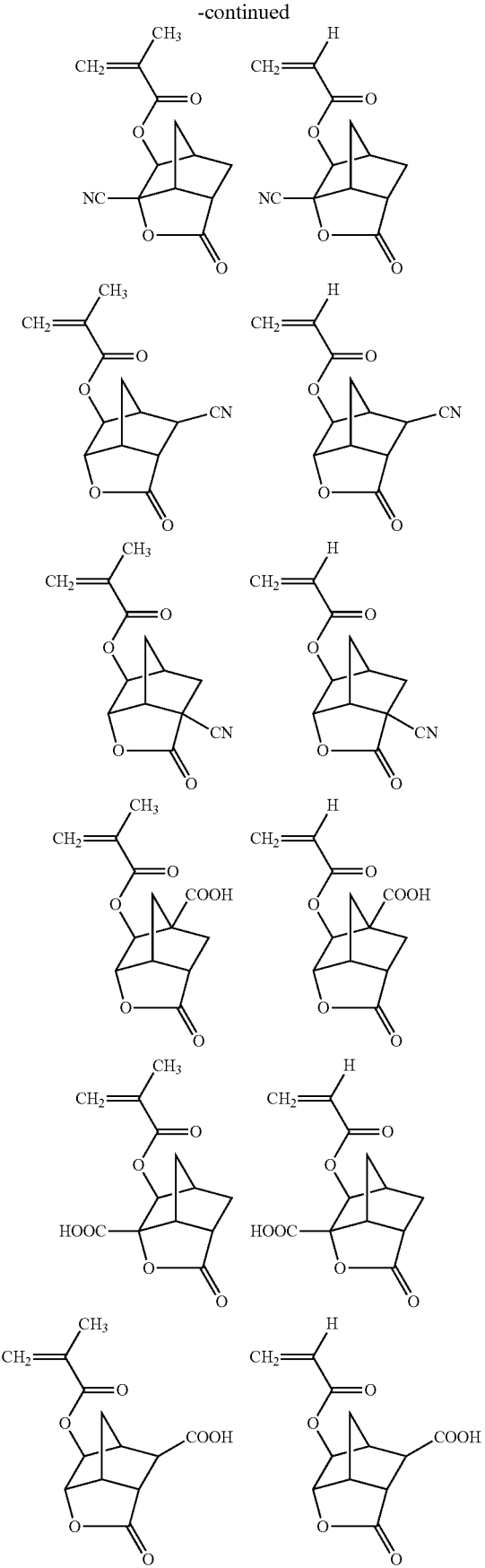
-continued
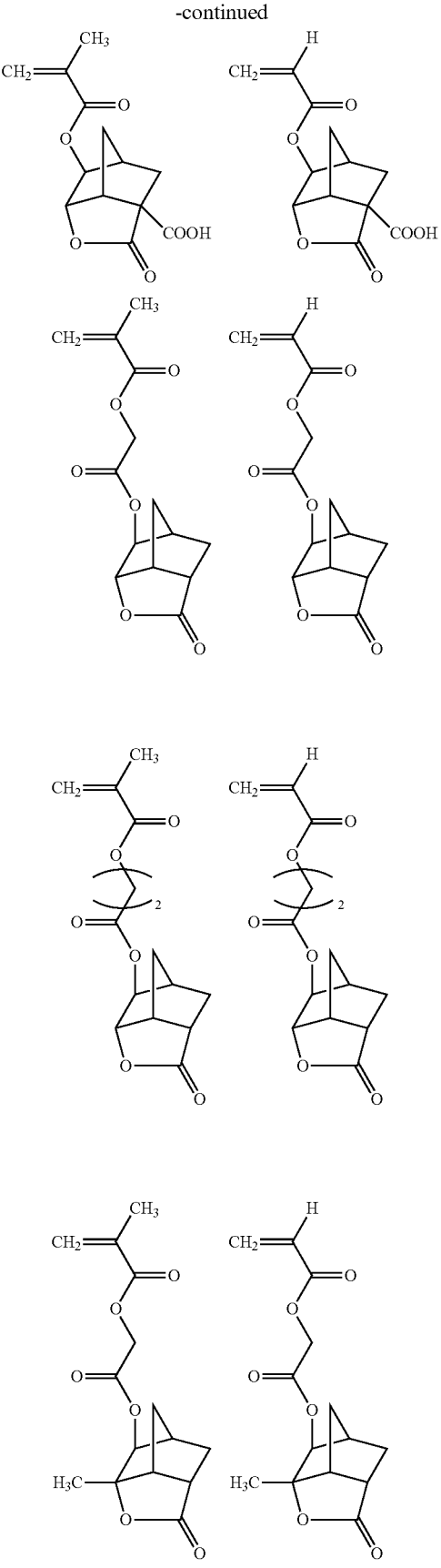

127
-continued
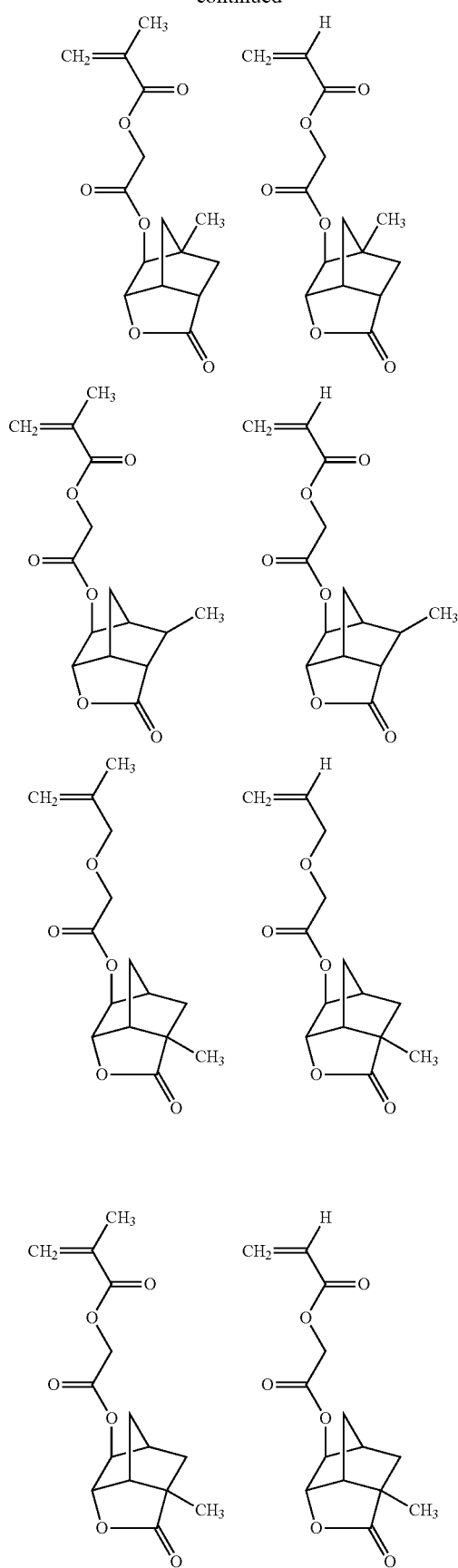
128
-continued
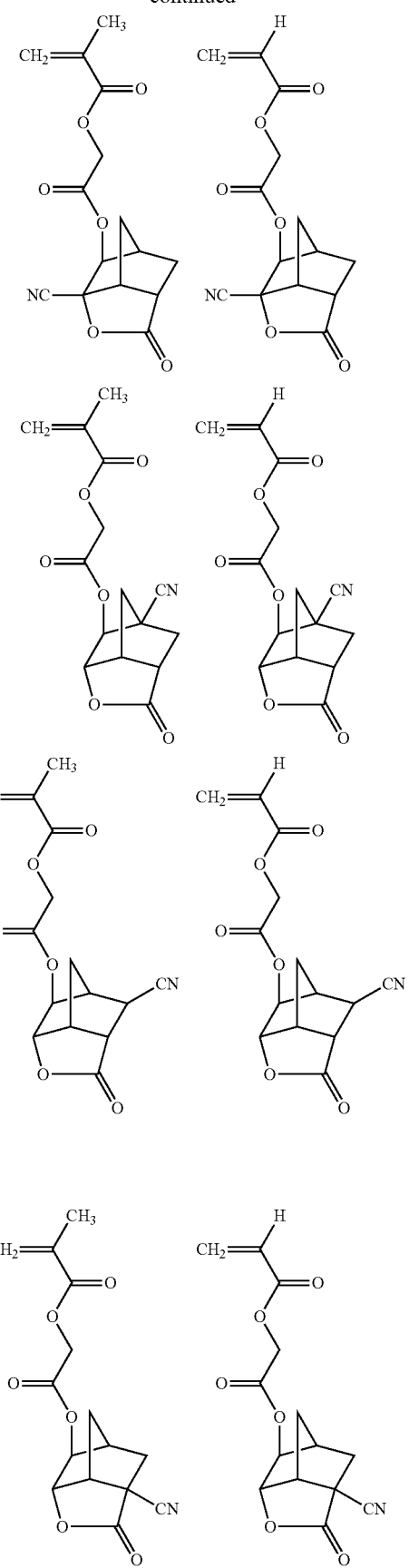

-continued
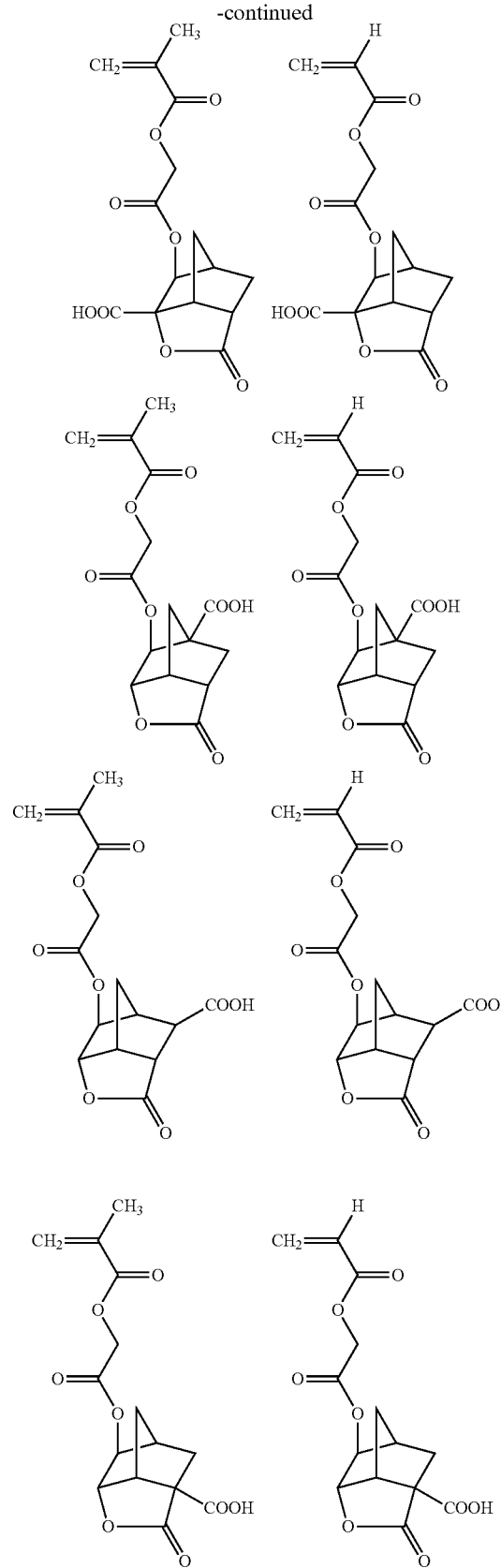
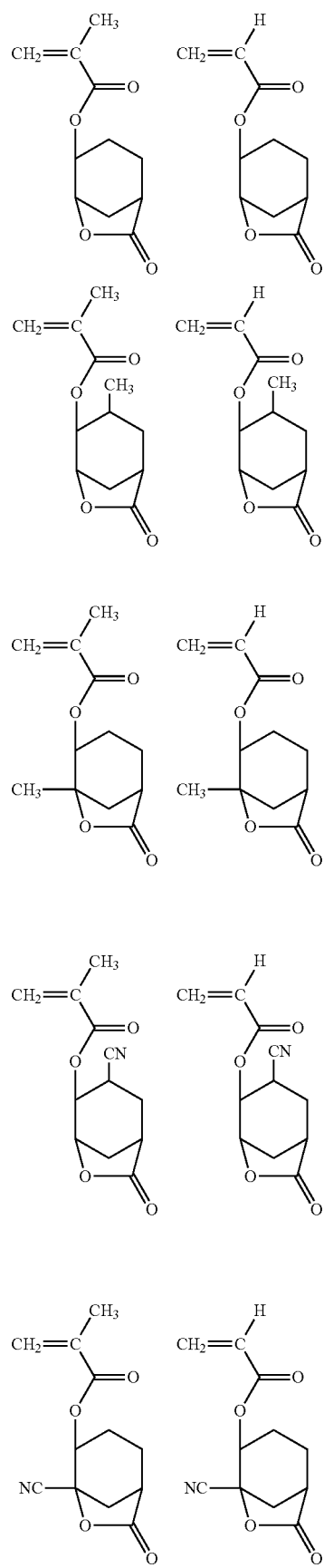
Examples of the monomer represented by the formula (a3-3) include the followings.

131
-continued
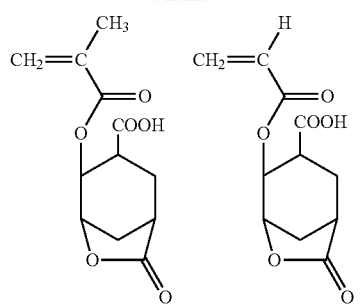
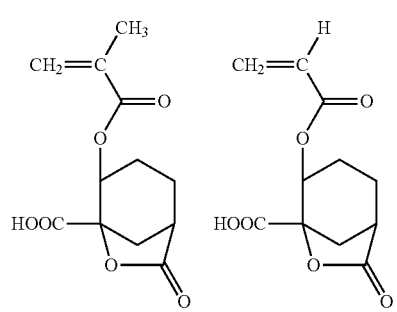
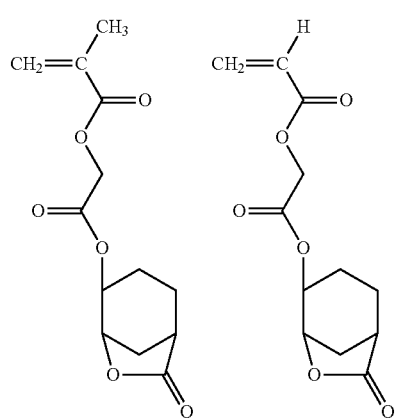 [SMILES: C=C(C)C(=O)OCC(=O)OC1(C)CCC2CC1OC2=O ; C=CC(=O)OCC(=O)OC1(C)CCC2CC1OC2=O]
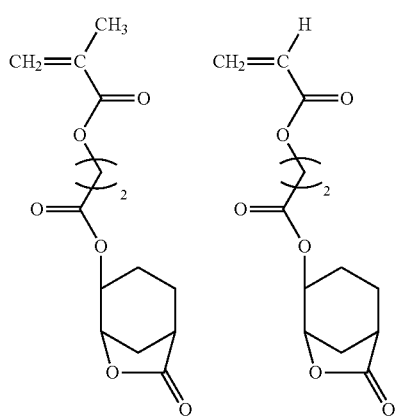
132
-continued
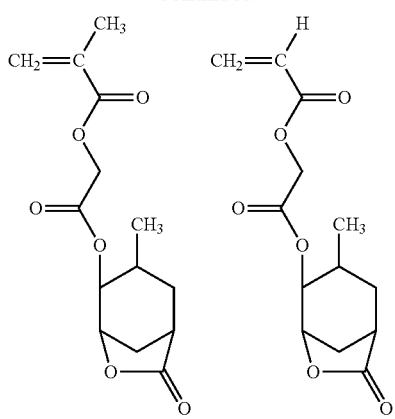
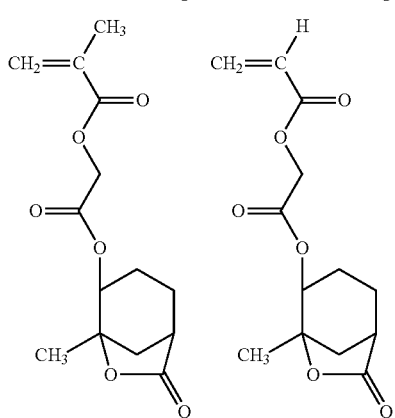
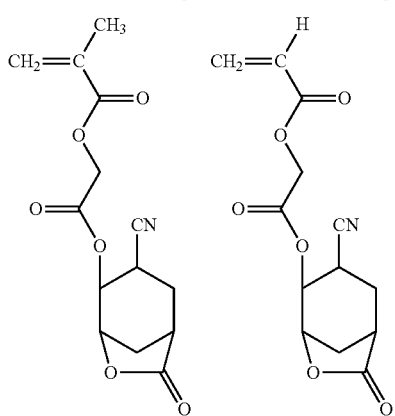
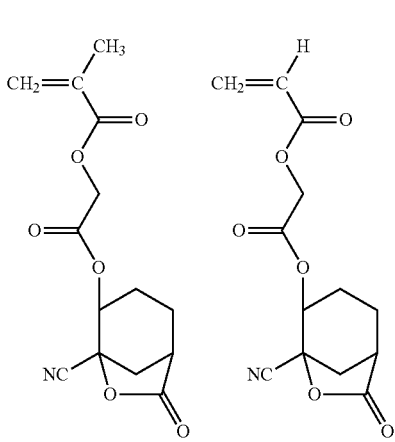

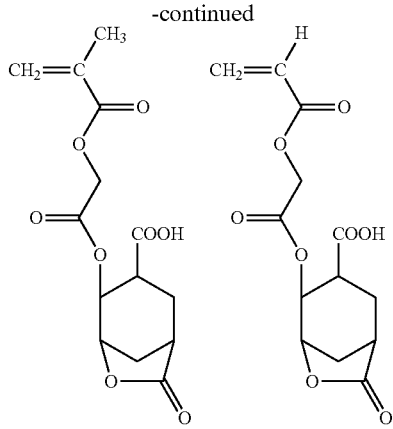

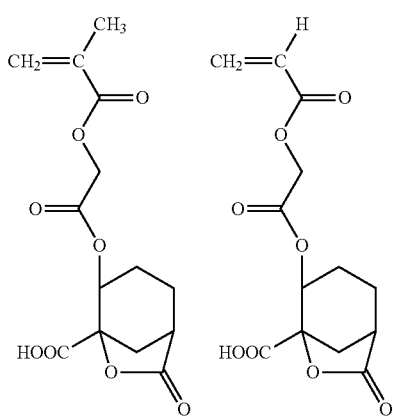

Among them, preferred are 5-oxo-4-oxatricyclo[4.2.1.0$^{3,7}$]nonan-2-yl acrylate, 5-oxo-4-oxatricyclo[4.2.1.0$^{3,7}$]nonan-2-yl methacrylate, tetrahydro-2-oxo-3-furyl acrylate, tetrahydro-2-oxo-3-furyl methacrylate, 2-(5-oxo-4-oxatricyclo[4.2.1.0$^{3,7}$]nonan-2-yloxy)-2-oxo-ethyl acrylate and 2-(5-oxo-4-oxatricyclo[4.2.1.0$^{3,7}$]nonan-2-yloxy)-2-oxo-ethyl methacrylate, and more preferred are 5-oxo-4-oxatricyclo[4.2.1.0$^{3,7}$]nonan-2-yl methacrylate, tetrahydro-2-oxo-3-furyl methacrylate and 2-(5-oxo-4-oxatricyclo[4.2.1.0$^{3,7}$]nonan-2-yloxy)-2-oxo-ethyl methacrylate.

When the resin contains the structural unit derived from the monomer having no acid-labile group and having a lactone ring, the content thereof is usually 5 to 50% by mole and preferably 10 to 45% by mole and more preferably 15 to 40% by mole based on total molar of all the structural units of the resin.

The resin can contain a structural unit derived from a monomer having an acid labile group containing a lactone ring. Examples of the monomer having an acid labile group containing a lactone ring include the followings.

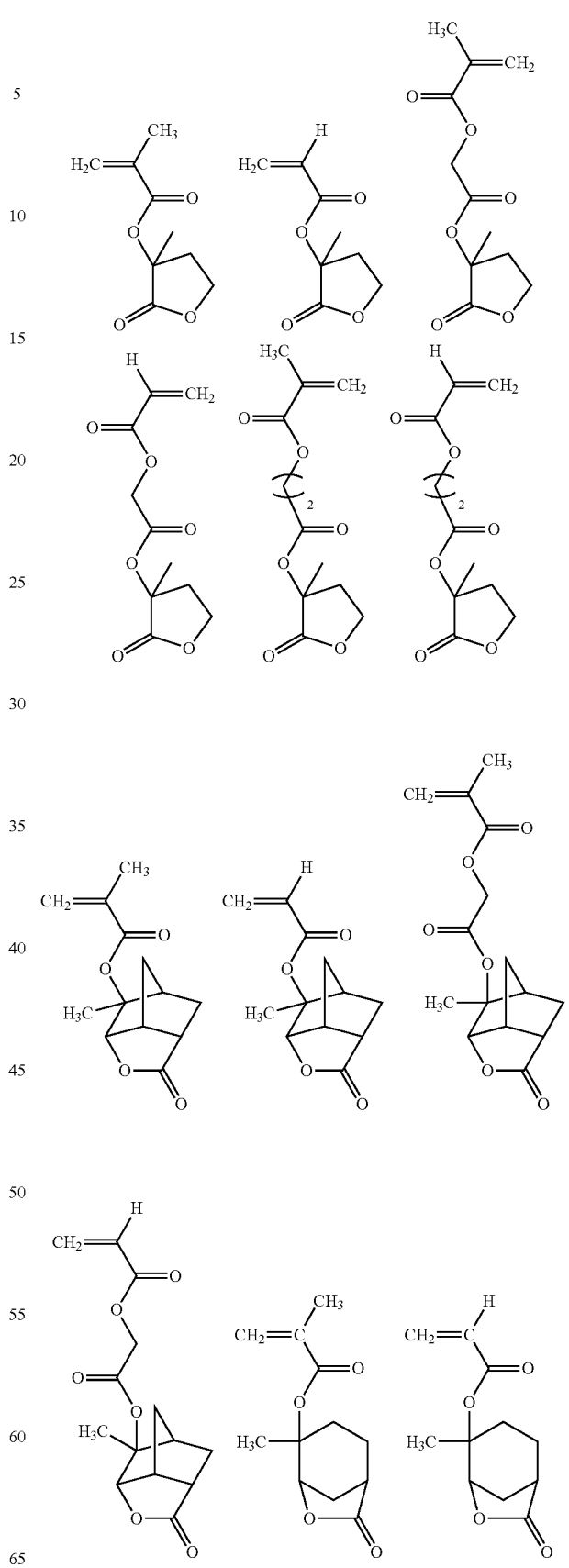

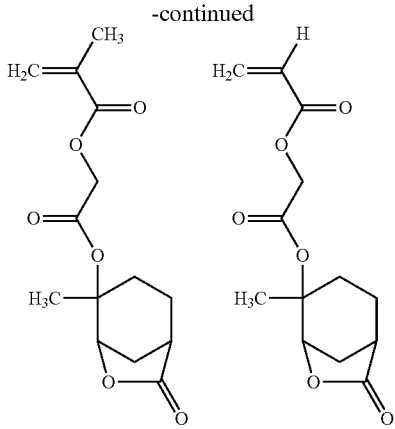

Examples of the other monomer having no acid-labile group include the monomers represented by the formulae (a4-1), (a4-2) and (a4-3):

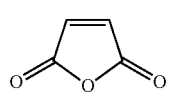
(a4-1)

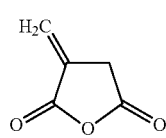
(a4-2)

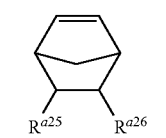
(a4-3)

wherein $R^{a25}$ and $R^{a26}$ each independently represents a hydrogen atom, a C1-C3 aliphatic hydrocarbon group which can have one or more substituents, a carboxyl group, a cyano group or a —COOR$^{a27}$ group in which $R^{a27}$ represents a C1-C36 aliphatic hydrocarbon group or a C3-C36 saturated cyclic hydrocarbon group, and one or more —CH$_2$— in the C1-C36 aliphatic hydrocarbon group and the C3-C36 saturated cyclic hydrocarbon group can be replaced by —O— or —CO—, with the proviso that the carbon atom bonded to —O— of —COO— of $R^{a27}$ is not a tertiary carbon atom, or $R^{a25}$ and $R^{a26}$ are bonded together to form a carboxylic anhydride residue represented by —C(=O)OC(=O)—.

Examples of the substituent of the C1-C3 aliphatic hydrocarbon group include a hydroxyl group. Examples of the C1-C3 aliphatic hydrocarbon group which can have one or more substituents include a C1-C3 alkyl group such as a methyl group, an ethyl group and a propyl group, and a C1-C3 hydroxyalkyl group such a hydroxymethyl group and a 2-hydroxyethyl group. The C1-C36 aliphatic hydrocarbon group represented by $R^{a27}$ is preferably a C1-C8 aliphatic hydrocarbon group and is more preferably a C1-C6 aliphatic hydrocarbon group. The C3-C36 saturated cyclic hydrocarbon group represented by $R^{a27}$ is preferably a C4-C36 saturated cyclic hydrocarbon group, and is more preferably C4-C12 saturated cyclic hydrocarbon group. Examples of $R^{a27}$ include a methyl group, an ethyl group, a propyl group, a 2-oxo-oxolan-3-yl group and a 2-oxo-oxolan-4-yl group.

Examples of the monomer represented by the formula (a4-3) include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic anhydride.

When the resin contains a structural unit derived from a monomer represented by the formula (a4-1), (a4-2) or (a4-3), the content thereof is usually 2 to 40% by mole and preferably 3 to 30% by mole and more preferably 5 to 20% by mole based on total molar of all the structural units of the resin.

Preferable resin is a resin containing the structural units derived from the monomer having an acid-labile group, and the structural units derived from the monomer having one or more hydroxyl groups and/or the monomer having a lactone ring. The monomer having an acid-labile group is preferably the monomer represented by the formula (a1-1) or the monomer represented by the formula (a1-2), and is more preferably the monomer represented by the formula (a1-1). The monomer having one or more hydroxyl groups is preferably the monomer represented by the formula (a2-1), and the monomer having a lactone ring is preferably the monomer represented by the formula (a3-1) or (a3-2).

The resin can be produced according to known polymerization methods such as radical polymerization.

The resin usually has 2,500 or more of the weight-average molecular weight, and preferably 3,000 or more of the weight-average molecular weight. The resin usually has 50,000 or less of the weight-average molecular weight, and preferably has 30,000 or less of the weight-average molecular weight. The weight-average molecular weight can be measured with gel permeation chromatography.

The photoresist composition of the present invention contains an acid generator, and preferably a photoacid generator.

The acid generator is a substance which is decomposed to generate an acid by applying a radiation such as a light, an electron beam or the like on the substance itself or on a photoresist composition containing the substance. The acid generated from the acid generator acts on the resin resulting in cleavage of the acid-labile group existing in the resin.

Examples of the acid generator include a nonionic acid generator, an ionic acid generator and the combination thereof. An ionic acid generator is preferable. Examples of the nonionic acid generator include an organo-halogen compound, a sulfone compound such as a disulfone, a ketosulfone and a sulfonyldiazomethane, a sulfonate compound such as a 2-nitrobenzylsulfonate, an aromatic sulfonate, an oxime sulfonate, an N-sulfonyloxyimide, a sulfonyloxyketone and DNQ 4-sulfonate. Examples of the ionic acid generator include an acid generator having an inorganic anion such as $BF_4^-$, $PF_6^-$, $AsF_6^-$ and $SbF_6^-$, and an acid generator having an organic anion such as a sulfonic acid anion and a bissulfonylimido anion, and an acid generator having a sulfonic acid anion is preferable. Preferable examples of the acid generator include a salt represented by the formula (B1):

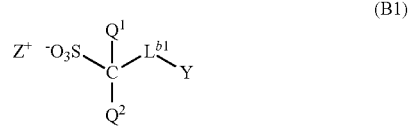
(B1)

wherein $Q^1$ and $Q^2$ each independently represent a fluorine atom or a C1-C6 perfluoroalkyl group, $L^{b1}$ represents a single bond or a C1-C17 divalent saturated hydrocarbon group in which one or more methylene groups can be replaced by —O— or —CO—,
Y represents a C1-C18 aliphatic hydrocarbon group which can have one or more substituents, or a C3-C18 saturated cyclic hydrocarbon group which can have one or more substituents, and one or more methylene groups in the aliphatic hydrocarbon group and the saturated cyclic hydrocarbon group can be replaced by —O—, —CO— or —SO$_2$—, and $Z^+$ represents an organic cation.

Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Q^1$ and $Q^2$ each independently preferably represent a fluorine atom or a trifluoromethyl group, and $Q^1$ and $Q^2$ are more preferably fluorine atoms.

Examples of the C1-C17 divalent saturated hydrocarbon group include a C1-C17 linear alkylene group such as a methylene group, an ethylene group, a propane-1,3-diyl group, a propane-1,2-diyl group, a butane-1,4-diyl group, a butane-1,3-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,1'-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group, a C1-C17 branched alkylene group such as a 1-methyl-1,3-propylene group, a 2-methyl-1,3-propylene group, a 2-methyl-1,2-propylene group, a 1-methyl-1,4-butylene group, and a 2-methyl-1,4-butylene group,
a divalent saturated monocyclic hydrocarbon group such as a cycloalkylene group such as a 1,3-cyclobutylene group, a 1,3-cyclopentylene group, a 1,4-cyclohexylene group, and a 1,5-cyclooctylene group, and
a divalent saturated polycyclic hydrocarbon group such as a 1,4-norbornylene group, a 2,5-norbornylene group, a 1,5-adamantylene group and a 2,6-adamantylene group.

Examples of the C1-C17 saturated hydrocarbon group in which one or more methylene groups are replaced by —O— or —CO— include *—CO—O-$L^{b2}$-, *—CO—O-$L^{b4}$-CO—O-$L^{b3}$-, *-$L^{b5}$-O—CO—, *-$L^{b7}$-O-$L^{b6}$-, *—CO—O-$L^{b8}$-O$L^{b8}$-O—, and *—CO—O-$L^{b10}$-O-$L^{b9}$-CO—O—, wherein $L^{b2}$ represents a single bond or a C1-C15 alkanediyl group, $L^{b3}$ represents a single bond or a C1-C12 alkanediyl group, $L^{b4}$ represents a single bond or a C1-C13 alkanediyl group, with proviso that total carbon number of $L^{b3}$ and $L^{b4}$ is 1 to 13, $L^{b5}$ represents a C1-C15 alkanediyl group, $L^{b6}$ represents a C1-C15 alkanediyl group, $L^{b7}$ represents a C1-C15 alkanediyl group, with proviso that total carbon number of $L^{b6}$ and $L^{b7}$ is 1 to 16, $L^{b8}$ represents a C1-C14 alkanediyl group, $L^{b9}$ represents a C1-C11 alkanediyl group, $L^{b10}$ represents a C1-C$^{11}$ alkanediyl group, with proviso that total carbon number of $L^{b9}$ and $L^{b10}$ is 1 to 12, and * represents a binding position to —C($Q^1$)($Q^2$)-. Among them, preferred are *—CO—O-$L^{b2}$-, *—CO—O-$L^{b4}$-CO—O-$L^{b3}$-, *-$L^{b5}$-O—CO— and *-$L^{b7}$-O-$L^{b6}$-, and more preferred are *—CO—O-$L^{b2}$- and *—CO—O-$L^{b4}$-CO—O-$L^{b3}$-, and much more preferred is *—CO—O-$L^{b2}$-, and especially preferred is *—CO—O-$L^{b2}$- in which $L^{b2}$ is a single bond or —CH$_2$—.

Examples of *—CO—O-$L^{b2}$- include *—CO—O— and *—CO—O—CH$_2$—. Examples of *—CO—O-$L^{b4}$-CO—O-$L^{b3}$- include *—CO—O—CH$_2$—CO—O—, *—CO—O—(CH$_2$)$_2$—CO—O—, *—CO—O—(CH$_2$)$_3$—CO—O—, *—CO—O—(CH$_2$)$_4$—CO—O—, *—CO—O—(CH$_2$)$_6$—CO—O—, *—CO—O—(CH$_2$)$_8$—CO—O—, *—CO—O—CH$_2$—CH(CH$_3$)—CO—O— and *—CO—O—CH$_2$—C(CH$_3$)$_2$—CO—O—. Examples of *-$L^{b5}$-O—CO— include *—CH$_2$—O—CO—, *—(CH$_2$)$_2$—O—CO—, *—(CH$_2$)$_3$—O—CO—, *—(CH$_2$)$_4$—O—CO—, *—(CH$_2$)$_6$—O—CO— and *—(CH$_2$)$_8$—O—CO—. Examples of *-$L^{b7}$-O-$L^{b6}$- include *—CH$_2$—O—CH$_2$—. Examples of *—CO—O-$L^{b8}$-O— include *—CO—O—CH$_2$—O—, *—CO—O—(CH$_2$)$_2$—O—, *—CO—O—(CH$_2$)$_3$—O—, *—CO—O—(CH$_2$)$_4$—O— and *—CO—O—(CH$_2$)$_6$—O—. Examples of *—CO—O-$L^{b10}$-O-$L^{b9}$-CO—O— include the followings.

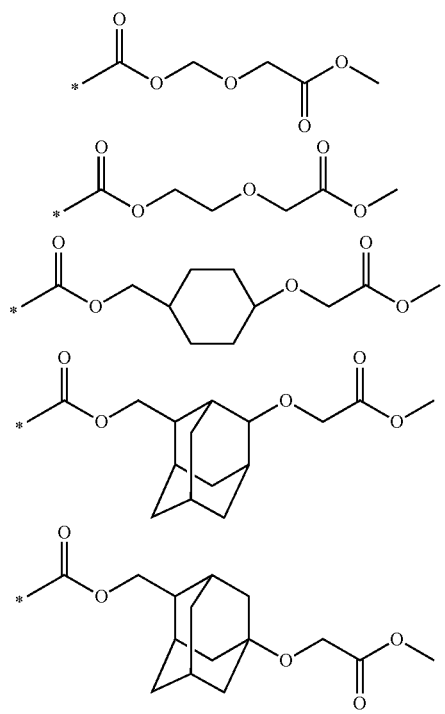

The saturated hydrocarbon group can have one or more substituents, and examples of the substituent include a halogen atom, a hydroxyl group, a carboxyl group, a C6-C18 aromatic hydrocarbon group, a C7-C21 aralkyl group such as a benzyl group, a phenethyl group, a phenylpropyl group, a trityl group, a naphthylmethyl group and a naphthyethyl group, a C2-C4 acyl group and a glycidyloxy group.

Examples of the substituent in Y include a halogen atom, a hydroxyl group, an oxo group, a glycidyloxy group, a C2-C4 acyl group, a C1-C12 alkoxy group, a C2-C7 alkoxycarbonyl group, a C1-C12 aliphatic hydrocarbon group, a C1-C12 hydroxy-containing aliphatic hydrocarbon group, a C3-C16 saturated cyclic hydrocarbon group, a C6-C18 aromatic hydrocarbon group, a C7-C21 aralkyl group and —(CH$_2$)$_{j2}$—O—CO—$R^{b1}$— in which $R^{b1}$ represents a C1-C16 aliphatic hydrocarbon group, a C3-C16 saturated cyclic hydrocarbon group or a C6-C18 aromatic hydrocarbon group and j2 represents an integer of 0 to 4. Examples of the halogen atom include a fluorine atom, a chlorine atom, a bromine atom and an iodine atom. Examples of the acyl group include an acetyl group and a propionyl group, and examples of the alkoxy group include a methoxy group, an ethoxy group, a propoxy group, an isopropoxy group and a butoxy group. Examples of the alkoxycarbonyl group include a methoxycarbonyl group, an ethoxycarbonyl group, a propoxycarbonyl group, an isopropoxycarbonyl group and a butoxycarbonyl group. Examples of the aliphatic hydrocarbon group include the same as described above. Examples of the hydroxyl-containing aliphatic hydrocarbon group include a hydroxymethyl group. Examples of the C3-C16 saturated cyclic hydrocarbon group include the same as described above, and examples of the aromatic hydrocarbon group include a phenyl group, a naphthyl group, an anthryl group, a p-methylphenyl group, a p-tert-butylphenyl group and a p-adamantylphenyl group. Examples of the aralkyl group include a benzyl group, a phenethyl group, a phenylpropyl group, a trityl group, a naphthylmethyl group and a naphthylethyl group.

Examples of the C1-C18 aliphatic hydrocarbon group represented by Y include a methyl group, an ethyl group, a propyl group, an isopropyl group, a butyl group, an isobutyl group, a sec-butyl group, a tert-butyl group, a pentyl group, a neopentyl group, a 1-methylbutyl group, a 2-methylbutyl group, a 1,2-dimethylpropyl group, a 1-ethylpropyl group, a hexyl group, a 1-methylpentyl group, a heptyl group, an octyl group, a 2-ethylhexyl group, a nonyl group, a decyl group, an undecyl group and a dodecyl group, and a C1-C6 alkyl group is preferable. Examples of the C3-C18 saturated cyclic hydrocarbon group represented by Y include the groups represented by the formulae (Y1) to (Y26):

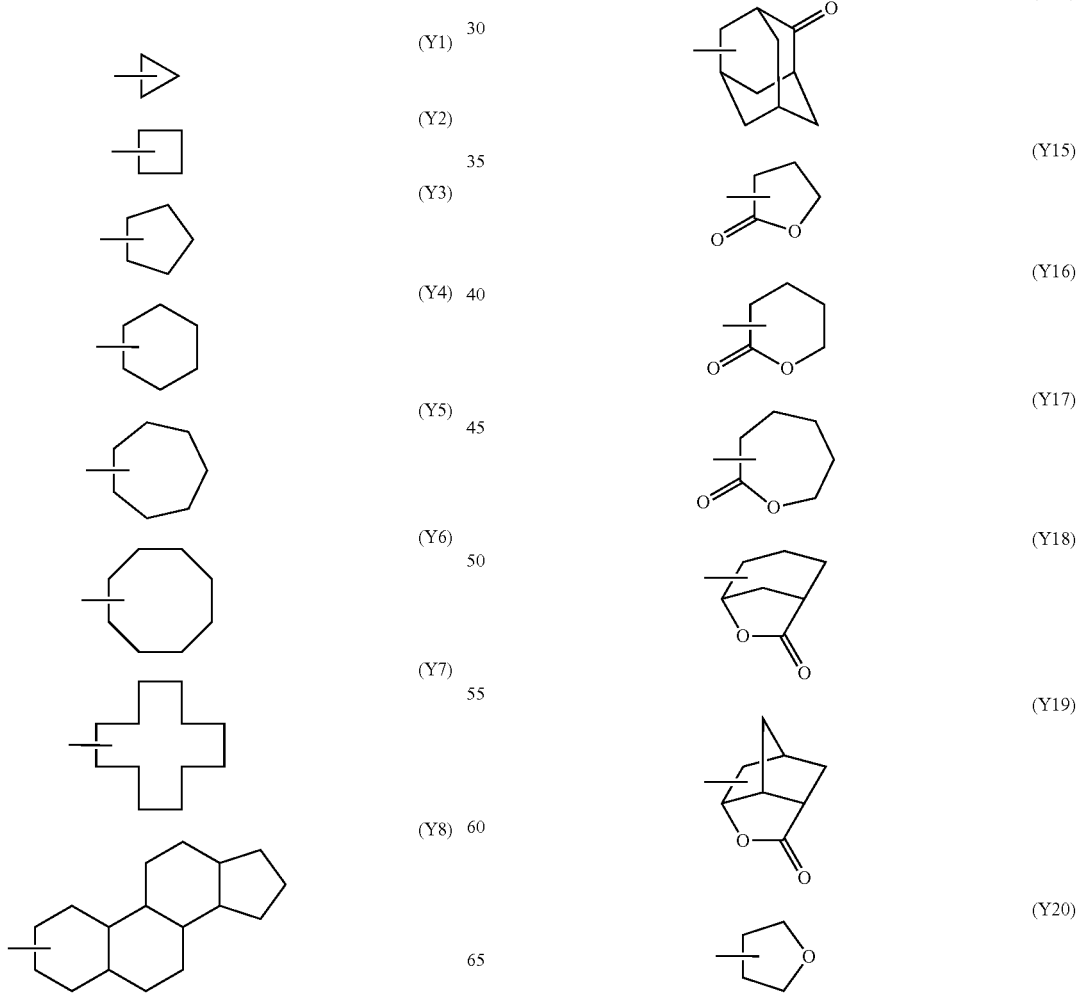

(Y21) 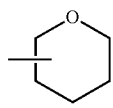

(Y22) 

(Y23) 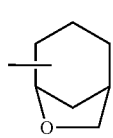

(Y24) 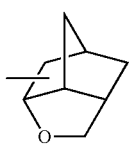

(Y25) 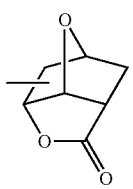

(Y26) 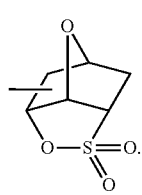

Among them, preferred are the groups represented by the formulae (Y1) to (Y19), and more preferred are the groups represented by the formulae (Y11), (Y14), (Y15) and (Y19). The groups represented by the formulae (Y11) and (Y14) are especially preferable.

Examples of Y having one or more substituents include the followings:

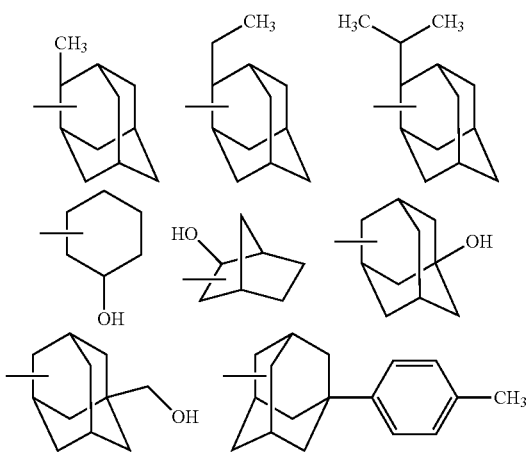

Y is preferably an adamantyl group which can have one or more substituents, and is more preferably an adamantyl group or an oxoadamantyl group.

Among the sulfonic acid anions of the acid generator represented by the formula (B1), preferred is a sulfonic acid anion having the group represented by the above-mentioned formula (b1-1), and more preferred are anions represented by the formulae (b1-1-1) to (b1-1-9).

-continued
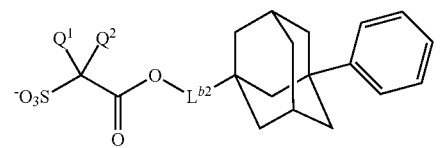
(b1-1-6)
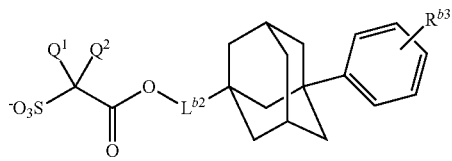
(b1-1-7)
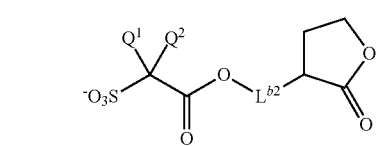
(b1-1-8)
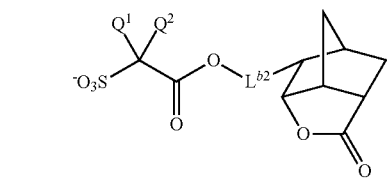
(b1-1-9)
wherein $Q^1$, $Q^2$ and $L^{b2}$ are the same as defined above, and $R^{b2}$ and $R^{b3}$ each independently represent a C1-C4 aliphatic hydrocarbon group, preferably a methyl group.
Specific examples of the sulfonic acid anion include the followings.
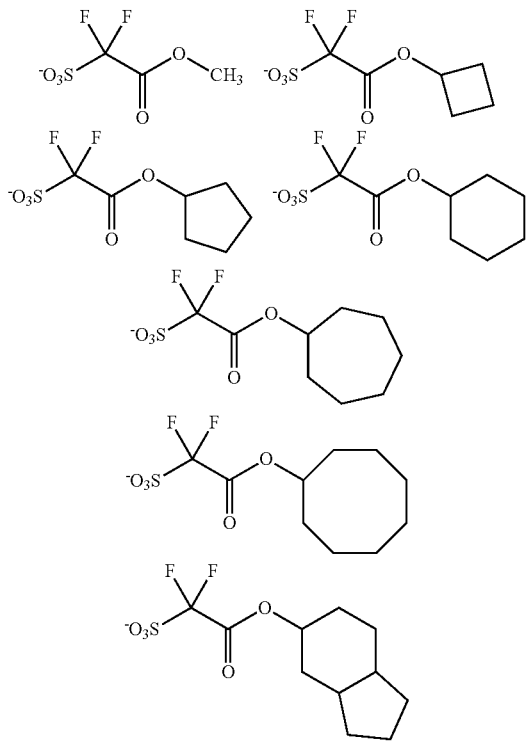
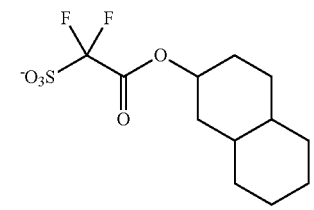
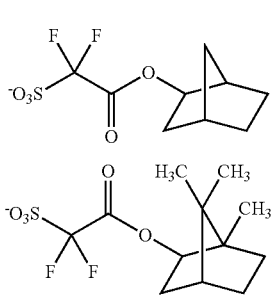
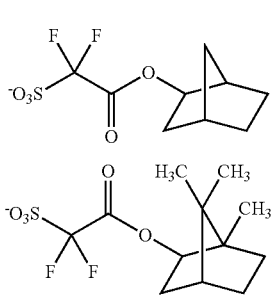
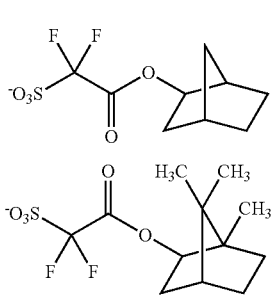
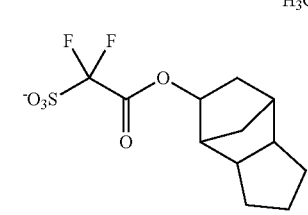
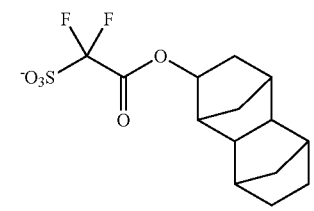
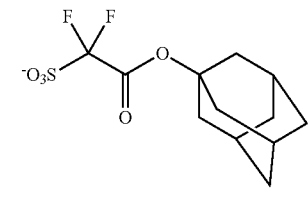
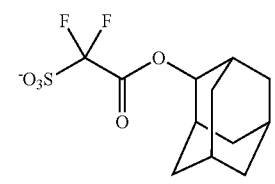
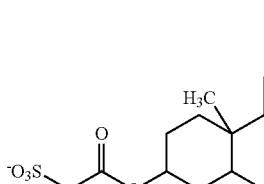
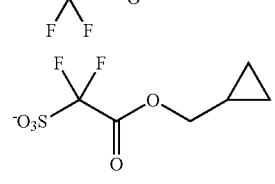

145
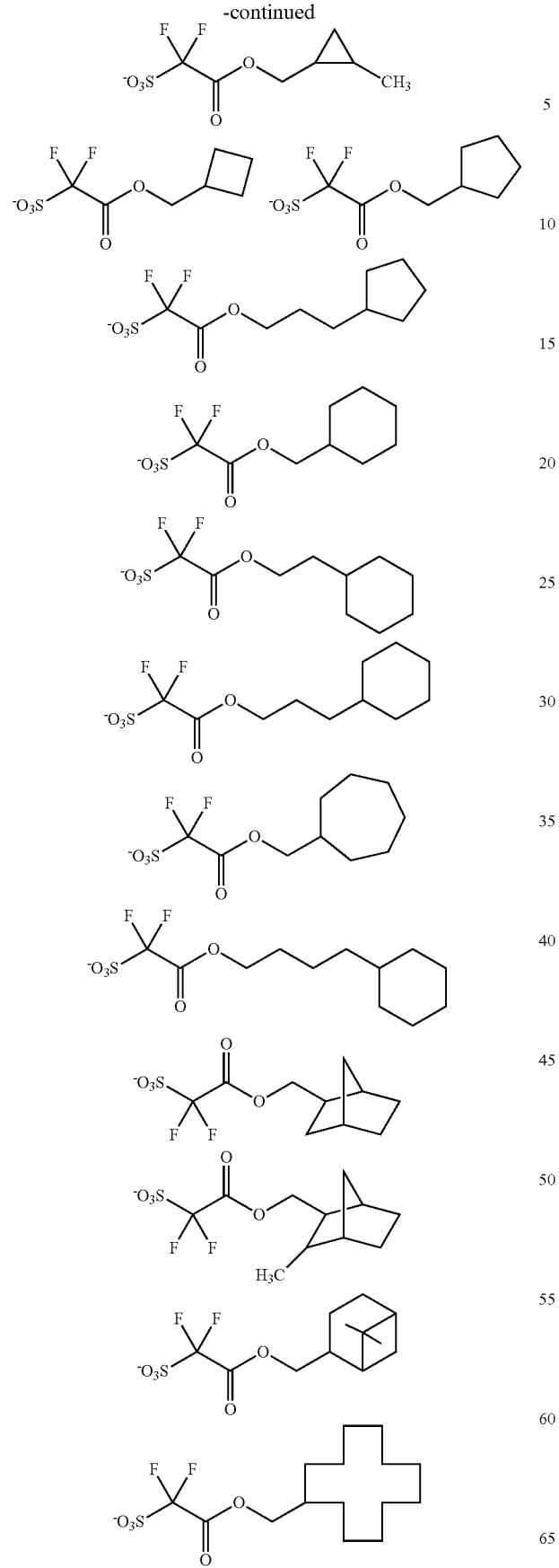
146
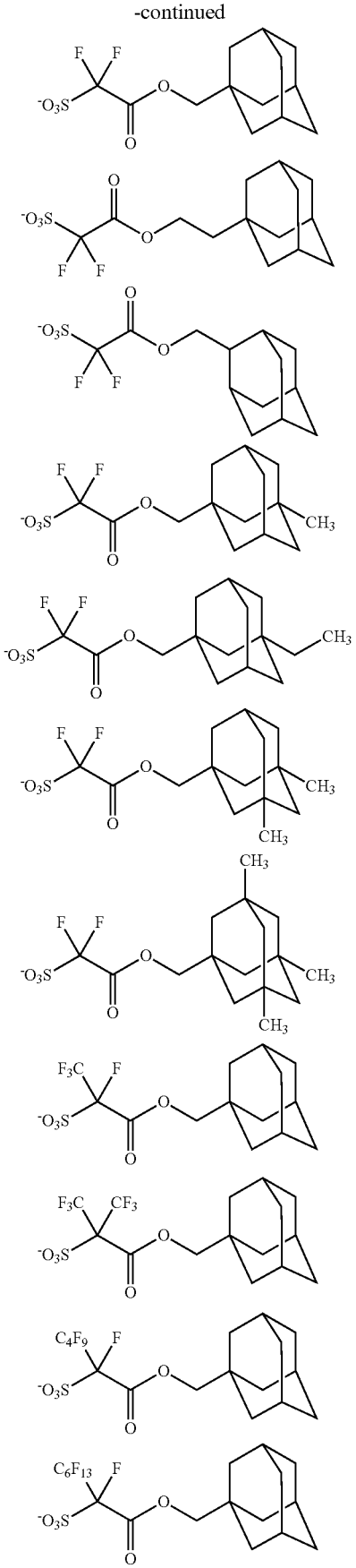

-continued
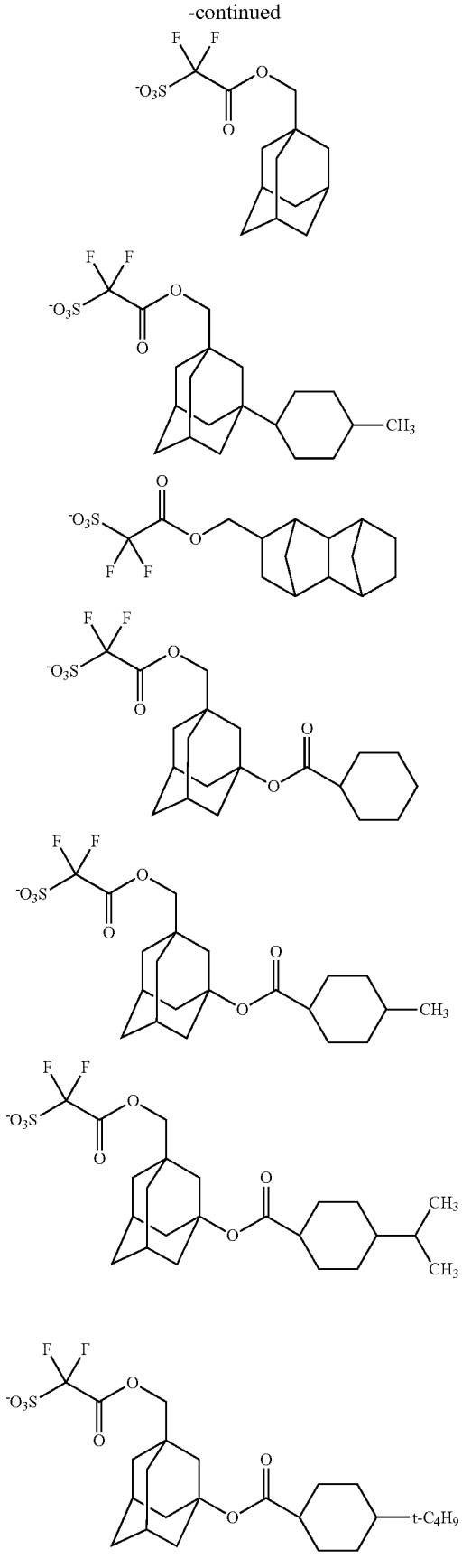
-continued
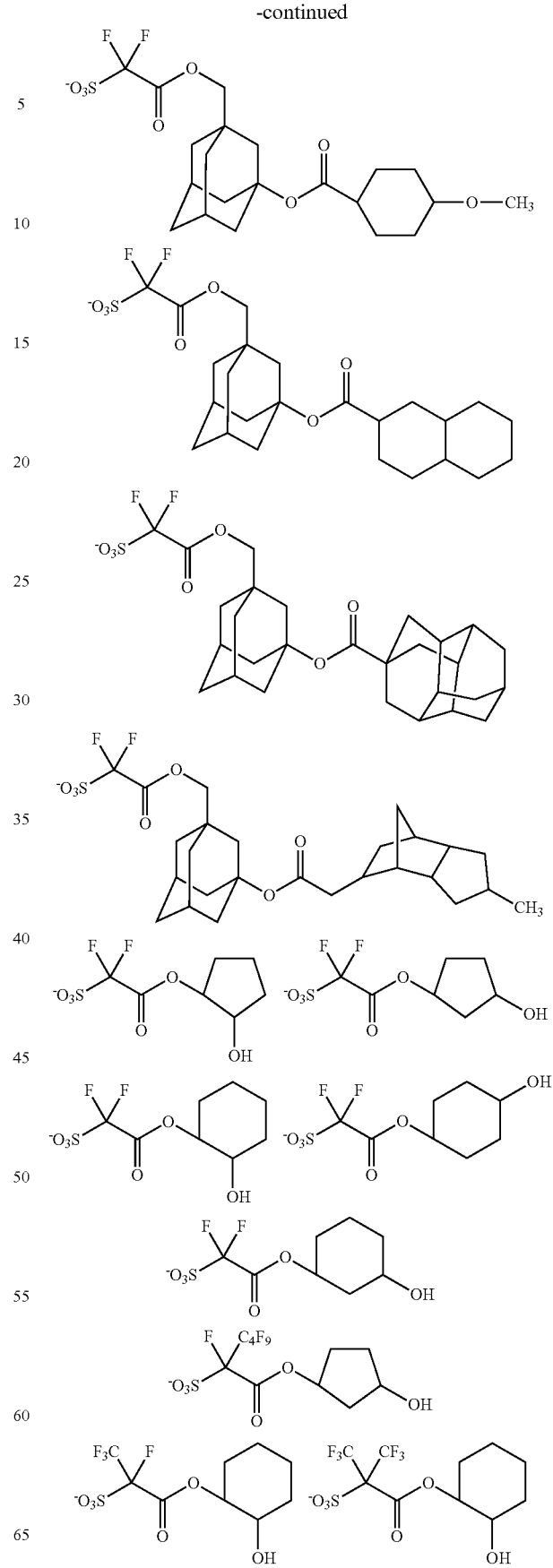

-continued
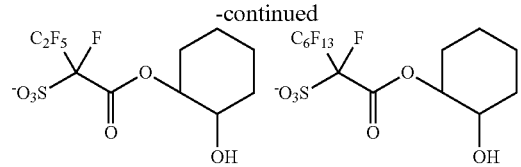
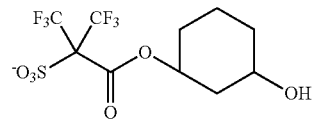
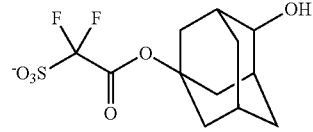
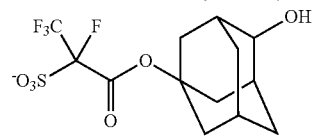
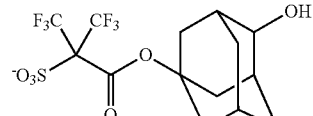
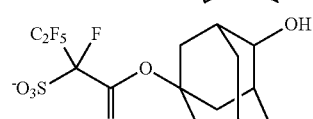
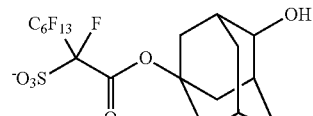
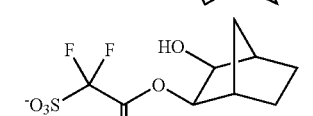
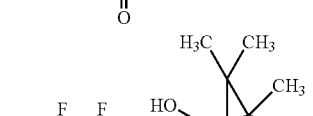
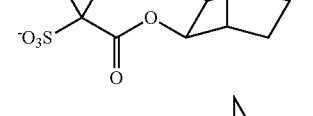
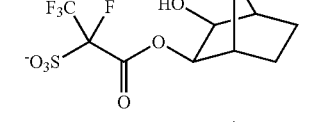
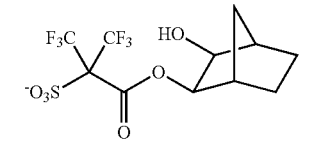
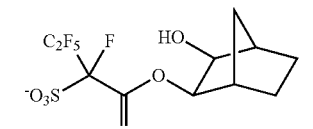
-continued
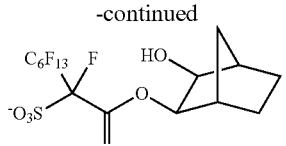
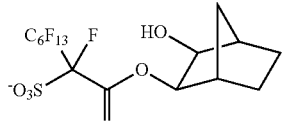
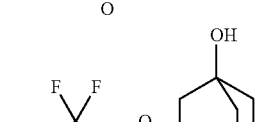
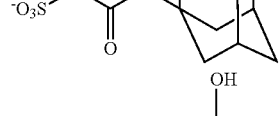
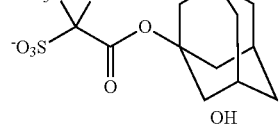
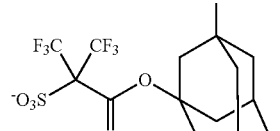
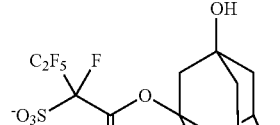
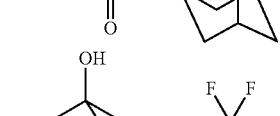
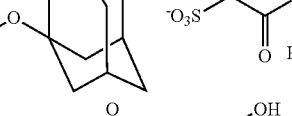
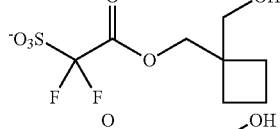
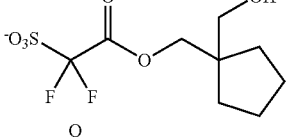
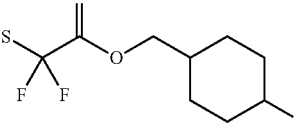
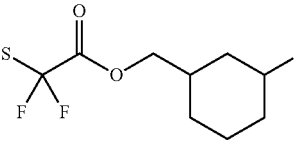

151
-continued
152
-continued
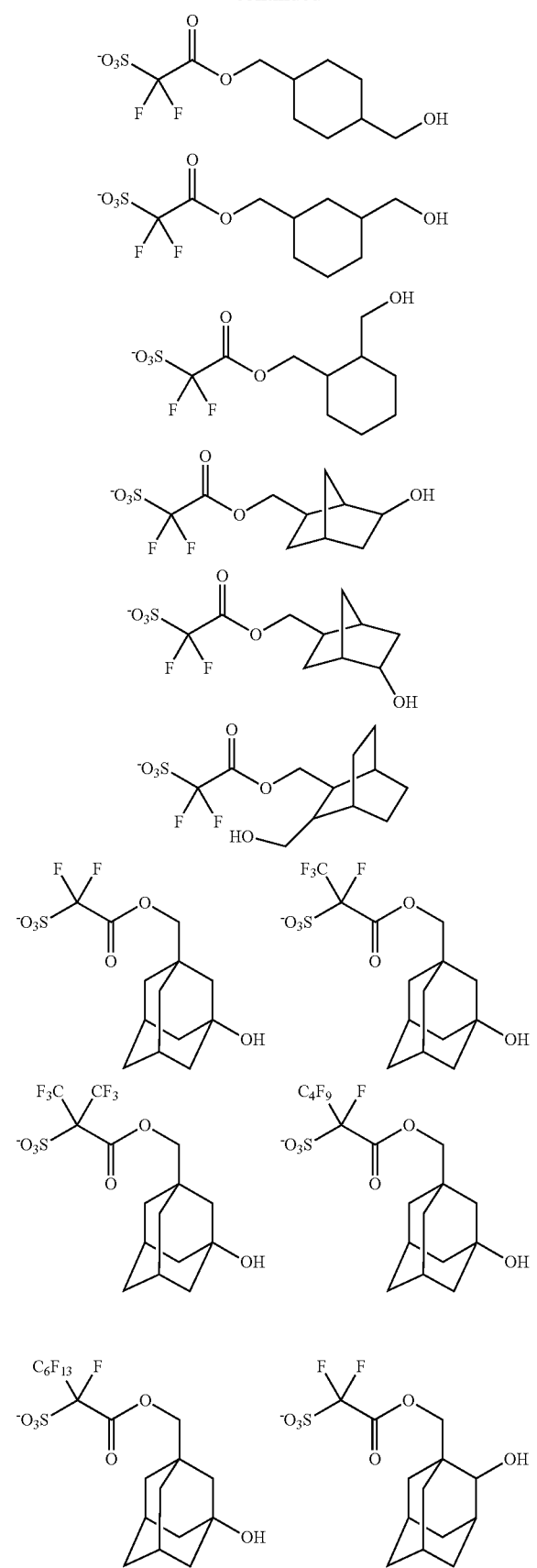
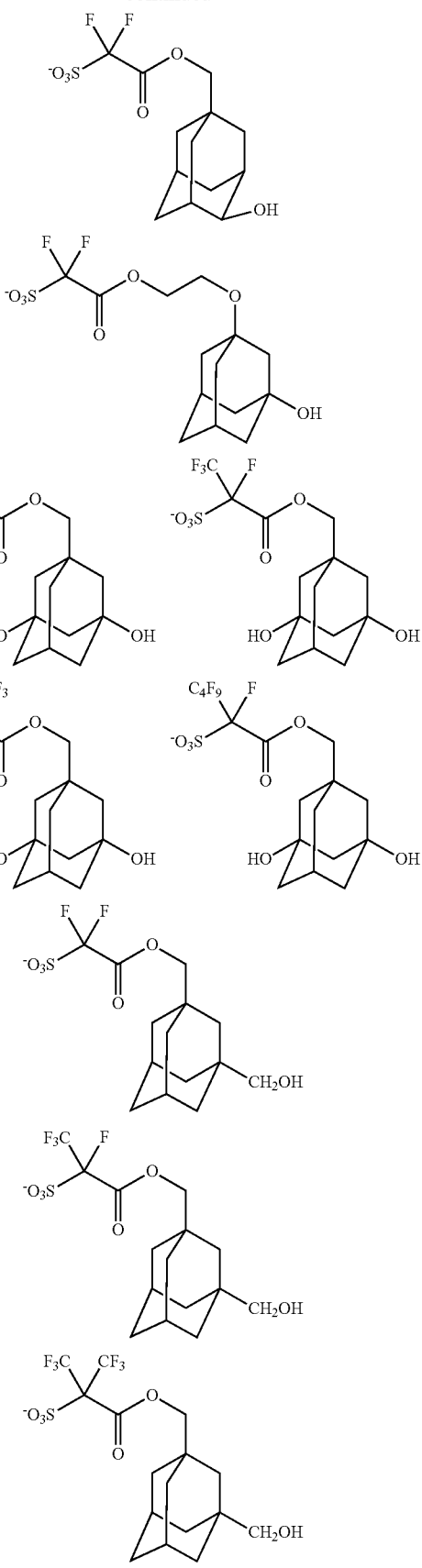

153
-continued
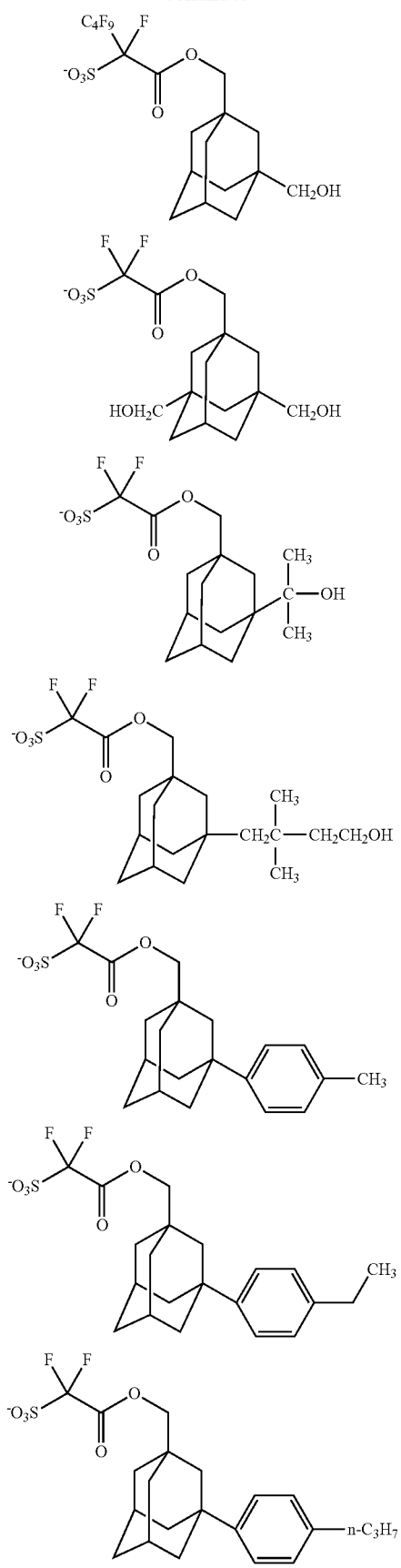
154
-continued
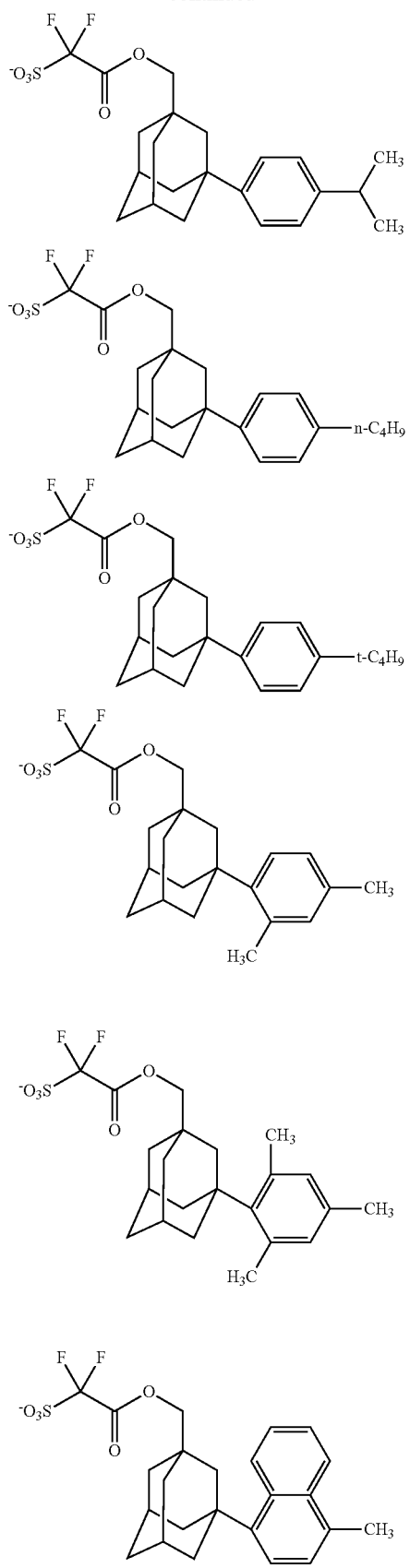

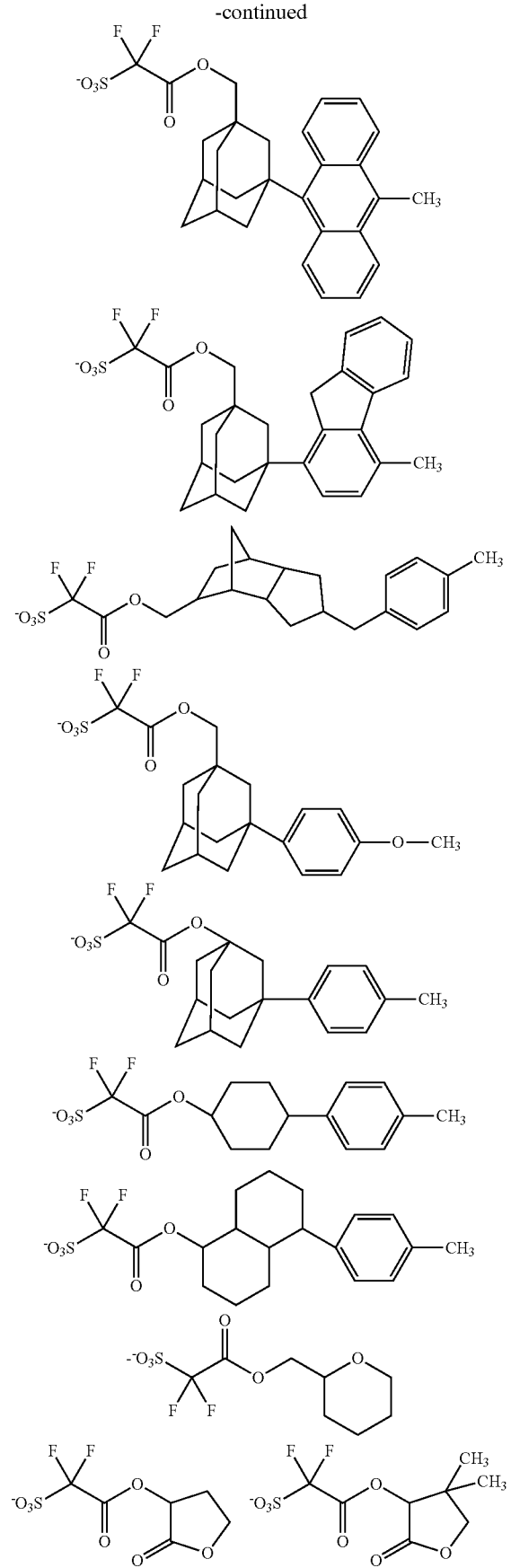
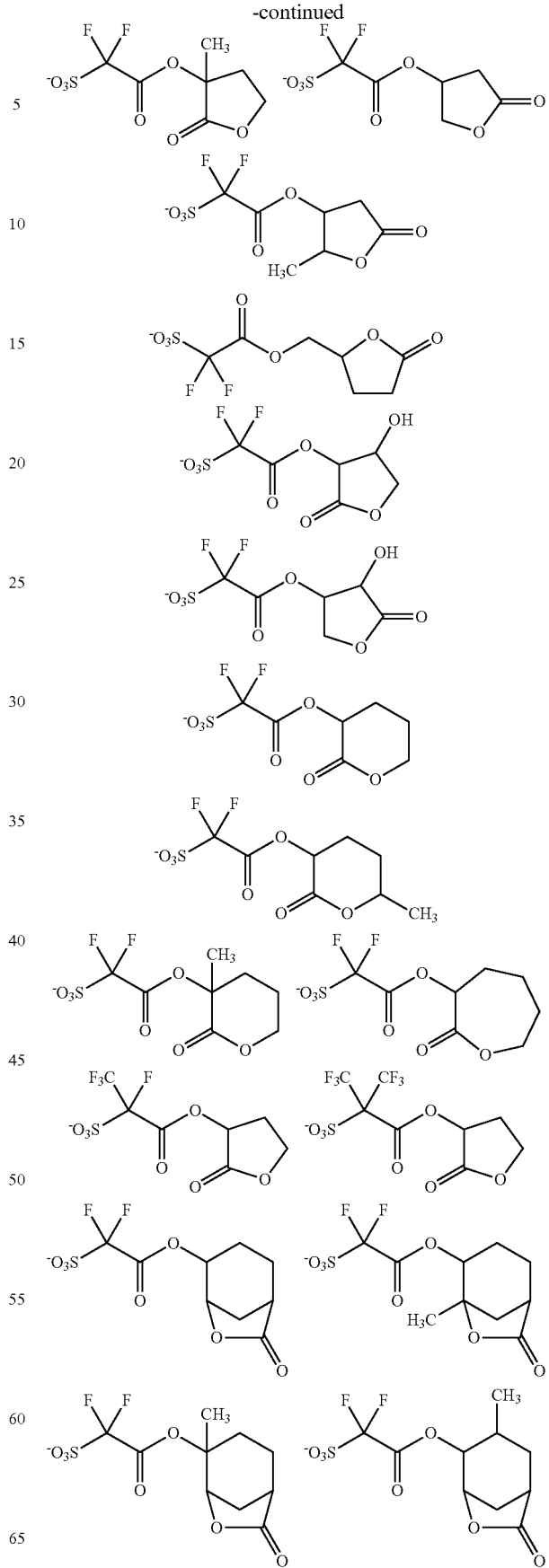

-continued
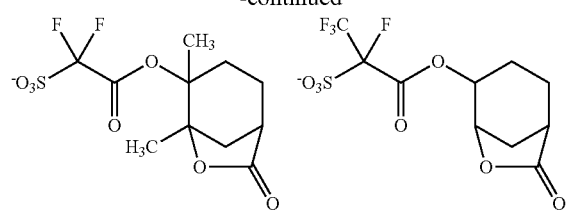
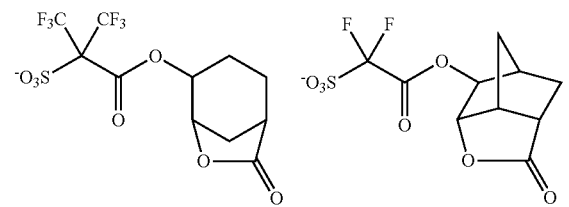
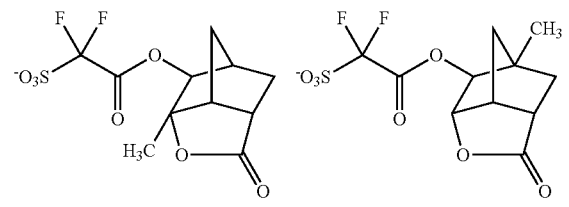
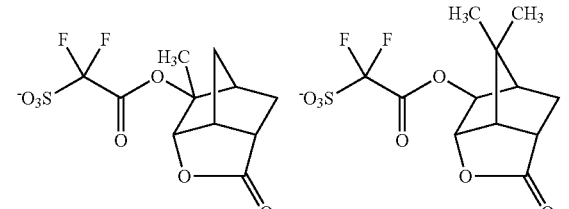
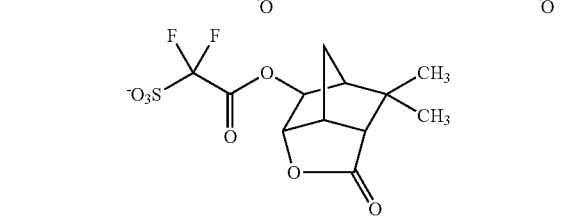
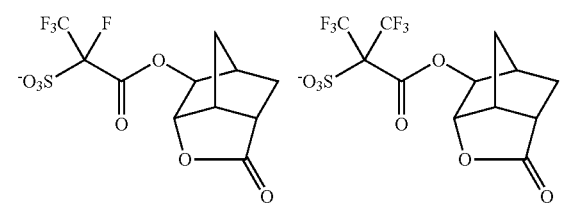
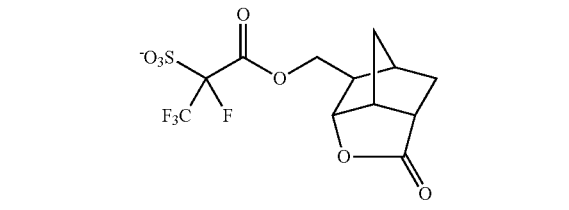
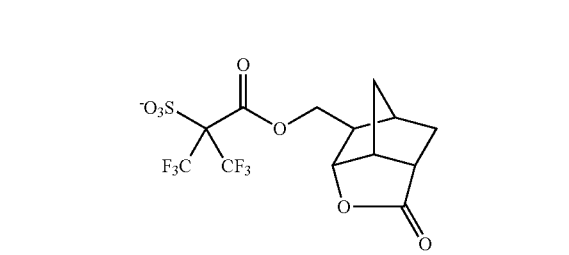
-continued
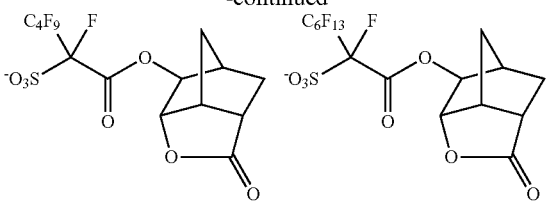
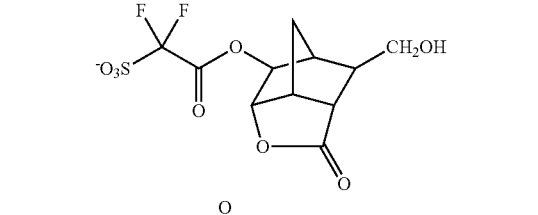
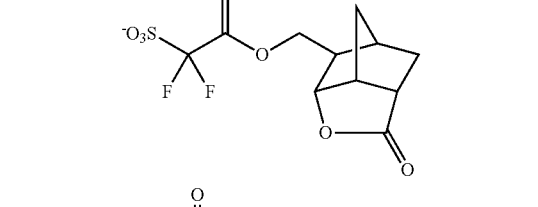
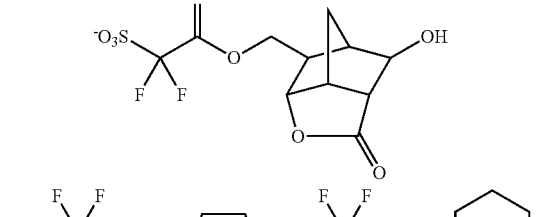
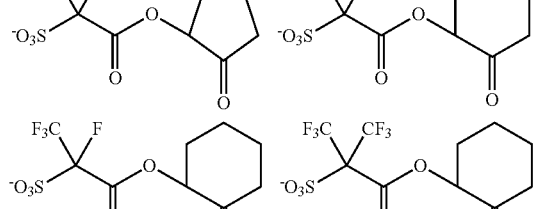
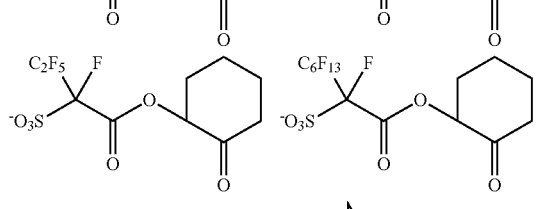
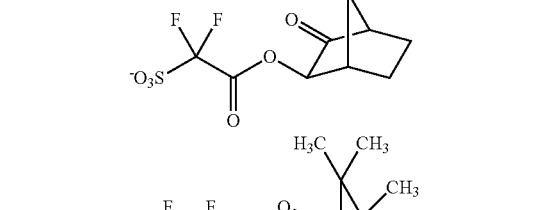
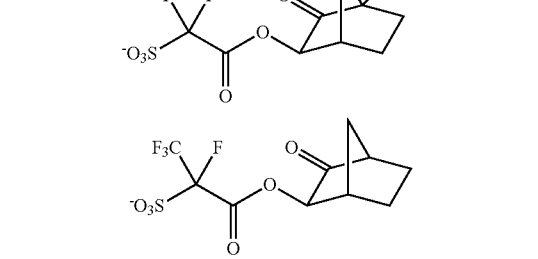

159
-continued
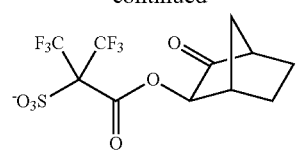
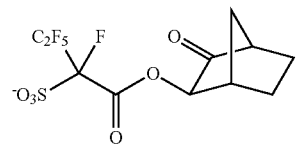
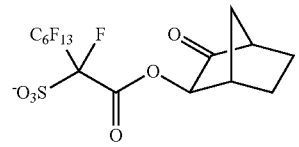
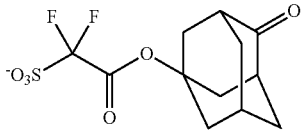
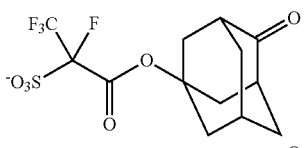
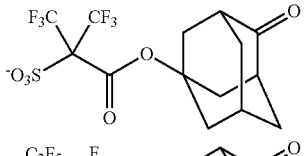
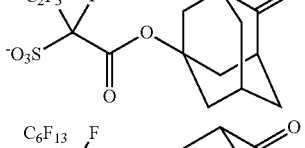
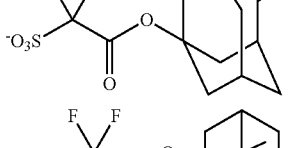
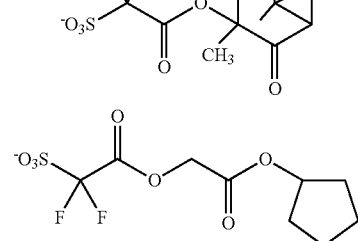
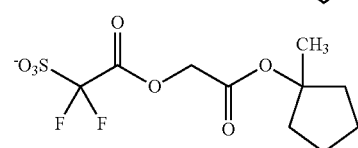
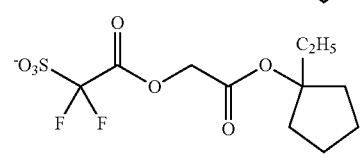
160
-continued
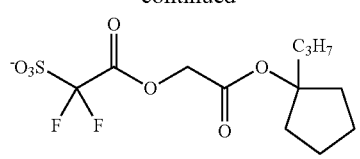
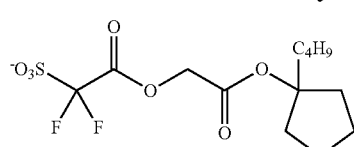
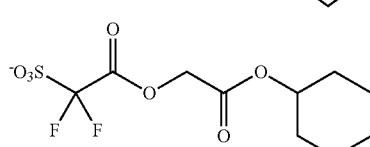
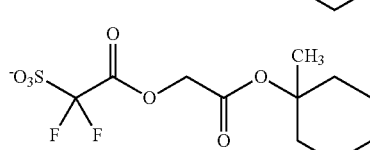
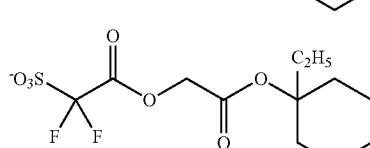
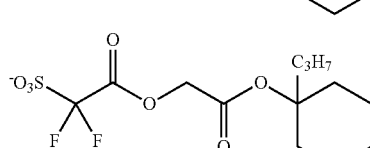
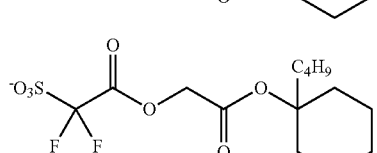
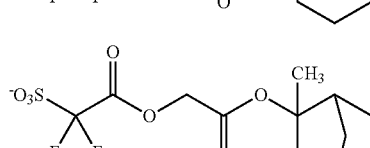
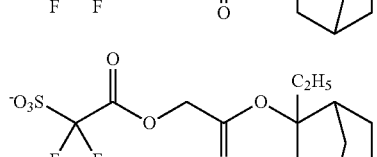
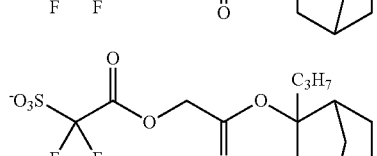
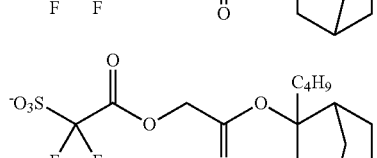

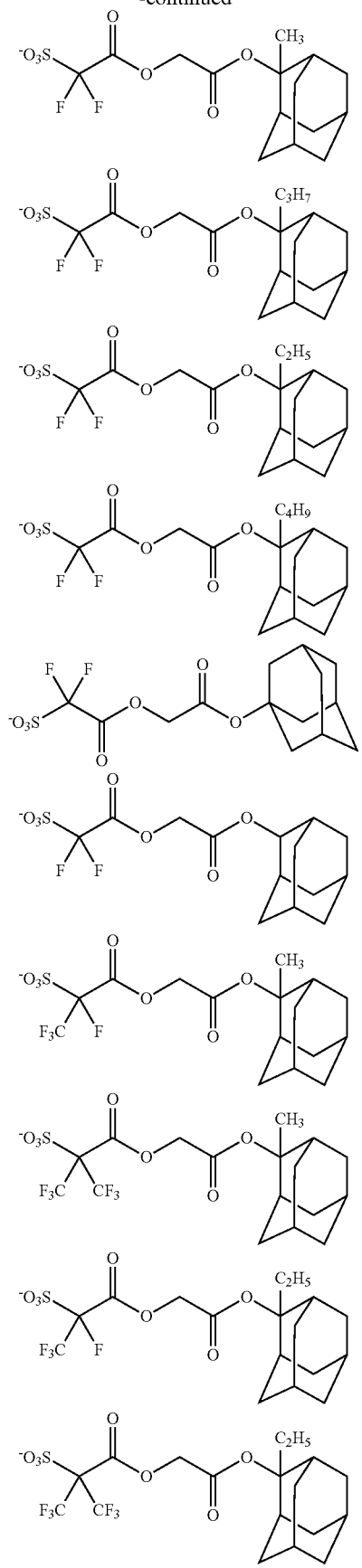
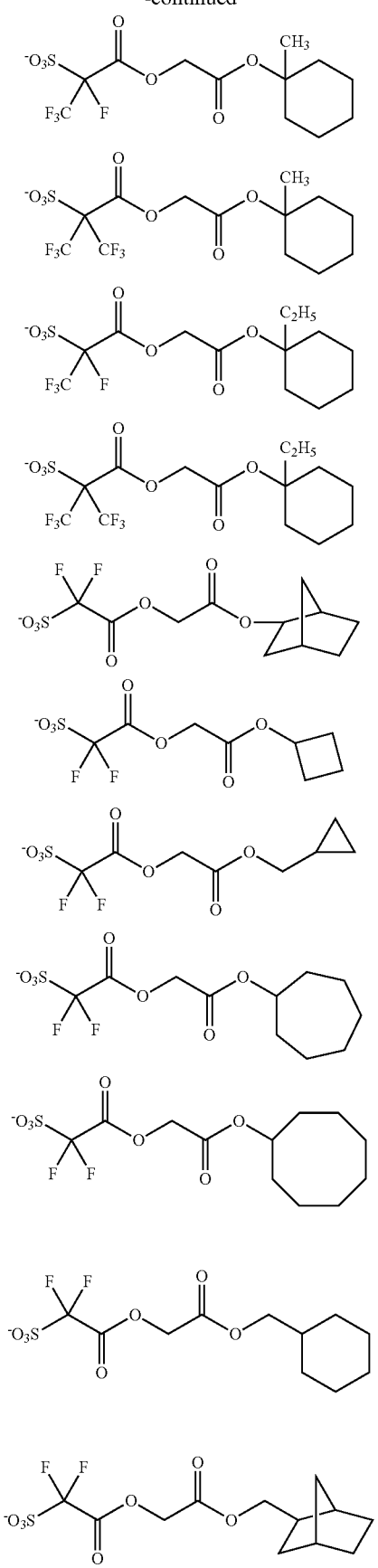

163
-continued
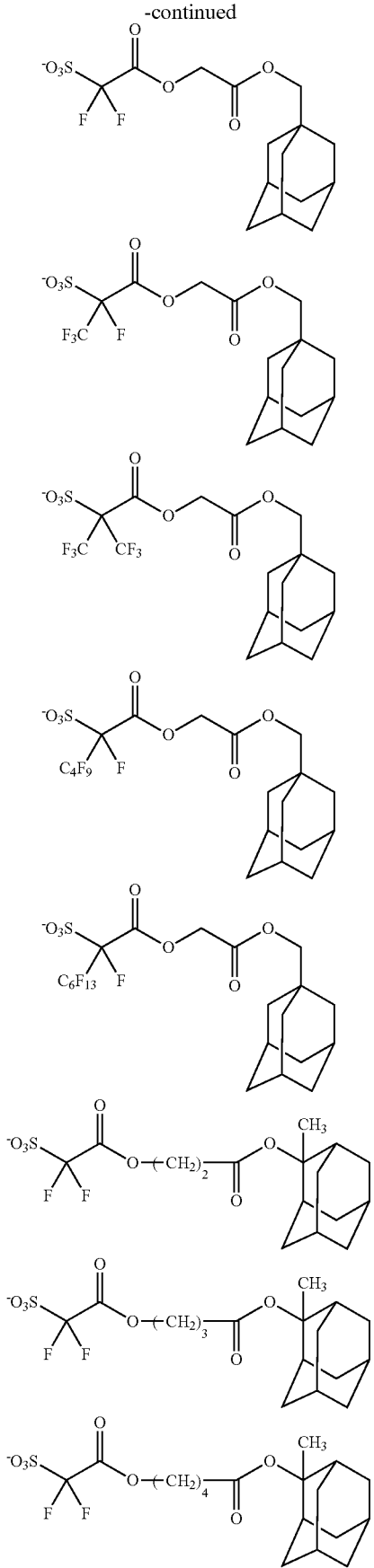
164
-continued
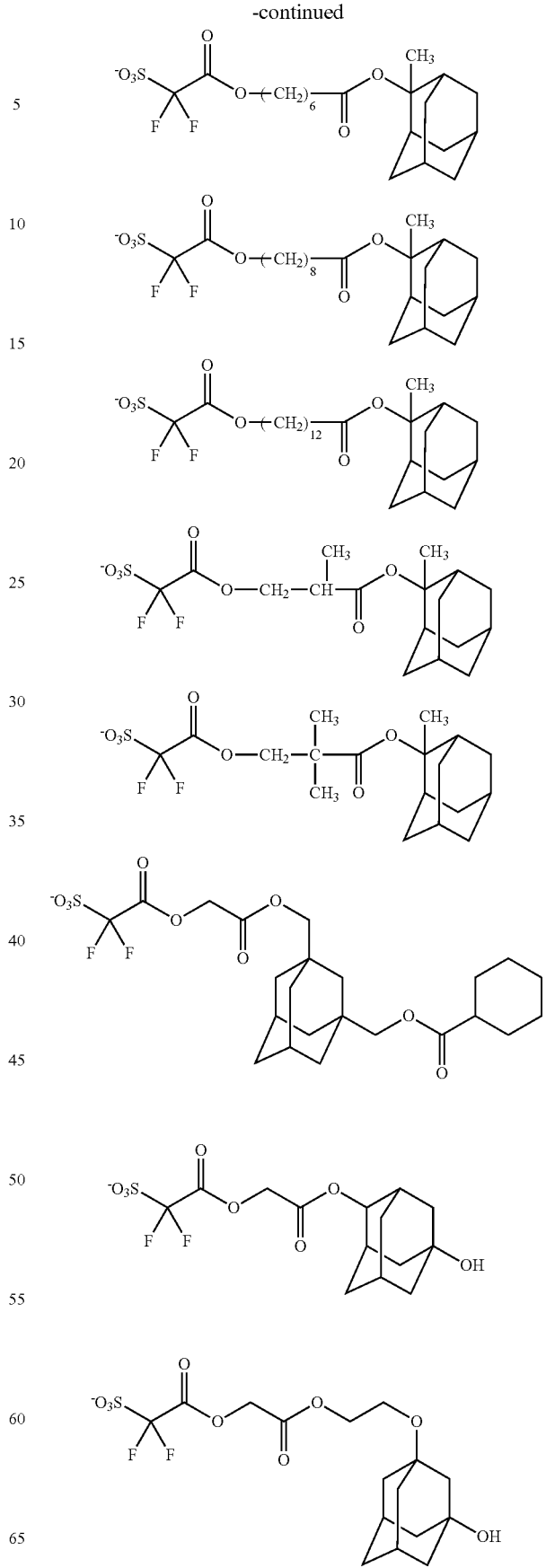

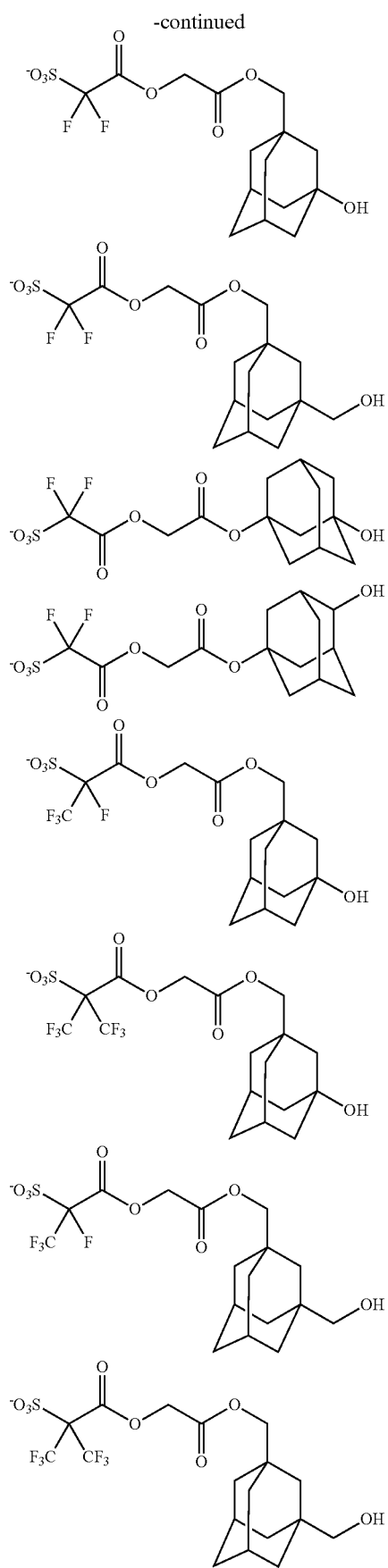
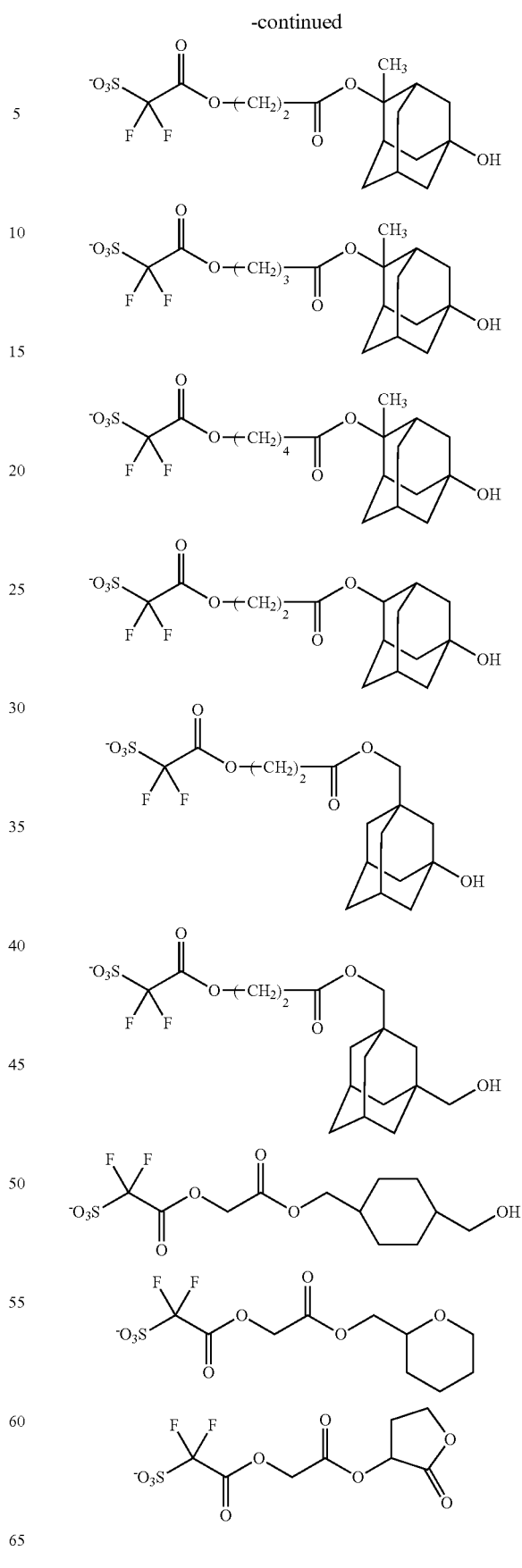

167
-continued
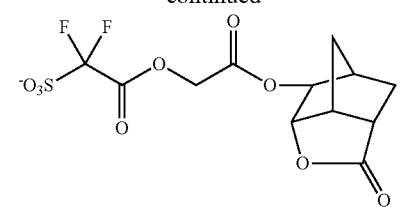
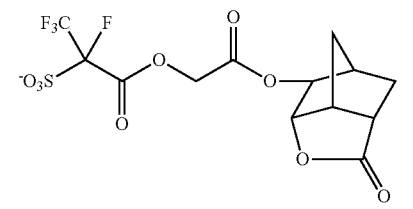
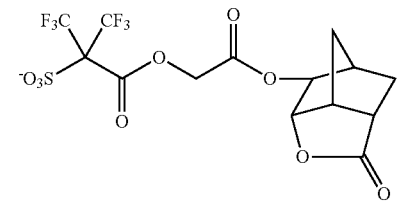
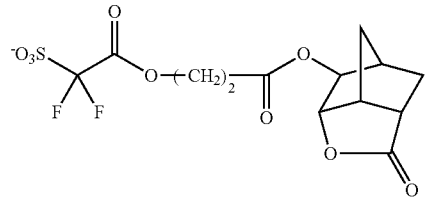
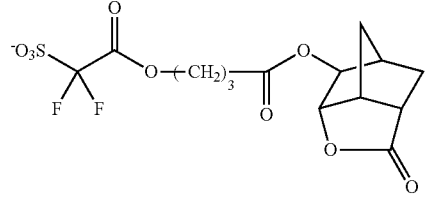
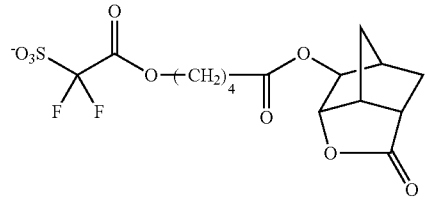
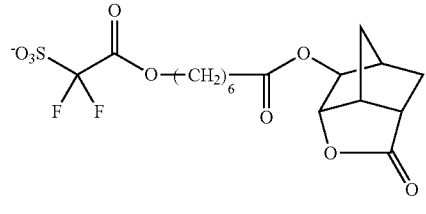
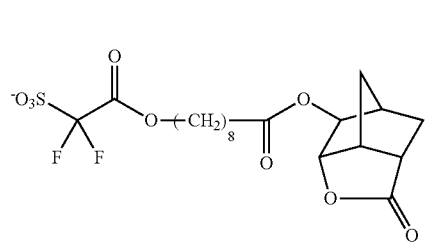
168
-continued
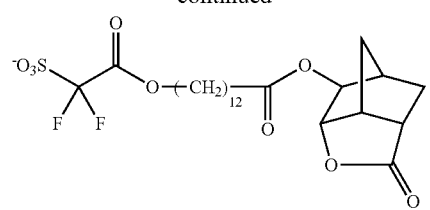
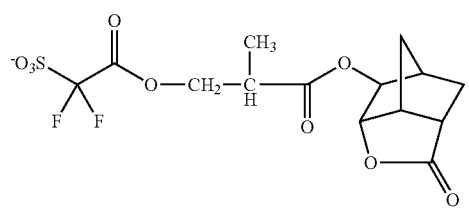
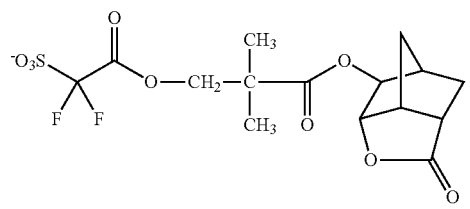
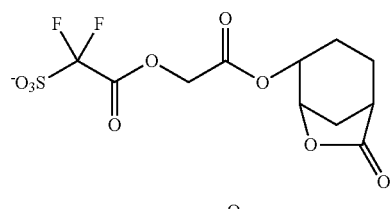
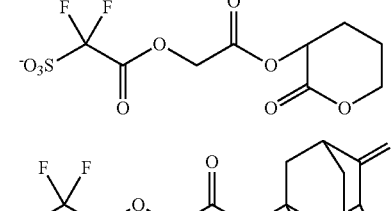
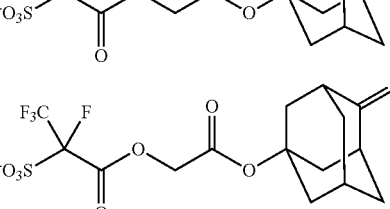
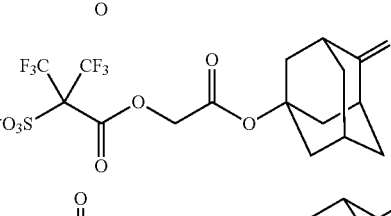
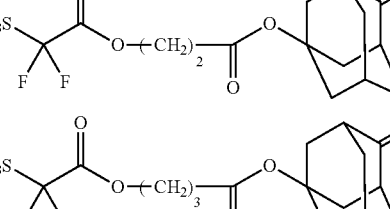

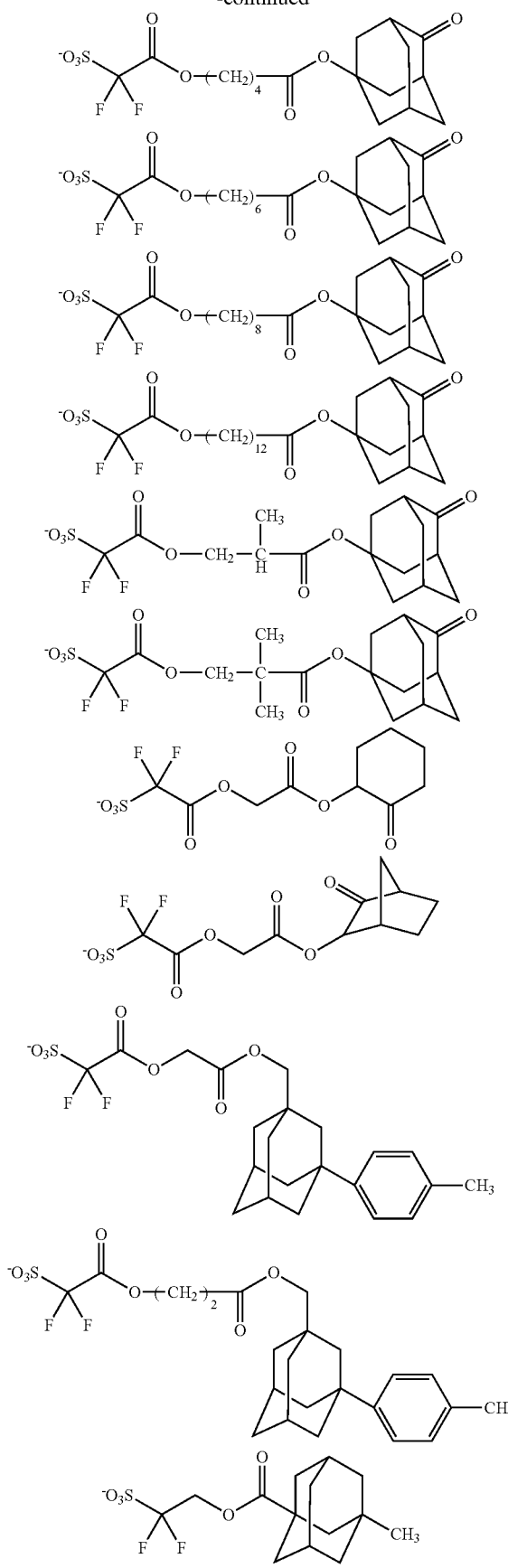
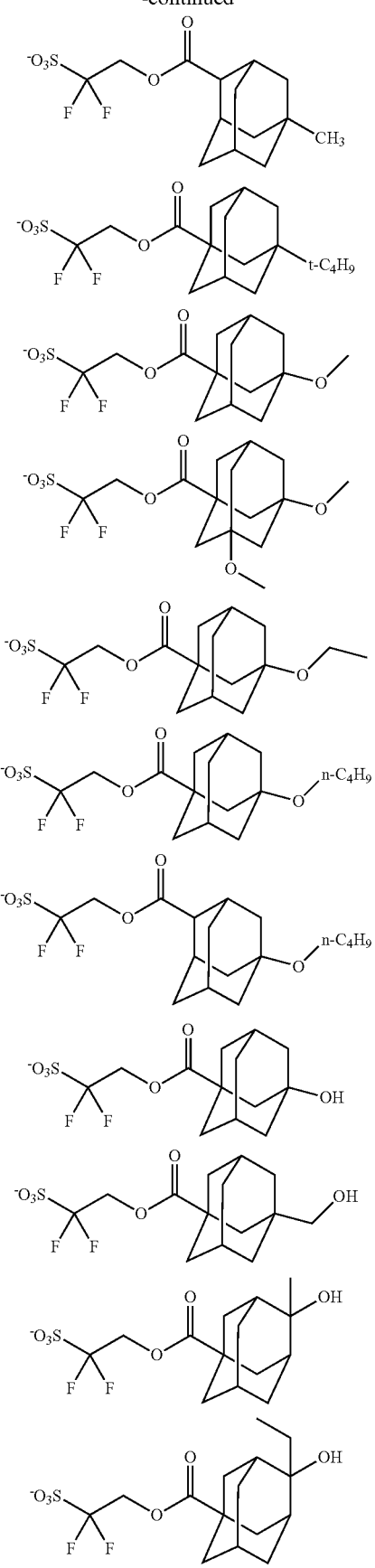

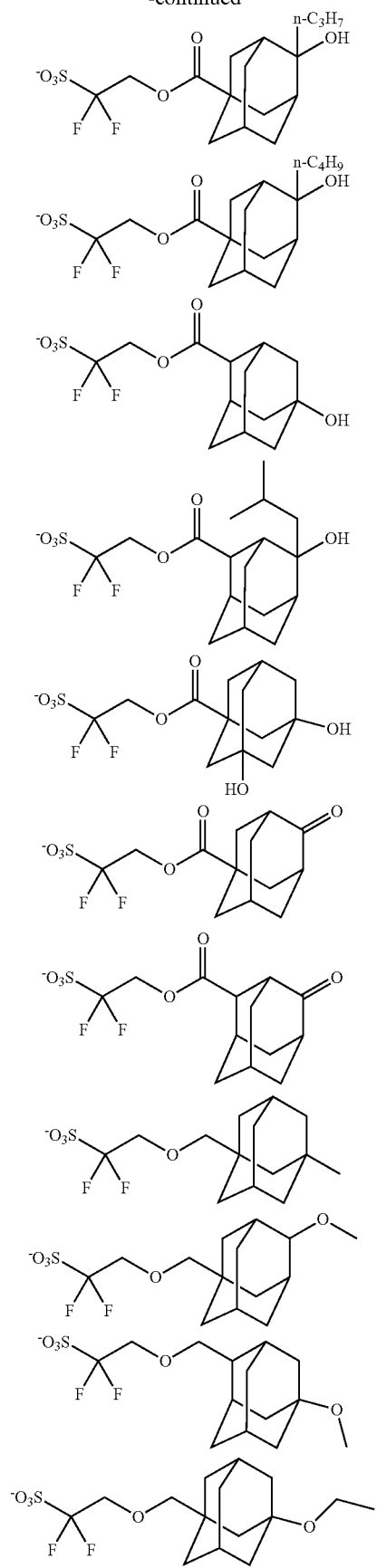
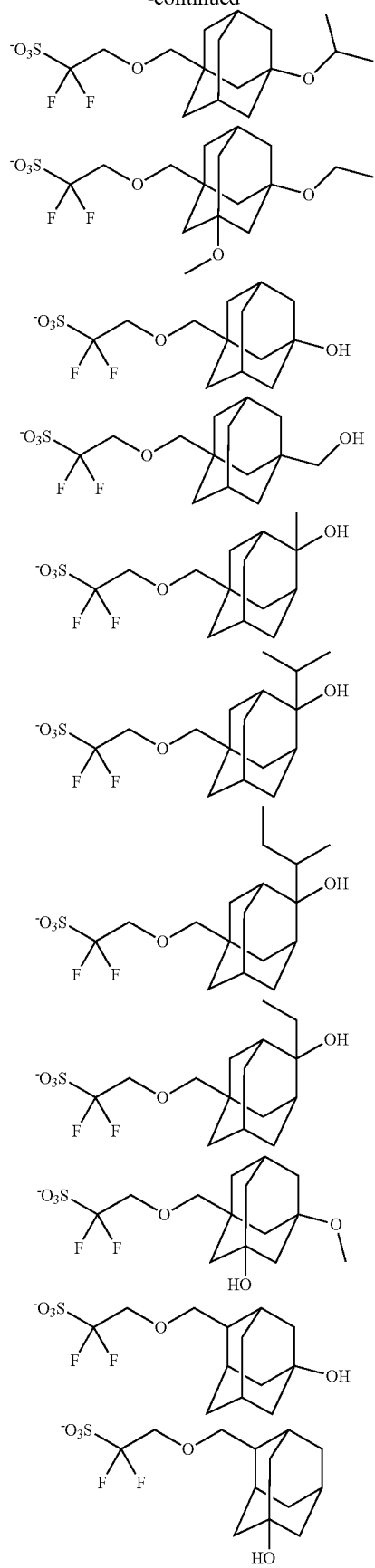

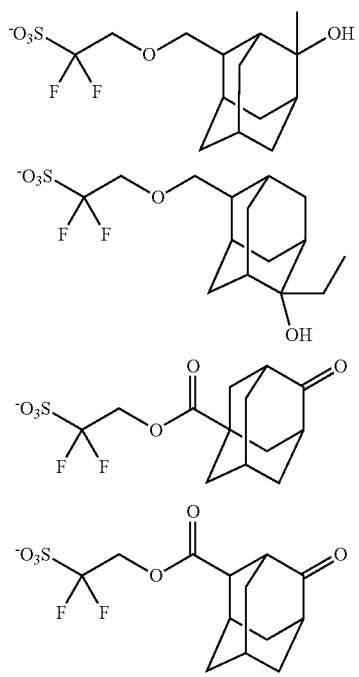

Among them, preferred are the following sulfonic anions.

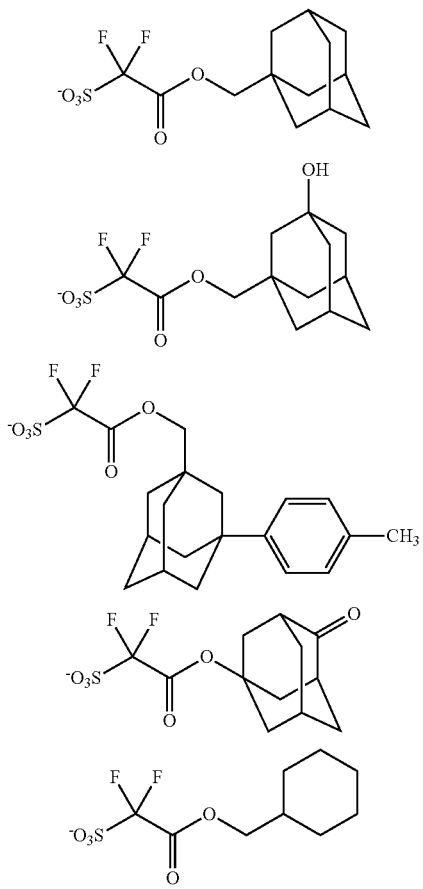

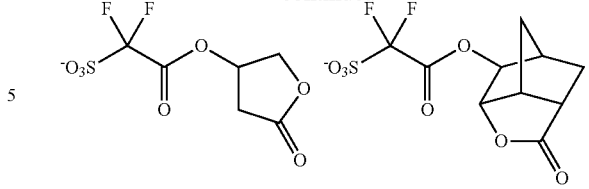

Examples of the cation part represented by $Z^+$ include an onium cation such as a sulfonium cation, an iodonium cation, an ammonium cation, a benzothiazolium cation and a phosphonium cation, and a sulfonium cation and an iodonium cation are preferable, and an arylsulfonium cation is more preferable.

Preferable examples of the cation part represented by $Z^+$ include the cations represented by the formulae (b2-1) to (b2-4):

 (b2-1)

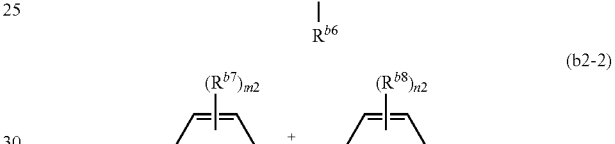 (b2-2)

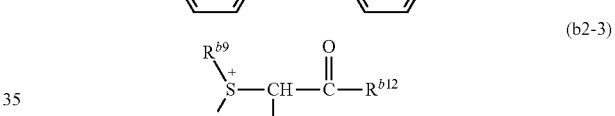 (b2-3)

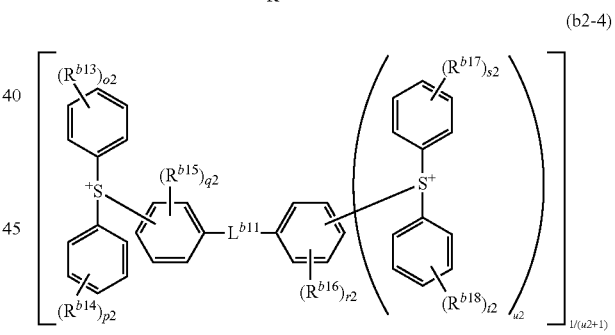 (b2-4)

wherein $R^{b4}$, $R^{b5}$ and $R^{b6}$ each independently represent a C1-C36 aliphatic hydrocarbon group which can have one or more substituents selected from the group consisting of a hydroxyl group, a C1-C12 alkoxy group and a C6-C18 aromatic hydrocarbon group, a C3-C36 saturated cyclic hydrocarbon group which can have one or more substituents selected from the group consisting of a halogen atom, a C2-C4 acyl group and a glycidyloxy group, or a C6-C18 aromatic hydrocarbon group which can have one or more substituents selected from the group consisting of a halogen atom, a hydroxyl group, a C1-C36 aliphatic hydrocarbon group, a C3-C36 saturated cyclic hydrocarbon group or a C1-C12 alkoxy group, $R^{b7}$ and $R^{b8}$ are independently in each occurrence a hydroxyl group, a C1-C12 aliphatic hydrocarbon group or a C1-C12 alkoxy group, m2 and n2 independently represents an integer of 0 to 5, $R^{b9}$ and $R^{b10}$ each independently represent a C1-C36 aliphatic hydrocarbon group or a C3-C36 saturated cyclic hydrocarbon group, or $R^{b9}$ and $R^{b10}$ are bonded to form a C2-C11 divalent acyclic hydrocarbon group which forms a ring together with the adjacent S+, and one or more —CH$_2$— in the divalent acyclic hydrocarbon group may be replaced by —CO—, —O— or —S—, and $R^{b11}$ represents a hydrogen atom, a C1-C36 aliphatic hydrocarbon group, a C3-C36 saturated cyclic hydrocarbon group or a C6-C18 aromatic hydrocarbon group, $R^{b12}$ represents a C1-C12 aliphatic hydrocarbon group, a C3-C18 saturated cyclic hydrocarbon group or a C6-C18 aromatic hydrocarbon group and the aromatic hydrocarbon group can have one or more substituents selected from the group consisting of a C1-C12 aliphatic hydrocarbon group, a C1-C12 alkoxy group, a C3-C18 saturated cyclic hydrocarbon group and an C2-C13 acyloxy group, or $R^{b11}$ and $R^{b12}$ are bonded each other to form a C1-C10 divalent acyclic hydrocarbon group which forms a 2-oxocycloalkyl group together with the adjacent —CHCO—, and one or more —CH$_2$— in the divalent acyclic hydrocarbon group may be replaced by —CO—, —O— or —S—, and $R^{b13}$, $R^{b14}$, $R^{b15}$, $R^{b16}$, $R^{b17}$ and $R^{b18}$ each independently represent a hydroxyl group, a C1-C12 aliphatic hydrocarbon group or a C1-C12 alkoxy group, $L^{b11}$ represents —S— or —O— and o2, p2, s2 and t2 each independently represents an integer of 0 to 5, q2 and r2 each independently represents an integer of 0 to 4, and u2 represents 0 or 1.

The aliphatic hydrocarbon group represented by $R^{b9}$ to $R^{b11}$ has preferably 1 to 12 carbon atoms. The saturated cyclic hydrocarbon group represented by $R^{b9}$ to $R^{b11}$ has preferably 3 to 18 carbon atoms and more preferably 4 to 12 carbon atoms.

Examples of the aliphatic hydrocarbon group and the aromatic hydrocarbon group include the same as described above. Preferable examples of the aliphatic hydrocarbon group include a methyl group, an ethyl group, a propyl group, an isopropyl group, a butyl group, a sec-butyl group, a tert-butyl group, a pentyl group, a hexyl group, an octyl group and a 2-ethylhexyl group. Preferable examples of the saturated cyclic hydrocarbon group include a cyclopropyl group, a cyclobutyl group, a cyclopentyl group, a cyclohexyl group, a cycloheptyl group, a cyclodecyl group, a 2-alkyl-a-adamantyl group, a 1-(1-adamantyl)-1-alkyl group and an isobornyl group. Preferable examples of the aromatic group include a phenyl group, a 4-methylphenyl group, a 4-ethylphenyl group, a 4-tert-butylphenyl group, a 4-cyclohexylphenyl group, a 4-methoxyphenyl group, a biphenyl group and a naphthyl group. Examples of the aliphatic hydrocarbon group having an aromatic hydrocarbon group include a benzyl group. Examples of the alkoxy group include a methoxy group, an ethoxy group, a propoxy group, an isopropoxy group, a butoxy group, a sec-butoxy group, a tert-butoxy group, a pentyloxy group, a hexyloxy group, a heptyloxy group, an octyloxy group, a 2-ethylhexyloxy group, a nonyloxy group, a decyloxy group, an undecyloxy group and a dodecyloxy group.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent S+ and the divalent acyclic hydrocarbon group include a thiolan-1-ium ring (tetrahydrothiphenium ring), a thian-1-ium ring and a 1,4-oxathian-4-ium ring. A C3-C7 divalent acyclic hydrocarbon group is preferable.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group and examples of the ring group include the followings.

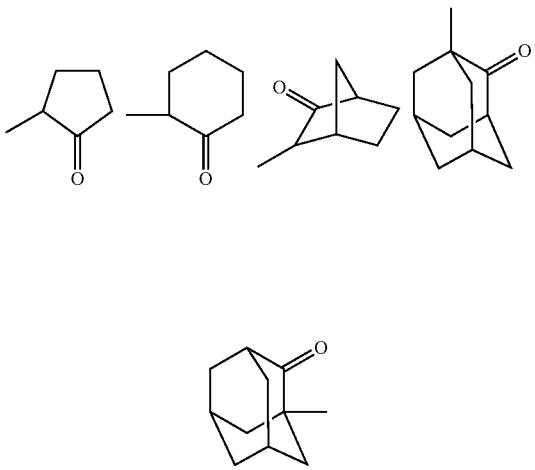

Among the above-mentioned cations, the cation represented by the formula (b2-1) is preferable, and the cation represented by the formula (b2-1-1) is more preferable and a triphenylsulfonium cation is especially preferable.

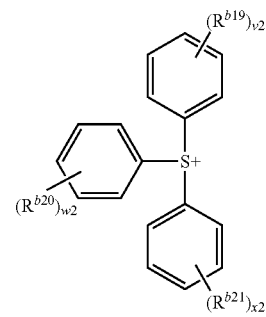

(b2-1-1)

wherein $R^{b19}$, $R^{b20}$ and $R^{b21}$ are independently in each occurrence a hydroxyl group, a C1-C36 aliphatic hydrocarbon group, a C3-C36 saturated cyclic hydrocarbon group or a C1-C12 alkoxy group, and one or more hydrogen atoms in the aliphatic hydrocarbon group can be replaced by a hydroxyl group, a C1-C12 alkoxy group or a C6-C18 aromatic hydrocarbon group, one or more hydrogen atoms of the saturated cyclic hydrocarbon group can be replaced by a halogen atom, a C2-C4 acyl group or a glycidyloxy group, and v2, w2 and x2 independently each represent an integer of 0 to 5. The aliphatic hydrocarbon group preferably has 1 to 12 carbon atoms, and the saturated cyclic hydrocarbon group preferably has 4 to 36 carbon atoms, and it is preferred that v2, w2 and x2 independently each represent 0 or 1. It is preferred that $R^{b19}$, $R^{b20}$ and $R^{b21}$ are independently halogen atom (preferably a fluorine atom), a hydroxyl group, a C1-C12 alkyl group or a C1-C12 alkoxy group.

Examples of the cation represented by the formula (b2-1) include the followings.

-continued
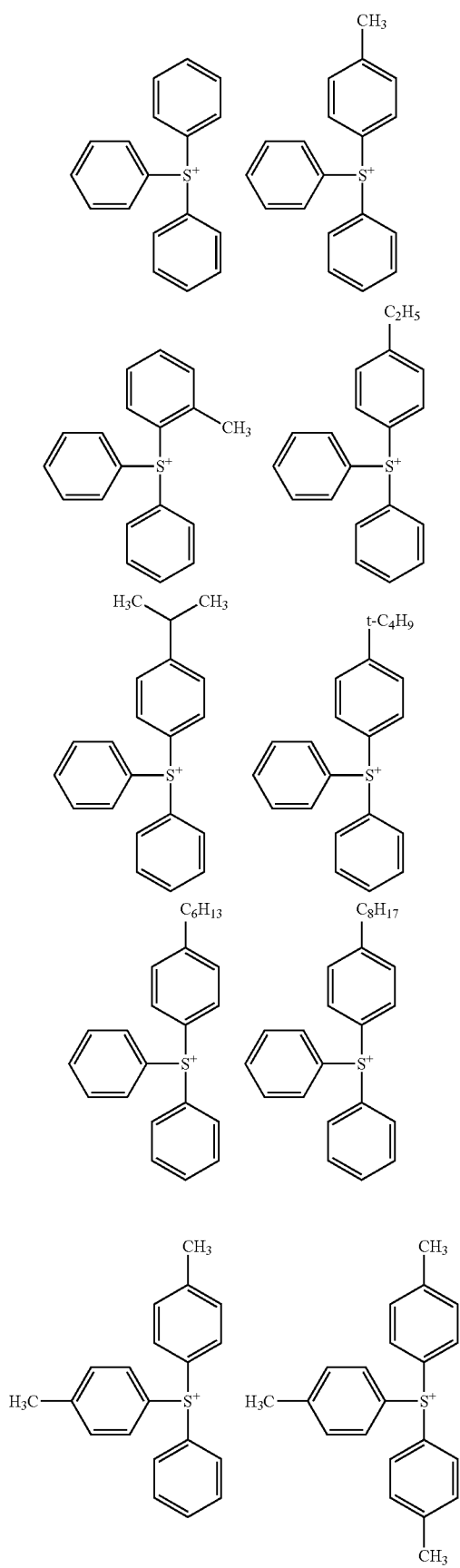
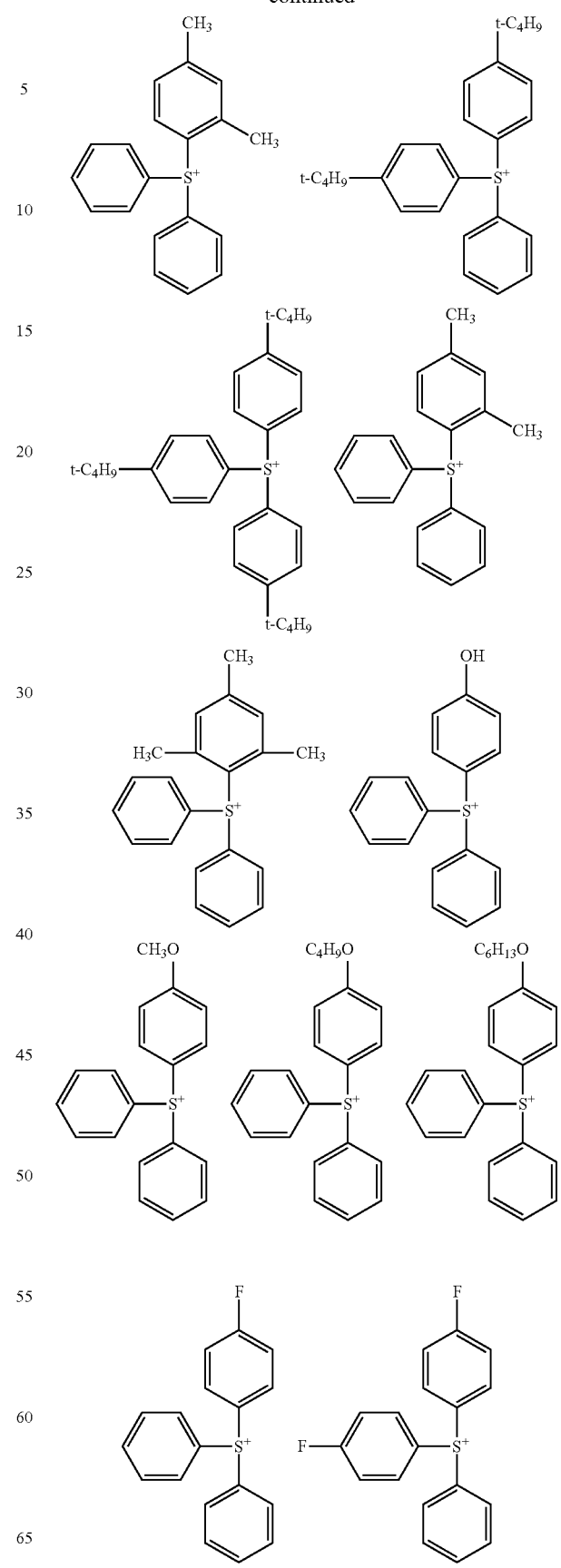

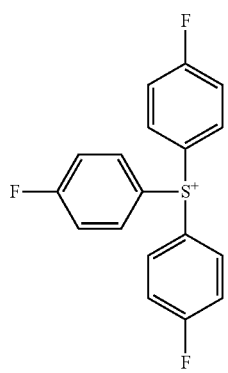 [SMILES: Fc1ccc([S+](c2ccc(F)cc2)c2ccc(F)cc2)cc1]
Examples of the cation represented by the formula (b2-2) include the followings.
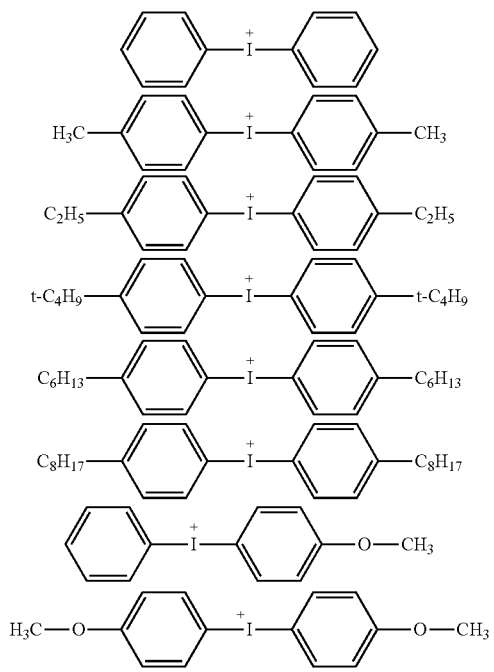
Examples of the cation represented by the formula (b2-3) include the followings.
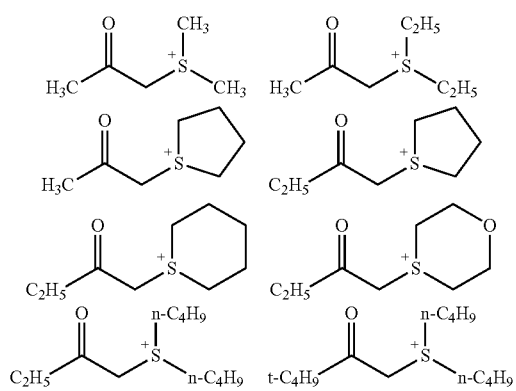
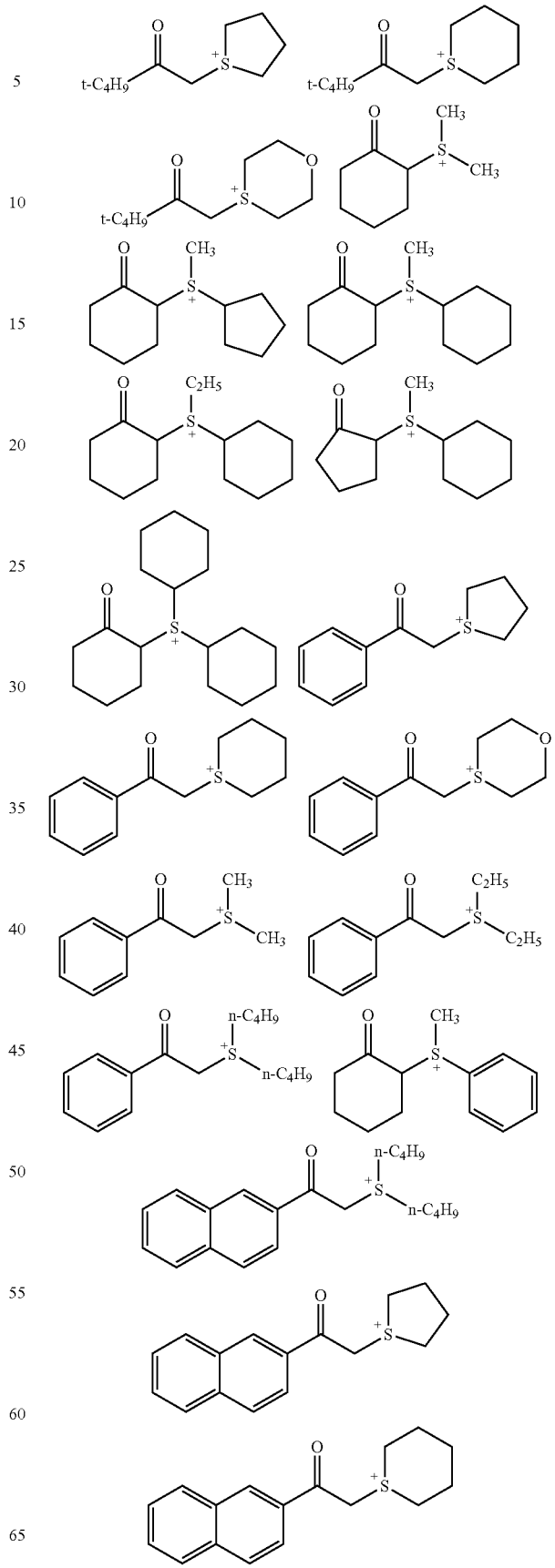

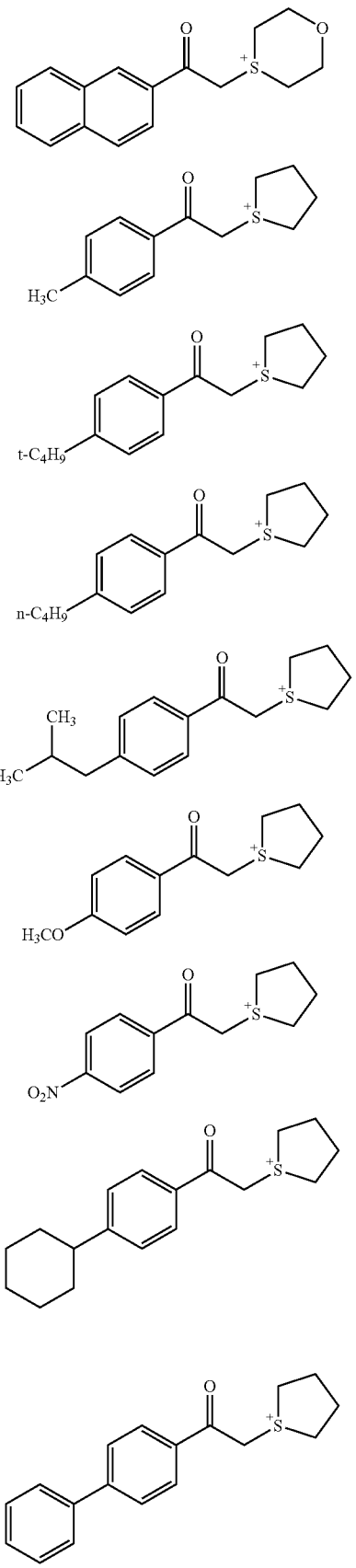
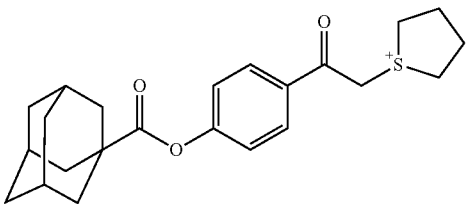
Examples of the cation represented by the formula (b2-4) include the followings.
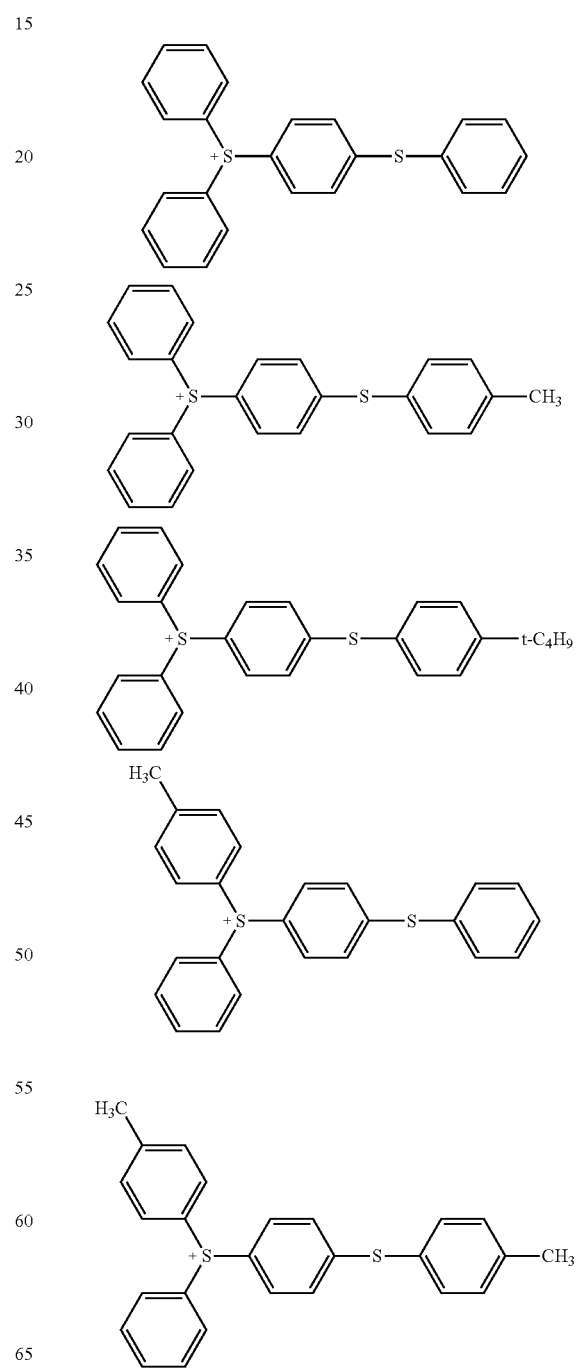

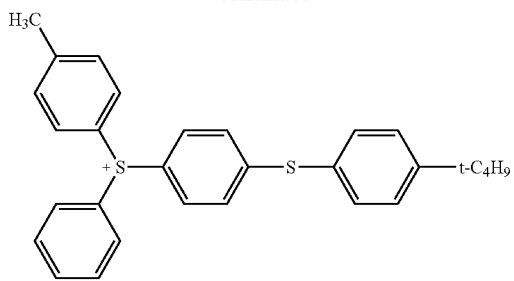
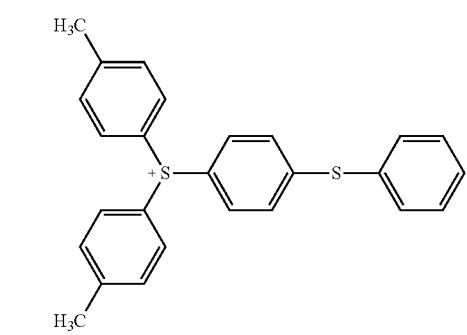
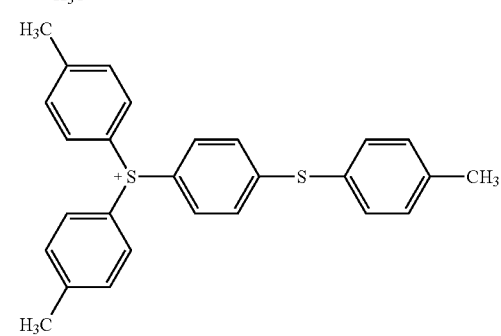
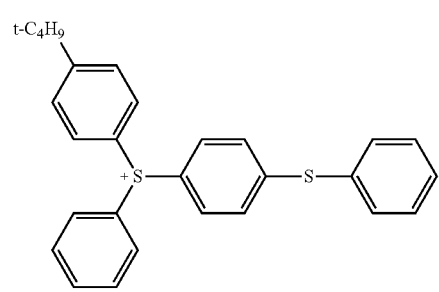
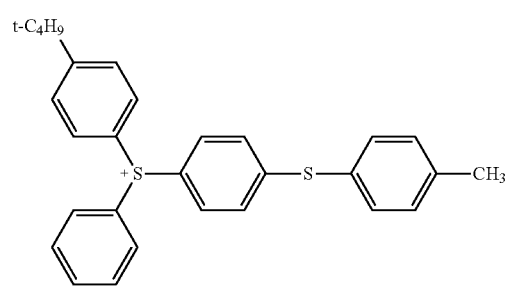
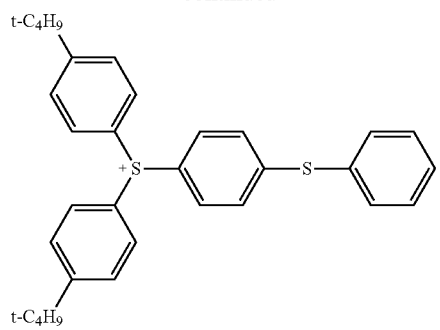
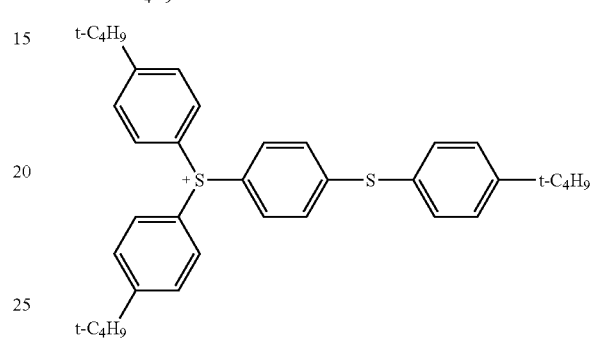
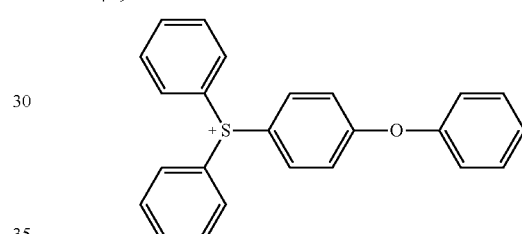
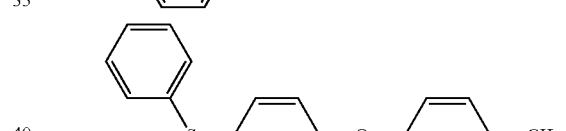
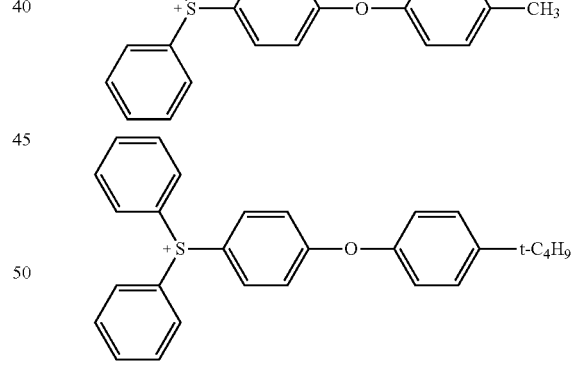
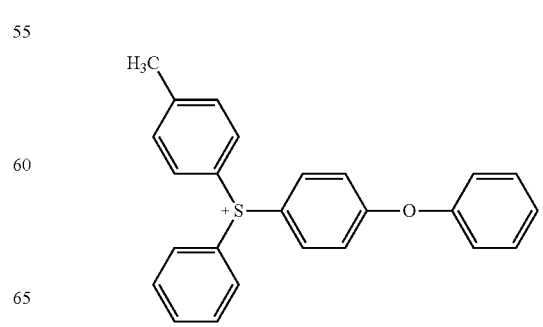

-continued
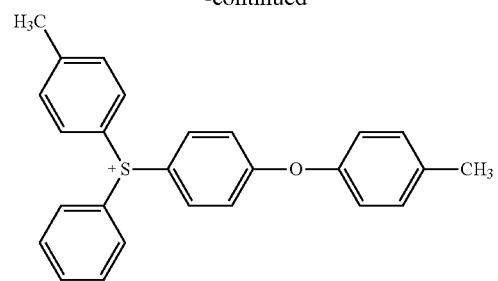
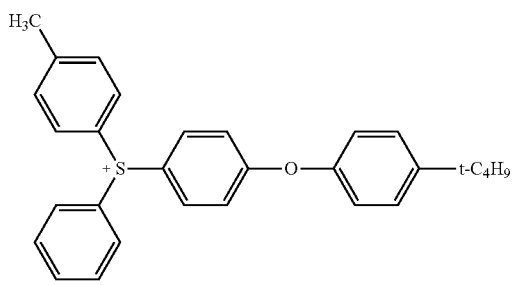
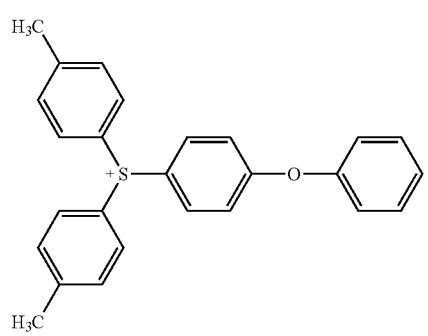
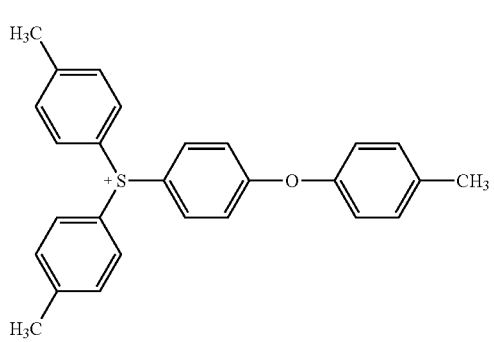
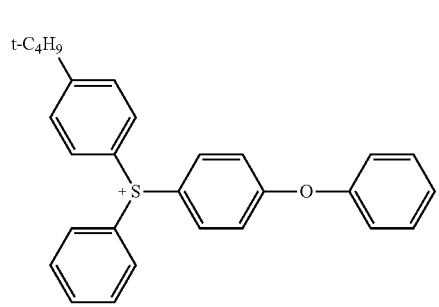
-continued
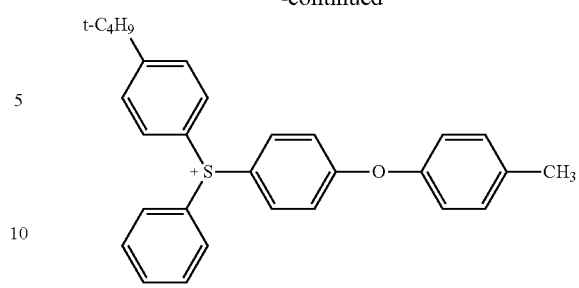
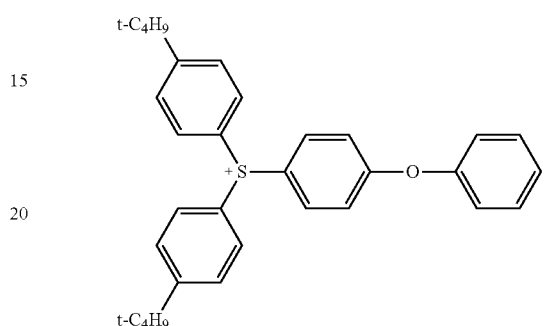
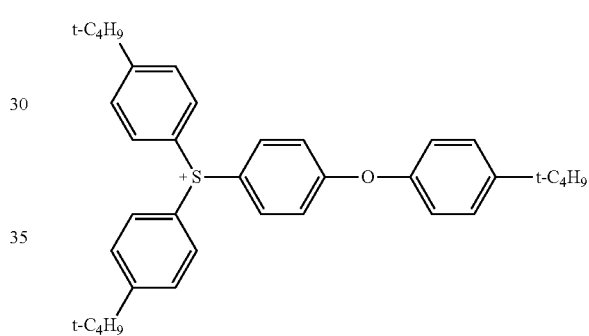
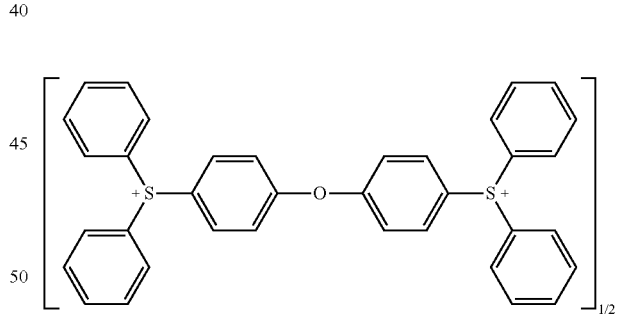
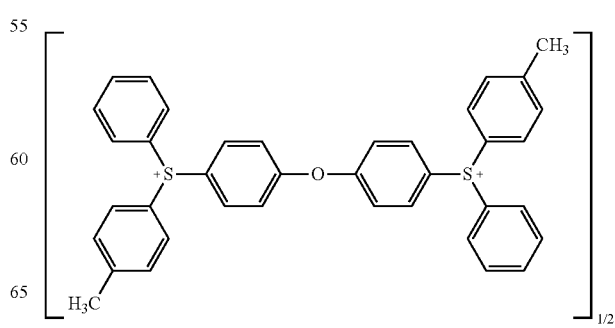

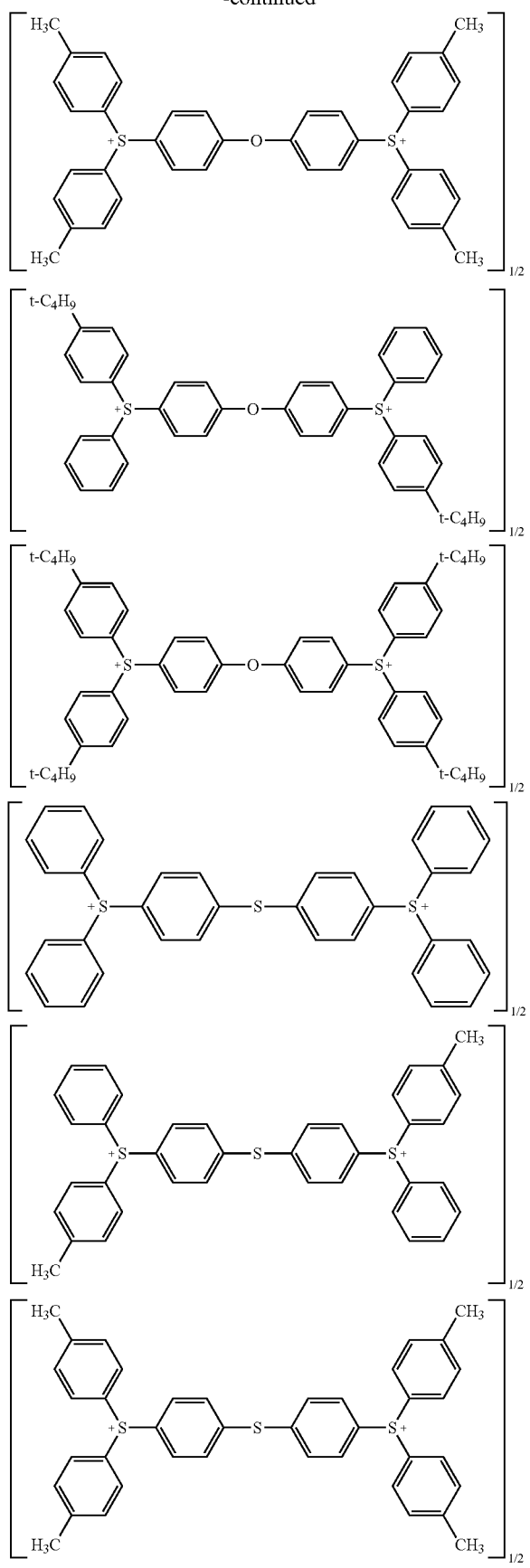

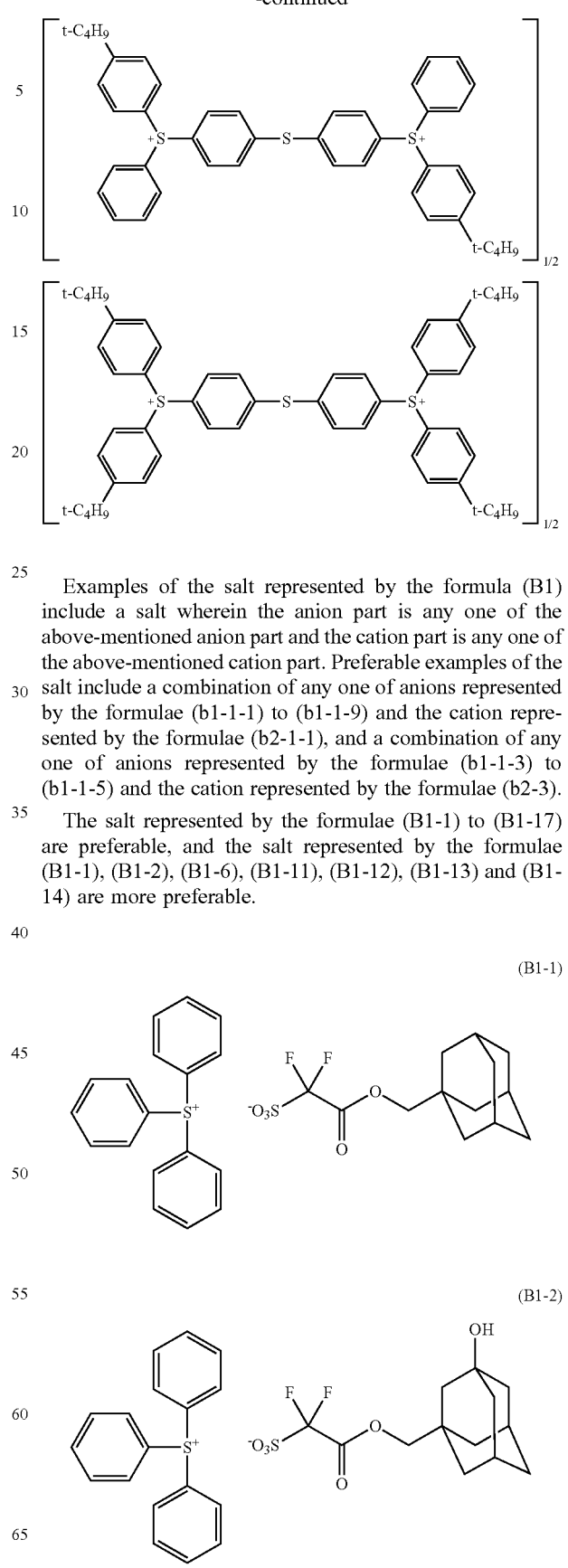

Examples of the salt represented by the formula (B1) include a salt wherein the anion part is any one of the above-mentioned anion part and the cation part is any one of the above-mentioned cation part. Preferable examples of the salt include a combination of any one of anions represented by the formulae (b1-1-1) to (b1-1-9) and the cation represented by the formulae (b2-1-1), and a combination of any one of anions represented by the formulae (b1-1-3) to (b1-1-5) and the cation represented by the formulae (b2-3).

The salt represented by the formulae (B1-1) to (B1-17) are preferable, and the salt represented by the formulae (B1-1), (B1-2), (B1-6), (B1-11), (B1-12), (B1-13) and (B1-14) are more preferable.

-continued
(B1-3)
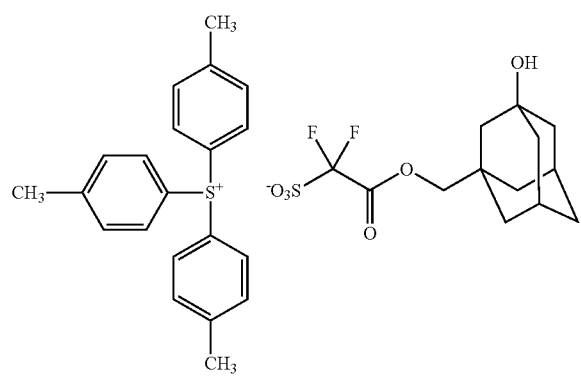
(B1-4)
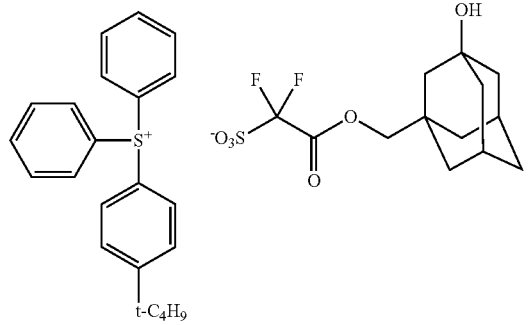
(B1-5)
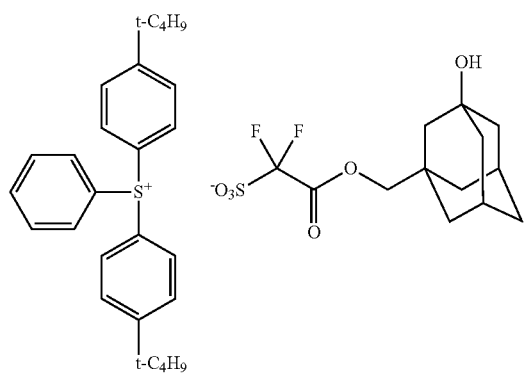
(B1-6)
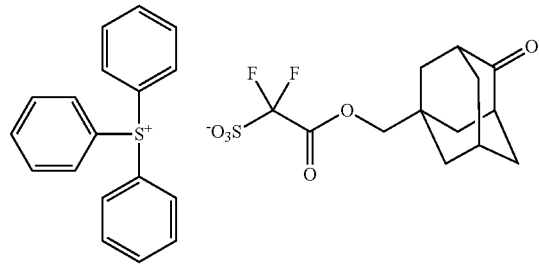
-continued
(B1-7)
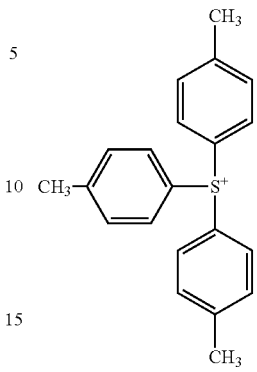
(B1-8)
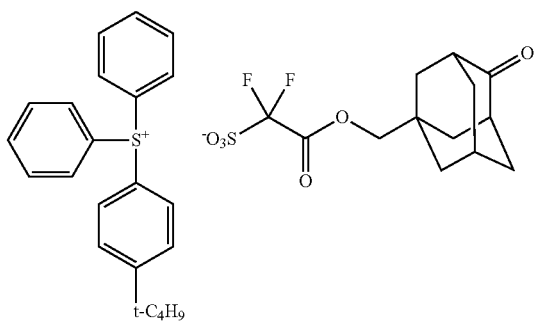
(B1-9)
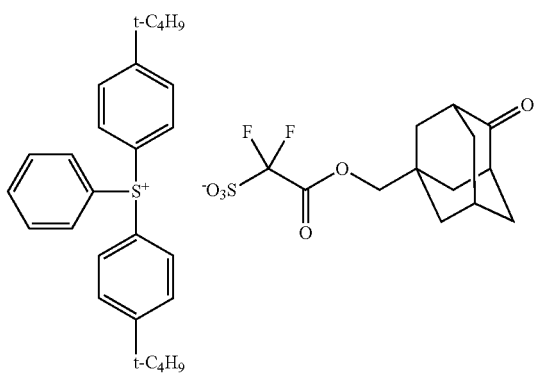
(B1-10)
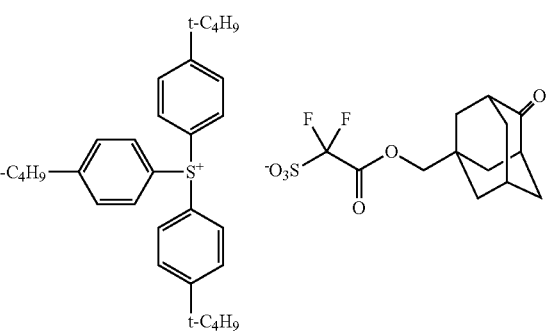

-continued (B1-11)
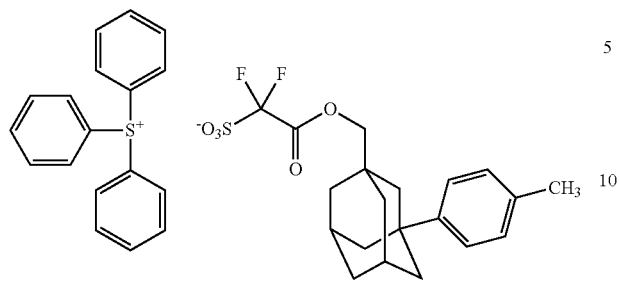

(B1-12)
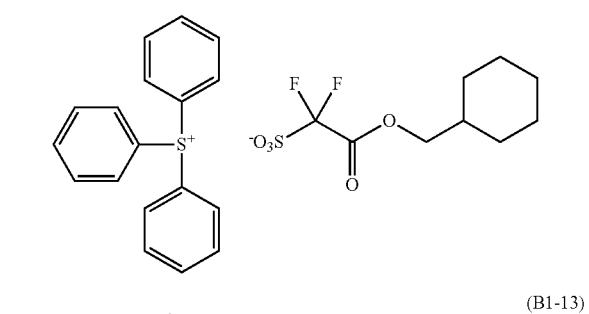

(B1-13)

(B1-14)

(B1-15)
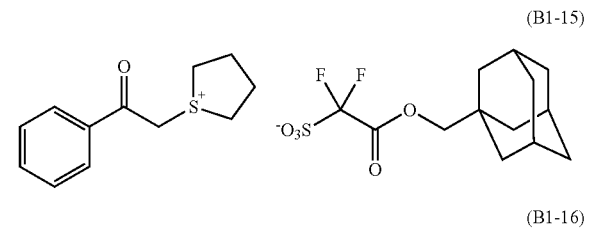

(B1-16)
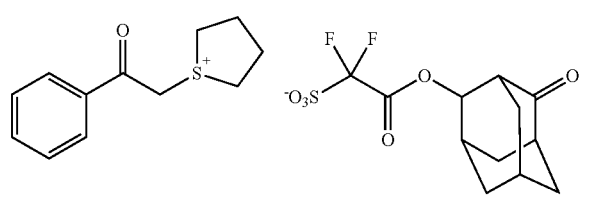

-continued (B1-17)
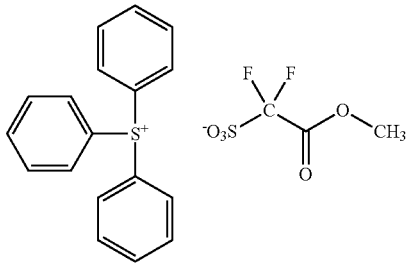

Two or more kinds of the acid generator can be used in combination.

The content of the acid generator is preferably 1 part by weight or more and more preferably 3 parts by weight or more per 100 parts by weight of the resin. The content of the acid generator is preferably 30 parts by weight or less and more preferably 25 parts by weight or less per 100 parts by weight of the resin.

The photoresist composition of the present invention usually includes 80% by weight or more of the solid component. In this specification, "solid component" means components other than solvent in the photoresist composition.

The photoresist composition of the present invention can contain two or more kinds of a basic compound as a quencher. Performance deterioration caused by inactivation of acid which occurs due to post exposure delay can be diminished by adding the basic compound as a quencher to the photoresist composition. The content of the basic compound is usually 0.01 to 1% by weight based on amount of solid component.

The basic compound is preferably a basic nitrogen-containing organic compound, and examples thereof include an amine compound such as an aliphatic amine and an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Preferable examples thereof include an aromatic amine represented by the formula (C2):

(C2)

wherein $Ar^{c1}$ represents an aromatic hydrocarbon group, and $R^{c5}$ and $R^{c6}$ each independently represent a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group.

The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms.

As the aromatic amine represented by the formula (C2), an amine represented by the formula (C2-1):

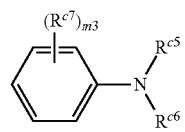
(C2-1)

wherein $R^{c5}$ and $R^{c6}$ are the same as defined above, and $R^{c7}$ is independently in each occurrence an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and m3 represents an integer of 0 to 3, is preferable. The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms. The alkoxy group preferably has 1 to 6 carbon atoms.

Examples of the aromatic amine represented by the formula (C2) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, and diphenylamine, and among them, preferred is diisopropylaniline and more preferred is 2,6-diisopropylaniline. Examples of the ammonium salt represented by the formula (C2-2) include tetramethylammonium hydroxide and tetrabutylammonium hydroxide.

Other examples of the basic compound include amines represented by the formulae (C3) to (C11):

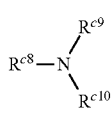
(C3)

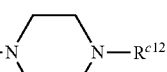
(C4)

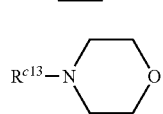
(C5)

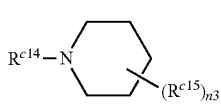
(C6)

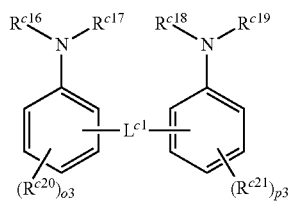
(C7)

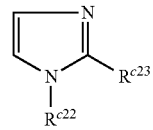
(C8)

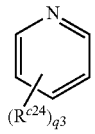
(C9)

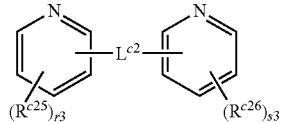
(C10)

(C11)

wherein $R^{c8}$, $R^{c20}$, $R^{c21}$, and $R^{c23}$ to $R^{c28}$ each independently represent an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c9}$, $R^{c10}$, $R^{c11}$ to $R^{c14}$, $R^{c16}$ to $R^{c19}$, and $R^{c22}$ each independently represents a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c15}$ is independently in each occurrence an aliphatic hydrocarbon group, a saturated cyclic hydrocarbon group or an alkanoyl group, $L^{c1}$ and $L^{c2}$ each independently represents a divalent aliphatic hydrocarbon group, —CO—, —C(=NH)—, —C(=NR$^{c3}$)—, —S—, —S—S— or a combination thereof and $R^{c3}$ represents a C1-C4 alkyl group, O3 to u3 each independently represents an integer of 0 to 3 and n3 represents an integer of 0 to 8.

The aliphatic hydrocarbon group has preferably 1 to 6 carbon atoms, and the saturated cyclic hydrocarbon group has preferably 3 to 6 carbon atoms, and the alkanoyl group has preferably 2 to 6 carbon atoms, and the divalent aliphatic hydrocarbon group has preferably 1 to 6 carbon atoms. The divalent aliphatic hydrocarbon group is preferably an alkylene group.

Examples of the amine represented by the formula (C3) include hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Examples of the amine represented by the formula (C4) include piperazine. Examples of the amine represented by the formula (C5) include morpholine. Examples of the amine represented by the formula (C6) include piperidine and hindered amine compounds having a piperidine skeleton as disclosed in JP 11-52575 A. Examples of the amine represented by the formula (C7) include 2,2'-methylenebisaniline. Examples of the amine represented by the formula (C8) include imidazole and 4-methylimidazole. Examples of the amine represented by the formula (C9) include pyridine and 4-methylpyridine. Examples of the amine represented by the formula (C10) include di-2-pyridyl ketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine and 2,2'-dipicolylamine. Examples of the amine represented by the formula (C11) include bipyridine.

The photoresist composition of the present invention usually contains one or more solvents. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 90% by weight or more, preferably 92% by weight or more preferably 94% by weight or more based on total amount of the photoresist composition of the present invention. The amount of the solvent is usually 99.9% by weight or less and preferably 99% by weight or less based on total amount of the photoresist composition of the present invention.

The photoresist composition of the present invention can contain, if necessary, a small amount of various additives such as a sensitizer, a dissolution inhibitor, other polymers, a surfactant, a stabilizer and a dye as long as the effect of the present invention is not prevented.

The photoresist composition of the present invention is useful for a chemically amplified photoresist composition.

A photoresist pattern can be produced by the following steps (1) to (5):

(1) a step of applying the photoresist composition of the present invention on a substrate, (2) a step of forming a photoresist film by conducting drying, (3) a step of exposing the photoresist film to radiation, (4) a step of baking the exposed photoresist film, and (5) a step of developing the baked photoresist film with an alkaline developer, thereby forming a photoresist pattern.

The applying of the photoresist composition on a substrate is usually conducted using a conventional apparatus such as spin coater. The photoresist composition is preferably filtrated with filter having 0.2 μm of a pore size before applying. Examples of the substrate include a silicon wafer or a quartz wafer on which a sensor, a circuit, a transistor or the like is formed.

The formation of the photoresist film is usually conducted using a heating apparatus such as hot plate or a decompressor, and the heating temperature is usually 50 to 200° C., and the operation pressure is usually 1 to $1.0*10^5$ Pa.

The photoresist film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a $F_2$ laser (wavelength: 157 nm), and a light source radiating harmonic laser light in a far UV region or a vacuum UV region by wavelength conversion of laser light from a solid laser light source (such as YAG or semiconductor laser).

The temperature of baking of the exposed photoresist film is usually 50 to 200° C., and preferably 70 to 150° C.

The development of the baked photoresist film is usually carried out using a development apparatus. The alkaline developer used may be any one of various alkaline aqueous solution used in the art. Generally, an aqueous solution of tetramethylammonium hydroxide or (2-hydroxyethyl)trimethylammonium hydroxide (commonly known as "choline") is often used. After development, the photoresist pattern formed is preferably washed with ultrapure water, and the remained water on the photoresist pattern and the substrate is preferably removed.

The photoresist composition of the present invention provides a photoresist pattern showing good Focus Margin (DOF), and therefore, the photoresist composition of the present invention is suitable for ArF excimer laser lithography, KrF excimer laser lithography, EUV (extreme ultraviolet) lithography, EUV immersion lithography and EB (electron beam) lithography.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [HLC-8120GPC Type, Column (Three Columns with guard column): TSKgel Multipore $H_{XL}$-M, manufactured by TOSOH CORPORATION, Solvent: tetrahydrofuran, Flow rate: 1.0 mL/min., Detector: RI detector, Column temperature: 40° C., Injection volume: 100 μL] using standard polystyrene, manufactured by TOSOH CORPORATION, as a standard reference material. Structures of compounds were determined by NMR (GX-270 Type or EX-270 Type, manufactured by JEOL LTD.) and mass spectrometry (Liquid Chromatography: 1100 Type, manufactured by AGILENT TECHNOLOGIES LTD., Mass Spectrometry: LC/MSD Type or LC/MSD TOF Type, manufactured by AGILENT TECHNOLOGIES LTD.).

Synthesis Example 1

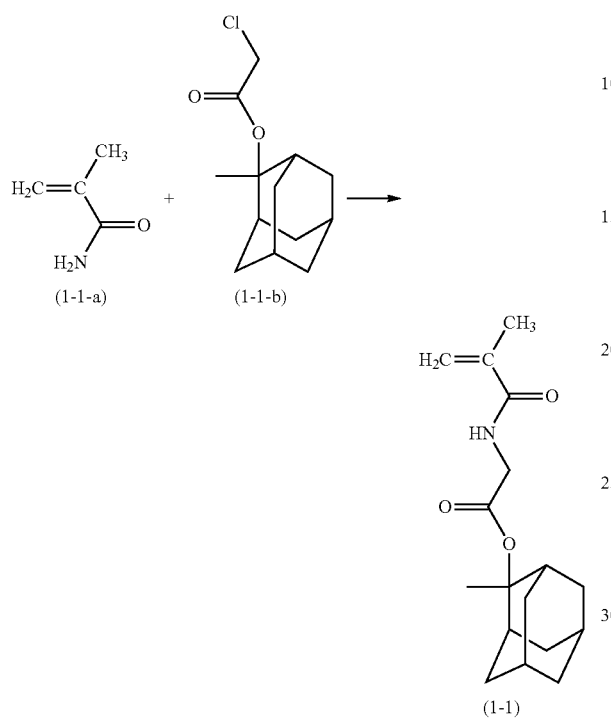

A mixture prepared by mixing 2.43 parts of a compound represented by the formula (1-1-b) with 15.00 parts of N,N-dimethylformamide was stirred at 23° C. for 30 minutes. To the mixture, 1.07 parts of potassium carbonate and 0.34 part of potassium iodine were added, and the resultant mixture was stirred at 50° C. for 1 hour. The obtained mixture was cooled down to 40° C., and then, a solution prepared by dissolving 0.85 part of a compound represented by the formula (1-1-a) in 5.00 parts of N,N-dimethylformamide was added thereto dropwise over 1 hour. The resultant mixture was stirred at 40° C. for 5 hours. The obtained mixture was cooled down to 23° C., and then, 30.00 parts of chloroform and 30.00 parts of 1N hydrochloric acid were added thereto. The obtained mixture was stirred and separated to an organic layer and an aqueous layer. The organic layer was washed with 30.00 parts of ion-exchanged water until the aqueous layer was neutralized. The organic layer was mixed with 1.2 parts of active carbon, and the resultant mixture was stirred, and then, filtrated. The filtrate was concentrated and the obtained residue was mixed with 10 parts of ethyl acetate. The obtained mixture was stirred and the supernatant solution was removed. The obtained residue was mixed with 10 parts of tert-butyl methyl ether. The obtained mixture was stirred and the supernatant solution was removed. The obtained residue was dissolved in chloroform, and then, the obtained solution was concentrated. The residue was purified with column chromatography (silica gel 60-200 mesh available from Merck KGaA, Developing solvent: hexane/ethyl acetate (8/1)) to obtain 0.63 part of a monomer represented by the formula (1-1) in the form of a colorless oil. This is called as Monomer (1-1).

MS: 291.2 (molecular ion peak)

Synthesis Example 2

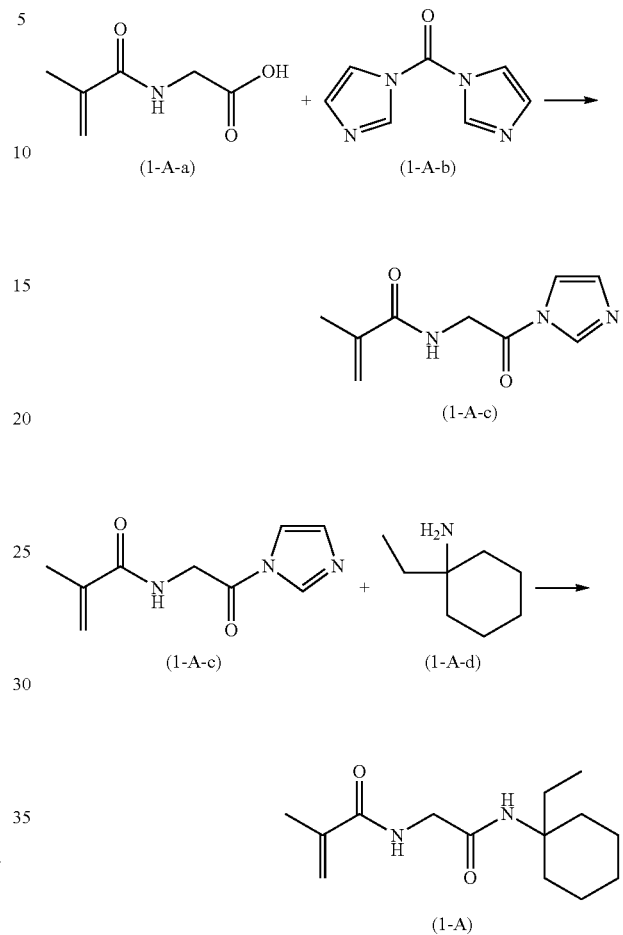

To a mixture prepared by mixing 33.25 parts of a compound represented by the formula (1-A-a), 23.93 parts of dicyclohexylcarbodiimide and 40.00 parts of dichloromethane, 18.83 parts of a compound represented by the formula (1-A-b) was added at 0° C., and the resultant mixture was stirred at 0° C. for 1 hour. The mixture was further stirred at 23° C. for 30 minutes. The obtained mixture was filtrated to remove an insoluble matters. The filtrate was concentrated to obtain 44.19 parts of a compound represented by the formula (1-A-c).

A mixture prepared by mixing 19.33 parts of a compound represented by the formula (1-A-c), 12.71 parts of a compound represented by the formula (1-A-d) and 200 parts of acetonitrile was stirred at 50° C. for 3 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: ethyl acetate) to obtain 22.98 parts of a monomer represented by the formula (1-A). This is called as Monomer (1-A).

MS: 252.2 (molecular ion peak)

Synthesis Example 3

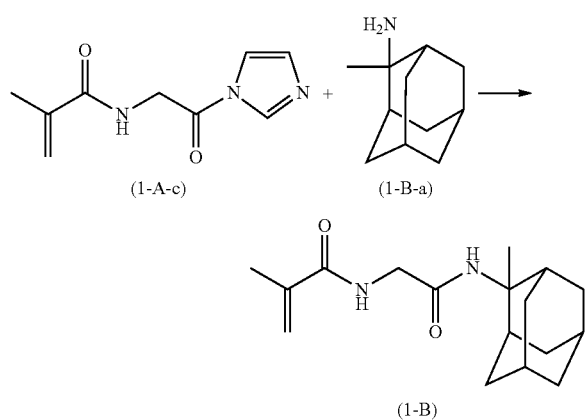

A mixture prepared by mixing 19.33 parts of a compound represented by the formula (1-A-c), 16.53 parts of a compound represented by the formula (1-B-a) and 200 parts of acetonitrile was stirred at 50° C. for 3 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: ethyl acetate) to obtain 24.18 parts of a monomer represented by the formula (1-B). This is called as Monomer (1-B).

MS: 290.2 (molecular ion peak)

Synthesis Example 4

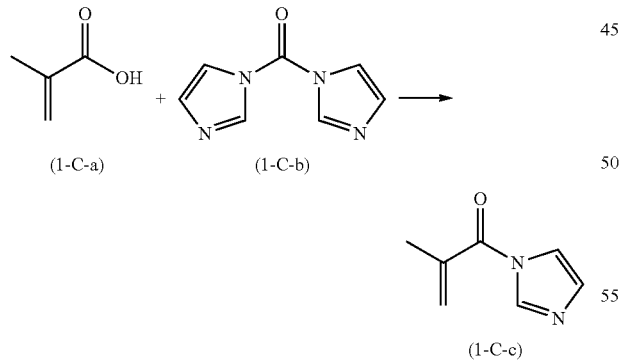

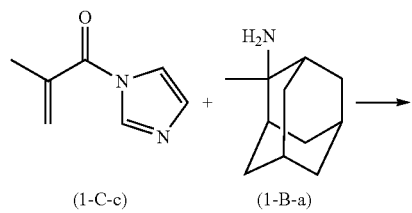

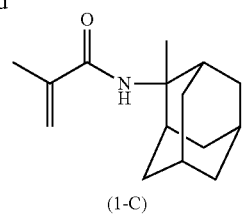

To a mixture prepared by mixing 20.00 parts of a compound represented by the formula (1-C-a), 23.93 parts of dicyclohexylcarbodiimide and 40.00 parts of dichloromethane, 18.83 parts of a compound represented by the formula (1-C-b) was added at 0° C., and the resultant mixture was stirred at 0° C. for 1 hour. The mixture was further stirred at 23° C. for 30 minutes. The obtained mixture was filtrated to remove an insoluble matters. The filtrate was concentrated to obtain 30.56 parts of a compound represented by the formula (1-C-c).

A mixture prepared by mixing 13.62 parts of a compound represented by the formula (1-C-c), 16.53 parts of a compound represented by the formula (1-B-a) and 200 parts of acetonitrile was stirred at 50° C. for 3 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: ethyl acetate) to obtain 21.84 parts of a monomer represented by the formula (1-C). This is called as Monomer (1-C).

MS: 233.2 (molecular ion peak)

Synthesis Example 5

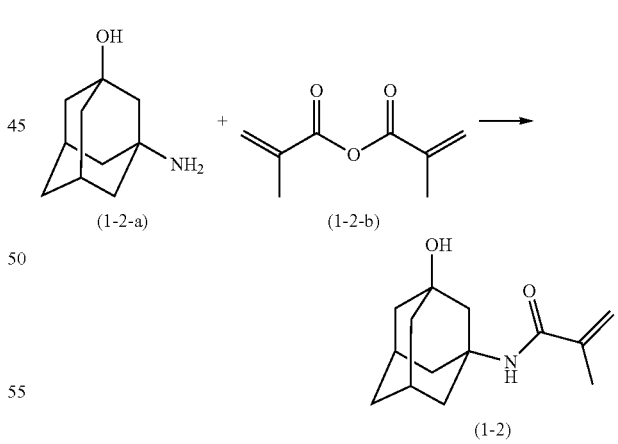

A mixture prepared by mixing 5.42 parts of a compound represented by the formula (1-2-a) with 100.00 parts of tetrahydrofuran was stirred at 23° C. for 30 minutes. To the mixture, 4.92 parts of triethylamine was added, and to the resultant mixture, a solution prepared by dissolving 5.00 parts of a compound represented by the formula (1-2-b) in 5.00 parts of tetrahydrofuran was added dropwise at 23° C. over 1 hour. The obtained mixture was stirred at 23° C. for 3 hours, and then, 100 parts of chloroform and 30 parts of ion-exchanged water were added thereto. The obtained mixture was stirred at 23° C. for 30 minutes and separated to an organic layer and an aqueous layer. The organic layer was washed with 50 parts of ion-exchanged water. The organic layer was concentrated. The obtained residue was mixed with 40 parts of ethyl acetate. The obtained solution was washed with 20 parts of ion-exchanged water and then, concentrated. To the obtained residue, 10 parts of ethyl acetate and 10 parts of hexane were added, and the resultant mixture was stirred at 23° C. for 30 minutes and the precipitate was isolated by filtration to obtain 3.49 parts of a monomer represented by the formula (1-2) in the form of a white solid. This is called as Monomer (1-2).

MS: 235.2 (molecular ion peak)

Melting point: 114-117° C.

$^1$H-NMR (CDCl$_3$, Internal standard: tetramethylsilane) δ ppm: 1.36-1.57 (m, 6H), 1.74-1.99 (m, 9H), 2.13 (m, 2H), 4.46 (s, 1H), 5.24 (m, 1H), 5.53 (m, 1H), 7.04 (s, 1H)

Synthesis Example 6

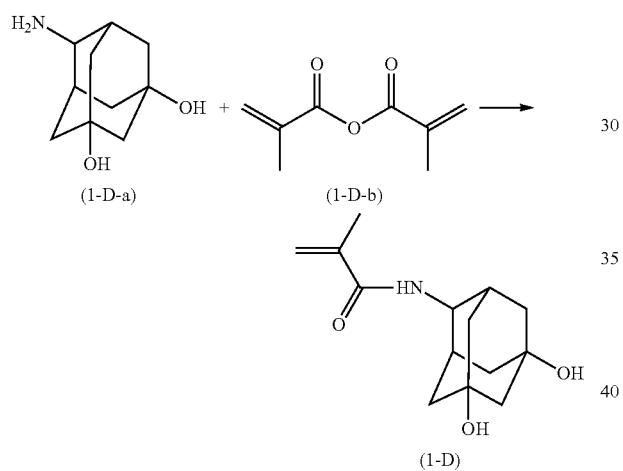

A mixture prepared by mixing 5.94 parts of a compound represented by the formula (1-D-a) with 100.00 parts of tetrahydrofuran was stirred at 23° C. for 30 minutes. To the mixture, 4.92 parts of triethylamine was added, and to the resultant mixture, a solution prepared by dissolving 5.00 parts of a compound represented by the formula (1-D-b) in 5.00 parts of tetrahydrofuran was added dropwise at 23° C. over 1 hour. The obtained mixture was stirred at 23° C. for 3 hours, and then, 100 parts of chloroform and 30 parts of ion-exchanged water were added thereto. The obtained mixture was stirred at 23° C. for 30 minutes and separated to an organic layer and an aqueous layer. The organic layer was washed with 50 parts of ion-exchanged water. The organic layer was concentrated. The obtained residue was mixed with 40 parts of ethyl acetate. The obtained solution was washed with 20 parts of ion-exchanged water and then, concentrated. The obtained residue was purified with column chromatography (silica gel 60-200 mesh available from Merck KGaA, Developing solvent: ethyl acetate) to obtain 0.96 part of a monomer represented by the formula (1-D). This is called as Monomer (1-D).

MS: 251.2 (molecular ion peak)

Synthesis Example 7

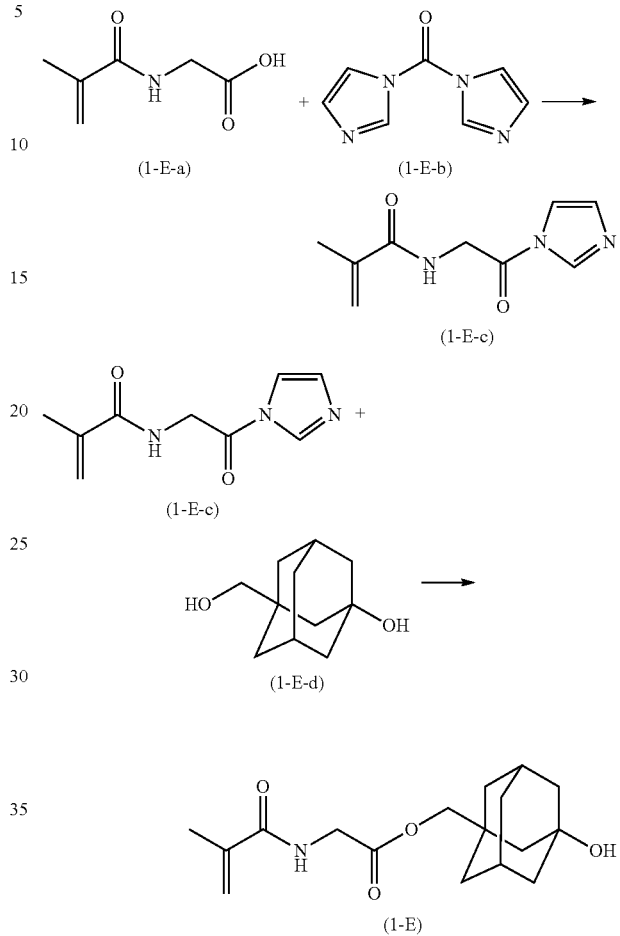

To a mixture prepared by mixing 33.25 parts of a compound represented by the formula (1-E-a), 23.93 parts of dicyclohexylcarbodiimide and 40.00 parts of dichloromethane, 18.83 parts of a compound represented by the formula (1-E-b) was added at 0° C., and the resultant mixture was stirred at 0° C. for 1 hour. The mixture was further stirred at 23° C. for 30 minutes. The obtained mixture was filtrated. The filtrate was concentrated to obtain 44.19 parts of a compound represented by the formula (1-E-c).

A mixture prepared by mixing 19.33 parts of a compound represented by the formula (1-E-c), 18.23 parts of a compound represented by the formula (1-E-d) and 200 parts of acetonitrile was stirred at 23° C. for 5 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: ethyl acetate) to obtain 26.13 parts of a monomer represented by the formula (1-E). This is called as Monomer (1-E).

MS: 307.2 (molecular ion peak)

Synthesis Example 8

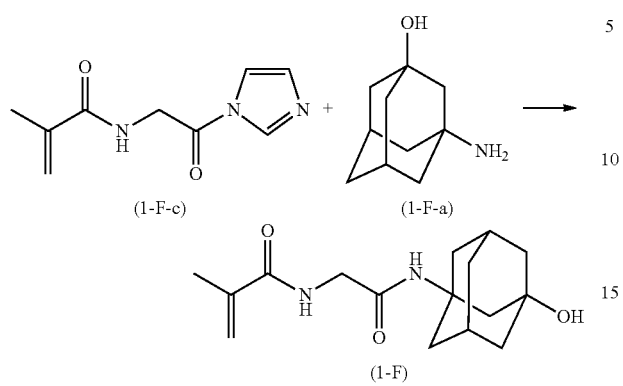

A mixture prepared by mixing 19.33 parts of a compound represented by the formula (1-F-c), 16.73 parts of a compound represented by the formula (1-F-a) and 200 parts of acetonitrile was stirred at 23° C. for 5 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: ethyl acetate) to obtain 8.42 parts of a monomer represented by the formula (1-F). This is called as Monomer (1-F).

MS: 292.2 (molecular ion peak)

Synthesis Example 9

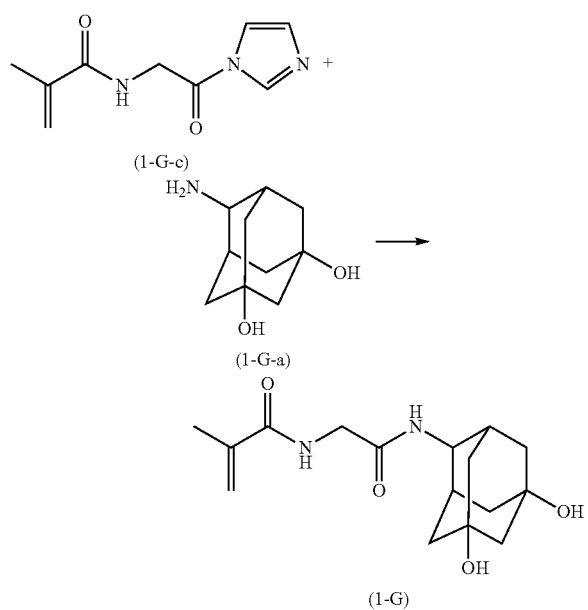

A mixture prepared by mixing 19.33 parts of a compound represented by the formula (1-G-c), 18.33 parts of a compound represented by the formula (1-G-a) and 200 parts of acetonitrile was stirred at 23° C. for 5 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: ethyl acetate) to obtain 4.81 parts of a monomer represented by the formula (1-G). This is called as Monomer (1-G).

MS: 308.2 (molecular ion peak)

Synthesis Example 10

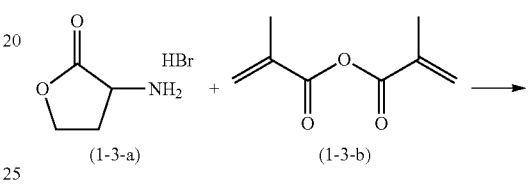

A mixture prepared by mixing 15.00 parts of a compound represented by the formula (I-3-a) with 100.00 parts of tetrahydrofuran was stirred at 23° C. for 30 minutes. To the mixture, 20.85 parts of triethylamine was added, and to the resultant mixture, 12.70 parts of a compound represented by the formula (1-3-b) was added dropwise at 23° C. over 30 minutes. The obtained mixture was stirred at 55° C. for 8 hours. The mixture was cooled down to 23° C., and then, filtrated to remove an insoluble matters. The filtrate was concentrated. The obtained residue was mixed with 100 parts of ethyl acetate. The obtained solution was stirred at 23° C. for 30 minutes, and then, filtrated. The filtrate was concentrated. The obtained residue was purified with column chromatography (silica gel 60-200 mesh available from Merck KGaA, Developing solvent: hexane/ethyl acetate (weight ratio=1/1)) to obtain 6.40 parts of a monomer represented by the formula (I-3). This is called as Monomer (I-3).

MS: 169.1 (molecular ion peak)

$^1$H-NMR (CDCl$_3$, Internal standard: tetramethylsilane) δ ppm: 1.96 (s, 3H), 2.35 (m, 1H), 2.65 (m, 1H), 4.32 (m, 1H), 4.47 (m, 1H), 4.68 (m, 1H), 5.40 (s, 1H), 5.81 (s, 1H), 7.22 (m, 1H)

Synthesis Example 11

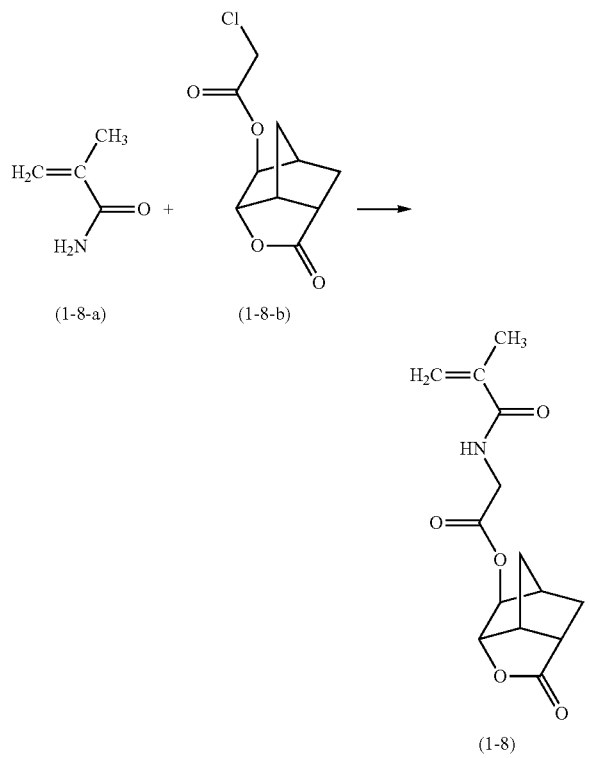

A mixture prepared by mixing 2.31 parts of a compound represented by the formula (I-8-b) with 15.00 parts of N,N-dimethylformamide was stirred at 23° C. for 30 minutes. To the mixture, 1.07 parts of potassium carbonate and 0.34 part of potassium iodine were added, and the resultant mixture was stirred at 50° C. for 1 hour. The obtained mixture was cooled down to 40° C., and then, a solution prepared by dissolving 0.85 part of a compound represented by the formula (I-8-a) in 5.00 parts of N,N-dimethylformamide was added thereto dropwise over 1 hour. The resultant mixture was stirred at 40° C. for 5 hours. The obtained mixture was cooled down to 23° C., and then, 30.00 parts of chloroform and 30.00 parts of 1N hydrochloric acid were added thereto. The obtained mixture was stirred and separated to an organic layer and an aqueous layer. The organic layer was washed with 30.00 parts of ion-exchanged water until the aqueous layer was neutralized. The organic layer was mixed with 1.2 parts of active carbon, and the resultant mixture was stirred, and then, filtrated. The filtrate was concentrated and the obtained residue was mixed with 10 parts of ethyl acetate. The obtained mixture was stirred and the supernatant solution was removed. The obtained residue was mixed with 10 parts of tert-butyl methyl ether. The obtained mixture was stirred and the supernatant solution was removed. The obtained residue was dissolved in chloroform, and then, the obtained solution was concentrated. The residue was purified with column chromatography (silica gel 60-200 mesh available from Merck KGaA, Developing solvent:hexane/ethyl acetate (weight ratio=1/1)) to obtain 0.45 part of a monomer represented by the formula (1-8) in the form of a white solid. This is called as Monomer (1-8).

MS: 279.1 (molecular ion peak)

Synthesis Example 12

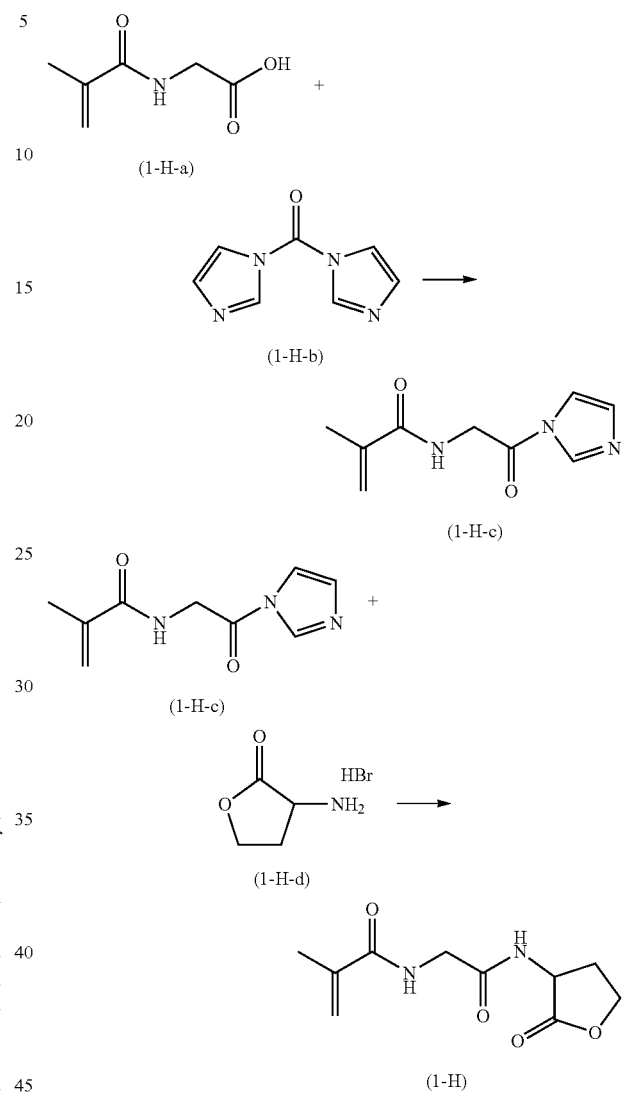

To a mixture prepared by mixing 33.25 parts of a compound represented by the formula (1-H-a), 23.93 parts of dicyclohexylcarbodiimide and 40.00 parts of dichloromethane, 18.83 parts of a compound represented by the formula (1-H-b) was added at 0° C., and the resultant mixture was stirred at 0° C. for 1 hour. The mixture was further stirred at 23° C. for 30 minutes. The obtained mixture was filtrated. The filtrate was concentrated to obtain 44.19 parts of a compound represented by the formula (1-H-c).

A mixture prepared by mixing 19.33 parts of a compound represented by the formula (1-H-c), 18.20 parts of a compound represented by the formula (1-H-d) and 200 parts of acetonitrile was stirred at 23° C. for 3 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: heptane/ethyl acetate (weight ratio=2/1)) to obtain 9.62 parts of a monomer represented by the formula (1-H). This is called as Monomer (1-H).

MS: 226.1 (molecular ion peak)

Synthesis Example 13

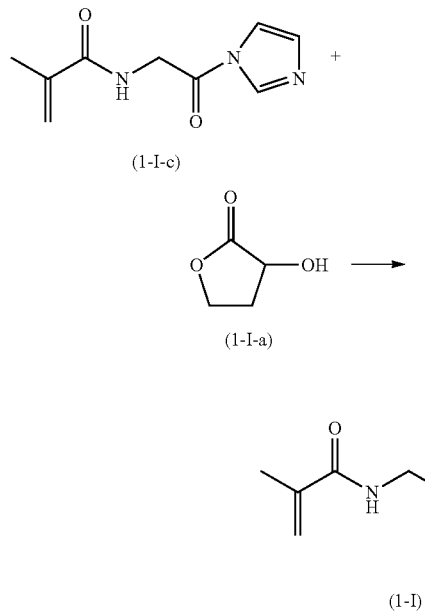

A mixture prepared by mixing 19.33 parts of a compound represented by the formula (1-I-c), 10.21 parts of a compound represented by the formula (1-I-a) and 200 parts of acetonitrile was stirred at 23° C. for 5 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: heptane/ethyl acetate (weight ratio=1/1)) to obtain 18.74 parts of a monomer represented by the formula (1-I). This is called as Monomer (1-I).

MS: 227.1 (molecular ion peak)

Synthesis Example 14

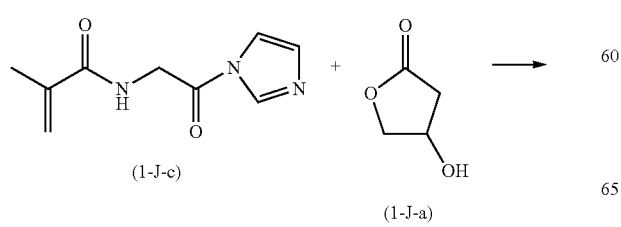

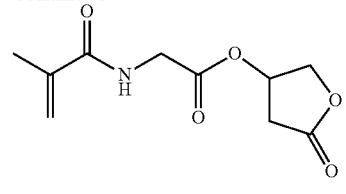

A mixture prepared by mixing 19.33 parts of a compound represented by the formula (1-J-c), 10.21 parts of a compound represented by the formula (1-J-a) and 200 parts of acetonitrile was stirred at 23° C. for 5 hours. The obtained mixture was concentrated and to the obtained residue, 300 parts of chloroform and 150 parts of ion-exchanged water were added. The resultant mixture was stirred and separated to an organic layer and an aqueous layer. The organic layer was washed with 150 parts of ion-exchanged water and concentrated. The residue was purified with column chromatography (silica gel 60-200 mesh available from Merck KGaA, Developing solvent: heptane/ethyl acetate (weight ratio=1/1)) to obtain 15.19 parts of a monomer represented by the formula (1-J). This is called as Monomer (1-J).

MS: 227.1 (molecular ion peak)

In Resin Synthesis Examples, the following monomers were used in addition to Monomer (1-1), Monomer (1-A), Monomer (1-B), Monomer (1-C), Monomer (1-2), Monomer (1-D), Monomer (1-E), Monomer (1-F), Monomer (1-G), Monomer (1-3), Monomer (1-8), Monomer (1-H), Monomer (1-I) and Monomer (1-J).

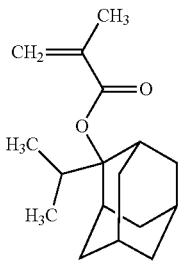

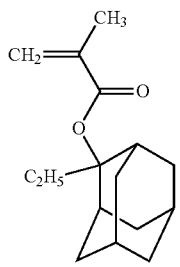

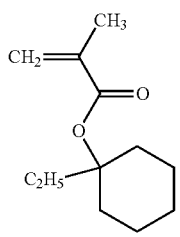

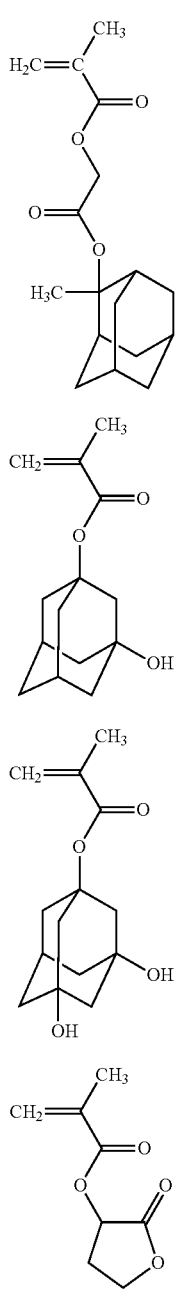

The monomers represented by the formulae (a1-1-1), (a1-1-2), (a1-2-1), (a1-1-3), (a2-1-1), (a2-1-2), (a3-1-1) and (a3-2-1) are called as Monomer (a1-1-1), Monomer (a1-1-2), Monomer (a1-2-1), Monomer (a1-1-3), Monomer (a2-1-1), Monomer (a2-1-2), Monomer (a3-1-1) and Monomer (a3-2-1), respectively.

Resin Synthesis Example 1

Monomer (a1-1-1), Monomer (1-1), Monomer (a2-1-1) and Monomer (a3-2-1) were mixed at a molar ratio of 20:20:20:40 (Monomer (a1-1-1):Monomer (1-1):Monomer (a2-1-1):Monomer (a3-2-1)), and 1,4-dioxane in 1.2 times weight based on all monomers was added thereto, to prepare solution. To the solution was added azobisisobutyronitrile as an initiator in a ratio of 1 mol % based on all monomer molar amount, and azobis(2,4-dimethylvaleronitrile) as an initiator in a ratio of 3 mol % based on all monomer molar amount. The obtained mixture was heated at 73° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of about $7.0 \times 10^3$ was obtained in a yield of 64%. This is called as Resin A1. Resin A1 had the structural units derived from Monomer (a1-1-1), Monomer (1-1), Monomer (a2-1-1) and Monomer (a3-2-1).

Resin Synthesis Example 2

A resin having a weight-average molecular weight of about $7.0 \times 10^3$ was obtained in a yield of 68%, according to the same manner in Resin Synthesis Example 1 except that Monomer (a3-1-1) was used in place of Monomer (a3-2-1). The obtained resin is called as Resin A2. Resin A2 had the structural units derived from Monomer (a1-1-1), Monomer (1-1), Monomer (a2-1-1) and Monomer (a3-1-1).

Resin Synthesis Example 3

A resin having a weight-average molecular weight of about $7.1 \times 10^3$ was obtained in a yield of 55%, according to the same manner in Resin Synthesis Example 1 except that 10/45 of Monomer (a3-2-1) was changed to Monomer (a3-1-1). The obtained resin is called as Resin A3. Resin A3 had the structural units derived from Monomer (a1-1-1), Monomer (1-1), Monomer (a2-1-1) Monomer (a3-2-1) and Monomer (a3-1-1).

Resin Synthesis Example 4

A resin having a weight-average molecular weight of about $7.1 \times 10^3$ was obtained in a yield of 63%, according to the same manner in Resin Synthesis Example 1 except that 5/20 of Monomer (a2-1-1) was changed to Monomer (a2-1-2). The obtained resin is called as Resin A4. Resin A4 had the structural units derived from Monomer (a1-1-1), Monomer (1-1), Monomer (a2-1-1), Monomer (a2-1-2) and Monomer (a3-2-1).

Resin Synthesis Example 5

A resin having a weight-average molecular weight of about $7.0 \times 10^3$ was obtained in a yield of 65%, according to the same manner in Resin Synthesis Example 1 except that Monomer (a1-2) was used in place of Monomer (a1-1-1).

The obtained resin is called as Resin A5. Resin A5 had the structural units derived from Monomer (a1-1-2), Monomer (1-1), Monomer (a2-1-1) and Monomer (a3-2-1).

Resin Synthesis Example 6

A resin having a weight-average molecular weight of about $7.0 \times 10^3$ was obtained in a yield of 70%, according to the same manner in Resin Synthesis Example 1 except that 5/20 of Monomer (1-1) was changed to Monomer (a1-2-1). The obtained resin is called as Resin A6. Resin A6 had the structural units derived from Monomer (a1-1-1), Monomer (a1-2-1), Monomer (1-1), Monomer (a2-1-1) and Monomer (a3-2-1).

Resin Synthesis Example 7

A resin having a weight-average molecular weight of about $6.6 \times 10^3$ was obtained in a yield of 64%, according to the same manner in Resin Synthesis Example 1 except that Monomer (1-A) was used in places of Monomer (1-1). The obtained resin is called as Resin A7. Resin A7 had the structural units derived from Monomer (a1-1-1), Monomer (1-A), Monomer (a2-1-1) and Monomer (a3-2-1).

Resin Synthesis Example 8

A resin having a weight-average molecular weight of about $6.5 \times 10^3$ was obtained in a yield of 62%, according to the same manner in Resin Synthesis Example 1 except that Monomer (1-B) was used in places of Monomer (1-1). The obtained resin is called as Resin A8. Resin A8 had the structural units derived from Monomer (a1-1-1), Monomer (1-B), Monomer (a2-1-1) and Monomer (a3-2-1).

Resin Synthesis Example 9

A resin having a weight-average molecular weight of about $6.6 \times 10^3$ was obtained in a yield of 63%, according to the same manner in Resin Synthesis Example 1 except that Monomer (1-C) was used in places of Monomer (1-1). The obtained resin is called as Resin A9. Resin A9 had the structural units derived from Monomer (a1-1-1), Monomer (1-C), Monomer (a2-1-1) and Monomer (a3-2-1).

Resin Synthesis Example 10

Monomer (a1-1-1), Monomer (a1-2-1), Monomer (I-2) and Monomer (a3-2-1) were mixed at a molar ratio of 40:10:20:30 (Monomer (a1-1-1):Monomer (a1-2-1):Monomer (1-2):Monomer (a3-2-1)), and 1,4-dioxane in 1.2 times weight based on all monomers was added thereto, to prepare solution. To the solution was added azobisisobutyronitrile as an initiator in a ratio of 2.5 mol % based on all monomer molar amount, and azobis(2,4-dimethylvaleronitrile) as an initiator in a ratio of 7.5 mol % based on all monomer molar amount. The obtained mixture was heated at 80° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $3.3 \times 10^3$ was obtained in a yield of 45%. This is called as Resin A10. Resin A10 had the structural units derived from Monomer (a1-1-1), Monomer (a1-2-1), Monomer (1-2) and Monomer (a3-2-1).

Resin Synthesis Example 11

Monomer (a1-1-1), Monomer (a1-2-1), Monomer (1-2) and Monomer (a3-2-1) were mixed at a molar ratio of 40:10:20:30 (Monomer (a1-1-1):Monomer (a1-2-1):Monomer (1-2):Monomer (a3-2-1)), and 1,4-dioxane in 1.2 times weight based on all monomers was added thereto, to prepare solution. To the solution was added azobisisobutyronitrile as an initiator in a ratio of 2 mol % based on all monomer molar amount, and azobis(2,4-dimethylvaleronitrile) as an initiator in a ratio of 6 mol % based on all monomer molar amount. The obtained mixture was heated at 75° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $4.9 \times 10^3$ was obtained in a yield of 65%. This is called as Resin A11. Resin A11 had the structural units derived from Monomer (a1-1-1), Monomer (a1-2-1), Monomer (1-2) and Monomer (a3-2-1).

Resin Synthesis Example 12

Monomer (a1-1-1), Monomer (a1-2-1), Monomer (1-2) and Monomer (a3-2-1) were mixed at a molar ratio of 40:10:20:30 (Monomer (a1-1-1):Monomer (a1-2-1):Monomer (1-2):Monomer (a3-2-1)), and 1,4-dioxane in 1.2 times weight based on all monomers was added thereto, to prepare solution. To the solution was added azobisisobutyronitrile as an initiator in a ratio of 1 mol % based on all monomer molar amount, and azobis(2,4-dimethylvaleronitrile) as an initiator in a ratio of 3 mol % based on all monomer molar amount. The obtained mixture was heated at 73° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $7.9 \times 10^3$ was obtained in a yield of 75%. This is called as Resin A12. Resin A12 had the structural units derived from Monomer (a1-1-1), Monomer (a1-2-1), Monomer (1-2) and Monomer (a3-2-1).

Resin Synthesis Example 13

Monomer (a1-1-1), Monomer (a1-2-1), Monomer (1-2) and Monomer (a3-2-1) were mixed at a molar ratio of 40:10:20:30 (Monomer (a1-1-1):Monomer (a1-2-1):Monomer (1-2):Monomer (a3-2-1)), and 1,4-dioxane in 1.2 times weight based on all monomers was added thereto, to prepare solution. To the solution was added azobisisobutyronitrile as an initiator in a ratio of 0.7 mol % based on all monomer molar amount, and azobis(2,4-dimethylvaleronitrile) as an initiator in a ratio of 2.1 mol % based on all monomer molar amount. The obtained mixture was heated at 70° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $1.1 \times 10^4$ was obtained in a yield of 70%. This is called as Resin A13. Resin A13 had the structural units derived from Monomer (a1-1-1), Monomer (a1-2-1), Monomer (1-2) and Monomer (a3-2-1).

Resin Synthesis Example 14

Monomer (a1-1-1), Monomer (a1-2-1), Monomer (1-D) and Monomer (a3-2-1) were mixed at a molar ratio of 40:10:20:30 (Monomer (a1-1-1):Monomer (a1-2-1):Monomer (1-D):Monomer (a3-2-1)), and 1,4-dioxane in 1.2 times weight based on all monomers was added thereto, to prepare solution. To the solution was added azobisisobutyronitrile as an initiator in a ratio of 2 mol % based on all monomer molar amount, and azobis(2,4-dimethylvaleronitrile) as an initiator in a ratio of 6 mol % based on all monomer molar amount. The obtained mixture was heated at 75° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $4.8 \times 10^3$ was obtained in a yield of 52%. This is called as Resin A14. Resin A14 had the structural units derived from Monomer (a1-1-1), Monomer (a1-2-1), Monomer (1-D) and Monomer (a3-2-1).

Resin Synthesis Example 15

Monomer (a1-1-1), Monomer (a1-2-1), Monomer (1-E) and Monomer (a3-2-1) were mixed at a molar ratio of 40:10:20:30 (Monomer (a1-1-1):Monomer (a1-2-1):Monomer (1-E):Monomer (a3-2-1)), and 1,4-dioxane in 1.2 times weight based on all monomers was added thereto, to prepare solution. To the solution was added azobisisobutyronitrile as an initiator in a ratio of 2 mol % based on all monomer molar amount, and azobis(2,4-dimethylvaleronitrile) as an initiator in a ratio of 6 mol % based on all monomer molar amount. The obtained mixture was heated at 75° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $4.6 \times 10^3$ was obtained in a yield of 62%. This is called as Resin A15. Resin A15 had the structural units derived from Monomer (a1-1-1), Monomer (a1-2-1), Monomer (1-E) and Monomer (a3-2-1).

Resin Synthesis Example 16

Monomer (a1-1-1), Monomer (a1-2-1), Monomer (1-F) and Monomer (a3-2-1) were mixed at a molar ratio of 40:10:20:30 (Monomer (a1-1-1):Monomer (a1-2-1):Monomer (1-F):Monomer (a3-2-1)), and 1,4-dioxane in 1.2 times weight based on all monomers was added thereto, to prepare solution. To the solution was added azobisisobutyronitrile as an initiator in a ratio of 2 mol % based on all monomer molar amount, and azobis(2,4-dimethylvaleronitrile) as an initiator in a ratio of 6 mol % based on all monomer molar amount. The obtained mixture was heated at 75° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $4.9 \times 10^3$ was obtained in a yield of 65%. This is called as Resin A16. Resin A16 had the structural units derived from Monomer (a1-1-1), Monomer (a1-2-1), Monomer (1-F) and Monomer (a3-2-1).

Resin Synthesis Example 17

Monomer (a1-1-1), Monomer (a1-2-1), Monomer (1-G) and Monomer (a3-2-1) were mixed at a molar ratio of 40:10:20:30 (Monomer (a1-1-1):Monomer (a1-2-1):Monomer (1-G):Monomer (a3-2-1)), and 1,4-dioxane in 1.2 times weight based on all monomers was added thereto, to prepare solution. To the solution was added azobisisobutyronitrile as an initiator in a ratio of 2 mol % based on all monomer molar amount, and azobis(2,4-dimethylvaleronitrile) as an initiator in a ratio of 6 mol % based on all monomer molar amount. The obtained mixture was heated at 75° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $4.5 \times 10^3$ was obtained in a yield of 48%. This is called as Resin A17. Resin A17 had the structural units derived from Monomer (a1-1-1), Monomer (a1-2-1), Monomer (1-G) and Monomer (a3-2-1).

Resin Synthesis Example 18

Monomer (a1-1-1), Monomer (a1-2-1), Monomer (a2-1-1) and Monomer (1-8) were mixed at a molar ratio of 25:10:20:45 (Monomer (a1-1-1):Monomer (a1-2-1):Monomer (a2-1-1):Monomer (1-8)), and 1,4-dioxane in 1.2 times weight based on all monomers was added thereto, to prepare solution. To the solution was added azobisisobutyronitrile as an initiator in a ratio of 1 mol % based on all monomer molar amount, and azobis(2,4-dimethylvaleronitrile) as an initiator in a ratio of 3 mol % based on all monomer molar amount. The obtained mixture was heated at 73° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of $7.1 \times 10^3$ was obtained in a yield of 60%. This is called as Resin A18. Resin A18 had the structural units derived from Monomer (a1-1-1), Monomer (a1-2-1), Monomer (a2-1-1) and Monomer (1-8).

Resin Synthesis Example 19

A resin having a weight-average molecular weight of about $6.9 \times 10^3$ was obtained, according to the same manner in Resin Synthesis Example 18 except that Monomer (1-3) was used in places of Monomer (1-8). The obtained resin is called as Resin A19. Resin A19 had the structural units derived from Monomer (a1-1-1), Monomer (a1-2-1), Monomer (a2-1-1) and Monomer (1-3).

Resin Synthesis Example 20

A resin having a weight-average molecular weight of about $7.2 \times 10^3$ was obtained, according to the same manner in Resin Synthesis Example 18 except that 10/45 of Monomer (1-8) was changed to Monomer (a3-2-1). The obtained resin is called as Resin A20. Resin A20 had the structural units derived from Monomer (a1-1-1), Monomer (a1-2-1), Monomer (a2-1-1), Monomer (1-8) and Monomer (a3-2-1).

Resin Synthesis Example 21

A resin having a weight-average molecular weight of about $6.8 \times 10^3$ was obtained, according to the same manner in Resin Synthesis Example 19 except that 10/45 of Monomer (1-3) was changed to Monomer (a3-2-1). The obtained resin is called as Resin A21. Resin A21 had the structural units derived from Monomer (a1-1-1), Monomer (a1-2-1), Monomer (a2-1-1), Monomer (1-3) and Monomer (a3-2-1).

Resin Synthesis Example 22

A resin having a weight-average molecular weight of about $7.0 \times 10^3$ was obtained, according to the same manner in Resin Synthesis Example 18 except that 5/20 of Monomer (a2-1-1) was changed to Monomer (a2-1-2). The obtained resin is called as Resin A22. Resin A22 had the structural units derived from Monomer (a1-1-1), Monomer (a1-2-1), Monomer (a2-1-1), Monomer (a2-1-2) and Monomer (1-8).

Resin Synthesis Example 23

A resin having a weight-average molecular weight of about $6.9 \times 10^3$ was obtained, according to the same manner in Resin Synthesis Example 18 except that Monomer (a1-1-2) was used in place of Monomer (a1-1-1). The obtained resin is called as Resin A23. Resin A23 had the structural units derived from Monomer (a1-1-2), Monomer (a1-2-1), Monomer (a2-1-1) and Monomer (1-8).

Resin Synthesis Example 24

A resin having a weight-average molecular weight of about $6.7 \times 10^3$ was obtained, according to the same manner in Resin Synthesis Example 18 except that Monomer (1-H) was used in place of Monomer (I-8). The obtained resin is called as Resin A24. Resin A24 had the structural units derived from Monomer (a1-1-1), Monomer (a1-2-1), Monomer (a2-1-1) and Monomer (1-H).

Resin Synthesis Example 25

A resin having a weight-average molecular weight of about $6.5 \times 10^3$ was obtained, according to the same manner in Resin Synthesis Example 18 except that Monomer (1-I) was used in place of Monomer (1-8). The obtained resin is called as Resin A25. Resin A25 had the structural units derived from Monomer (a1-1-1), Monomer (a1-2-1), Monomer (a2-1-1) and Monomer (1-I).

Resin Synthesis Example 26

A resin having a weight-average molecular weight of about $6.2 \times 10^3$ was obtained, according to the same manner in Resin Synthesis Example 18 except that Monomer (1-J) was used in place of Monomer (1-8). The obtained resin is called as Resin A26. Resin A26 had the structural units derived from Monomer (a1-1-1), Monomer (a1-2-1), Monomer (a2-1-1) and Monomer (1-J).

Resin Synthesis Example 27

Monomer (a1-1-2), Monomer (a2-1-1) and Monomer (a3-1-1) were mixed at a molar ratio of 50:25:25 (Monomer (a1-1-2):Monomer (a2-1-1):Monomer (a3-1-1)), and 1,4-dioxane in 1.5 times weight based on all monomers was added thereto, to prepare solution. To the solution was added azobisisobutyronitrile as an initiator in a ratio of 1 mol % based on all monomer molar amount, and azobis(2,4-dimethylvaleronitrile) as an initiator in a ratio of 3 mol % based on all monomer molar amount. The obtained mixture was heated at 77° C. for about 5 hours. Then, the reaction solution was poured into large amount of a mixture of methanol and water (methanol/water=4/1 (weight ratio)) to cause precipitation. The precipitate was isolated and dissolved in 1,4-dioxane. The resultant solution was poured into large amount of a mixture of methanol and water to cause precipitation, and this operation was repeated twice for purification. As a result, a resin having a weight-average molecular weight of about $8.0 \times 10^3$ was obtained in a yield of 60%. This is called as Resin H1. Resin H1 had the structural units derived from Monomer (a1-1-2), Monomer (a2-1-1) and Monomer (a3-1-1).

Examples 1 to 9 and Reference Examples 1 to 2

<Resin>
Resin A1 to A9
Resin H1
<Acid Generator>

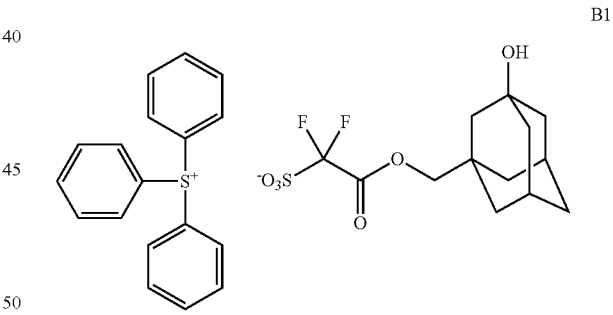

B1

<Quencher>
Q1: 2,6-diisopropylaniline
<Solvent>

| S1: | propylene glycol monomethyl ether acetate | 265 parts |
| --- | --- | --- |
| | propylene glycol monomethyl ether | 20 parts |
| | 2-heptanone | 20 parts |
| | γ-butyrolactone | 3.5 parts |

The following components were mixed and dissolved, further, filtrated through a fluorine resin filter having pore diameter of 0.2 μm, to prepare photoresist compositions.
Resin (kind and amount are described in Table 1)
Acid generator (kind and amount are described in Table 1)
Quencher (kind and amount are described in Table 1)

Solvent S1

TABLE 1

| Ex. No. | Resin (kind/amount (part)) | Acid generator (kind/amount (part)) | Quencher (kind/amount (part)) | PB (° C.) | PEB (° C.) |
|---|---|---|---|---|---|
| Ex. 1 | A1/10 | B1/0.70 | Q1/0.065 | 100 | 100 |
| Ex. 2 | A2/10 | B1/0.70 | Q1/0.065 | 100 | 100 |
| Ex. 3 | A3/10 | B1/0.70 | Q1/0.065 | 100 | 100 |
| Ex. 4 | A4/10 | B1/0.70 | Q1/0.065 | 100 | 100 |
| Ex. 5 | A5/10 | B1/0.70 | Q1/0.065 | 100 | 100 |
| Ex. 6 | A6/10 | B1/0.70 | Q1/0.065 | 100 | 100 |
| Ex. 7 | A7/10 | B1/0.70 | Q1/0.065 | 100 | 100 |
| Ex. 8 | A8/10 | B1/0.70 | Q1/0.065 | 100 | 100 |
| Ex. 9 | A9/10 | B1/0.70 | Q1/0.065 | 100 | 100 |
| Ref. Ex. 1 | H1/10 | B1/0.27 | Q1/0.0325 | 130 | 130 |
| Ref. Ex. 2 | H1/10 | B1/0.70 | Q1/0.065 | 100 | 100 |

Silicon wafers were each coated with "ARC-29SR", which is an organic anti-reflective coating composition available from Nissan Chemical Industries, Ltd., and then baked under the conditions: 205° C., 60 seconds, to form a 780 Å-thick organic anti-reflective coating. Each of the resist liquids prepared as above was spin-coated over the anti-reflective coating so that the thickness of the resulting film became 85 nm after drying. The silicon wafers thus coated with the respective resist liquids were each prebaked on a direct hotplate at a temperature shown in column of "PB" of Table 1 for 60 seconds. Using an ArF excimer stepper ("XT:1900Gi" manufactured by ASML, NA=1.35, 3/4 Annular, X-Y deflection), each wafer thus formed with the respective resist film was subjected to exposure using photomasks having a 50 nm line and space pattern, with the exposure quantity being varied stepwise.

After the exposure, each wafer was subjected to post-exposure baking on a hotplate at a temperature shown in column of "PEB" of Table 1 for 60 seconds and then to paddle development for 60 seconds with an aqueous solution of 2.38 wt % tetramethylammonium hydroxide.

Each of line and space patterns developed on the organic anti-reflective coating substrate after the development was observed with a scanning electron microscope, the results of which are shown in Table 2.

Effective Sensitivity (ES): It was expressed as the amount of exposure that the line and space pattern of 50 nm became 1:1 after exposure through line and space pattern mask and development.

Pattern Profile: The line and space pattern of 50 nm was observed with a scanning electron microscope, and when a cross-section of the pattern is a rectangle or nearly a rectangle, pattern profile is good and its evaluation is marked by "G", when upper of a cross-section of the pattern is round or length of the upper of a cross-section of the pattern is longer than that of bottom of a cross-section of the pattern, or a cross-section of the pattern is a tapered shape, pattern profile is bad, and its evaluation is marked by "B".

Focus margin (DOF): The photoresist patterns were obtained using a 50 nm line and space pattern photomask at the exposure amount of ES, with the focal point distance being varied stepwise. Each of patterns developed on the organic anti-reflective coating substrate after the development were observed and the focal point distances when the patterns of which line width was within 50 nm±5% (about 47.5 to 52.5 nm) were measured and the difference between the max value of the focal point distance and the minimum value of the focal point distance was calculated. When the difference is 0.15 µm or more, DOF is good and its evaluation is marked by "G", and when the difference is less than 0.15 µm, DOF is bad and its evaluation is marked by "B". Further, each of the differences is also shown in parentheses in a column of "DOF". The difference is bigger, the better focus margin the photoresist composition has.

TABLE 2

| Ex. No. | Pattern Profile | DOF |
|---|---|---|
| Ex. 1 | G | G (0.18) |
| Ex. 2 | G | G (0.21) |
| Ex. 3 | G | G (0.24) |
| Ex. 4 | G | G (0.18) |
| Ex. 5 | G | G (0.21) |
| Ex. 6 | G | G (0.21) |
| Ex. 7 | G | G (0.18) |
| Ex. 8 | G | G (0.18) |
| Ex. 9 | G | G (0.15) |
| Ref. Ex. 1 | B | B (0.03) |
| Ref. Ex. 2 | B | B (0.09) |

Examples 10 to 17 and Reference Examples 3 to 4

<Resin>
Resin A10 to A17
Resin H1
<Acid Generator>

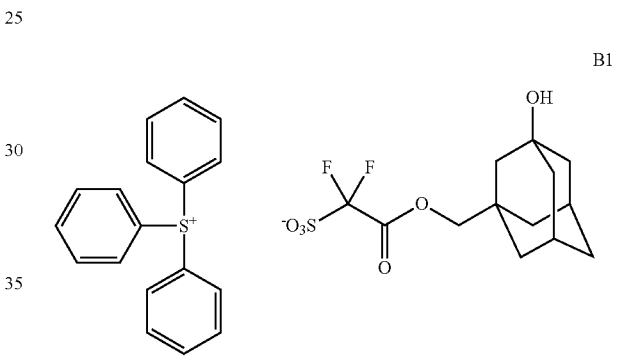

B1

<Quencher>
Q1: 2,6-diisopropylaniline
<Solvent>

| S1: | propylene glycol monomethyl ether acetate | 265 parts |
|---|---|---|
| | propylene glycol monomethyl ether | 20 parts |
| | 2-heptanone | 20 parts |
| | γ-butyrolactone | 3.5 parts |

The following components were mixed and dissolved, further, filtrated through a fluorine resin filter having pore diameter of 0.2 µm, to prepare photoresist compositions.
Resin (kind and amount are described in Table 3)
Acid generator (kind and amount are described in Table 3)
Quencher (kind and amount are described in Table 3)
Solvent S1

TABLE 3

| Ex. No. | Resin (kind/amount (part)) | Acid generator (kind/amount (part)) | Quencher (kind/amount (part)) | PB (° C.) | PEB (° C.) |
|---|---|---|---|---|---|
| Ex. 10 | A10/10 | B1/0.50 | Q1/0.07 | 100 | 95 |
| Ex. 11 | A11/10 | B1/0.50 | Q1/0.07 | 100 | 95 |
| Ex. 12 | A10/7 A12/3 | B1/0.50 | Q1/0.07 | 100 | 95 |

TABLE 3-continued

| Ex. No. | Resin (kind/amount (part)) | Acid generator (kind/amount (part)) | Quencher (kind/amount (part)) | PB (° C.) | PEB (° C.) |
|---|---|---|---|---|---|
| Ex. 13 | A10/8 A13/2 | B1/0.50 | Q1/0.07 | 100 | 95 |
| Ex. 14 | A14/10 | B1/0.50 | Q1/0.07 | 100 | 95 |
| Ex. 15 | A15/10 | B1/0.50 | Q1/0.07 | 100 | 95 |
| Ex. 16 | A16/10 | B1/0.50 | Q1/0.07 | 100 | 95 |
| Ex. 17 | A17/10 | B1/0.50 | Q1/0.07 | 100 | 95 |
| Ref. Ex. 3 | H1/10 | B1/0.27 | Q1/0.0325 | 130 | 130 |
| Ref. Ex. 4 | H1/10 | B1/0.50 | Q1/0.07 | 100 | 95 |

Silicon wafers were each coated with "ARC-29SR", which is an organic anti-reflective coating composition available from Nissan Chemical Industries, Ltd., and then baked under the conditions: 205° C., 60 seconds, to form a 780 A-thick organic anti-reflective coating. Each of the resist liquids prepared as above was spin-coated over the anti-reflective coating so that the thickness of the resulting film became 85 nm after drying. The silicon wafers thus coated with the respective resist liquids were each prebaked on a direct hotplate at a temperature shown in column of "PB" of Table 3 for 60 seconds. Using an ArF excimer stepper ("XT:1900Gi" manufactured by ASML, NA=1.35), each wafer thus formed with the respective resist film was subjected to exposure using photomasks for forming a hole pattern of which hole pitch is 100 nm and hole diameter is 72 nm, with the exposure quantity being varied stepwise.

After the exposure, each wafer was subjected to post-exposure baking on a hotplate at a temperature shown in column of "PEB" of Table 3 for 60 seconds and then to paddle development for 60 seconds with an aqueous solution of 2.38 wt % tetramethylammonium hydroxide.

Each of hole patterns developed on the organic anti-reflective coating substrate after the development was observed with a scanning electron microscope, the results of which are shown in Table 4.

Effective Sensitivity (ES): It was expressed as the amount of exposure that hole diameter of the pattern became 55 nm after exposure using the photomask for forming a hole pattern of which hole diameter is 70 nm and development.

Pattern Profile: The hole pattern obtained by using the photomask for forming a hole pattern of which hole diameter is 70 nm was observed with a scanning electron microscope, and when a cross-section of the pattern is as shown in the following (a), pattern profile is good and its evaluation is marked by "G", when a cross-section of the pattern is as shown in the following (b), (c) or (d), pattern profile is bad, and its evaluation is marked by "B".

Focus margin (DOF): The photoresist patterns were obtained using a hole pattern photomask at the exposure amount of ES, with the focal point distance being varied stepwise. Each of patterns developed on the organic anti-reflective coating substrate after the development were observed and the focal point distances when the patterns of which hole diameter was 52.2 nm or more and 57.7 nm or less were measured and the difference between the max value of the focal point distance and the minimum value of the focal point distance was calculated. When the difference is 0.16 µm or more and 0.20 µm or less, DOF is insufficient and its evaluation is marked by "I", when the difference is more than 0.20 µm, DOF is good and its evaluation is marked by "G", and when the difference is less than 0.16 µm, DOF is bad and its evaluation is marked by "B". Further, each of the differences is also shown in parentheses in a column of "DOF". The difference is bigger, the better focus margin the photoresist composition has.

CD uniformity (CDU): The photoresist patterns were obtained using a photomask for forming a hole pattern having a hole diameter of 70 nm at the exposure amount of ES. Each of patterns developed on the organic anti-reflective coating substrate after the development was observed with a scanning electron microscope. The hole diameter of the hole patterns was twenty four times measured and its average diameter was calculated. The average diameters of four hundred holes on the same wafer were respectively measured. When population was the average diameters of four hundred holes, the standard deviation was calculated. When the standard deviation is 1.80 nm or more and 2.00 nm or less, CDU is insufficient and its evaluation is marked by "I", when the standard deviation is less than 1.80 nm, CDU is good and its evaluation is marked by "G", and when the standard deviation is more than 2.00 nm, CDU is bad and its evaluation is marked by "B". Further, each of the standard deviations is also shown in parentheses in a column of "CDU". The smaller the standard deviation is, the better CDU the photoresist pattern shows.

TABLE 4

| Ex. No. | ES (mJ/cm²) | Pattern Profile | DOF | CDU |
|---|---|---|---|---|
| Ex. 10 | 32 | G | G (0.28) | G (1.58) |
| Ex. 11 | 38 | G | G (0.28) | G (1.62) |
| Ex. 12 | 35 | G | G (0.24) | G (1.74) |
| Ex. 13 | 35 | G | G (0.24) | G (1.78) |
| Ex. 14 | 40 | G | G (0.24) | G (1.63) |
| Ex. 15 | 37 | G | G (0.28) | G (1.60) |
| Ex. 16 | 38 | G | G (0.28) | G (1.63) |
| Ex. 17 | 41 | G | G (0.24) | G (1.65) |
| Ref. Ex. 3 | 42 | B | B (0.08) | B (2.98) |
| Ref. Ex. 4 | 38 | B | I (0.16) | I (1.98) |

Examples 18 to 26 and Reference Examples 5 to 6

<Resin>

Resin A18 to A26

Resin H1

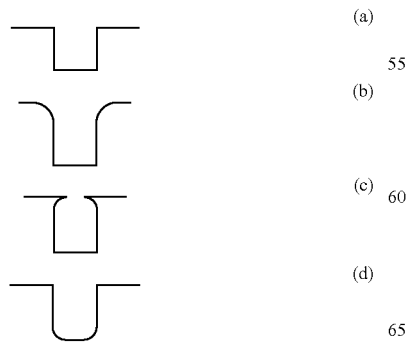

(a)
(b)
(c)
(d)

Acid Generator

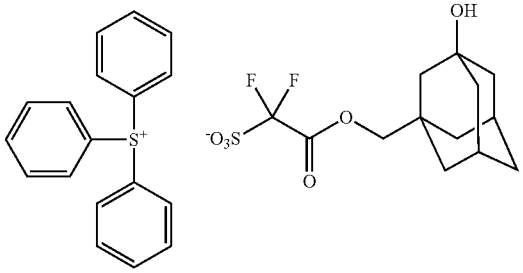

B1

Quencher
Q1: 2,6-diisopropylaniline

Solvent

| S1: | propylene glycol monomethyl ether acetate | 265 parts |
|---|---|---|
| | propylene glycol monomethyl ether | 20 parts |
| | 2-heptanone | 20 parts |
| | γ-butyrolactone | 3.5 parts |

The following components were mixed and dissolved, further, filtrated through a fluorine resin filter having pore diameter of 0.2 μm, to prepare photoresist compositions.

Resin (kind and amount are described in Table 5)
Acid generator (kind and amount are described in Table 5)
Quencher (kind and amount are described in Table 5)
Solvent S1

TABLE 5

| Ex. No. | Resin (kind/amount (part)) | Acid generator (kind/amount (part)) | Quencher (kind/amount (part)) | PB (° C.) | PEB (° C.) |
|---|---|---|---|---|---|
| Ex. 18 | A18/10 | B1/0.70 | Q1/0.065 | 100 | 100 |
| Ex. 19 | A19/10 | B1/0.70 | Q1/0.065 | 100 | 100 |
| Ex. 20 | A20/10 | B1/0.70 | Q1/0.065 | 100 | 100 |
| Ex. 21 | A21/10 | B1/0.70 | Q1/0.065 | 100 | 100 |
| Ex. 22 | A22/10 | B1/0.70 | Q1/0.065 | 100 | 100 |
| Ex. 23 | A23/10 | B1/0.70 | Q1/0.065 | 100 | 100 |
| Ex. 24 | A24/10 | B1/0.70 | Q1/0.065 | 100 | 100 |
| Ex. 25 | A25/10 | B1/0.70 | Q1/0.065 | 100 | 100 |
| Ex. 26 | A26/10 | B1/0.70 | Q1/0.065 | 100 | 100 |
| Ref. Ex. 5 | H1/10 | B1/0.27 | Q1/0.0325 | 130 | 130 |
| Ref. Ex. 6 | H1/10 | B1/0.70 | Q1/0.065 | 100 | 100 |

Silicon wafers were each coated with "ARC-29SR", which is an organic anti-reflective coating composition available from Nissan Chemical Industries, Ltd., and then baked under the conditions: 205° C., 60 seconds, to form a 780 Å-thick organic anti-reflective coating. Each of the resist liquids prepared as above was spin-coated over the anti-reflective coating so that the thickness of the resulting film became 85 nm after drying. The silicon wafers thus coated with the respective resist liquids were each prebaked on a direct hotplate at a temperature shown in column of "PB" of Table 5 for 60 seconds. Using an ArF excimer stepper ("XT:1900Gi" manufactured by ASML, NA=1.35, 3/4 Annular, X-Y deflection), each wafer thus formed with the respective resist film was subjected to exposure using photomasks having a line and space pattern, with the exposure quantity being varied stepwise.

After the exposure, each wafer was subjected to post-exposure baking on a hotplate at a temperature shown in column of "PEB" of Table 5 for 60 seconds and then to paddle development for 60 seconds with an aqueous solution of 2.38 wt % tetramethylammonium hydroxide.

Each of line and space patterns developed on the organic anti-reflective coating substrate after the development was observed with a scanning electron microscope, the results of which are shown in Table 6.

Effective Sensitivity (ES): It was expressed as the amount of exposure that the line and space pattern of 50 nm became 1:1 after exposure through line and space pattern mask and development.

Resolution: The line and space pattern was observed with a scanning electron microscope, and when the line and space pattern of 45 nm was resolved, resolution is good and its evaluation is marked by "G", and when the line and space pattern of 45 nm was not resolved or the toppling of the patterns was observed, resolution is bad and its evaluation is marked by "B".

Pattern profile: The line and space pattern of 50 nm was observed with a scanning electron microscope, and when a cross-section of the pattern is a rectangle or nearly a rectangle, pattern profile is good and its evaluation is marked by "G", when upper of a cross-section of the pattern is round or length of the upper of a cross-section of the pattern is longer than that of bottom of a cross-section of the pattern, or a cross-section of the pattern is a tapered shape, pattern profile is bad, and its evaluation is marked by "B".

TABLE 6

| Ex. No. | Pattern Profile | Resolution |
|---|---|---|
| Ex. 18 | G | G |
| Ex. 19 | G | G |
| Ex. 20 | G | G |
| Ex. 21 | G | G |
| Ex. 22 | G | G |
| Ex. 23 | G | G |
| Ex. 24 | G | G |
| Ex. 25 | G | G |
| Ex. 26 | G | G |
| Ref. Ex. 5 | B | B |
| Ref. Ex. 6 | B | B |

The photoresist composition of the present invention provides a photoresist pattern having good pattern profile and good resolution.

What is claimed is:

1. A photoresist composition comprising an acid generator and a resin comprising a structural unit derived from a monomer represented by the formula (1):

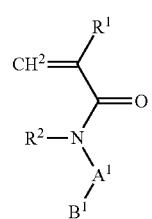

(1)

wherein $R^1$ represents a hydrogen atom or a C1-C4 alkyl group,
$R^2$ represents a hydrogen atom or a C1-C4 alkyl group, $A^1$ represents —$(CH_2)_m$—CO—O-$A^2$-*  or —$(CH_2)_n$—CO—$NR^{30}$-$A^3$-*, m and n each independently represent an integer of 1 to 6, $R^{30}$ represents a hydrogen atom or a C1-C4 alkyl group, $A^2$ represents a single bond, $A^3$ represents a single bond, and * represents a binding position to $B^1$, and $B^1$ represents a group represented by the formula (1a):

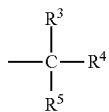
(1a)

wherein $R^3$, $R^4$ and $R^5$ each independently represents a C1-C8 aliphatic hydrocarbon group or a C3-C8 saturated cyclic hydrocarbon group, and $R^4$ and $R^5$ can be bonded to each other to form a C3-C10 ring together with the carbon atom to which $R^4$ and $R^5$ are bonded, and the saturated cyclic hydrocarbon group and the ring can have a C1-C8 aliphatic hydrocarbon group.

2. The photoresist composition according to claim 1, wherein $B^1$ is a group represented by the formula (1a-1) or (1a-2):

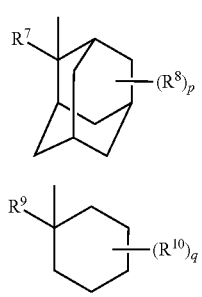
(1a-1)

(1a-2)

wherein $R^7$ represents a C1-C8 aliphatic hydrocarbon group or a C3-C8 saturated cyclic hydrocarbon group which can have a C1-C8 aliphatic hydrocarbon group, $R^8$ is independently in each occurrence a C1-C8 aliphatic hydrocarbon group, p represents an integer of 0 to 10, $R^9$ represents a C1-C8 aliphatic hydrocarbon group or a C3-C8 saturated cyclic hydrocarbon group which can have a C1-C8 aliphatic hydrocarbon group, $R^{10}$ is independently in each occurrence a C1-C8 aliphatic hydrocarbon group, and q represents an integer of 0 to 10.

3. A photoresist composition comprising an acid generator and a resin comprising a structural unit derived from a monomer represented by the formula (1):

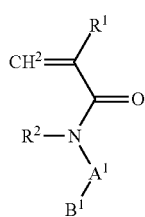
(1)

wherein $R^1$ represents a hydrogen atom or a C1-C4 alkyl group, $R^2$ represents a hydrogen atom or a C1-C4 alkyl group, $A^1$ represents —$(CH_2)_m$—CO—O-$A^2$-* or —$(CH_2)_n$—CO—$NR^{30}$-$A^3$-*, m and n each independently represent an integer of 1 to 6, $R^{30}$ represents a hydrogen atom or a C1-C4 alkyl group, $A^2$ represents a single bond, $A^3$ represents a single bond, and * represents a binding position to $B^1$, and $B^1$ represents a group represented by the formula (1c-1):

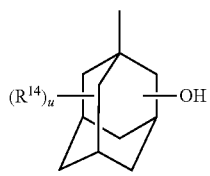
(1c-1)

wherein $R^{14}$ is independently in each occurrence a C1-C4 alkyl group or a hydroxyl group, u represents an integer of 0 to 3.

4. A photoresist composition comprising an acid generator and a resin comprising a structural unit derived from a monomer represented by the formula (1):

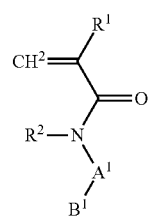
(1)

wherein $R^1$ represents a hydrogen atom or a C1-C4 alkyl group, $R^2$ represents a hydrogen atom or a C1-C4 alkyl group, $A^1$ represents —$(CH_2)_m$—CO—O-$A^2$-* or —$(CH_2)_n$—CO—$NR^{30}$-$A^3$-*, m and n each independently represent an integer of 1 to 6, $R^{30}$ represents a hydrogen atom or a C1-C4 alkyl group, $A^2$ represents a single bond, $A^3$ represents a single bond, and * represents a binding position to $B^1$, and $B^1$ is a group represented by the formula (1c-2):

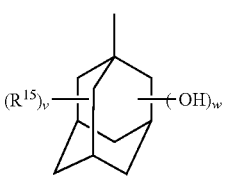
(1c-2)

wherein $R^{15}$ is independently in each occurrence a C1-C4 alkyl group, v represents an integer of 0 to 3, and w represents an integer of 1 to 3, with the proviso that sum of v and w is 4 or less.

5. The photoresist composition according to claim 1, wherein the resin has an acid-labile group and is insoluble or poorly soluble in an aqueous alkaline solution but becomes soluble in an aqueous alkaline solution by the action of an acid.

6. The photoresist composition according to claim 1, wherein the acid generator is a salt represented by the formula (B1):

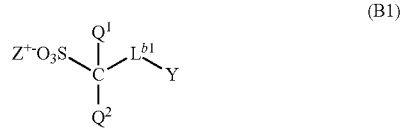

(B1)

wherein $Q^1$ and $Q^2$ each independently represent a fluorine atom or a C1-C6 perfluoroalkyl group, $L^{b1}$ represents a single bond or a C1-C17 divalent saturated aliphatic hydrocarbon group in which one or more methylene groups can be replaced by —O— or —CO—, Y represents a C1-C36 aliphatic hydrocarbon group which can have one or more substituents, and one or more methylene groups in the aliphatic hydrocarbon group can be replaced by —O—, —CO— or —SO$_2$—, and $Z^+$ represents an organic cation.

7. The photoresist composition according to claim 6, wherein Lb1 is *—CO—O— in which * represents a binding position to —C($Q^1$)($Q^2$)-.

8. The photoresist composition according to claim 6, wherein $Z^+$ is an arylsulfonium cation.

9. The photoresist composition according to claim 1, wherein the composition further comprises a basic compound.

10. A process for producing a photoresist pattern comprising the following steps (1) to (5):
   (1) a step of applying the photoresist composition according to claim 1 on a substrate,
   (2) a step of forming a photoresist film by conducting drying,
   (3) a step of exposing the photoresist film to radiation,
   (4) a step of baking the exposed photoresist film, and
   (5) a step of developing the baked photoresist film with an alkaline developer, thereby forming a photoresist pattern.

11. The photoresist composition according to claim 1, wherein the content of the structural unit derived from the monomer represented by formula (1) is 5 to 80% by moles based on 100 moles of all the structural units of the resin.

* * * * *